US009093434B2

(12) United States Patent
Kimura et al.

(10) Patent No.: US 9,093,434 B2
(45) Date of Patent: Jul. 28, 2015

(54) SEMICONDUCTOR DEVICE AND METHOD FOR MANUFACTURING SEMICONDUCTOR DEVICE

(75) Inventors: Akihiro Kimura, Kyoto (JP); Takeshi Sunaga, Kyoto (JP); Shouji Yasunaga, Kyoto (JP); Akihiro Koga, Kyoto (JP)

(73) Assignee: ROHM CO., LTD., Kyoto-Shi, Kyoto (JP)

( * ) Notice: Subject to any disclaimer, the term of this patent is extended or adjusted under 35 U.S.C. 154(b) by 0 days.

(21) Appl. No.: 14/110,131

(22) PCT Filed: Apr. 3, 2012

(86) PCT No.: PCT/JP2012/059040
§ 371 (c)(1), (2), (4) Date: Oct. 4, 2013

(87) PCT Pub. No.: WO2012/137760
PCT Pub. Date: Oct. 11, 2012

(65) Prior Publication Data

US 2014/0027891 A1 Jan. 30, 2014

(30) Foreign Application Priority Data

| | | | |
|---|---|---|---|
| Apr. 4, 2011 | (JP) | ................................ | 2011-082405 |
| Apr. 4, 2011 | (JP) | ................................ | 2011-082560 |
| May 9, 2011 | (JP) | ................................ | 2011-104349 |
| May 10, 2011 | (JP) | ................................ | 2011-105511 |
| May 10, 2011 | (JP) | ................................ | 2011-105512 |
| May 10, 2011 | (JP) | ................................ | 2011-105513 |

(51) Int. Cl.
*H01L 21/48* (2006.01)
*H01L 23/495* (2006.01)

(Continued)

(52) U.S. Cl.
CPC .......... *H01L 21/4825* (2013.01); *H01L 21/561* (2013.01); *H01L 21/565* (2013.01); *H01L 23/3107* (2013.01); *H01L 23/3142* (2013.01); *H01L 23/36* (2013.01);

(Continued)

(58) Field of Classification Search
CPC .............................. H01L 21/48; H01L 23/495
USPC .......................................................... 257/675
See application file for complete search history.

(56) References Cited

U.S. PATENT DOCUMENTS 5,703,399 A * 12/1997 Majumdar et al. ............ 257/723
7,166,926 B2 1/2007 Hayashi et al.

(Continued)

FOREIGN PATENT DOCUMENTS

DE 10048377 A1 6/2001
EP 0774782 A2 5/1997

(Continued)

OTHER PUBLICATIONS

Patent Cooperation Treaty, Japanese Patent Office; International Search Report for PCT/JP2012/059040; Jul. 3, 2012; 4 pages.

*Primary Examiner* — Marc Armand
(74) *Attorney, Agent, or Firm* — Howison & Arnott, LLP

(57) ABSTRACT

A method includes the steps of: preparing a lead frame including a plurality of die pads, and preparing a plurality of semiconductor chips; disposing each of the semiconductor chips on a respective one of the die pads; forming a sealing resin to cover the die pads and the semiconductor chips; and attaching a heat dissipation plate to the die pads by pressing the heat dissipation plate against the die pads via a resin sheet which is an adhesive layer after the sealing resin is formed.

20 Claims, 106 Drawing Sheets

(51) Int. Cl.

| | |
|---|---|
| ***H01L 23/31*** | (2006.01) |
| ***H01L 23/433*** | (2006.01) |
| ***H01L 21/56*** | (2006.01) |
| ***H01L 23/36*** | (2006.01) |
| *H01L 23/00* | (2006.01) |

(52) U.S. Cl.

CPC ..... *H01L 23/4334* (2013.01); *H01L 23/49541* (2013.01); *H01L 23/49551* (2013.01); *H01L 23/49568* (2013.01); *H01L 23/49575* (2013.01); *H01L 23/49586* (2013.01); *H01L 24/49* (2013.01); *H01L 24/32* (2013.01); *H01L 24/48* (2013.01); *H01L 24/83* (2013.01); *H01L 24/85* (2013.01); *H01L 2224/291* (2013.01); *H01L 2224/32245* (2013.01); *H01L 2224/48091* (2013.01); *H01L 2224/48137* (2013.01); *H01L 2224/48247* (2013.01); *H01L 2224/48472* (2013.01); *H01L 2224/49171* (2013.01); *H01L 2224/49173* (2013.01); *H01L 2224/49175* (2013.01); *H01L 2224/49177* (2013.01); *H01L 2224/73265* (2013.01); *H01L 2224/83192* (2013.01); *H01L 2224/85* (2013.01); *H01L 2224/92247* (2013.01); *H01L 2924/00013* (2013.01); *H01L 2924/01029* (2013.01); *H01L 2924/1305* (2013.01); *H01L 2924/13055* (2013.01); *H01L 2924/13091* (2013.01)

(56) References Cited

U.S. PATENT DOCUMENTS

| | | | |
|---|---|---|---|
| 7,501,700 | B2 | 3/2009 | Jeun et al. |
| 2006/0113562 | A1 | 6/2006 | Jeun et al. |

FOREIGN PATENT DOCUMENTS

| | | | | | |
|---|---|---|---|---|---|
| JP | 6125024 | A | | 6/1994 | |
| JP | 7106469 | A | | 4/1995 | |
| JP | 9139461 | A | | 5/1997 | |
| JP | 11036959 | A | | 2/1999 | |
| JP | 2001156253 | A | | 6/2001 | |
| JP | 2005123495 | A | | 5/2005 | |
| JP | 2008166621 | A | | 7/2008 | |
| JP | 2008218616 | A | | 9/2008 | |
| JP | 2009049049 | A | | 3/2009 | |
| JP | 2009105389 | A | | 5/2009 | |
| JP | 2009302526 | | * | 12/2009 | ............. H01L 23/29 |
| KR | 20010035579 | A | | 5/2001 | |

* cited by examiner

SEMICONDUCTOR DEVICE AND METHOD FOR MANUFACTURING SEMICONDUCTOR DEVICE

CROSS-REFERENCE TO RELATED APPLICATIONS

This application is a U.S. National Phase application submitted under 35 U.S.C. §371 of Patent Cooperation Treaty application serial no. PCT/JP2012-059040, filed Apr. 3, 2012, and entitled SEMICONDUCTOR DEVICE AND METHOD FOR MANUFACTURING SEMICONDUCTOR, which application claims priority to Japanese patent application serial nos. JP 2011-082405, filed Apr. 4, 2011, JP 2011-082560, filed Apr. 4, 2011, JP 2011-104349, filed May 9, 2011, JP 2011-105511, filed May 10, 2011, JP 2011-105512, filed May 10, 2011, and JP 2011-105513, filed May 10, 2011, entitled 【発明の名称】 半導体製造装置 用部品.

Patent Cooperation Treaty application serial no. PCT/JP2012-059040, published as WO2012/137760, and Japanese patent application serial no. 2011-082405, 2011-082560, 2011-104349, 2011-105511, 2011-105512 and 2011-105513, are incorporated herein by reference.

TECHNICAL FIELD

The present invention relates to a semiconductor device and a method for manufacturing a semiconductor device.

BACKGROUND

Conventionally, various kinds of semiconductor devices are known. For instance, there exists a semiconductor device called an IPM (Intelligent Power Module). This type of semiconductor device includes semiconductor chips, die pads, a heat dissipation plate, a bonding layer and a sealing resin. The semiconductor chips are disposed on the die pads, respectively. The die pads are bonded to the heat dissipation plate via the bonding layer. The sealing resin covers the semiconductor chips, the die pads, the heat dissipation plate and the bonding layer. Such a semiconductor device called IPM is disclosed in e.g. Patent Document 1.

Conventionally, to manufacture a semiconductor device of this type, the die pads and the heat dissipation plate are bonded together before or at the same time as the sealing resin is formed. In bonding each die pad to a heat dissipation plate, the die pad is pressed against the heat dissipation plate by using a relatively thin pin. When only a portion of the die pad is pressed with a pin, the force is exerted only to the portion of the die pad, so that the die pad may tilt with respect to the heat dissipation plate. Further, when a pin is not used, the die pad may move in the process of forming the sealing resin, which may lead to problems such as cutting of the wires. To avoid such a problem, the die pad needs to be fixed with a pin. To prevent the die pad from tilting with respect to the heat dissipation plate, a plurality of portions of the die pad need to be pressed with pins. To press a plurality of portions of the die pad with pins, the die pad needs to have spaces for the pins, which hinders size reduction of the semiconductor device.

In the above-described semiconductor device, the distance between the die pads and the heat dissipation plate is set to a certain value. Positioning each of the die pads with respect to the heat dissipation plate so that the distance between the die pad and the heat dissipation plate is the predetermined value requires a high level of technique and is not easy.

Conventionally, various kinds of semiconductor devices are known. For instance, there exists a semiconductor device called an IPM (Intelligent Power Module). This type of semiconductor device includes semiconductor chips, die pads, terminals, a heat dissipation plate, a bonding layer and a sealing resin. The semiconductor chips are disposed on the die pads, respectively. The die pads are bonded to the heat dissipation plate via the bonding layer. The sealing resin covers the semiconductor chips, the die pads, the heat dissipation plate and the bonding layer. The terminals are connected to the die pads, respectively, and project from the sealing resin. The terminals are arranged in parallel to each other.

When the semiconductor device is used, a large potential difference is generated between the terminals. Further, it is necessary to prevent dielectric breakdown and the resulting current flow from occurring between adjacent terminals during the use of the semiconductor device. Thus, a high withstand voltage needs to be secured between adjacent terminals. For instance, in the semiconductor device disclosed in Patent Document 2, the withstand voltage between terminals is made high by fitting an insulating tube to each terminal. However, in the semiconductor device disclosed in Patent Document 1, the end of each terminal is not covered by an insulating tube. When the end of each terminal is not covered by the insulating tube, dielectric breakdown may occur in a space between the ends of the terminals and current may flow in the space. To prevent this, a considerably large distance needs to be secured between the ends of the terminals. This is not suitable for size reduction of the semiconductor device.

Conventionally, various kinds of semiconductor devices are known. For instance, there exists a semiconductor device called an IPM (Intelligent Power Module). This type of semiconductor device includes semiconductor chips, die pads, terminals, a heat dissipation plate, a bonding layer and a sealing resin. The semiconductor chips are disposed on the die pads, respectively. The die pads are bonded to the heat dissipation plate via the bonding layer. The sealing resin covers the semiconductor chips, the die pads, the heat dissipation plate and the bonding layer. The terminals are connected to the die pads, respectively, and project from the sealing resin. The terminals are arranged in parallel to each other. This type of semiconductor device is described in Patent Document 2.

In the state in which the semiconductor device is mounted, the heat dissipation plate of the semiconductor device is held in contact with a heat dissipating member having a high thermal conductivity. There is a demand for a technique for quickly transmitting the heat generated at the semiconductor chips of a semiconductor device to a heat dissipating member.

Conventionally, various kinds of semiconductor devices are known. An example of a semiconductor device is disclosed in Patent Document 3. The semiconductor device disclosed in this document includes semiconductor chips, a die pad and a molding resin. The semiconductor chips are disposed on the die pad. The molding resin covers the semiconductor chips and the die pad. In this semiconductor device, the semiconductor chips are disposed on a same surface of the die pad. Thus, the position of each semiconductor chip on the die pad is restricted by arrangement of other semiconductor chips. For instance, the semiconductor chips need to be arranged as spaced apart from each other by a certain distance as viewed in the thickness direction of the die pad. This type of semiconductor device has room for improvement in size reduction.

FIG. 95 shows an example of conventional semiconductor device (see e.g. Patent Document 4). The semiconductor device 900 illustrated in the figure includes a semiconductor element 904 mounted on an island 901 made of a metal. From the island 901A extends a lead 902. The semiconductor element 904 is connected to a lead 903 via a wire 905. The entireties of the semiconductor element 904 and the island 901 and part of each lead 902, 903 are covered by a sealing resin 906. The semiconductor device 900 is mounted on a non-illustrated circuit board and operates in accordance with the function of the semiconductor element 904.

In recent years, an IPM (Intelligent Power Module) has become widely used as a semiconductor device for converting inputted current into current of desired specifications and outputting the current. When the semiconductor device 900 is designed as an IPM, the semiconductor device incorporates, as a semiconductor element 904, a control element such as a power MOSFET or an IGBT (insulated gate bipolar transistor) and a driver element for driving and controlling the control element. Since the control element considerably heats up due to current flow, the heat dissipation performance of the semiconductor device 900 needs to be enhanced. Further, when the control element and the driver element are not properly arranged, the size of the semiconductor device 900 becomes large.

Conventionally, a semiconductor device in which a semiconductor element is resin-molded is widely used (see e.g. Patent Document 3). FIG. 123 shows an example of such a semiconductor device. The semiconductor device 90 shown in FIG. 123 includes a pair of terminal leads 91, 92, a semiconductor element 93, an insulating resin sheet 94, a metal member 95 made of a metal, wires 96, and a sealing resin 97 protecting these members. The terminal lead 91 is made by e.g. working a lead frame made of copper and includes a die pad 911. The semiconductor element 93 is mounted on the front surface of the die pad 911 and electrically connected to the terminal leads 91 and 92 via wires 96. The semiconductor element 93 is actuated by applying current to the terminal leads 91, 92. At that time, the semiconductor element 93 heats up. The metal member 95 is provided to efficiently dissipate heat generated by the semiconductor element 93 to the outside. The resin sheet 94 bonds the reverse surface of the die pad 911 and the front surface of the metal member 95. The resin sheet 94 is made of an epoxy resin containing a filler for enhancing the thermal conduction.

To bond the die pad 911 and the metal member 95 by using the resin sheet 94, pressing is performed in e.g. a hot environment. According to this manufacturing process, pressure is applied to the resin sheet 94 in the thickness direction. When the pressure application is uneven, the resin sheet 94 may be deformed into an undesired shape, as shown in FIG. 124. In the example shown in FIG. 124, the die pad 911 is also deformed to come into contact with the metal member 95 due to the pressure. Since the die pad 911 is electrically connected to the terminal lead 91, contact of the die pad 911 and the metal member 95 may result in the formation of an unintentional current path when the semiconductor device 90 is incorporated in a circuit.

Even when the situation shown in FIG. 124 does not occur, reduction of the thickness of the resin sheet 94 makes it difficult to maintain the insulation between the metal member 95 and the die pad 911, and the semiconductor device 90 may not be able to secure the withstand voltage. Further, the pressure may make the distribution of the filler in the resin sheet 94 uneven. In such a case, the heat dissipation performance of the resin sheet 94 may vary depending on positions.

In this way, although the provision of the metal member 95 is effective for enhancing the heat dissipation performance of the semiconductor device 90, it may degrade the reliability of the device.

TECHNICAL REFERENCE

Patent Document

Patent Document 1: JP-A-2009-105389
Patent Document 2: JP-A-11-36959
Patent Document 3: JP-A-2005-123495
Patent Document 4: JP-A-2008-166621

SUMMARY OF THE INVENTION

Problem to be Solved by the Invention

The present invention is conceived under the circumstances described above. It is therefore a main object of the present invention to provide a method for manufacturing a semiconductor device which realizes size reduction and facilitates positioning of die pads relative to a heat dissipation plate.

A variation of the present invention is conceived under the circumstances described above, and its object is to provide a semiconductor device, a method for manufacturing a semiconductor device, and a mount structure of a semiconductor device which are suitable for size reduction.

Another variation of the present invention is conceived under the circumstances described above, and its object is to provide a mount structure of a semiconductor device which allows heat generated at a semiconductor chip to be quickly transferred to a heat dissipating member.

Another variation of the present invention is conceived under the circumstances described above, and its main object is to provide a semiconductor device that realizes reduction in size as viewed in plan.

Another variation of the present invention is conceived under the circumstances described above, and its object is to provide a semiconductor device and a method for manufacturing a semiconductor device which realize size reduction while enhancing heat dissipation performance.

Another variation of the present invention is conceived under the circumstances described above, and its object is to provide a semiconductor device and a method for manufacturing a semiconductor device which enhance the reliability while also enhancing heat dissipation performance.

Means for Solving the Problems

According to a first aspect of the present invention, there is provided a method for manufacturing a semiconductor device comprising the steps of preparing a lead frame including a plurality of die pads, and a plurality of semiconductor chips, disposing each of the semiconductor chips on a respective one of the die pads, forming a sealing resin to cover the die pads and the semiconductor chips, and attaching a heat dissipation plate to the die pads by pressing the heat dissipation plate against the die pads via an adhesive layer after the sealing resin is formed.

According to this method, the number of pins to be used is reduced. Thus, it is not necessary to design different molds to make different products, i.e., the same mold can be used for making different products, which leads to cost reduction.

Preferably, the step of forming a sealing resin comprises forming in the sealing resin a recess that expose the die pads, and the step of attaching a heat dissipation plate comprises fitting the heat dissipation plate into the recess.

Preferably, one of the adhesive layer and the heat dissipation plate has insulating properties.

Preferably, the method further comprises the step of performing blasting with respect to the die pads after the step of forming a sealing resin and before the step of attaching a heat dissipation plate.

According to a second aspect of the present invention, there is provided a semiconductor device comprising a plurality of die pads, a plurality of semiconductor chips each of which is disposed on a respective one of the die pads, a sealing resin including a recess that exposes all the die pads and covering the die pads and the semiconductor chips, a heat dissipation plate disposed in the recess, and an intermediate layer including a plurality of first portions. Each of the first portions bonds a respective one of the die pads and the heat dissipation plate and is between the die pad and the heat dissipation plate. The recess includes a recess side surface spaced apart from the heat dissipation plate.

Preferably, the heat dissipation plate or the first portions have insulating properties.

Preferably, each of the die pads includes an irregular surface with which a corresponding one of the first portions is in contact.

Preferably, the recess includes a recess bottom surface, and the die pads are exposed from the recess bottom surface.

Preferably, the recess bottom surface is an irregular surface.

Preferably, the intermediate layer includes an insulating portion between the recess side surface and the heat dissipation plate.

Preferably, the intermediate layer includes a second portion connected to the first portions, the heat dissipation plate is made of a conductor, and the first portions and the second portion are made of a same insulating material.

Preferably, the semiconductor device further comprises a filler contained in the first portions and the second portion.

Preferably, the conductor is aluminum, copper or iron.

Preferably, the insulating material is a thermoplastic resin.

Preferably, the heat dissipation plate is made of a ceramic material, and the first portions are spaced apart from each other and made of a conductor.

Preferably, the ceramic material is alumina, aluminum nitride or silicon nitride.

Preferably, the conductor is silver, gold or copper.

Preferably, the sealing resin includes a resin bottom surface, the recess is dented from the resin bottom surface, and the heat dissipation plate includes a portion projecting from the resin bottom surface.

Preferably, the sealing resin includes a plurality of bar portions standing from the recess bottom surface, and each of the bar portions is positioned between the heat dissipation plate and the recess side surface.

Preferably, the sealing resin includes a projection projecting from the recess bottom surface, and the projection is in contact with the heat dissipation plate.

Other features and advantages of the present invention will become clearer by the description given below with reference to the accompanying drawings.

BRIEF DESCRIPTION OF THE DRAWINGS

FIG. 120 is a sectional view showing an example of use of the semiconductor device shown in FIG. 119;

FIG. 121 is a schematic enlarged view of the semiconductor device shown in FIG. 119;

FIG. 122 is a schematic sectional view of a semiconductor device according to the 7E embodiment;

FIG. 123 is a sectional view of an example of a conventional semiconductor device; and FIG. 124 is a sectional view showing an example of a problem in the conventional semiconductor device.

DETAILED DESCRIPTION

Embodiments of the present invention are described below with reference to the accompanying drawings.

1A Embodiment

The 1A Embodiment of the present invention is described below with reference to FIGS. 1-9.

Figure 1:
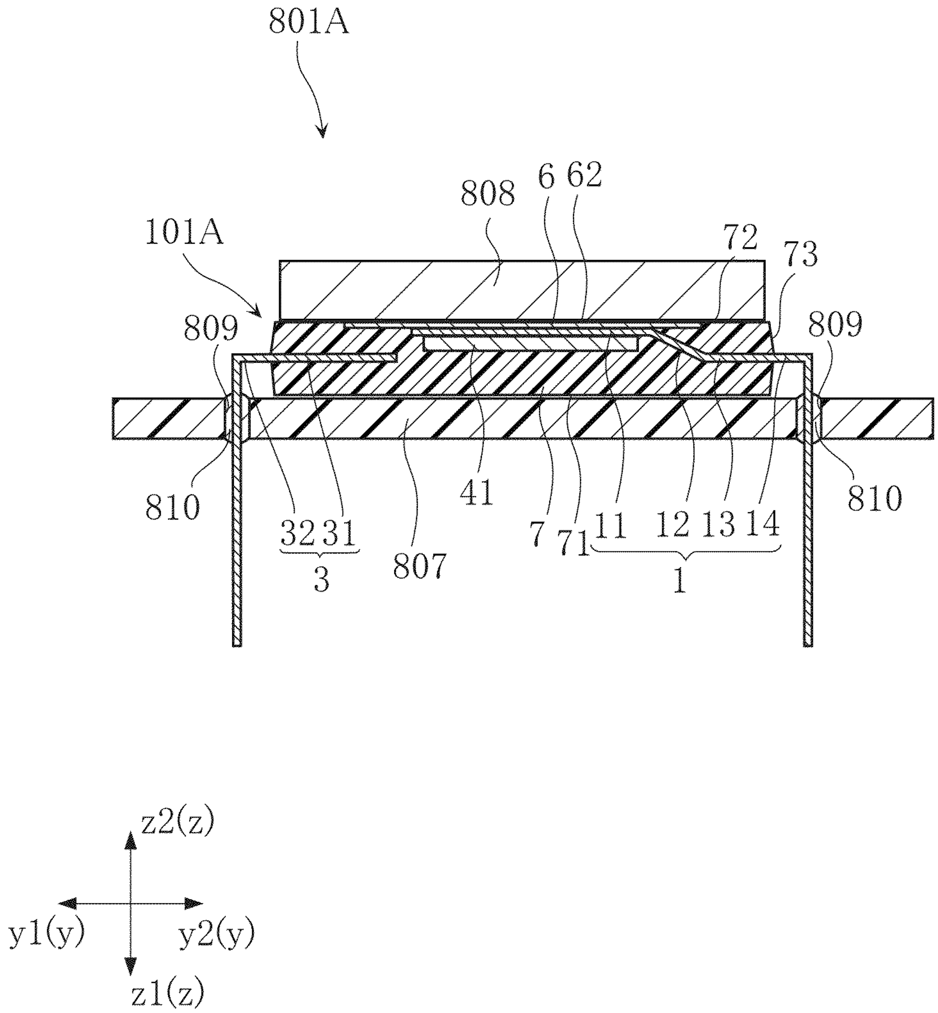
FIG. 1 is a sectional view of a mount structure of a semiconductor device according to the 1A Embodiment of the present invention.

FIG. 1 is a sectional view showing a mount structure of a semiconductor device according to this embodiment.

The mount structure 801A of the semiconductor device shown in FIG. 1 includes a semiconductor device 101A, a board 807 and a heat dissipating member 808.

On the board 807 are mounted a plurality of electronic components. The board 807 is made of an insulating material. The board 807 is provided with a non-illustrated wiring pattern. The board 807 has a plurality of holes 809. The heat dissipating member 808 is made of a material having a relatively high thermal conductivity, e.g. a metal such as aluminum. The heat dissipating member 808 is fixed to the board 807 by a non-illustrated support member. The semiconductor device 101A is mounted on the board 807. In this embodiment, the semiconductor device 101A is a product called an IPM (Intelligent Power Module). For instance, the semiconductor device 101A is used for an air conditioner or motor control equipment.

Figure 2:
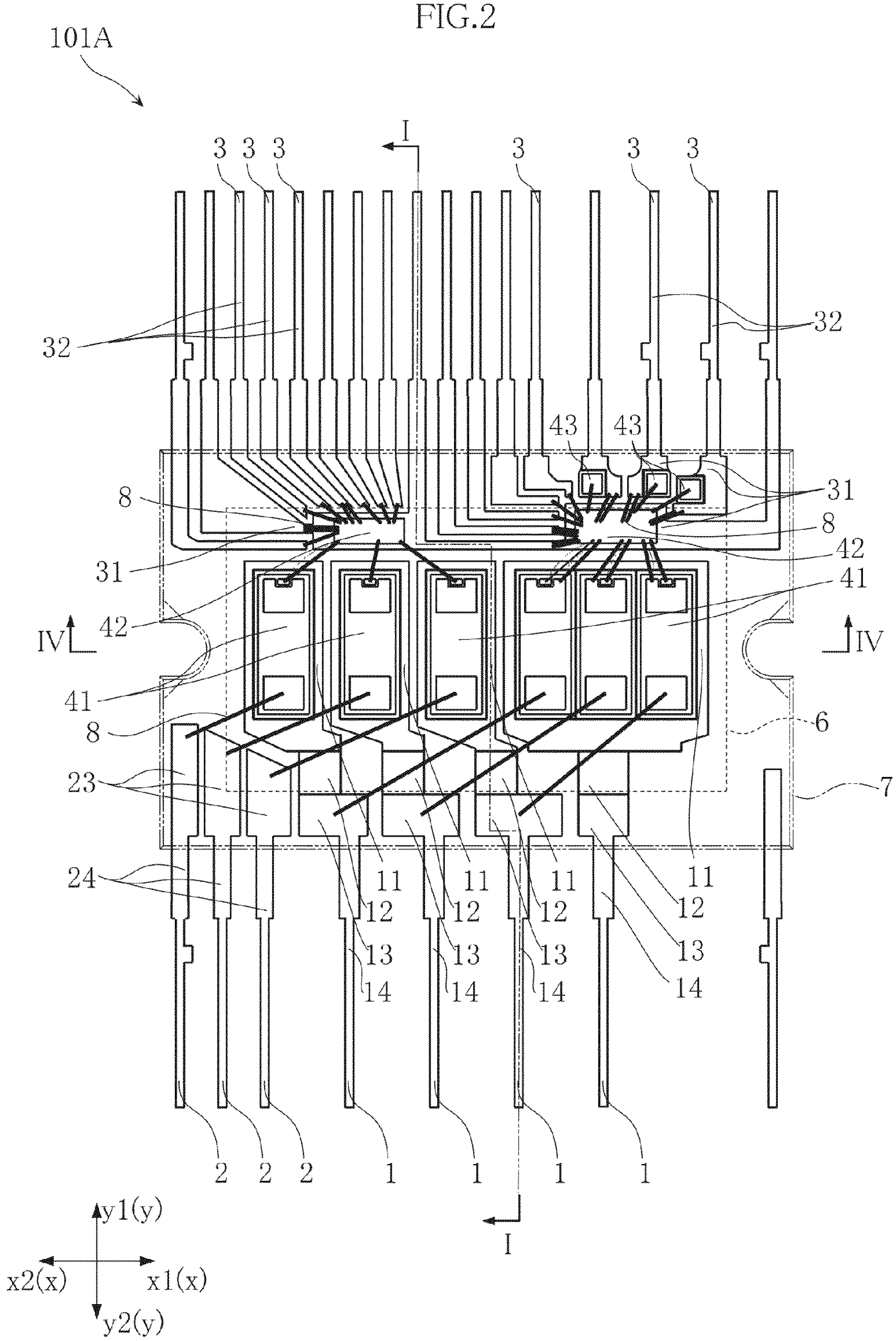
FIG. 2 is a perspective plan view for describing the semiconductor device according to the 1A Embodiment of the present invention.
Figure 3:
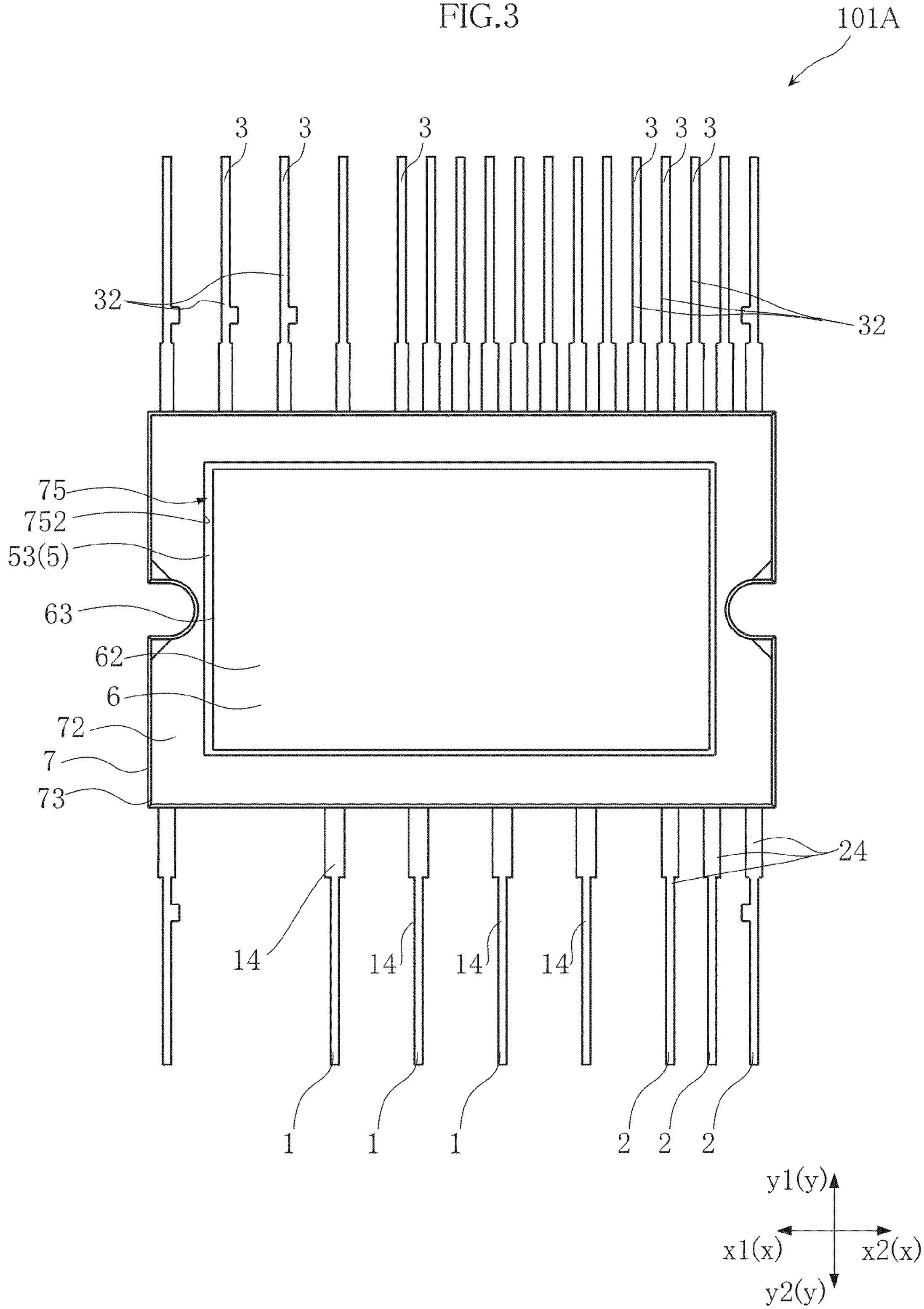
FIG. 3 is a bottom view of the semiconductor device according to the 1A Embodiment of the present invention before leads are bent.
Figure 4:
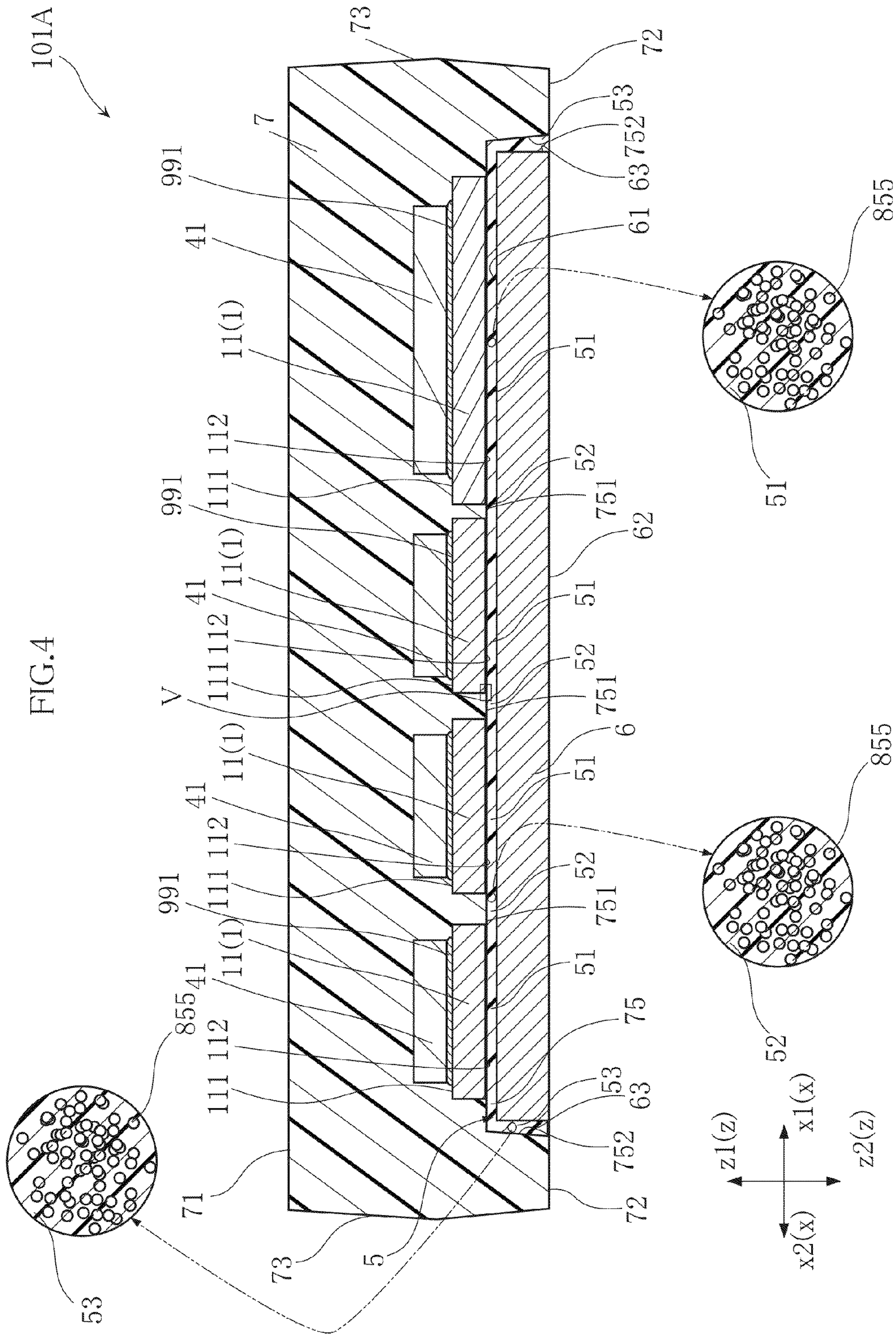
FIG. 4 is a sectional view taken along liens IV-IV in FIG. 2.
Figure 5:
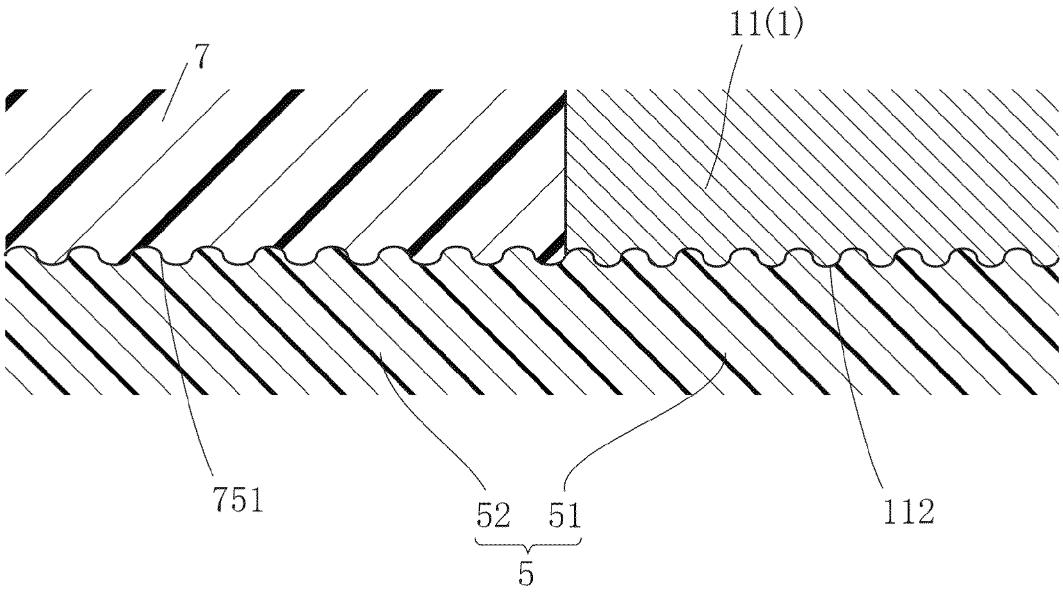
FIG. 5 is an enlarged view of the region V of FIG. 4.

FIG. 2 is a perspective plan view for describing the semiconductor device according to this embodiment. FIG. 3 is a bottom view before the leads 32 and so on of the semiconductor device of this embodiment are bent. FIG. 4 is a sectional view taken along lines IV-IV in FIG. 2. FIG. 5 is an enlarged view of the region V of FIG. 4. Note that FIG. 1 is a sectional view taken along lines I-I in FIG. 2. In FIG. 4, each structure is schematically shown for easier understanding.

The semiconductor device 101A shown in these figures includes electrodes 1-3, semiconductor chips 41, 42, passive component chips 43, an intermediate layer 5, a heat dissipation plate 6, a sealing resin 7 and wires 8. In FIG. 2, the heat dissipation plate 6 is indicated by dotted lines, whereas the sealing resin 7 is indicated by phantom lines.

The sealing resin 7 covers the electrodes 1-3, the semiconductor chips 41 and 42 and passive component chips 43. For instance, the sealing resin 7 comprises a black epoxy resin. As shown in FIGS. 3 and 4, the sealing resin 7 includes a resin principal surface 71, a resin bottom surface 72 and a resin side surface 73.

The resin principal surface 71 is a flat surface facing to the direction z1 and extending along the x-y plane. The resin bottom surface 72 is a flat surface facing to the direction z2 opposite from the direction z1 and extending along the x-y plane. The resin side surface 73 surrounds the semiconductor chips 41, 42 and the passive component chips 43, as viewed toward the x-y plane. The resin side surface 73 is connected to the resin principal surface 71 and the resin bottom surface 72.

The sealing resin 7 has a recess 75. The recess 75 is dented from the bottom surface 72. The recess 75 has a recess bottom surface 751 and a recess side surface 752. The recess bottom surface 751 extends along the x-y plane. As shown in FIG. 5, the recess bottom surface 751 in this embodiment is an irregular surface with minute irregularities. The recess bottom surface 751 is made an irregular surface by performing blasting with respect to the sealing resin 7 (which will be described later). The arithmetic mean roughness Ra of the recess bottom surface 751 is e.g. 0.1-1 μm.

As shown in FIG. 4, the recess side surface 752 is connected to the recess bottom surface 751 and the resin bottom surface 72. The recess side surface 752 is inclined with respect to the direction z to be tapered. The recess side surface 752 is inclined with respect to the direction z so as to become further away from the recess bottom surface 751 as viewed toward the x-y plane as proceeding in the direction z2.

As shown in FIG. 2, the semiconductor chips 41, 42 and the passive component chips 43 are rectangular as viewed in plan. Each semiconductor chip 41 may be a power chip such as an IGBT, a MOS or a diode. Each semiconductor chip 42 may be an LSI chip such as a control IC. Each passive component chip 43 may be a passive component such as a resistor or a capacitor.

All the electrodes 1-3 shown in FIGS. 2-4 are made of an electrically conductive material. Examples of the electrically conductive material include copper.

Each of the plurality of electrodes 1 (four in this embodiment) includes a die pad 11 (see FIGS. 1, 2 and 4), a connecting portion 12 (see FIGS. 1 and 2), a wire bonding portion 13 (see FIGS. 1 and 2) and a lead 14 (see FIGS. 1-3). The electrodes 1 are spaced apart from each other in the direction x.

Each die pad 11 is in the form of a plate extending along the x-y plane. On the die pad 11 is disposed a semiconductor chip 41. As shown in FIG. 4, a bonding layer 991 is provided between the die pad 11 and the semiconductor chip 41. For instance, the bonding layer 991 is made of solder. Solder has a relatively high thermal conductivity. Thus, using solder as the bonding layer 991 allows heat to be efficiently transferred from the semiconductor chip 41 to the die pad 11. All of the die pads 11 are exposed from the recess bottom surface 751.

Each die pad 11 has a first surface 111 and a second surface 112. The first surface 111 faces to the direction z1, whereas the second surface 112 faces to the direction z2. That is, the first surface 111 and the second surface 112 face away from each other. On the first surface 111 is disposed a semiconductor chip 41. The bonding layer 991 is between the first surface 111 and the semiconductor chip 41. As shown in FIG. 5, in this embodiment, the second surface 112 is an irregular surface with minute irregularities. The second surface 112 is made an irregular surface by performing blasting with respect to the die pad 11 (which will be described later).

As shown in FIG. 2, each connecting portion 12 is between the die pad 11 and a wire bonding portion 13 and connected to the die pad 11 and the wire bonding portion 13. As shown in FIG. 1, the connecting portion 12 extends along a surface inclined with respect to the x-y plane. The connecting portion 12 is inclined with respect to the x-y plane so as to proceed in the direction z1 as becoming further away from the die pad 11.

As shown in FIGS. 1 and 2, each wire bonding portion 13 extends along the x-y plane. In the direction z, the wire bonding portion 13 is closer to the direction z1 than the die pad 11 is. A wire 8 is bonded to a wire bonding portion 13 and a semiconductor chip 41 so that the wire bonding portion 13 and the semiconductor chip 41 are electrically connected to each other. Each lead 14 is connected to a wire bonding portion 13. Each lead 14 extends along the direction y. Each lead 14 includes a portion projecting from the resin side surface 73 of the sealing resin 7. The leads 14 of this embodiment are for insertion mounting. As shown in FIG. 1, in mounting the semiconductor device 101A to the board 807, the leads 14 are bent and inserted into the holes 809. To fix the leads 14 to the board 807, the holes 809 are filled with solder 810.

As shown in FIG. 2, each of the plurality of electrodes 2 (three in this embodiment) includes a wire bonding portion 23 and a lead 24. The electrodes 2 are spaced apart from each other in the direction x.

Each wire bonding portion 23 has a shape extending along the x-y plane. In the direction z, each wire bonding portion 23 is closer to the direction z1 than the die pad 11 is. A wire 8 is bonded to a wire bonding portion 23 and a semiconductor chip 41 so that the wire bonding portion 23 and the semiconductor chips 41 are electrically connected to each other. Each lead 24 is connected to a wire bonding portion 23. Each lead 24 extends along the direction y. Each lead 34 includes a portion projecting from the resin side surface 73 of the sealing resin 7. The leads 24 of this embodiment are for insertion mounting. Though not illustrated, in mounting the semiconductor device 101A to the board 807, the leads 24 are inserted into the holes 809.

As shown in FIGS. 1 and 2, the electrodes 3 include die pads 31 and leads 32. The die pads 31 and the leads 32 are arranged at the same position in the direction z. On each die pad 31 is disposed a semiconductor chip 42 or a passive component chip 43. A bonding layer (not shown) is between each die pad 31 and a semiconductor chip 42 or a passive component chip 43.

Each lead 32 includes a portion projecting from the resin side surface 73 of the sealing resin 7. The leads 32 of this embodiment are for insertion mounting. As shown in FIG. 1, in mounting the semiconductor device 101A to the board 807, the leads 32 are inserted into the holes 809. To fix the leads 32 to the board 807, the holes 809 are filled with solder 810. A wire 8 is bonded to a lead 32 and a semiconductor chip 42 so that the lead 32 and the semiconductor chip 42 are electrically connected to each other. A wire 8 is also bonded to a semiconductor chip 42 and a passive component chip 43.

As shown in FIG. 4, the heat dissipation plate 6 is arranged in the recess 75 of the sealing resin 7. In this embodiment, the heat dissipation plate 6 is in the form of a plate extending along the x-y plane. The heat dissipation plate 6 is provided to quickly dissipate the heat generated at the semiconductor chips 41 to the outside of the semiconductor device 101A. In order that the heat generated at the semiconductor chips 41 can be quickly dissipated to the outside of the semiconductor device 101A, making the heat dissipation plate 6 from a material having a higher thermal conductivity is better. Preferably, the heat dissipation plate 6 is made of a material having a higher thermal conductivity than the material for the sealing resin 7. More preferably, the heat dissipation plate 6 is made of a material having a higher thermal conductivity than the material for the die pads 11. The heat dissipation plate 6 is made of a conductor such as aluminum, copper or iron. The heat dissipation plate 6 may be made of aluminum plated with silver. As shown in FIG. 2, as viewed toward the x-y plane, the heat dissipation plate 6 overlaps the entirety of each die pad 11.

As shown in FIGS. 3 and 4, the heat dissipation plate 6 has a first surface 61, a second surface 62 and a side surface 63. The first surface 61 faces to the direction z1. As viewed toward the x-y plane, the first surface 61 overlaps the second surface 112 of each die pad 11 and the recess bottom surface 751. The second surface 62 faces to the direction z2 opposite from the direction to which the first surface 61 faces. The second surface 62 is exposed from the resin bottom surface 72 of the sealing resin 7. In this embodiment, the second surface 62 is flush with the resin bottom surface 72. The side surface 63 faces to the direction perpendicular to the direction z which is the thickness direction of the heat dissipation plate 6. The side surface 63 is spaced apart from the recess side surface 752. That is, the recess side surface 752 is spaced apart from the heat dissipation plate 6. This is because the sealing resin 7 is formed in such a manner that the heat dissipation plate 6 can be later fitted into the recess 75, as will be described later. As shown in FIG. 1, during the use of the semiconductor device 101A, the heat dissipation plate 6 is held in contact with the heat dissipating member 808.

The intermediate layer 5, which is shown in FIGS. 3 and 4, is between the heat dissipation plate 6 and the sealing resin 7. The intermediate layer 5 bonds the heat dissipation plate 6 to the sealing resin 7. Specifically, the intermediate layer 5 includes first portions 51, a second portion 52 and an insulating portion 53.

Either the heat dissipation plate 6 or the first portions 51 are made to have insulating properties so that the die pads 11 are not electrically connected to each other. In this embodiment, the first portions 51 have insulating properties. The first portions 51, the second portion 52 and the insulating portion 53 are made of a same insulating material. Examples of the material include a resin such as epoxy. It is preferable that the insulating material is a thermoplastic resin. The first portions 51, the second portion 52 and the insulating portion 53 (i.e., the intermediate layer 5) are made from an insulating resin sheet or insulating resin paste. The first portions 51, the second portion 52 and the insulating portion 53 are integral with each other. Each of the first portions 51 bonds one of the die pads 11 and the heat dissipation plate 6 and is between the die pad 11 and the heat dissipation plate 6. The first portion 51 is in contact with the second surface 112 of the die pad 11 and the first surface 61 of the heat dissipation plate 6. The second portion 52 bonds the recess bottom surface 751 and the heat dissipation plate 6 and is between the recess bottom surface 751 and the heat dissipation plate 6. The second portion 52 is in contact with the recess bottom surface 751 and the first surface 61 of the heat dissipation plate 6. The second portion 52 is connected to the first portions 51. The insulating portion 53 bonds the recess side surface 752 and the heat dissipation plate 6 and is between the recess side surface 752 and the heat dissipation plate 6. The insulating portion 53 is exposed to the direction z2 side. The insulating portion 53 is in contact with the recess side surface 752 and the side surface 63 of the heat dissipation plate 6.

As shown in FIG. 4, a filler 855 may be contained in the first portions 51, the second portion 52 and the insulating portion 53. The thermal conductivity of the material forming the filler 855 is higher than that of the material forming the intermediate layer 5. With this arrangement, heat is efficiently transferred from the die pads 11 to the heat dissipation plate 6. Examples of the material for the filler 855 include alumina, and boron nitride.

A method for manufacturing the semiconductor device 101A is described below. In the figures used below for describing the manufacturing method, the elements that are identical or similar to those described above are designated by the same reference signs as those used above.

Figure 6:
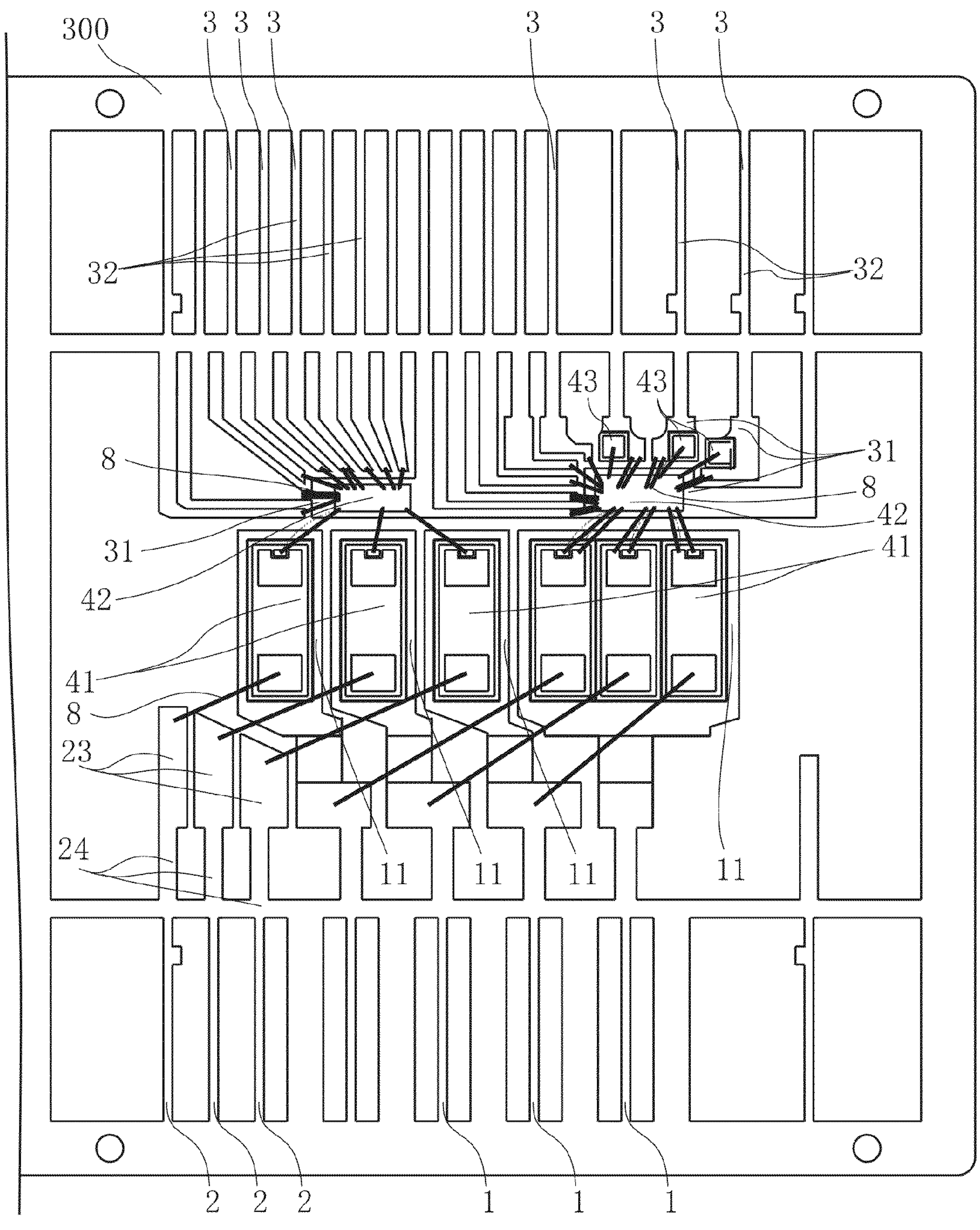
FIG. 6 is a plan view showing a process step of a method for manufacturing the semiconductor device according to the 1A Embodiment of the present invention.

First, as shown in FIG. 6, a lead frame 300 including a plurality of die pads 11, 31, a plurality of semiconductor chips 41, 42 and passive component chips 43 are prepared. Then, as shown in the figure, each of the semiconductor chips 41 is disposed on one of the die pads 11 via a bonding layer (not shown). Similarly, each of the semiconductor chips 42 and passive component chips 43 is disposed on one of the die pads 31 via a bonding layer (not shown). Then, as shown in the figure, wires 8 are bonded to the semiconductor chips 41, 42 and so on.

Figure 7:
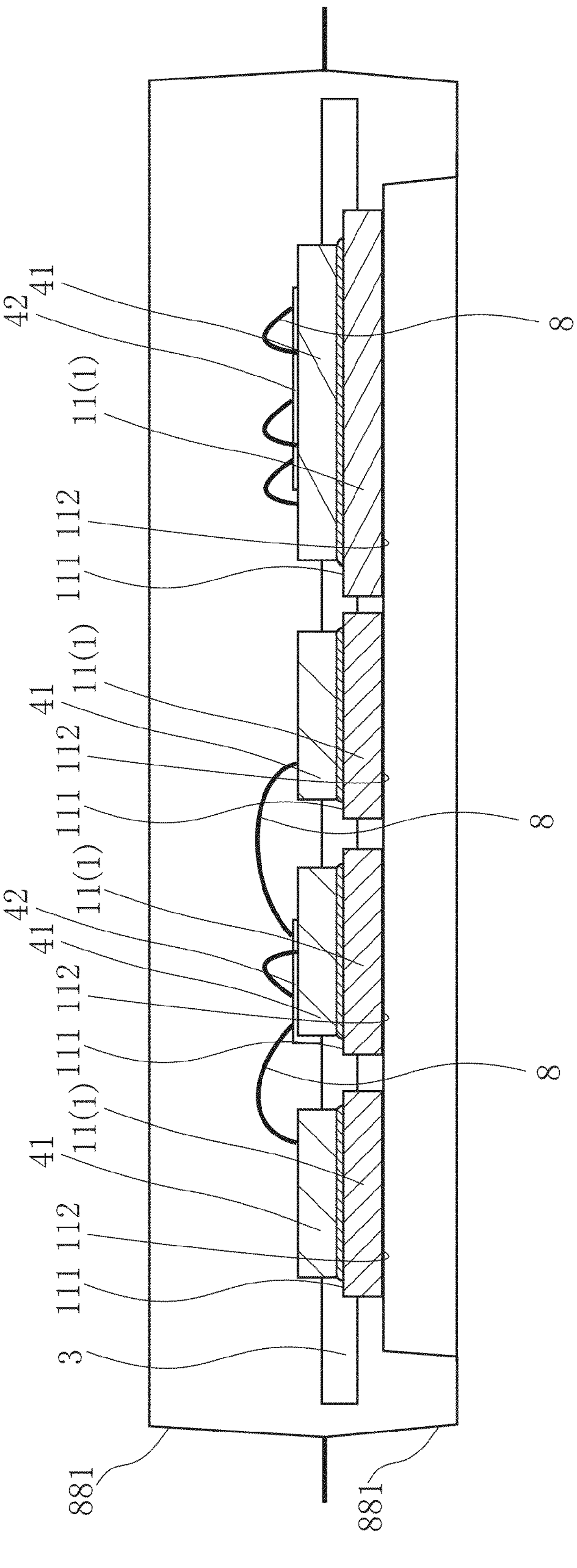
FIG. 7 is a sectional view showing the process step subsequent to FIG. 6.
Figure 8:
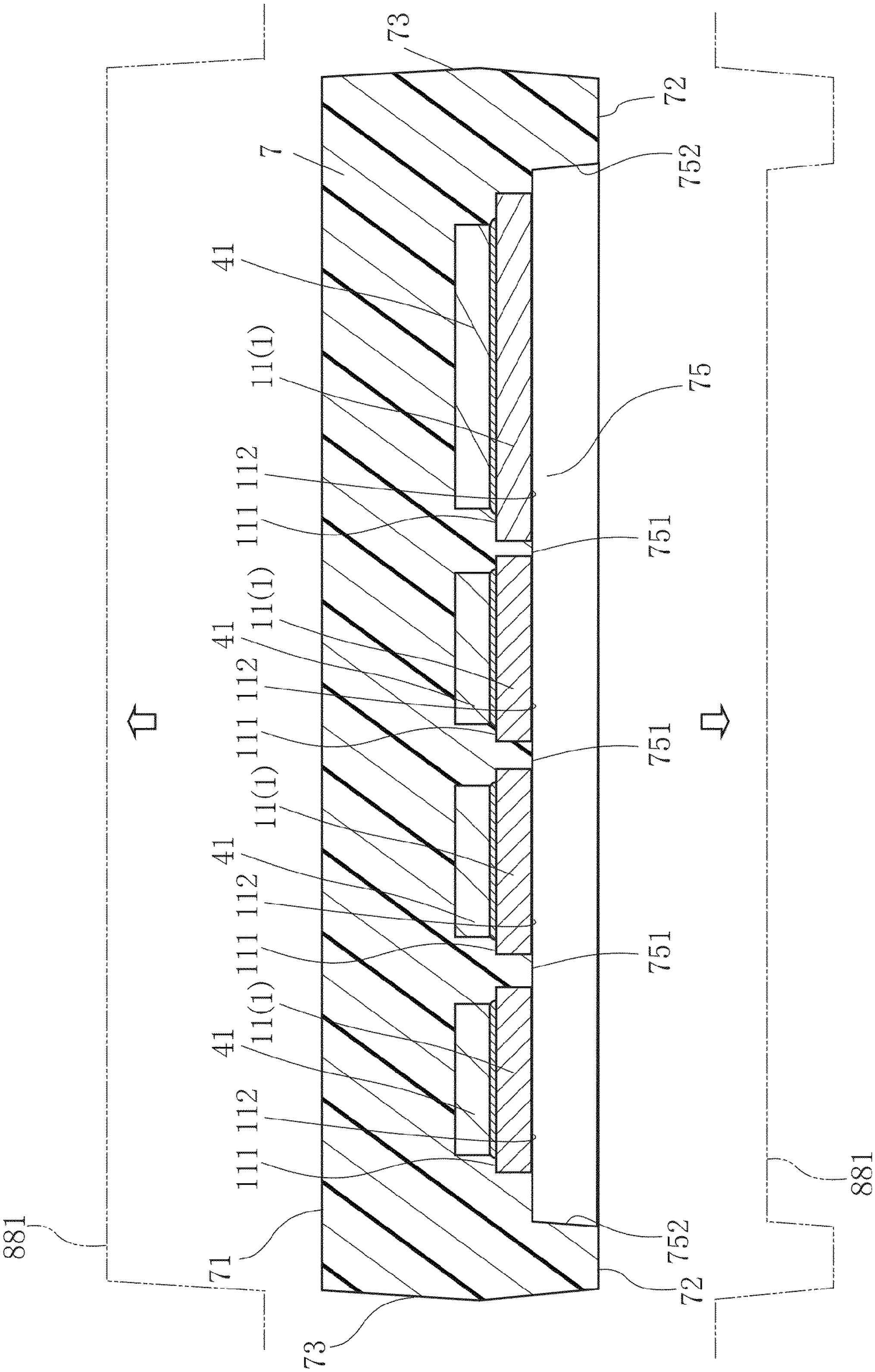
FIG. 8 is a sectional view showing the process step subsequent to FIG. 7.

Then, a sealing resin 7 is formed as shown in FIGS. 7 and 8. As shown in FIG. 7, the sealing resin 7 is formed by molding using a mold 881. As shown in the figure, the die pads 11 and so on are pressed with the mold 881. Then, a resin material is injected into the mold 881 and allowed to harden. After the resin material is hardened, the mold 881 is removed from the die pads 11 and so on, as shown in FIG. 8. Thus, the sealing resin 7 is formed. In the process of forming the sealing resin 7, a recess 75 for exposing the die pads 11 is formed in the sealing resin 7. To allow the mold 881 to be easily removed from the sealing resin 7 after the hardening of the resin, the recess side surface 752 of the recess 75 has a tapered shape as described above.

In the state after the sealing resin 7 is formed, the die pads 11 may be covered with thin resin burrs. To remove the resin burrs, the die pads 11 are subjected to blasting (not shown). Blasting is a technique of spraying non-metal particles such as silica sand or metal particles at a high speed to roughen the surface. By this technique, the second surface 112 of each die pad 11 and the recess bottom surface 751 of the sealing resin 7 become irregular surfaces with minute irregularities as shown in FIG. 5.

Figure 9:
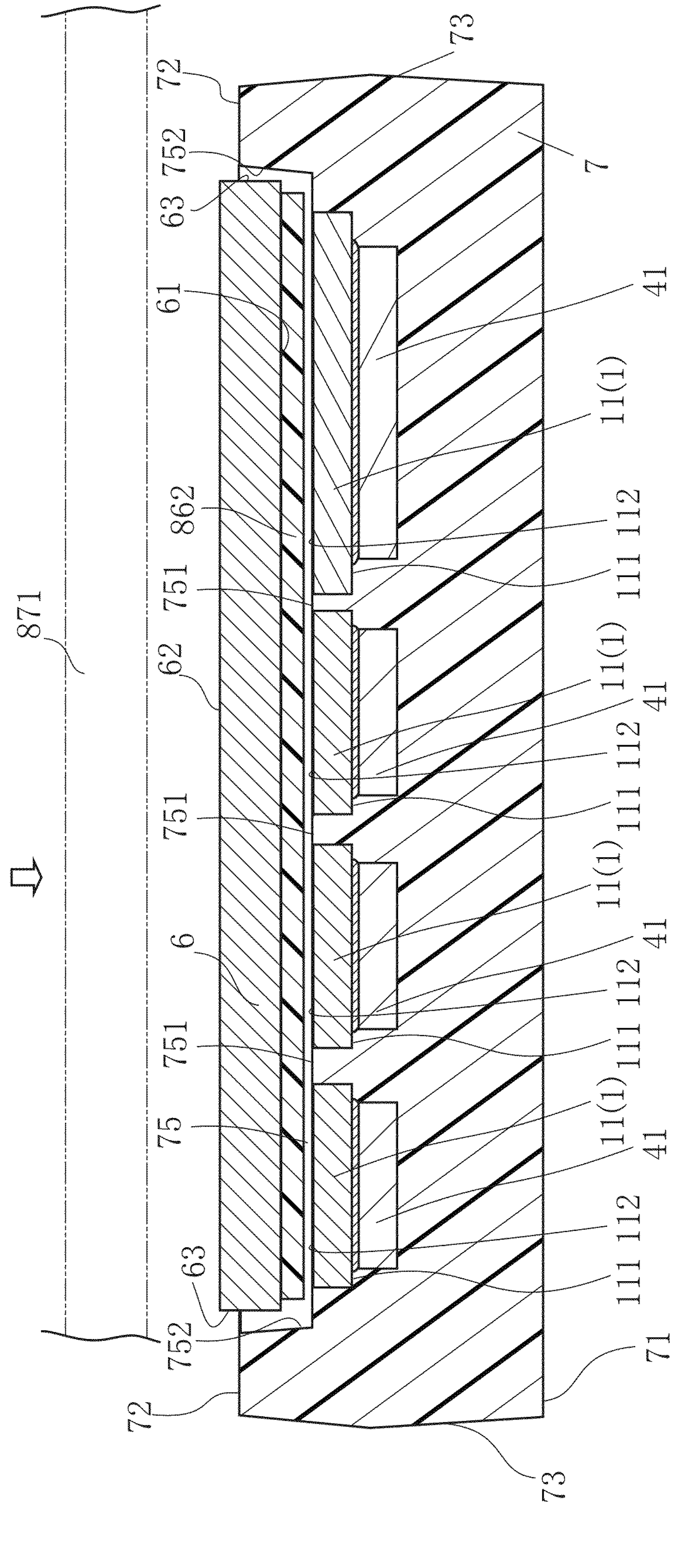
FIG. 9 is a sectional view showing the process step subsequent to FIG. 8.

Then, as shown in FIG. 9, a heat dissipation plate 6 is fitted into the recess 75 of the sealing resin 7. The provision of the recess 75 in the sealing resin 7 makes it easier to position the heat dissipation plate 6 relative to the die pads 11. After the heat dissipation plate 6 is fitted into the recess 75 of the sealing resin 7, the heat dissipation plate 6 is pressed by a plate member 871 against the die pads 11, with the resin sheet 862 as an adhesive layer sandwiched between them. In pressing the heat dissipation plate 6 against the die pads 11, the entirety including the sealing resin 7 is placed on a heater, whereby the resin sheet 862 is heated. In this embodiment, the resin sheet 862 is made of a thermoplastic material. Thus, the resin sheet 862 is softened when the heat dissipation plate 6 is pressed against the die pads 11. The heat dissipation plate 6 fits into the recess 75 of the sealing resin 7, while the softened resin sheet 862 is pushed toward the side surface 63 of the heat dissipation plate 6. Thereafter, the resin sheet 862 hardens to become the above-described intermediate layer 5. In this way, the heat dissipation plate 6 is bonded to the die pads 11. To obtain a product in which filler 855 is contained in the intermediate layer 5 as shown in FIG. 4, a resin sheet 862 containing filler 855 is used. As an adhesive layer, resin paste may be used instead of the resin sheet 862.

Then, the lead frame 300 shown in FIG. 6 is cut appropriately, whereby the semiconductor device 101A shown in e.g. FIG. 2 is obtained.

The advantages of this embodiment are described below.

In this embodiment, after the formation of the sealing resin 7, the heat dissipation plate 6 is bonded to the die pads 11 by pressing the heat dissipation plate 6 against the die pads 11, with the resin sheet 862 as an adhesive layer sandwiched between them. According to this arrangement, in bonding the heat dissipation plate 6 against the die pads 11, the semiconductor chips 41 are covered by the sealing resin 7. Thus, as shown in FIG. 9, to bond the heat dissipation plate 6 to the die pads 11, it is only necessary to press the heat dissipation plate 6 against the die pads 11 and the sealing resin 7 covering the semiconductor chips 41. Unlike the conventional method for manufacturing a semiconductor device, it is not necessary to press the die pads 11 with pins. Thus, each die pad 11 does not need to have a space for pressing with a pin, which leads to size reduction of each die pad 11. The size reduction of each die pad 11 leads to size reduction of the semiconductor device.

In this embodiment, bonding of the heat dissipation plate 6 is performed after the sealing resin 7 is formed. Thus, in bonding the heat dissipation plate 6 to the die pads 11, each die pad 11 is covered by the sealing resin 7. The fact that the die pads 11 are covered by the sealing resin 7 means that the die pads 11 are fixed to each other by the sealing resin 7. Thus, it is not necessary to perform the work for positioning each of the die pads 11 relative to the heat dissipation plate 6, and the die pads 11 are easily positioned relative to the heat dissipation plate 6. The distance between each of the die pads 11 and the heat dissipation plate 6 is easily made uniform.

In the case where the die pads 11 are bonded to the heat dissipation plate 6 by using pins, the mold 881 needs to have holes for receiving the pins. Thus, to make semiconductor devices which differ from each other in positions of the die pads 11, different molds 881 having holes for receiving the pins at different positions need to be used, even when the semiconductor devices have the same outer shape. In this embodiment, however, pins are not used. Thus, when the semiconductor devices have the same outer shape, the sealing resins 7 can be formed by using a same mold even when the positions of the die pads 11 in the semiconductor devices differ from each other. This enhances the manufacturing efficiency of the semiconductor device.

In this embodiment, blasting is performed with respect to the die pads 11 after the step of forming the sealing resin 7 and before the step of bonding the heat dissipation plate 6. This makes the second surface 112 of each die pad 11 an irregular surface having minute irregularities. The first portions 51 come into contact with the second surface 112, and this arrangement increases the contact area between the second surface 112 and the first portions 51. Thus, the second surface 112 and the first portions 51 are strongly bonded. Thus, the heat dissipation plate 6, which comes into contact with the first portions 51, is prevented from becoming separated from the sealing resin 7.

In this embodiment, the first portions 51 are made of an insulating material. Insulating resin, which is a typical example of an insulating material, is not easily bonded to the second surface 112 of the die pad 11 made of a conductor. The structure of this embodiment in which the second surface 112 is an irregular surface is advantageous because it strongly bonds an insulating material and a conductor to each other.

Other embodiments of the present invention are described below. In the figures used in these embodiments, the elements that are identical or similar to those of the foregoing embodiment are designated by the same reference signs as those used for the foregoing embodiment.

2A Embodiment

The 2A Embodiment of the present invention is described below.

Figure 10:
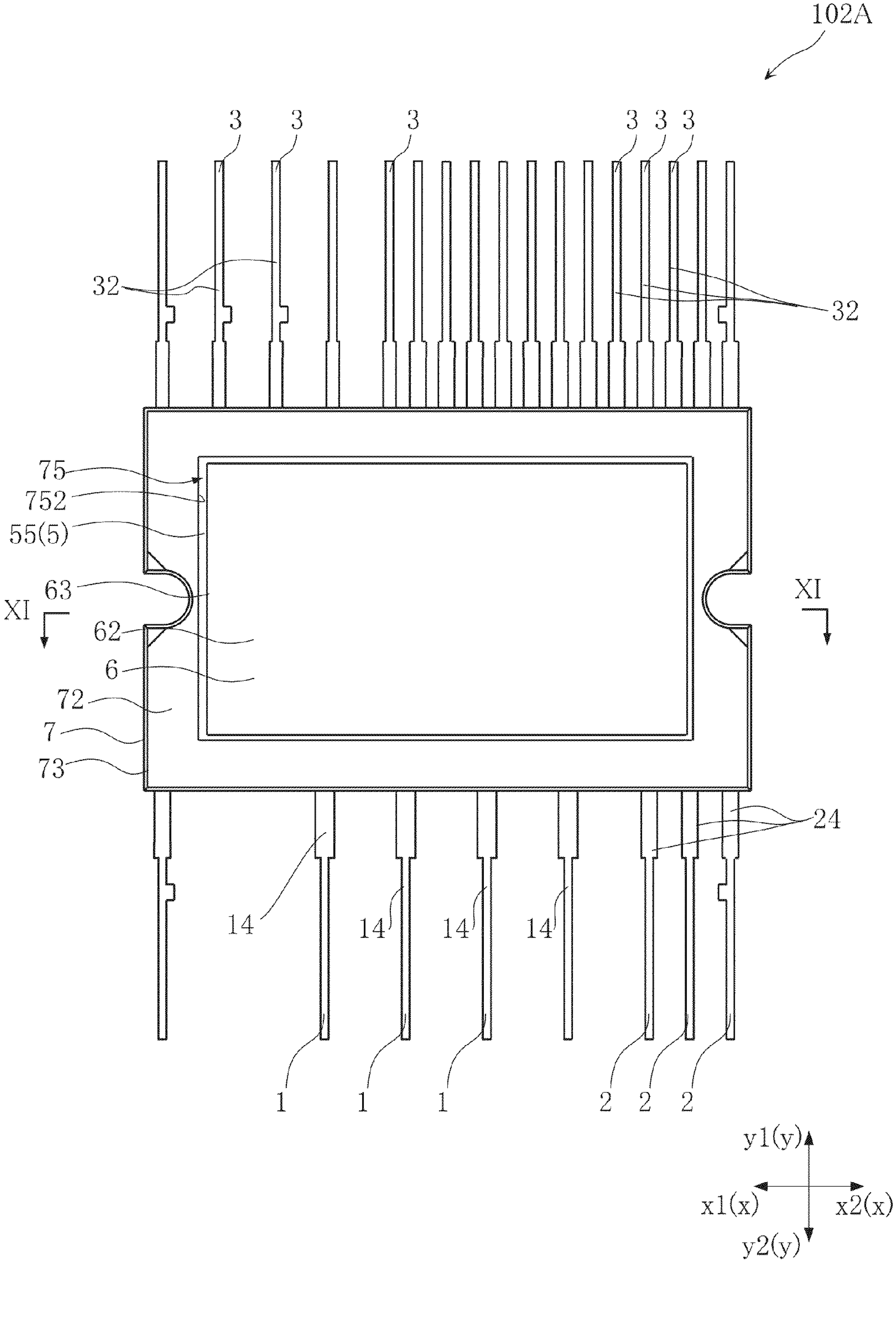
FIG. 10 is a bottom view of a semiconductor device according to the 2A Embodiment of the present invention.
Figure 11:
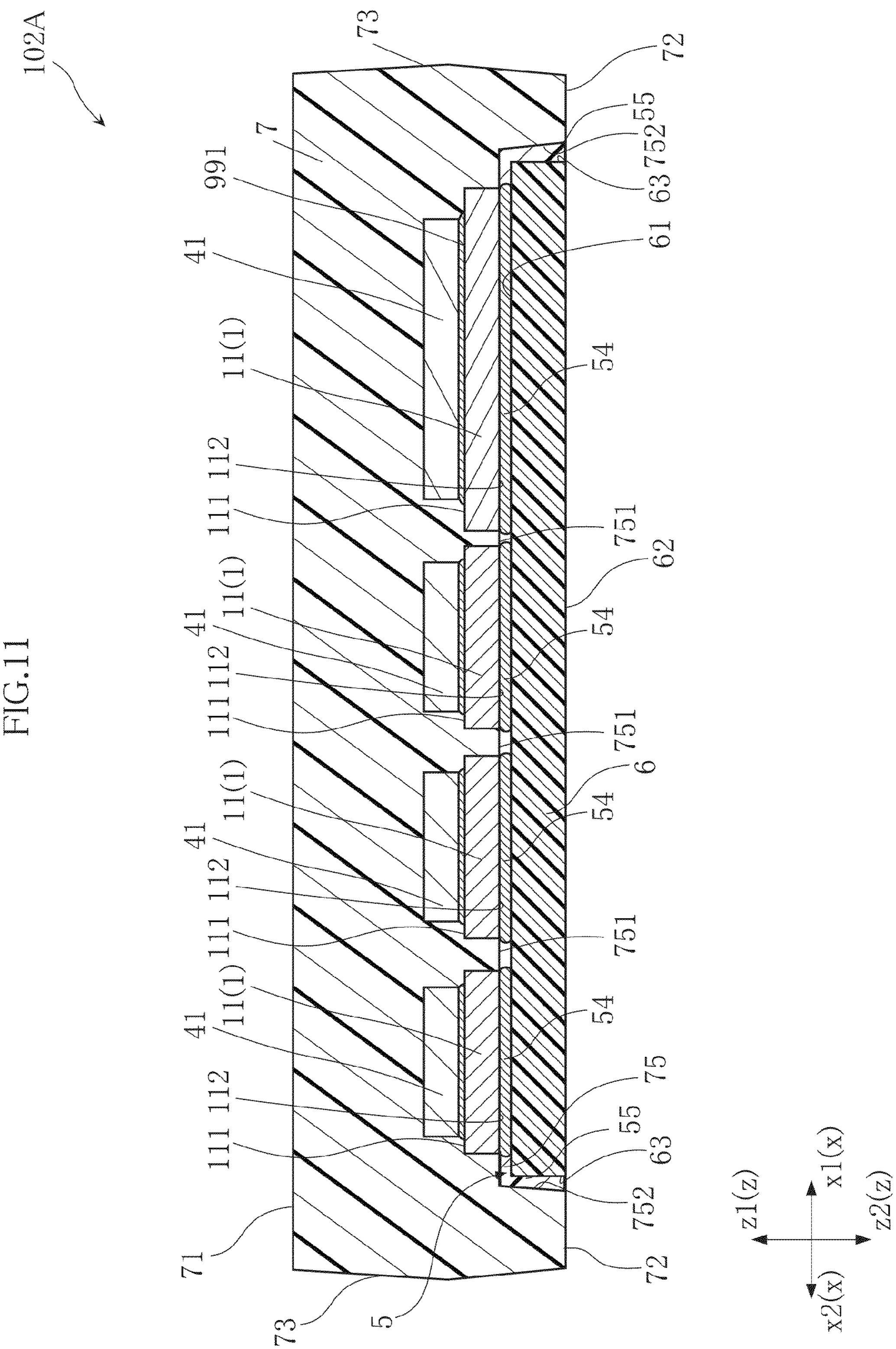
FIG. 11 is a sectional view taken along lines XI-XI in FIG. 10.

FIG. 10 is a bottom view of a semiconductor device according to this embodiment. FIG. 11 is a sectional view taken along lines XI-XI in FIG. 10.

The parts other than the intermediate layer 5 and the heat dissipation plate 6 of the semiconductor device 102A shown in these figures have the same structures as those of the semiconductor device 101A, so that description of these parts is omitted.

In the semiconductor device 102A, the heat dissipation plate 6 is arranged in the recess 75 of the sealing resin 7. The heat dissipation plate 6 is in the form of a plate extending along the x-y plane. The heat dissipation plate 6 is provided to quickly dissipate the heat generated at the semiconductor chips 41 to the outside of the semiconductor device 102A. In this embodiment, the heat dissipation plate 6 has insulating properties. Examples of the insulating material for forming the heat dissipation plate 6 include a ceramic material such as alumina, aluminum nitride or silicon nitride. Similarly to the 1A embodiment, as viewed toward the x-y plane, the heat dissipation plate 6 overlaps the entirety of each die pad 11.

The heat dissipation plate 6 has a first surface 61, a second surface 62 and a side surface 63. Since the first surface 61, the second surface 62 and the side surface 63 are the same as those of the semiconductor device 101A, description of these portions are omitted.

The intermediate layer 5 is between the heat dissipation plate 6 and the sealing resin 7. The intermediate layer 5 includes a plurality of first portions 54 and an insulating portion 55.

In this embodiment, the first portions 54 are made of a conductor. Examples of the conductor include silver, gold and copper. Each of the first portions 54 is made of metal paste. Each of the first portions 54 bonds one of the die pads 11 and the heat dissipation plate 6 and is between the die pad 11 and the heat dissipation plate 6. The first portion 54 is in contact with the second surface 112 of the die pad 11 and the first surface 61 of the heat dissipation plate 6. The first portions 54 are spaced apart from each other so that the die pads 11 are not electrically connected to each other via the first portions 54.

The insulating portion 55 bonds the recess side surface 752 and the heat dissipation plate 6 and is between the recess side surface 752 and the heat dissipation plate 6. The insulating portion 55 is exposed to the direction z2 side. The insulating portion 55 is in contact with the recess side surface 752 and the side surface 63 of the heat dissipation plate 6. The insulating portion 55 is made of a resin such as epoxy. The intermediate layer 5 may not include the insulating portion 55.

A method for manufacturing the semiconductor device 102A is described below.

Figure 12:
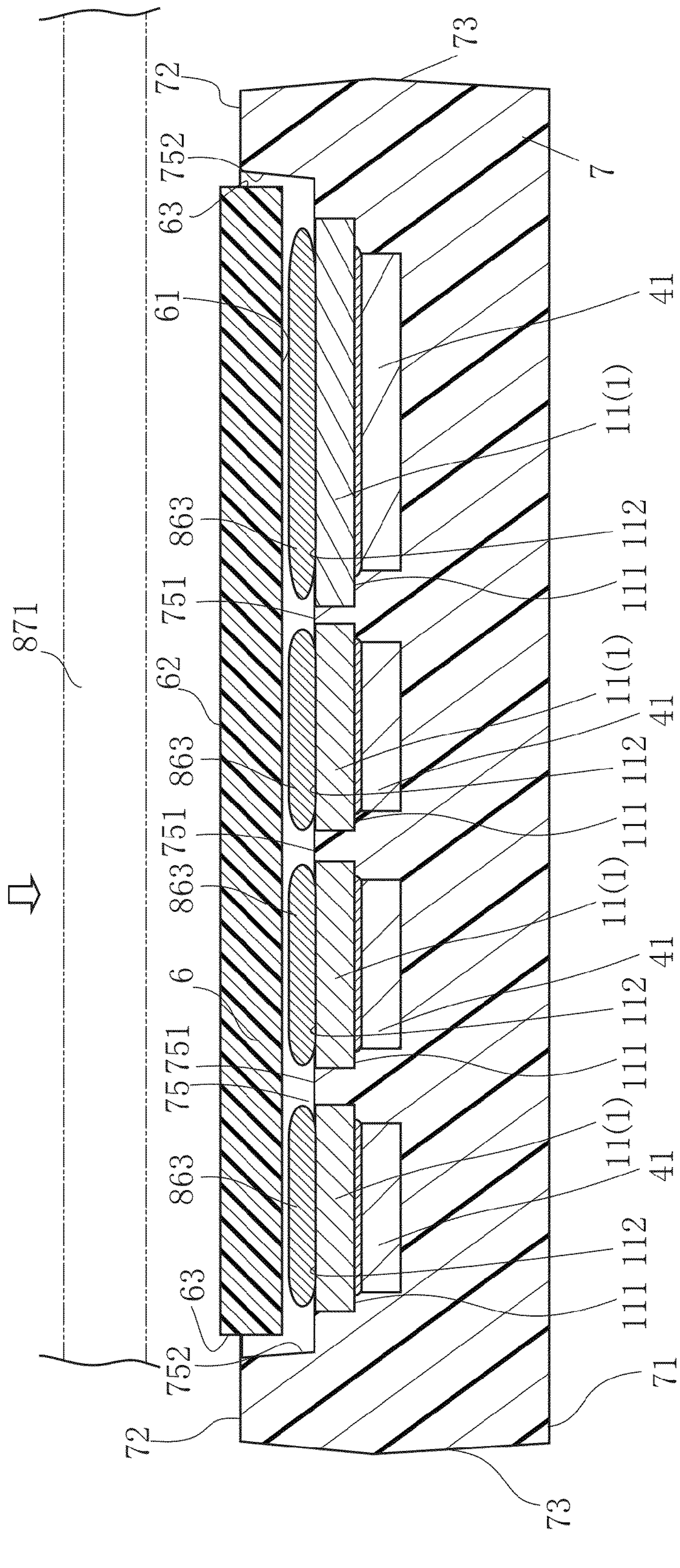
FIG. 12 is a sectional view showing a process step of a method for manufacturing a semiconductor device according to the 2A Embodiment of the present invention.

First, the product shown in FIG. 8 is made by the same process as described in the 1A Embodiment. Then, as shown in FIG. 12, the heat dissipation plate 6 is pressed by a plate member 871 against the die pads 11, with metal paste 863 as an adhesive layer sandwiched between them. Thereafter, the metal paste 863 is allowed to harden to become the above-described first portions 54. In this way, the heat dissipation plate 6 is bonded to the die pads 11.

Then, the insulating portion 55 (see FIG. 11) of the intermediate layer 5 is formed by e.g. loading resin paste into the space between the side surface 63 of the heat dissipation plate 6 and the recess side surface 752. Then, similarly to the 1A Embodiment, the lead frame 300 is cut, whereby the semiconductor device 102A shown in FIG. 11 and so on is obtained.

In this embodiment, after the formation of the sealing resin 7, the heat dissipation plate 6 is bonded to the die pads 11 by pressing the heat dissipation plate 6 against the die pads 11, with the metal paste 863 as an adhesive layer sandwiched between them. According to this arrangement again, because of the same reason as those described in the 1A Embodiment, size reduction of the die pads 11 and the resulting size reduction of the semiconductor device can be achieved.

This embodiment provides the same advantages as those of the 1A Embodiment.

Figure 13:
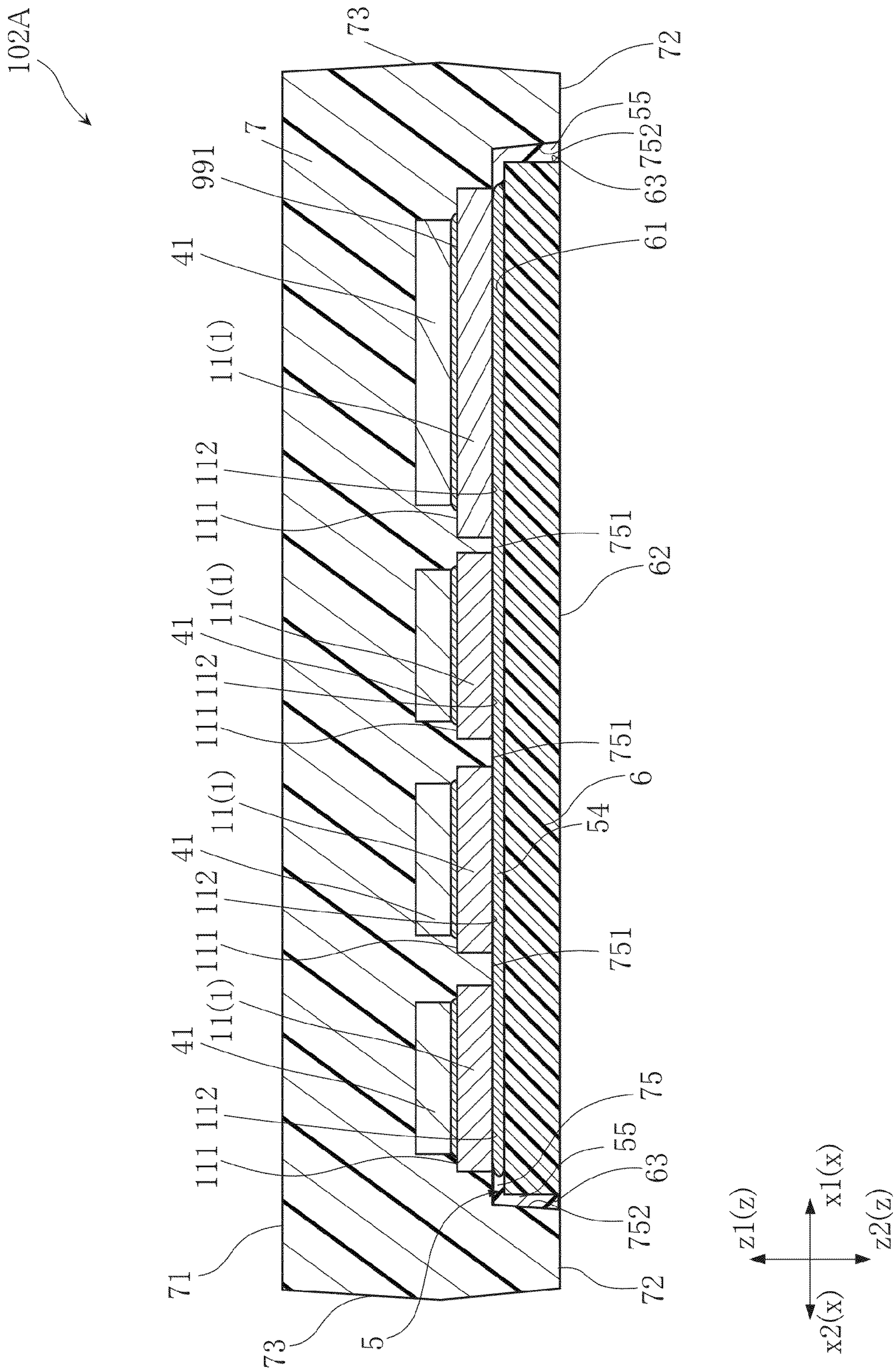
FIG. 13 is a sectional view of the semiconductor device according to a variation of the 2A Embodiment of the present invention.
Figure 14:
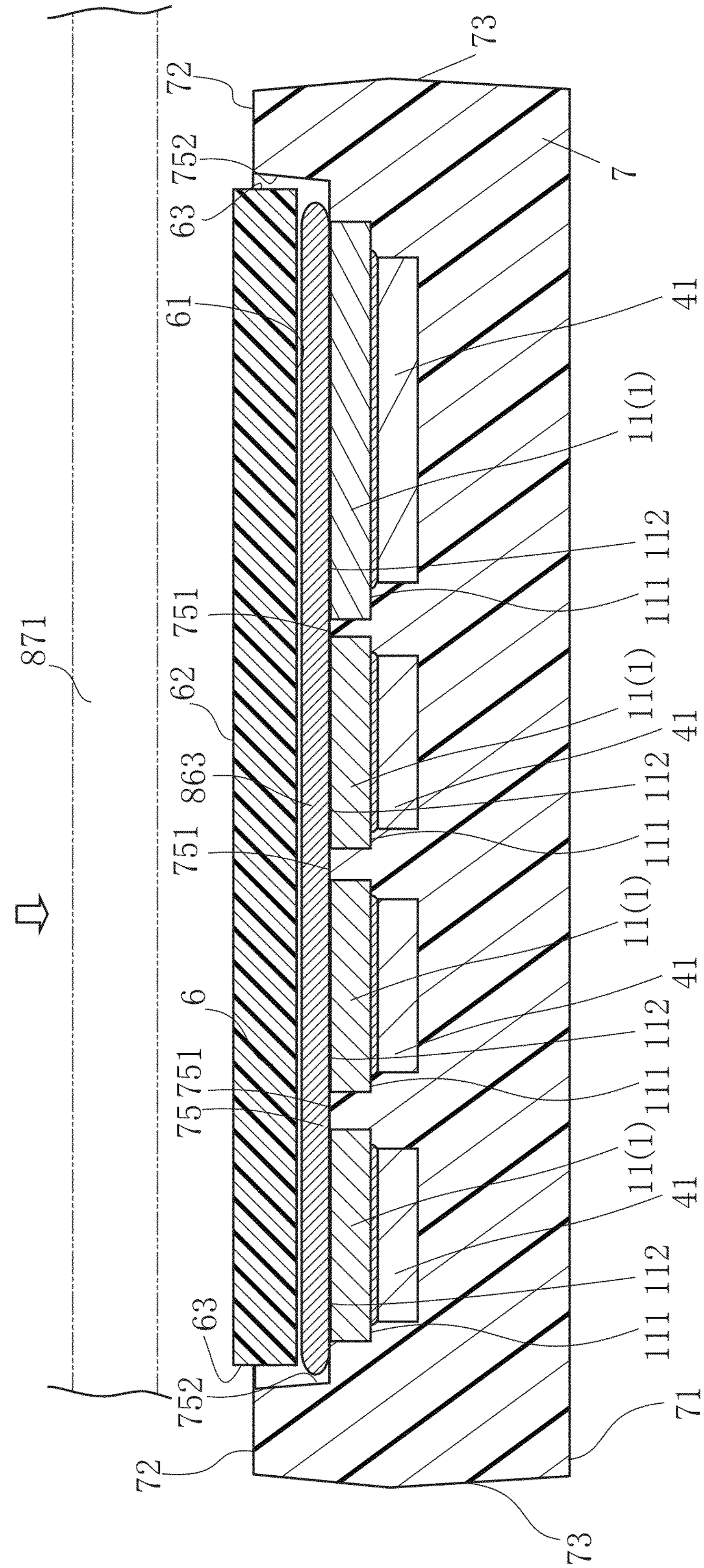
FIG. 14 is a sectional view showing a process step of a method for manufacturing a semiconductor device according to a variation of the 2A Embodiment of the present invention.

FIG. 13 is a sectional view of a semiconductor device according to a variation of this embodiment. The semiconductor device 102A shown in this figure differs from the semiconductor device 102A shown in FIG. 11 in that the intermediate layer 5 includes not a plurality of first portions 54 but a single first portion 54. The first portion 54 of this variation is bonded to the die pads 11. To make the semiconductor device 102A of this variation, metal paste 863 as an adhesive layer is applied to the die pads 11 as shown in FIG. 14. Alternatively, the metal paste 863 as an adhesive layer may be applied to the substantially the entirety of the first surface 61 of the heat dissipation plate 6. Then, the heat dissipation plate 6 is pressed by a plate member 871 against the die pads 11, with the metal paste 863 as an adhesive layer sandwiched between them. Thereafter, the metal paste 863 is allowed to harden to become the above-described first portion 54. According to this arrangement again, the same advantages as those of the semiconductor device 102A shown in FIG. 11 are obtained.

3A Embodiment

The 3A Embodiment of the present invention is described below.

Figure 15:
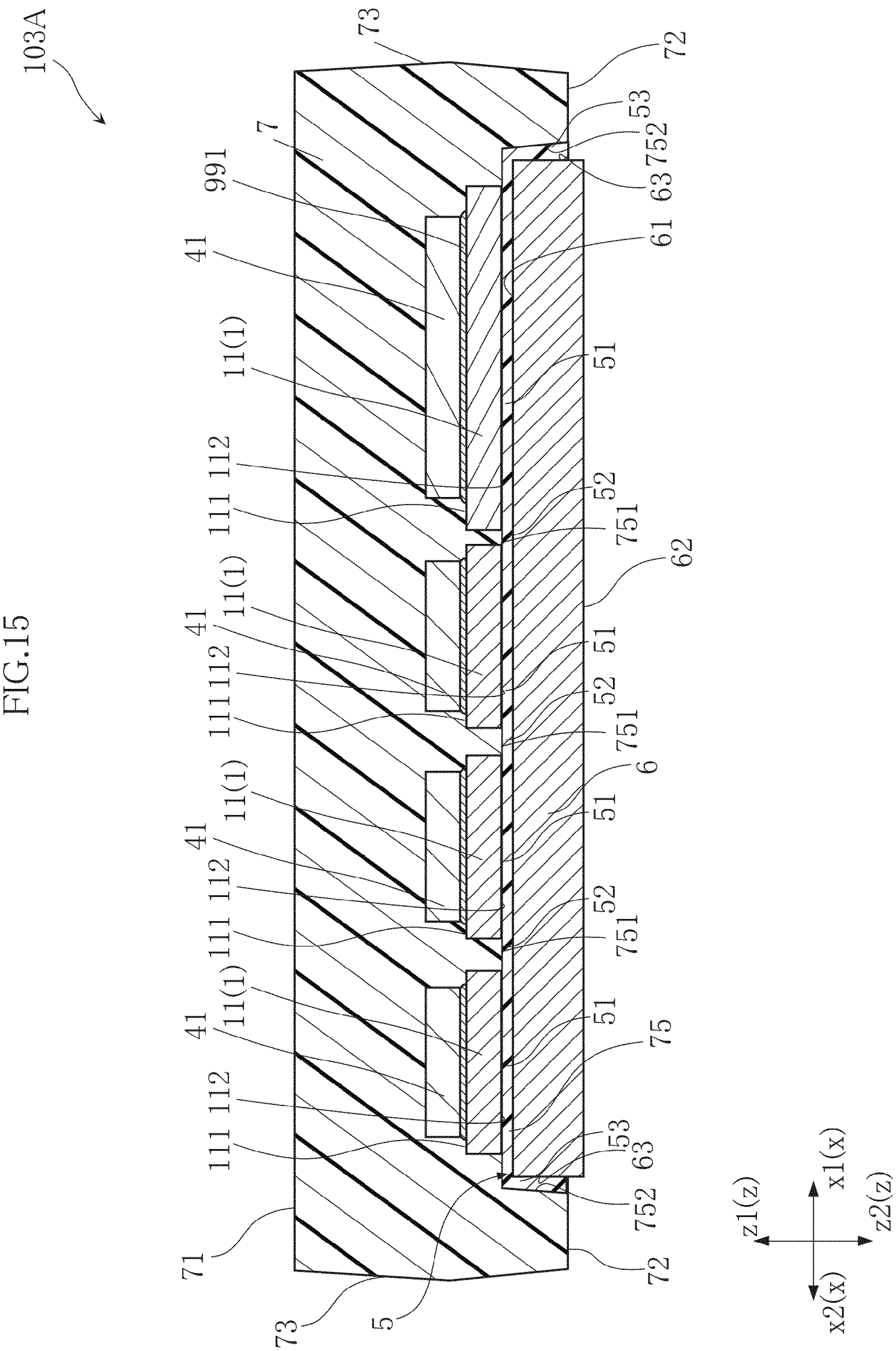
FIG. 15 is a sectional view of a semiconductor device according to the 3A Embodiment of the present invention.

FIG. 15 is a sectional view of a semiconductor device according to this embodiment.

The semiconductor device 103A shown in this figure differs from the semiconductor device 101A in that a part of the heat dissipation plate 6 projects from the resin bottom surface 72. That is, in the semiconductor device 103A, the second surface 62 of the heat dissipation plate 6 projects from the resin bottom surface 72. According to this arrangement, the heat dissipating member 808 shown in FIG. 1 does not easily come into contact with the resin bottom surface 72, and the second surface 62 of the heat dissipation plate 6 easily comes into contact with the heat dissipating member 808. Thus, the heat transferred from the semiconductor chips 41 to the heat dissipation plate 6 is efficiently transferred to the heat dissipating member 808. The arrangement of this embodiment may be employed in the semiconductor device 102A.

4A Embodiment

The 4A Embodiment of the present invention is described below.

Figure 16:
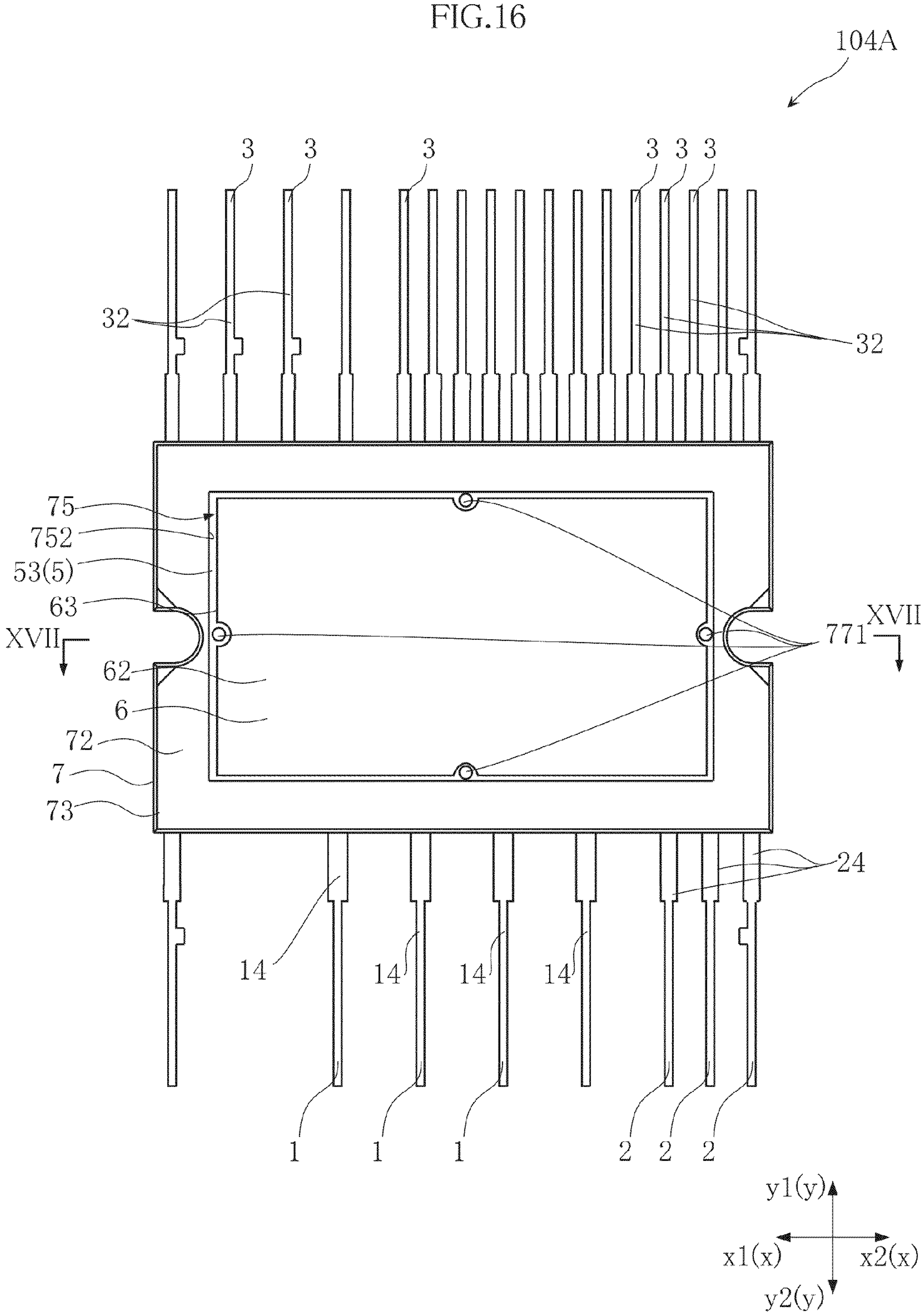
FIG. 16 is a bottom view of a semiconductor device according to the 4A Embodiment of the present invention.
Figure 17:
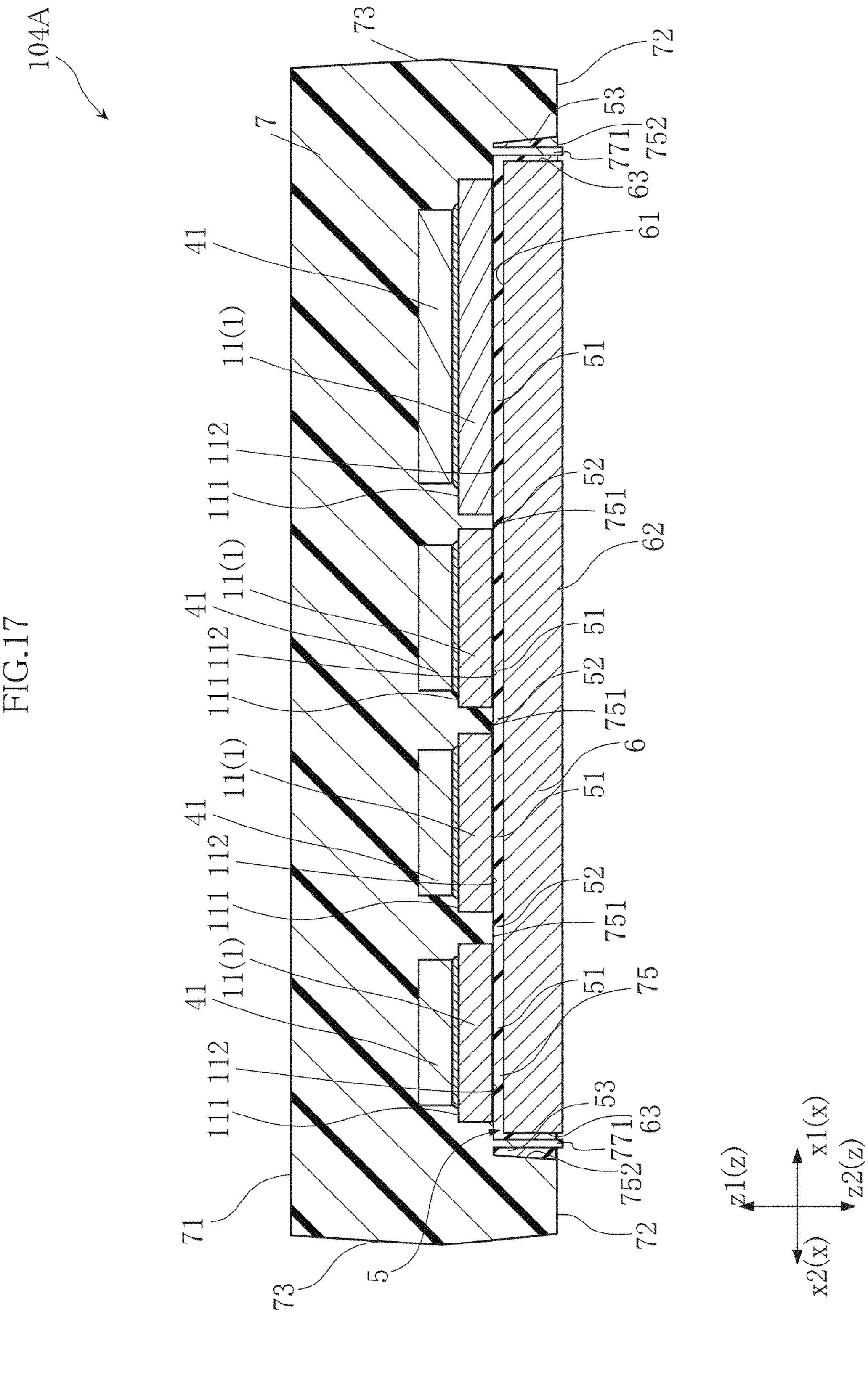
FIG. 17 is a sectional view taken along lines XVII-XVII in FIG. 16.

FIG. 16 is a bottom view of a semiconductor device according to this embodiment. FIG. 17 is a sectional view taken along lines XVII-XVII in FIG. 16.

Figure 18:
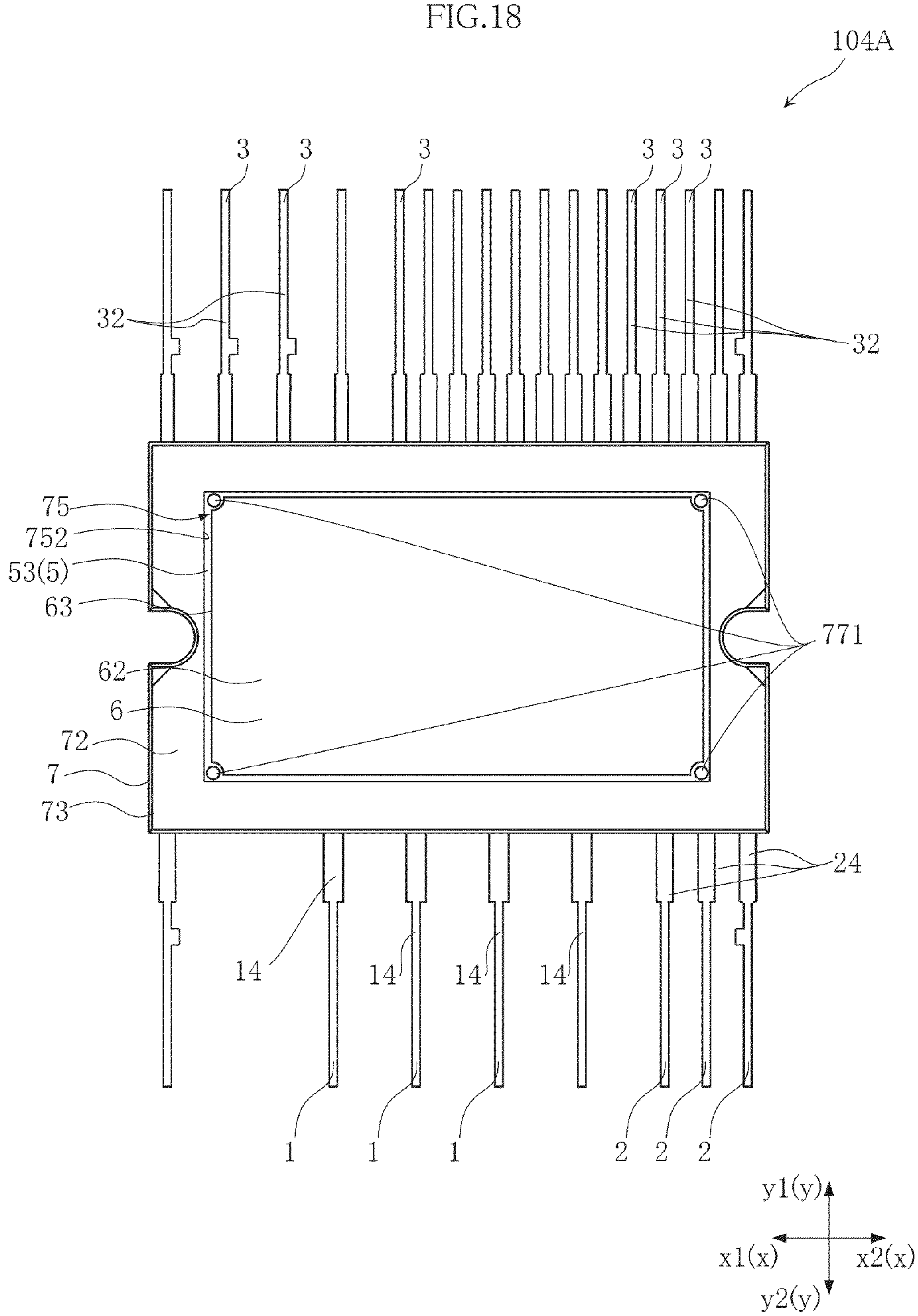
FIG. 18 is a bottom view of a semiconductor device according to a variation of the 4A Embodiment of the present invention.

The semiconductor device 104A shown in these figures differs from the semiconductor device 101A in that the sealing resin 7 includes a plurality of bar portions 771. Each of the bar portions 771 is provided between the side surface 63 of the heat dissipation plate 6 and the recess side surface 752. In the semiconductor device 104A, in the direction z, the end of each bar portion 771 on the direction z2 side is at the same position as the second surface 62 of the heat dissipation plate 6. According to this arrangement, the plate member 871 shown in FIG. 9 pushes the heat dissipation plate 6 toward the recess bottom surface 751 until it comes into contact with the bar portions 771. After the plate member 871 comes into contact with the bar portions 771, the plate member 871 does not push the heat dissipation plate 6 toward the recess bottom surface 751. Thus, the position and posture of the heat dissipation plate 6 in the semiconductor device 104A are determined by the position of the end of each bar portion 771. This allows the heat dissipation plate 6 to be set in the semiconductor device 104A at a desired position with a desired posture. As shown in FIG. 18, the bar portions 771 may be set at four corners of the heat dissipation plate 6.

5A Embodiment

The 5A Embodiment of the present invention is described below.

Figure 19:
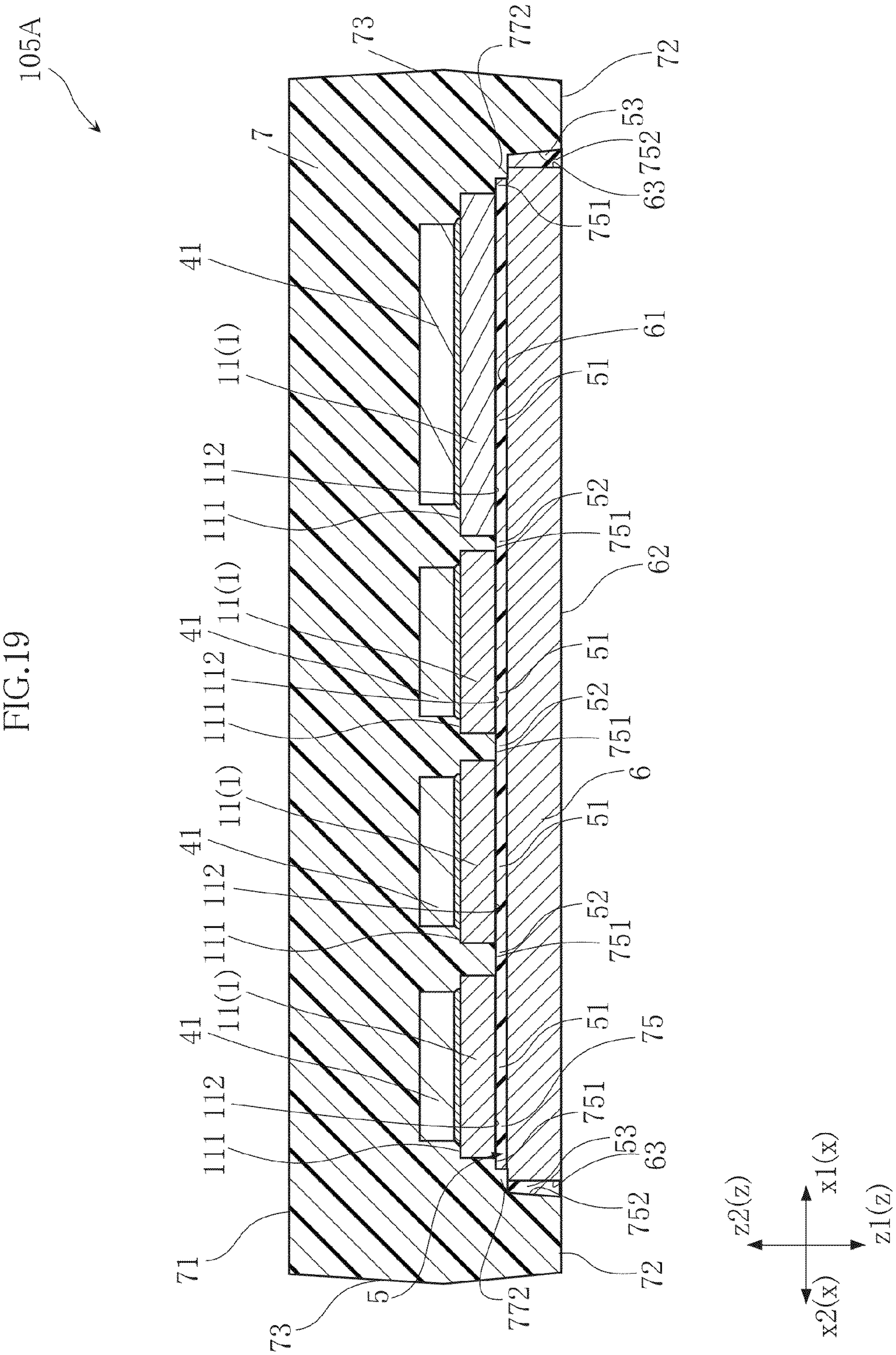
FIG. 19 is a sectional view of a semiconductor device according to the 5A Embodiment of the present invention.

FIG. 19 is a sectional view of a semiconductor device according to this embodiment.

The semiconductor device 105A shown in the figure differs from the semiconductor device 101A in that the sealing resin 7 includes a projection 772 projecting from the recess bottom surface 751 and that the projection 772 is in contact with the heat dissipation plate 6. According to this arrangement, in pressing the heat dissipation plate 6 against the die pads 11, the movement of the heat dissipation plate 6 toward the die pads 11 is stopped by the projection 772 after the heat dissipation plate 6 comes into contact with the projection 772. Thus, after the heat dissipation plate 6 comes into contact with the projection 772, the heat dissipation plate 6 does not get closer to the die pads 11. Thus, the position and posture of the heat dissipation plate 6 in the semiconductor device 105A are determined by the projection 772. This allows the heat dissipation plate 6 to be set in the semiconductor device 105A at a desired position with a desired posture.

The present invention is not limited to the foregoing embodiments. The specific structure of each part of the present invention can be varied in design in many ways. The intermediate layer may comprise a composite material or the heat dissipation plate may comprise a composite material.

1B Embodiment

The 1B Embodiment of a variation of the present invention is described below with reference to FIGS. 20-40.

Figure 20:
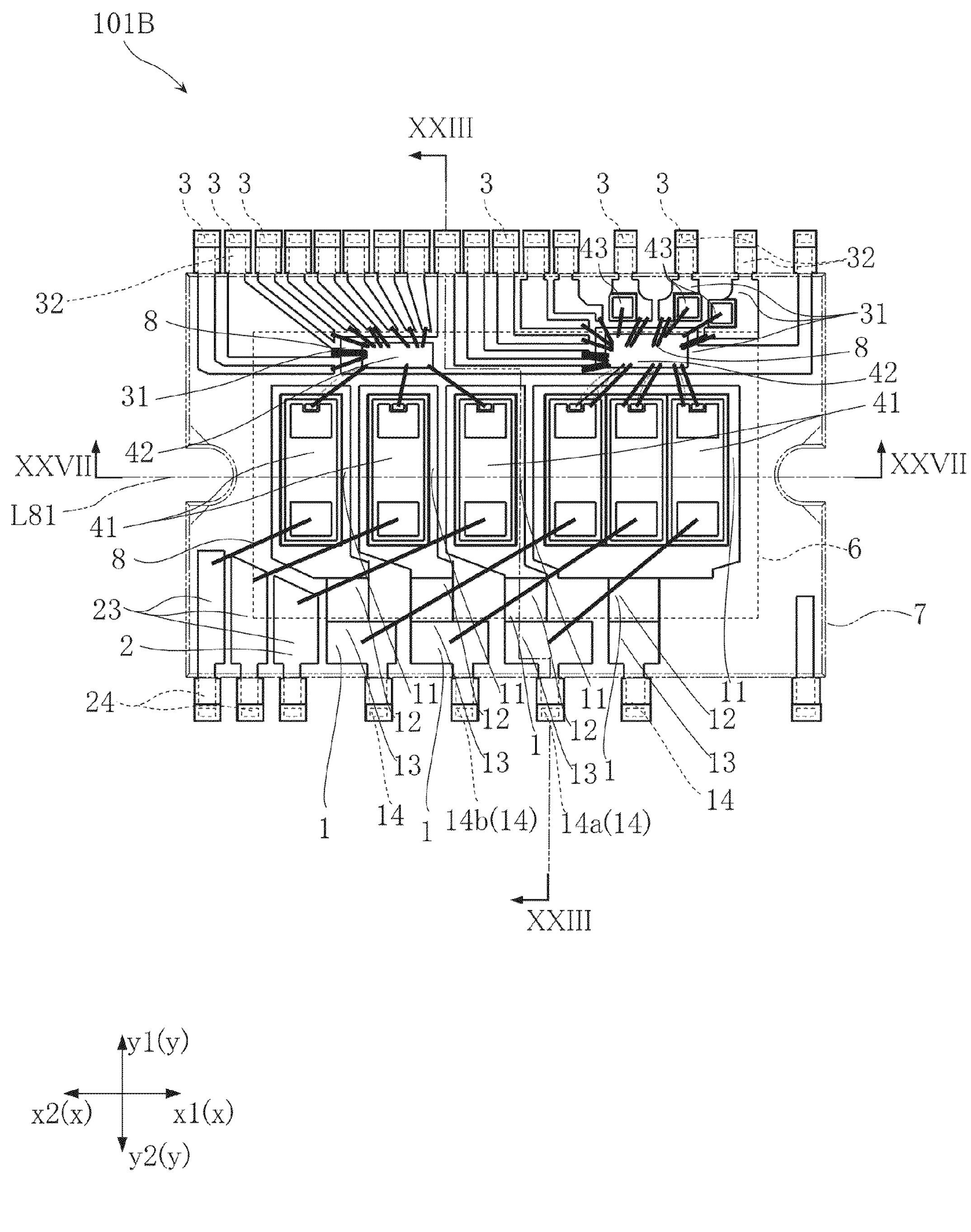
FIG. 20 is a (partially omitted and partially perspective) plan view of a semiconductor device according to the 1B Embodiment.

The semiconductor device 101B shown in FIGS. 20-23 is a product called an IPM (Intelligent Power Module). The semiconductor device 101B is a product for insertion mounting. For instance, the semiconductor device 101B is used for an air conditioner or motor control equipment. The semiconductor device 101B includes electrodes 1-3, semiconductor chips 41, 42, passive component chips 43, an intermediate layer 5 (see FIG. 27), a heat dissipation plate 6, a sealing resin 7, wires 8 and insulating films 460. In FIG. 20, the heat dissipation plate 6 is indicated by dotted lines, whereas the sealing resin 7 is indicated by phantom lines.

Figure 27:
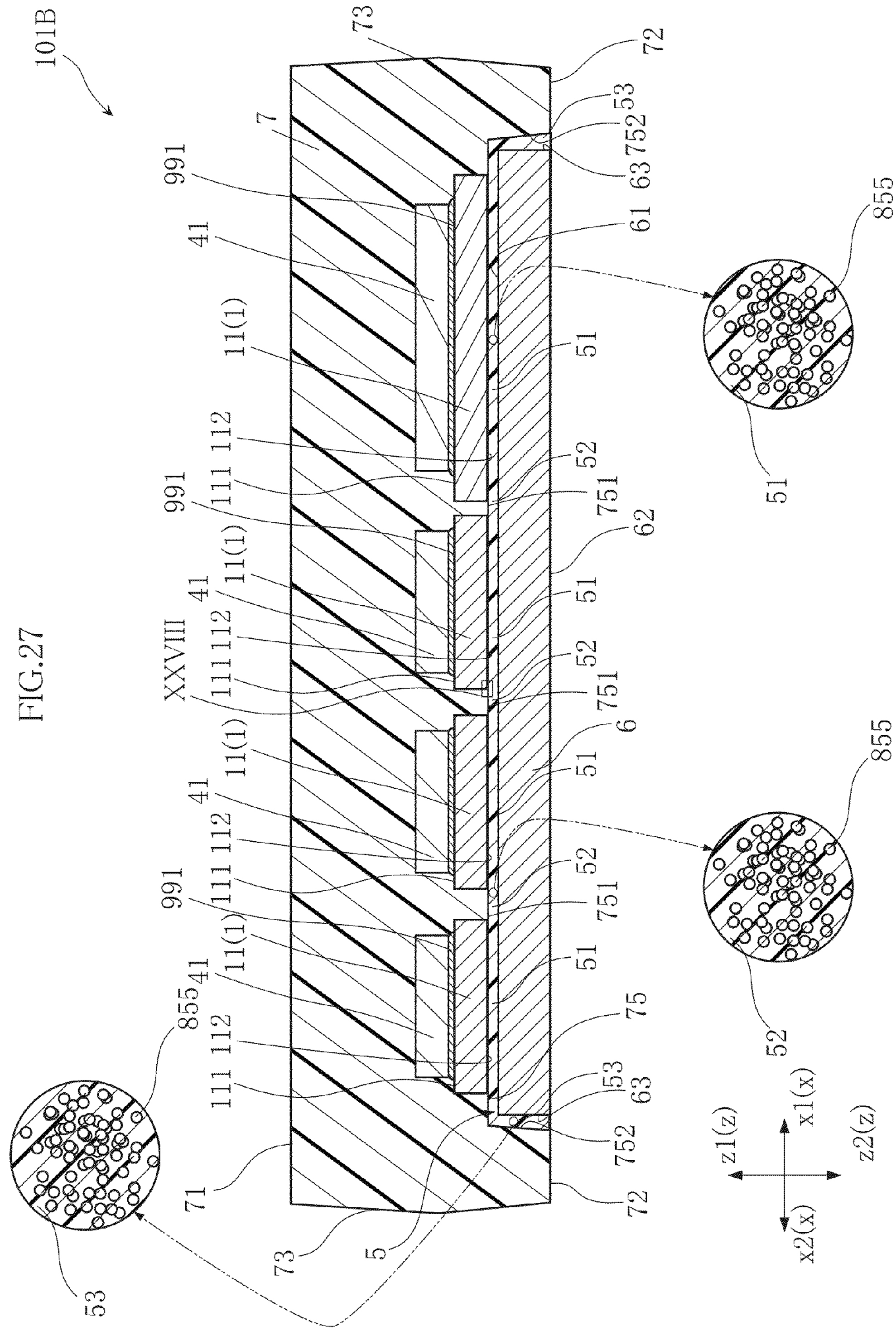
FIG. 27 is a sectional view taken along lines XXVII-XXVII in FIG. 20.

The sealing resin 7 covers the electrodes 1-3, the semiconductor chips 41 and 42, and passive component chips 43. For instance, the sealing resin 7 comprises a black epoxy resin. As shown in FIG. 27, the sealing resin 7 includes a resin principal surface 71, a resin bottom surface 72 and a resin side surface 73.

The resin principal surface 71 is a flat surface facing to the direction z1 and extending along the x-y plane. The resin bottom surface 72 is a flat surface facing to the direction z2 opposite from the direction z1 and extending along the x-y plane. The resin side surface 73 surrounds the semiconductor chips 41, 42 and the passive component chips 43, as viewed toward the x-y plane. The resin side surface 73 is connected to the resin principal surface 71 and the resin bottom surface 72.

Figure 28:
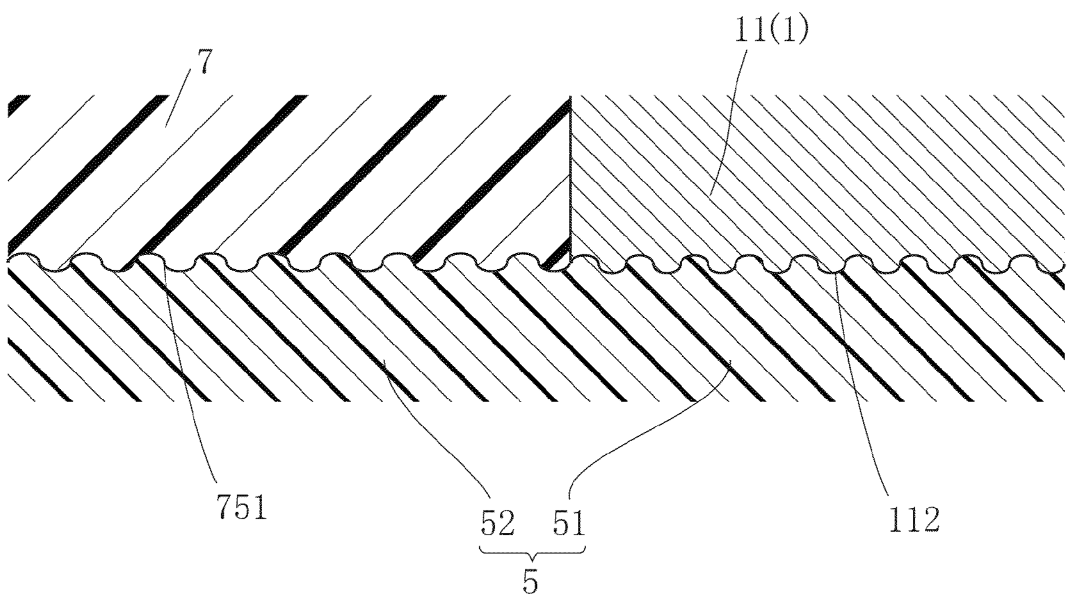
FIG. 28 is an enlarged view of the region XXVIII of FIG. 27.

The sealing resin 7 has a recess 75. The recess 75 is dented from the bottom surface 72. The recess 75 has a recess bottom surface 751 and a recess side surface 752. The recess bottom surface 751 extends along the x-y plane. As shown in FIG. 28, in this embodiment, the recess bottom surface 751 is an irregular surface with minute irregularities. The recess bottom surface 751 is made an irregular surface by performing blasting with respect to the sealing resin 7 (which will be described later). The arithmetic mean roughness Ra of the recess bottom surface 751 is e.g. 0.1-1 μm.

As shown in FIG. 27, the recess side surface 752 is connected to the recess bottom surface 751 and the resin bottom surface 72. The recess side surface 752 is inclined with respect to the direction z to be tapered. The recess side surface 752 is inclined with respect to the direction z so as to become further away from the recess bottom surface 751 as viewed toward the x-y plane as proceeding in the direction z2.

Figure 29:
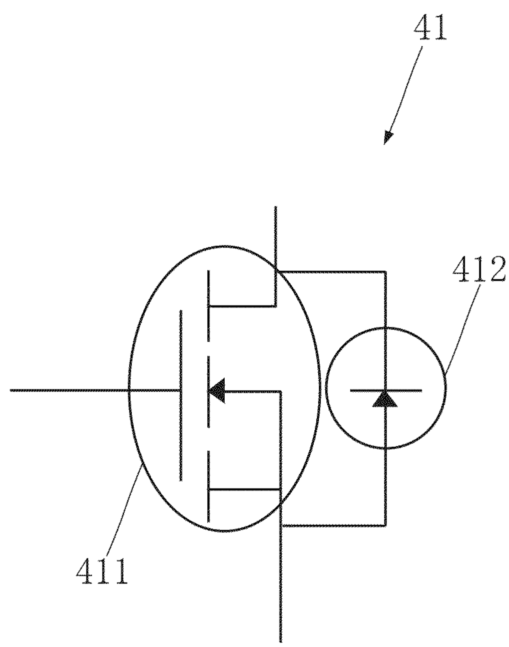
FIG. 29 shows an example of a circuit constituted by one of the semiconductor chips of the semiconductor device according to the 1B Embodiment.

As shown in FIG. 20, the semiconductor chips 41, 42 and the passive component chips 43 are rectangular as viewed in plan. Each semiconductor chip 41 is a power chip. For instance, the semiconductor chip 41 which is a power chip may be a MOS, an IGBT or a diode. As viewed toward the x-y plane, the semiconductor chips 41 are arranged along the straight line L81 extending along the direction x. In this embodiment, as viewed toward the x-y plane, the three semiconductor chips 41 from the left are in the form of an elongated rectangle having a width in the direction in which the straight line L81 extends. As viewed toward the x-y plane, the semiconductor chips 41 are on the straight line L81. FIG. 29 shows an example of a circuit constituted by one of the semiconductor chips 41. Each semiconductor chip 41 includes functional element portions 411, 412. In this embodiment, the functional element portion 411 is a transistor, whereas the functional element portion 412 is a diode. The semiconductor chip 42 may be an LSI chip such as a control IC. Each passive component chip 43 may be a passive component such as a resistor or a capacitor.

All the electrodes 1-3 shown in FIGS. 20-27 are made of an electrically conductive material. Examples of the electrically conductive material include copper.

Each of the plurality of electrodes 1 (four in this embodiment) includes a die pad 11 (see FIGS. 20 and 27), a connecting portion 12 (see FIG. 20), a wire bonding portion 13 (see FIG. 20) and a terminal 14 (see FIG. 20). The electrodes 1 are spaced apart from each other in the direction x.

Each die pad 11 is in the form of a plate extending along the x-y plane. On the die pad 11 is disposed a semiconductor chip 41. As shown in FIG. 27, a bonding layer 991 is provided between the die pad 11 and the semiconductor chip 41. The bonding layer 991 may comprise solder. Solder has a relatively high thermal conductivity. Thus, using solder as the bonding layer 991 allows heat to be efficiently transferred from the semiconductor chip 41 to the die pad 11. All of the die pads 11 are exposed from the recess bottom surface 751.

Each die pad 11 has a first surface 111 and a second surface 112. The first surface 111 faces to the direction z1, whereas the second surface 112 faces to the direction z2. That is, the first surface 111 and the second surface 112 face away from each other. On the first surface 111 is disposed a semiconductor chip 41. The bonding layer 991 is between the first surface 111 and the semiconductor chip 41. As shown in FIG. 28, the second surface 112 in this embodiment is an irregular surface with minute irregularities. The second surface 112 is made an irregular surface by performing blasting with respect to the die pad 11 (which will be described later).

Figure 23:
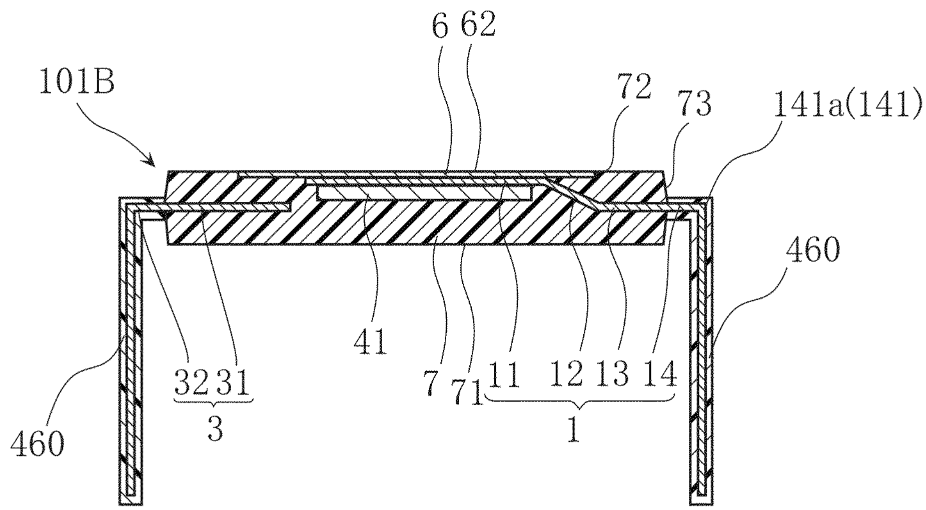
FIG. 23 is a sectional view taken along lines XXIII-XXVIII in FIG. 20.
Figure 23:
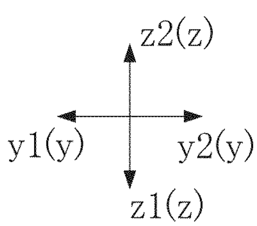

As shown in FIG. 20, each connecting portion 12 is between the die pad 11 and a wire bonding portion 13 and connected to the die pad 11 and the wire bonding portion 13. As shown in FIG. 23, the connecting portion 12 extends along a surface inclined with respect to the x-y plane. The connecting portion 12 is inclined with respect to the x-y plane so as to proceed in the direction z1 as becoming further away from the die pad 11.

Each wire bonding portion 13 shown in FIG. 20 extends along the x-y plane. A wire 8 is bonded to a wire bonding portion 13 and a semiconductor chip 41 so that the wire bonding portion 13 and the semiconductor chip 41 are electrically connected to each other. As shown in FIG. 23, in the direction z, each wire bonding portion 13 is closer to the direction z1 than the die pad 11 is.

Figure 24:
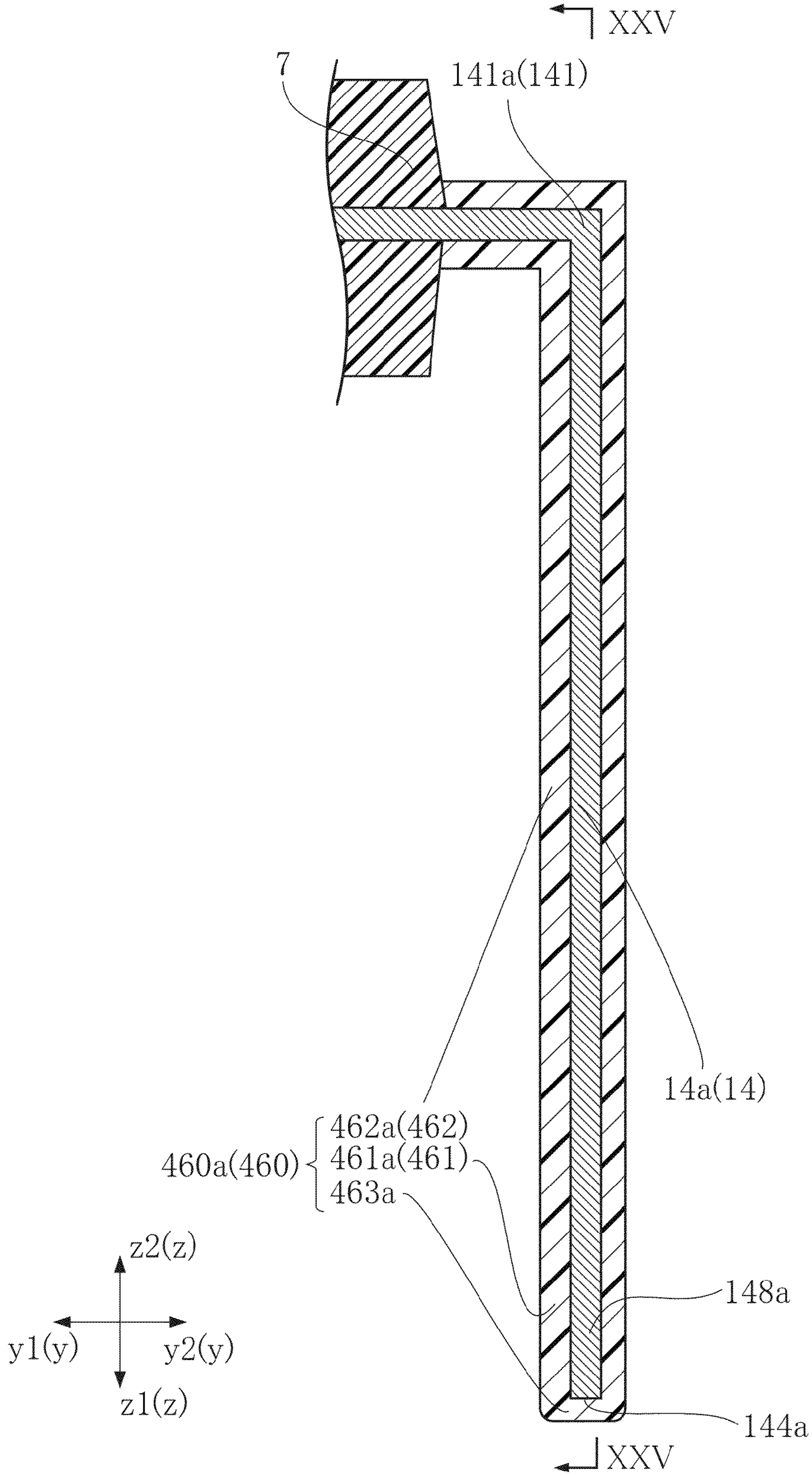
FIG. 24 is a partial enlarged view of FIG. 23.
Figure 25:
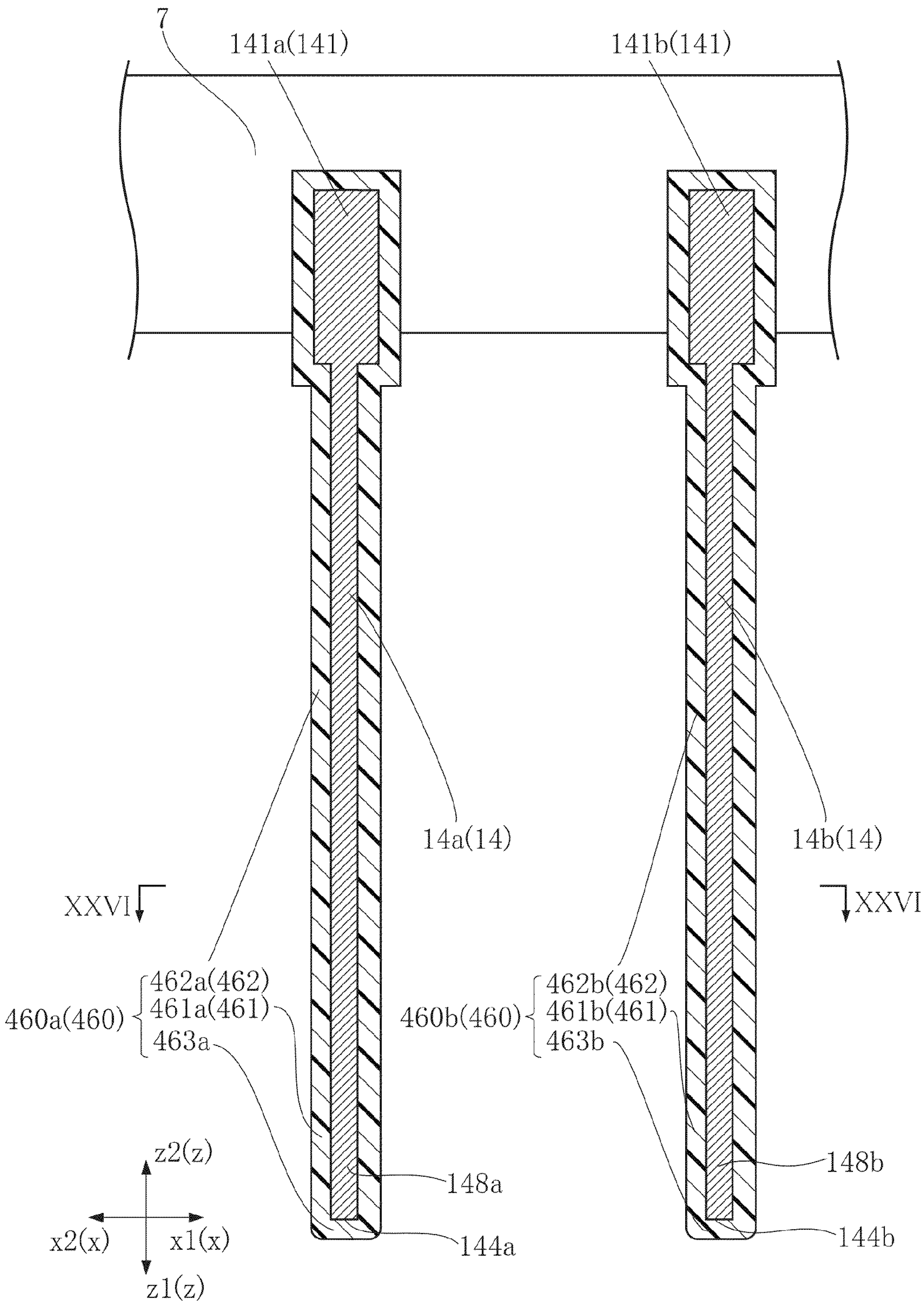
FIG. 25 is a sectional view taken along lines XXV-XXV in FIG. 24.

The terminals 14 shown in FIGS. 20-23 are connected to the wire bonding portions 13. The terminals 14 are exposed from the sealing resin 7. Specifically, each terminal 14 includes a portion projecting from the resin side surface 73 of the sealing resin 7. The terminals 14 of this embodiment are for insertion mounting. As shown in FIGS. 23 and 24, each terminal 14 includes a bent portion 141. The terminals 14 are arranged in parallel to each other. As shown in FIG. 25, the terminals 14 include a first terminal **14*a* and a second terminal 14*b*. The bent portion 141 of the first terminal 14*a* is referred to as a bent portion 141*a*, whereas the bent portion 141 of the second terminal 14*b* is referred to as a bent portion 141*b*. The first terminal 14*a* and the second terminal 14*b*** are adjacent to each other in the direction x.

As shown in FIG. 20, each of the plurality of electrodes 2 (three in this embodiment) includes a wire bonding portion 23 and a terminal 24. The electrodes 2 are spaced apart from each other in the direction x.

Each wire bonding portion 23 has a shape extending along the x-y plane. In the direction z, each wire bonding portion 23 is closer to the direction z1 than the die pad 11 is. A wire 8 is bonded to a wire bonding portion 23 and a semiconductor chip 41 so that the wire bonding portion 23 and the semiconductor chips 41 are electrically connected to each other.

The terminals 24 are connected to the wire bonding portions 23. The terminals 24 are exposed from the sealing resin 7. Specifically, each terminal 24 includes a portion projecting from the resin side surface 73 of the sealing resin 7. The terminals 24 of this embodiment are for insertion mounting. The terminals 24 are arranged in parallel to each other.

As shown in FIG. 20, the electrodes 3 include die pads 31 and terminals 32. The die pads 31 and the terminals 32 are at the same position in the direction z. On each die pad 31 is disposed a semiconductor chip 42 or a passive component chip 43. A bonding layer (not shown) is provided between each die pad 31 and a semiconductor chip 42 or a passive component chip 43.

The terminals 32 are exposed from the sealing resin 7. Specifically, each terminal 32 includes a portion projecting from the resin side surface 73 of the sealing resin 7. The terminals 32 of this embodiment are for insertion mounting. The terminals 32 are arranged in parallel to each other. A wire 8 is bonded to a terminal 32 and a semiconductor chip 42 so that the terminal 32 and the semiconductor chip 42 are electrically connected to each other. A wire 8 is bonded to a semiconductor chip 42 and a passive component chip 43.

As shown in FIG. 27, the heat dissipation plate 6 is arranged in the recess 75 of the sealing resin 7. In this embodiment, the heat dissipation plate 6 is in the form of a plate extending along the x-y plane. The heat dissipation plate 6 is provided to quickly dissipate the heat generated at the semiconductor chips 41 to the outside of the semiconductor device 101B. In order that the heat generated at the semiconductor chips 41 can be quickly dissipated to the outside of the semiconductor device 101A, making the heat dissipation plate 6 from a material having a higher thermal conductivity is better. Preferably, the heat dissipation plate 6 is made of a material having a thermal conductivity higher than that of the material for the sealing resin 7. More preferably, the heat dissipation plate 6 is made of a material having a thermal conductivity higher than that of the material for the die pads 11. The heat dissipation plate 6 is made of a conductor such as aluminum, copper or iron. The heat dissipation plate 6 may be made of aluminum plated with silver. As shown in FIG. 20, as viewed toward the x-y plane, the heat dissipation plate 6 overlaps the entirety of each die pad 11.

As shown in FIG. 27, the heat dissipation plate 6 has a first surface 61, a second surface 62 and a side surface 63. The first surface 61 faces to the direction z1. As viewed toward the x-y plane, the first surface 61 overlaps the second surface 112 of each die pad 11 and the recess bottom surface 751. The second surface 62 faces to the direction z2 opposite from the direction to which the first surface 61 faces. The second surface 62 is exposed from the resin bottom surface 72 of the sealing resin 7. In this embodiment, the second surface 62 is flush with the resin bottom surface 72. The side surface 63 faces to the direction perpendicular to the direction z which is the thickness direction of the heat dissipation plate 6. The side surface 63 is spaced apart from the recess side surface 752. That is, the recess side surface 752 is spaced apart from the heat dissipation plate 6. This is because the sealing resin 7 is formed in such a manner that the heat dissipation plate 6 can be later fitted into the recess 75, as will be described later. During the use of the semiconductor device 101B, the heat dissipation plate 6 is held in contact with the heat dissipating member 840, which will be described later.

The intermediate layer 5, which is shown in FIG. 27, is between the heat dissipation plate 6 and the sealing resin 7. The intermediate layer 5 bonds the heat dissipation plate 6 to the sealing resin 7. Specifically, the intermediate layer 5 includes a plurality of first portions 51, a second portion 52 and an insulating portion 53.

Either the heat dissipation plate 6 or the first portions 51 are made to have insulating properties so that the die pads 11 are not electrically connected to each other. In this embodiment, the first portions 51 have insulating properties. The first portions 51, the second portion 52 and the insulating portion 53 are made of a same insulating material. Examples of the material include a resin such as epoxy. It is preferable that the insulating material is a thermoplastic resin. The first portions 51, the second portion 52 and the insulating portion 53 (i.e., the intermediate layer 5) are made from an insulating resin sheet or insulating resin paste. The first portions 51, the second portion 52 and the insulating portion 53 are integral with each other. Each of the first portions 51 bonds one of the die pads 11 and the heat dissipation plate 6 and is between the die pad 11 and the heat dissipation plate 6. The first portion 51 is in contact with the second surface 112 of the die pad 11 and the first surface 61 of the heat dissipation plate 6. The second portion 52 bonds the recess bottom surface 751 and the heat dissipation plate 6 and is between the recess bottom surface 751 and the heat dissipation plate 6. The second portion 52 is in contact with the recess bottom surface 751 and the first surface 61 of the heat dissipation plate 6. The second portion 52 is connected to the first portions 51. The insulating portion 53 bonds the recess side surface 752 and the heat dissipation plate 6 and is between the recess side surface 752 and the heat dissipation plate 6. The insulating portion 53 is exposed to the direction z2 side. The insulating portion 53 is in contact with the recess side surface 752 and the side surface 63 of the heat dissipation plate 6.

As shown in FIG. 27, filler 855 may be contained in the first portions 51, the second portion 52 and the insulating portion 53. The thermal conductivity of the material forming the filler 855 is higher than that of the material forming the intermediate layer 5. With this arrangement, heat is efficiently transferred from the die pads 11 to the heat dissipation plate 6. Examples of the material for the filler 855 include alumina, and boron nitride.

Figure 21:
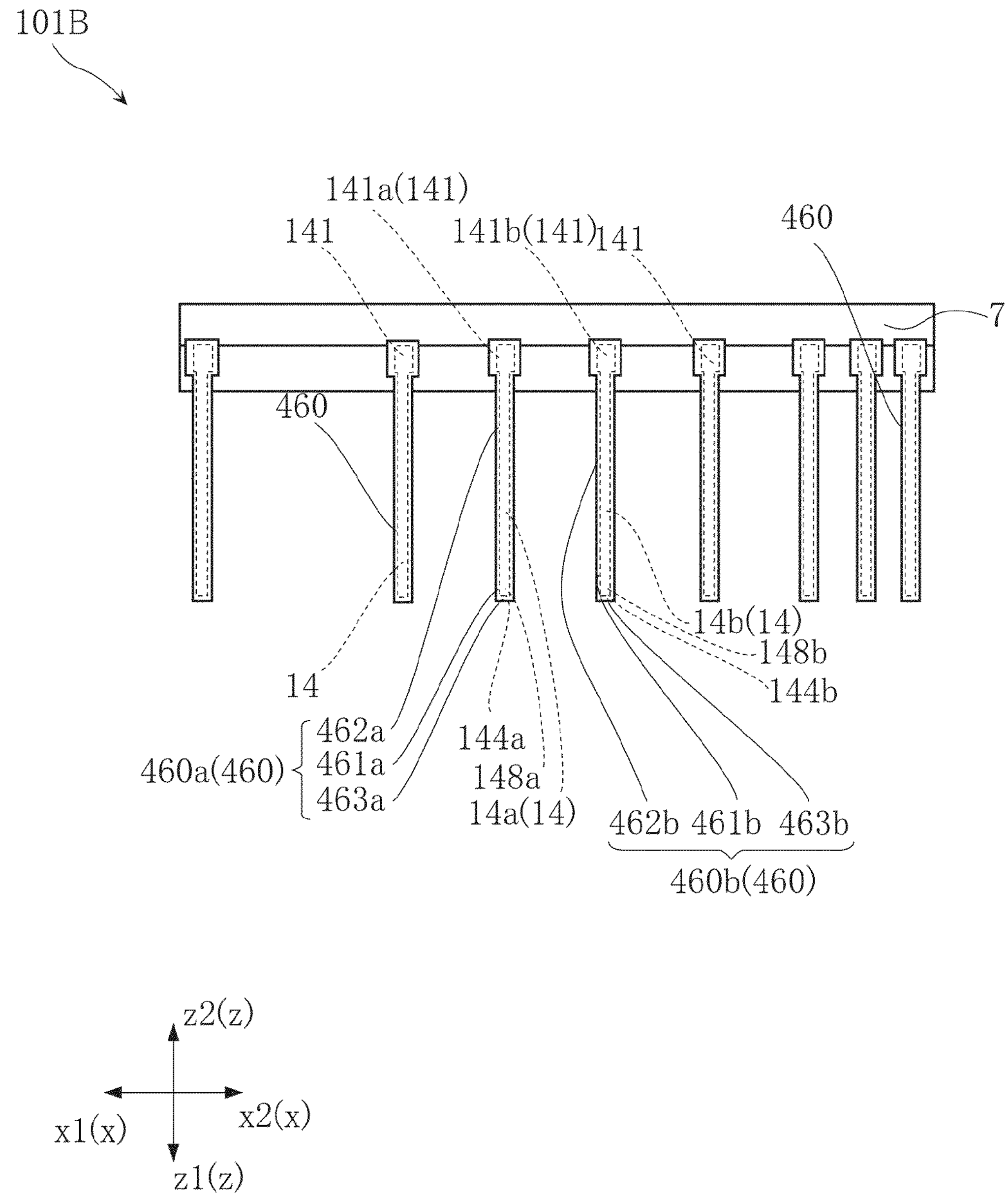
FIG. 21 is a front view of a semiconductor device according to the 1B Embodiment.
Figure 22:
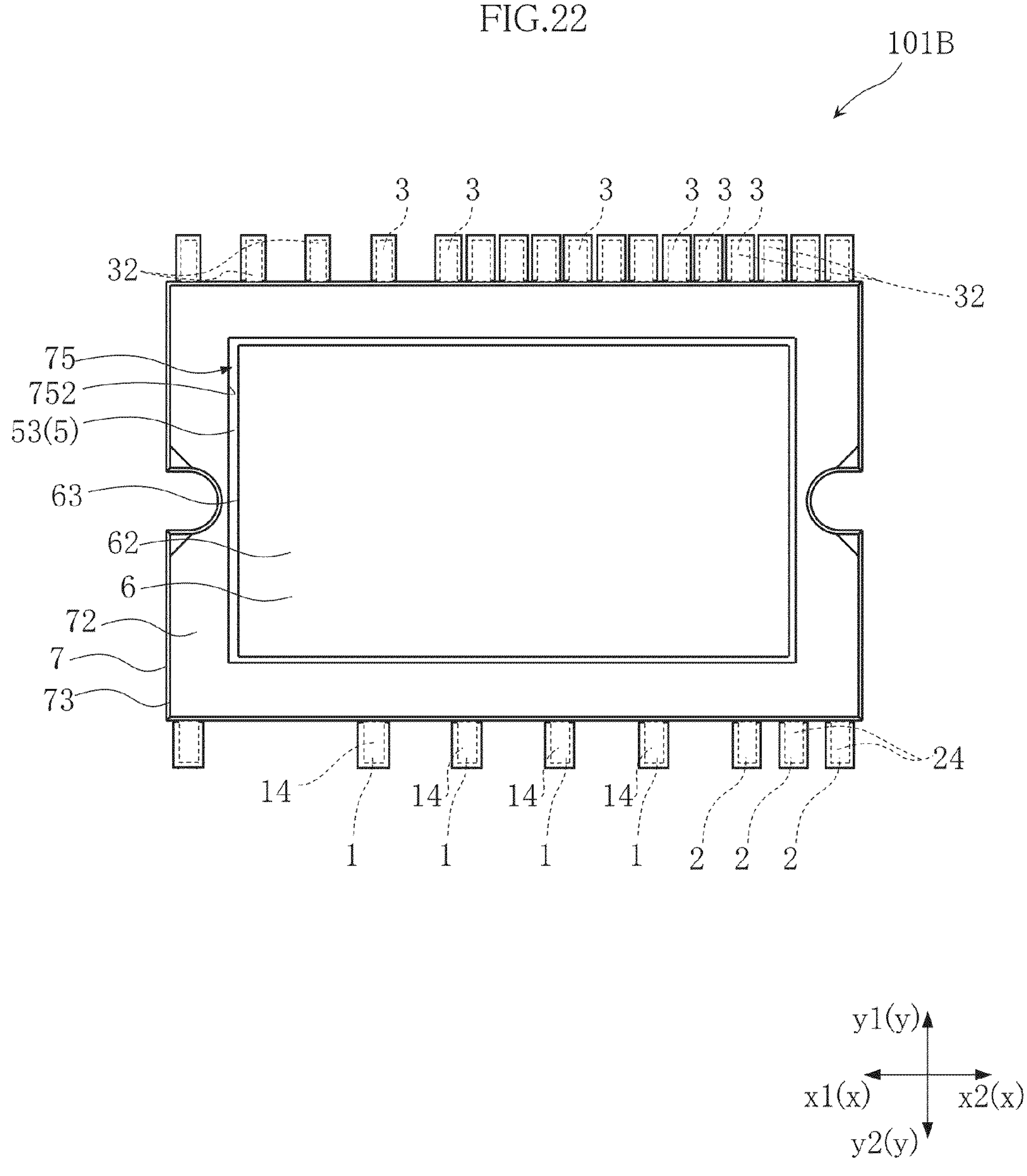
FIG. 22 is a bottom view of the semiconductor device according to the 1B Embodiment.

As shown in FIGS. 21 and 23, the insulating films 460 cover the terminals 14, 24 and 32 (partially not shown). The insulating films 460 include a first insulating film 460*a* that covers the first terminal 14*a* and a second insulating film 460*b* that covers the second terminal 14*b*. Hereinafter, of the insulating films 460, the first insulating film 460*a* and the second insulating film 460*b* are explained. Since other insulating films 460 have the same structure as that of the first insulating film 460*a* and the second insulating film 460*b*, explanation of these are omitted.

Figure 26:
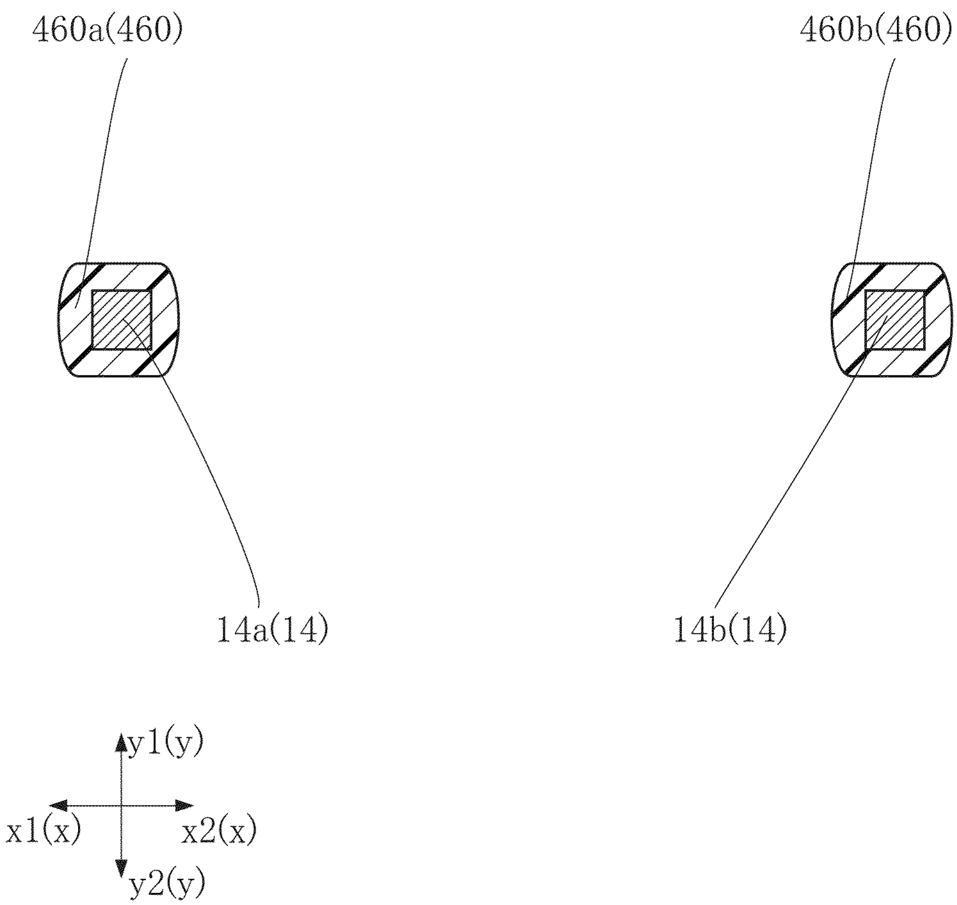
FIG. 26 is a sectional view taken along lines XXVI-XXVI in FIG. 25.

Referring to FIGS. 24-26, the insulating films 460 are made of a flux. Each of the insulating films 460 includes surrounding portions 461 and 462. Specifically, as shown in FIG. 25, the first insulating film 460*a* includes a surrounding portion 461*a* (first surrounding portion) and a surrounding portion 462*a* (second surrounding portion). The second insulating film 460*b* includes a surrounding portion 461*b* (additional surrounding portion) and a surrounding portion 462*b*.

Both of the surrounding portions 461*a* and 462*a* surround the first terminal 14*a*. Specifically, the surrounding portion 461*a* surrounds the front end 148*a* of the first terminal 14*a* in the direction extending from the sealing resin 7. In this embodiment, the first insulating film 460*a* further includes an end covering portion 463*a*. The end covering portion 463*a* covers the end surface 144*a* of the first terminal 14*a* in the direction extending from the sealing resin 7. Unlike this embodiment, the first insulating film 460*a* may not include the end covering portion 463*a*. In this case, the end surface 144*a* is exposed from the first insulating film 460*a*.

As shown in FIGS. 24 and 25, the surrounding portion 462*a* is connected to the surrounding portion 461*a* and in contact with the sealing resin 7. The surrounding portion 462*a* surrounds the bent portion 141*a* of the first terminal 14*a*. In this embodiment, the portion of the first terminal 14*a* which is exposed from the sealing resin 7 is entirely covered by the first insulating film 460*a*.

The second insulating film 460*b* has a structure similar to that of the first insulating film 460*a*. Both of the surrounding portions 461*b* and 462*b* surround the second terminal 14*b*. Specifically, the surrounding portion 461*b* surrounds the front end 148*b* of the second terminal 14*b* in the direction extending from the sealing resin 7. A part of the surrounding portion 461*b* faces the surrounding portion 461*a* via a gap. In this embodiment, the second insulating film 460*b* further includes an end covering portion 463*b*. The end covering portion 463*b* covers the end surface 144*b* of the second terminal 14*b* in the direction extending from the sealing resin 7. Unlike this embodiment, the second insulating film 460*b* may not include the end covering portion 463*b*. In this case, the end surface 144*b* is exposed from the second insulating film 460*b*.

Similarly to the surrounding portion 462*a*, the surrounding portion 462*b* is connected to the surrounding portion 461*b* and in contact with the sealing resin 7. The surrounding portion 462*b* surrounds the bent portion 141*b* of the second terminal 14*b*. In this embodiment, the portion of the second terminal 14*b* which is exposed from the sealing resin 7 is entirely covered by the second insulating film 460*b*.

A method for manufacturing the semiconductor device 101B is described below. In the figures used below for describing the manufacturing method, the elements that are identical or similar to those described above are designated by the same reference signs as those used above.

Figure 30:
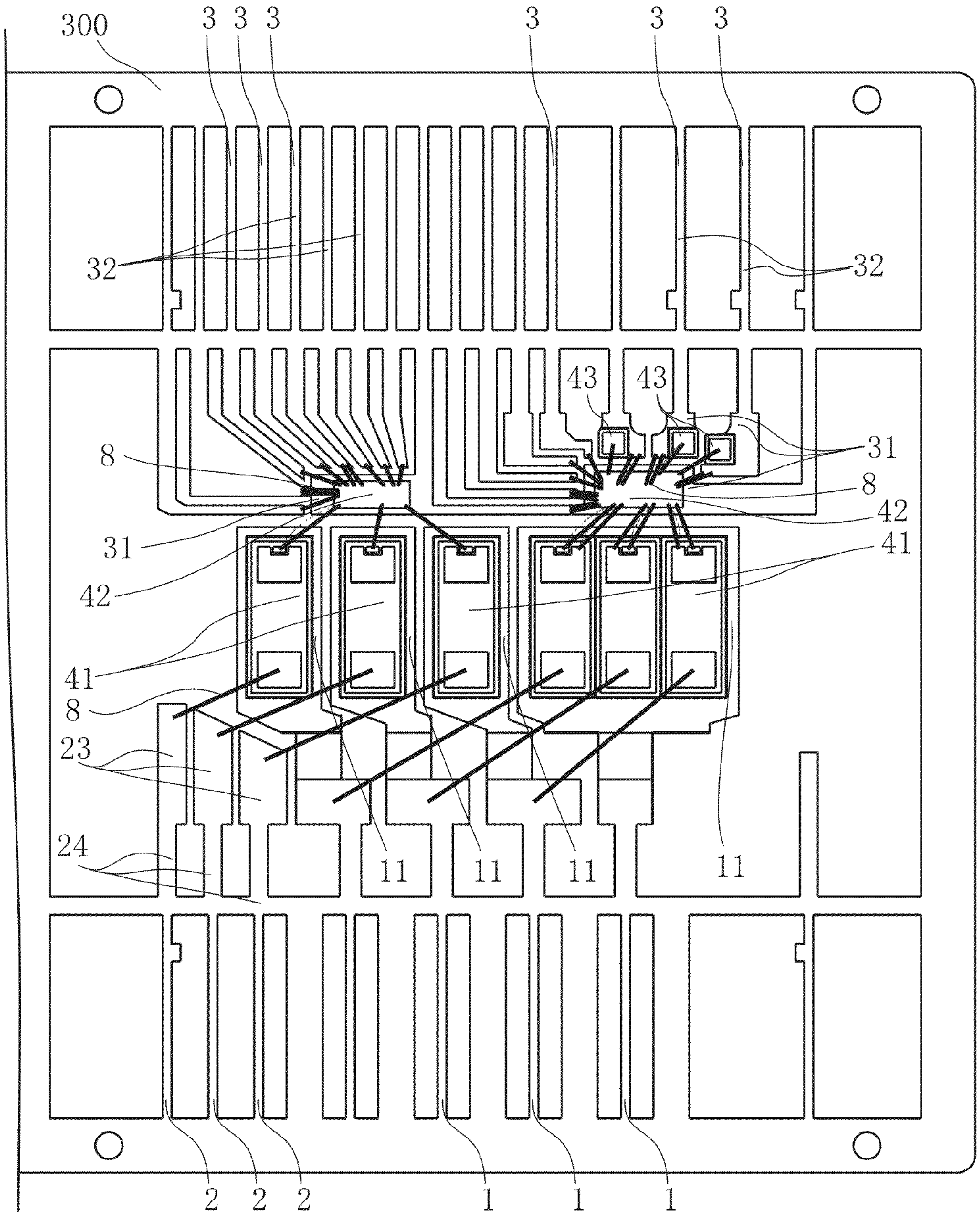
FIG. 30 is a plan view showing a process step of a method for manufacturing the semiconductor device according to the 1B Embodiment.

First, as shown in FIG. 30, a lead frame 300 including a plurality of die pads 11, 31, a plurality of semiconductor chips 41, 42 and passive component chips 43 are prepared. Then, each of the semiconductor chips 41 is disposed on one of the die pads 11 via a bonding layer (not shown). Similarly, each of the semiconductor chips 42 and passive component chips 43 is disposed on one of the die pads 31 via a bonding layer (not shown). Then, as shown in the figure, wires 8 are bonded to the semiconductor chips 41, 42 and so on.

Figure 31:
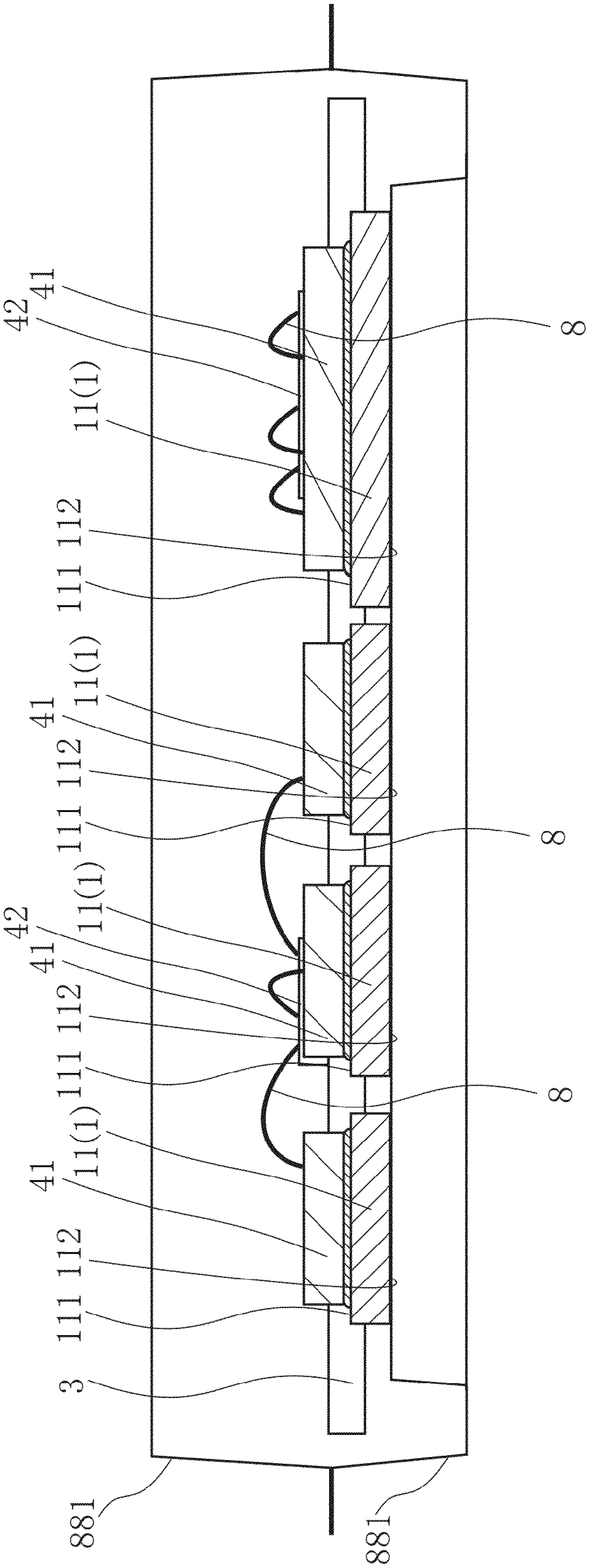
FIG. 31 is a sectional view showing a process step of a method for manufacturing the semiconductor device according to the 1B Embodiment.
Figure 32:
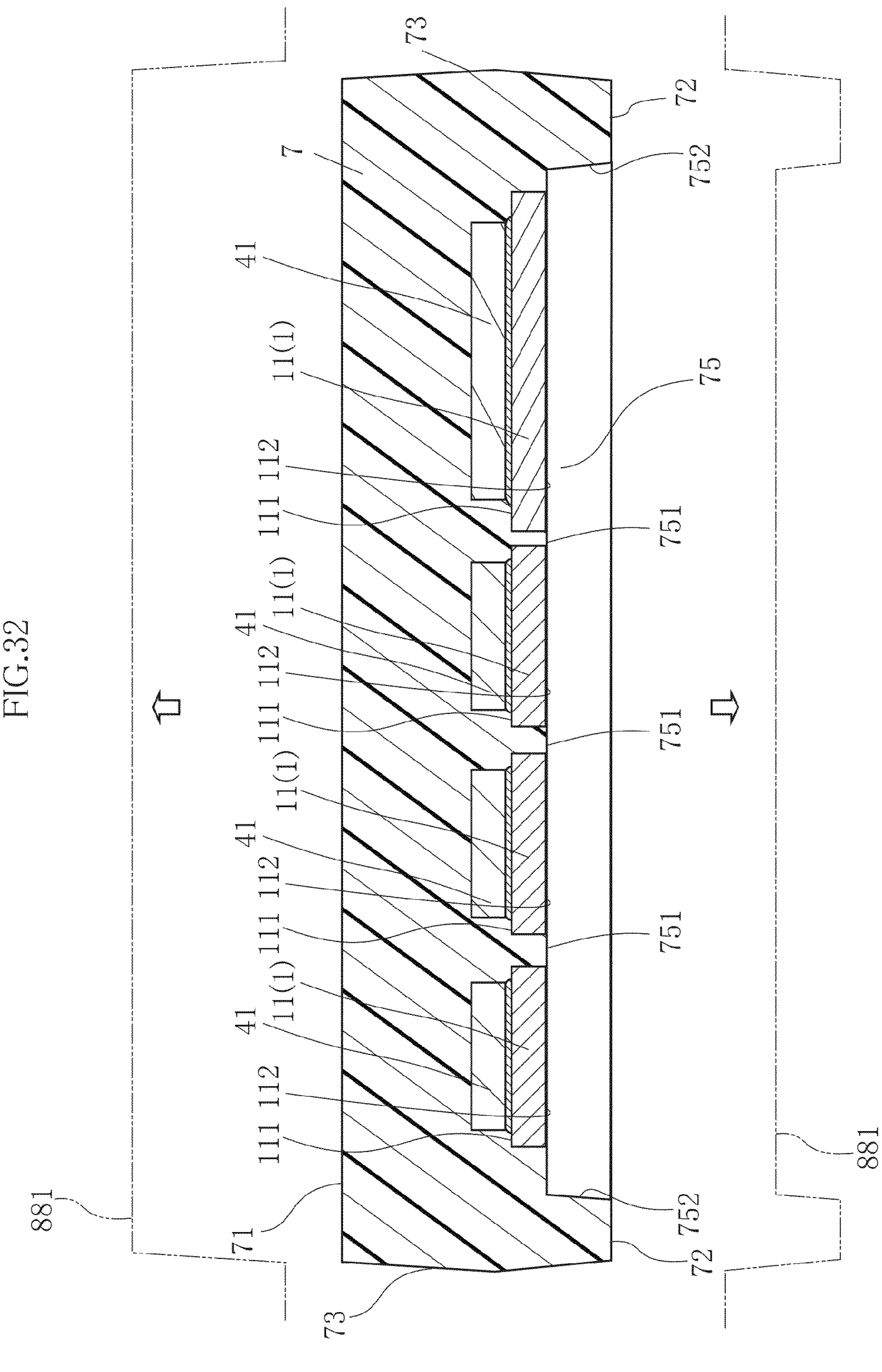
FIG. 32 is a sectional view showing the process step subsequent to FIG. 31.

Then, a sealing resin 7 is formed as shown in FIGS. 31 and 32. As shown in FIG. 31, the sealing resin 7 is formed by molding using a mold 881. As shown in the figure, the die pads 11 and so on are pressed with the mold 881. Then, a resin material is injected into the mold 881 and allowed to harden. After the resin material is hardened, the mold 881 is removed from the die pads 11 and so on, as shown in FIG. 32. Thus, the sealing resin 7 is formed. In the process of forming the sealing resin 7, a recess 75 for exposing the die pads 11 is formed in the sealing resin 7. To allow the mold 881 to be easily removed from the resin sealing resin 7 after the hardening of the resin, the recess side surface 752 of the recess 75 has a tapered shape as described above.

In the state after the sealing resin 7 is formed, the die pads 11 may be covered with thin resin burrs. To remove the resin burrs, the die pads 11 are subjected to blasting (not shown). Blasting is a technique of spraying non-metal particles such as silica sand or metal particles at a high speed to roughen the surface. By this technique, the second surface 112 of each die pad 11 and the recess bottom surface 751 of the sealing resin 7 become irregular surfaces with minute irregularities as shown in FIG. 28.

Figure 33:
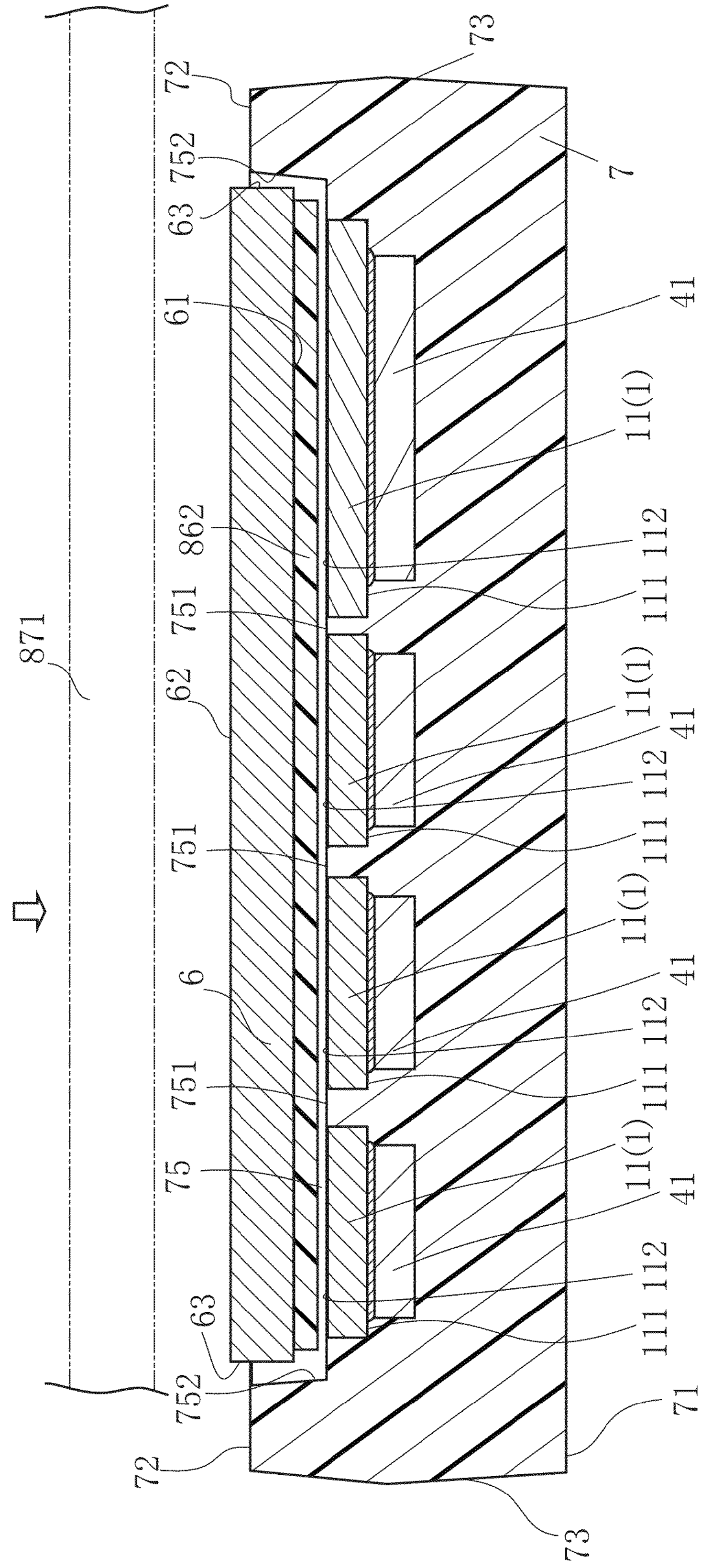
FIG. 33 is a sectional view showing the process step subsequent to FIG. 32.

Then, as shown in FIG. 33, a heat dissipation plate 6 is fitted into the recess 75 of the sealing resin 7. The provision of the recess 75 in the sealing resin 7 makes it easier to position the heat dissipation plate 6 relative to the die pads 11. After the heat dissipation plate 6 is fitted into the recess 75 of the sealing resin 7, the heat dissipation plate 6 is pressed by a plate member 871 against the die pads 11, with the resin sheet 862 as an adhesive layer sandwiched between them. In pressing the heat dissipation plate 6 against the die pads 11, the resin sheet 862 is heated. In this embodiment, the resin sheet 862 is made of a thermoplastic material. Thus, the resin sheet 862 is softened when the heat dissipation plate 6 is pressed against the die pads 11. The heat dissipation plate 6 fits into the recess 75 of the sealing resin 7, while the softened resin sheet 862 is pushed toward the side surface 63 of the heat dissipation plate 6. Thereafter, the resin sheet 862 hardens to become the above-described intermediate layer 5. In this way, the heat dissipation plate 6 is bonded to the die pads 11. To obtain a product in which filler 855 is contained in the intermediate layer 5 as shown in FIG. 27, a resin sheet 862 containing filler 855 is used. As an adhesive layer, resin paste may be used instead of the resin sheet 862.

Figure 34:
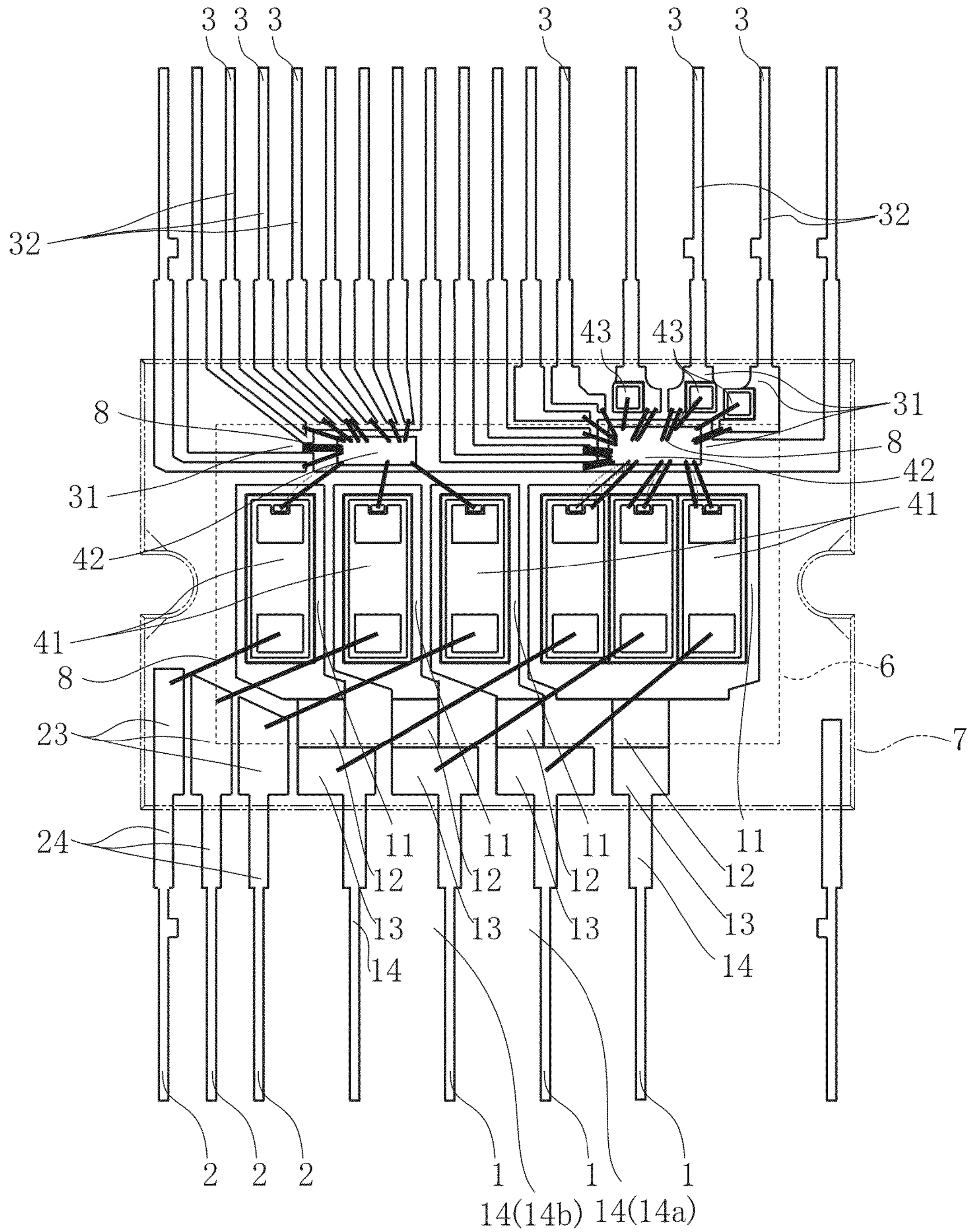
FIG. 34 is a plan view showing the process step subsequent to FIG. 33.

Then, the lead frame 300 shown in FIG. 30 is cut, whereby the product shown in FIG. 34 is obtained. The product shown in this figure includes terminals 14, 24 and 32 projecting from the sealing resin 7. Then, the process step for bending the terminals 14, 24, 32 is performed (not shown), whereby the above-described bent portion 141 is formed in each of the terminals 14.

Then, insulating films 460 for covering the terminals 14, 24 and 32 are formed. Specifically, a first insulating film 460*a* of flux is formed to surround the front end 148*a* of the first terminal 14*a*, which is one of the terminals 14, in the direction extending from the sealing resin 7. Similarly, a second insulating film 460*b* of flux is formed to surround the front end 148*b* of the second terminal 14*b*, which is one of the terminals 14, in the direction extending from the sealing resin 7. The insulating films 460 are also formed to surround the terminals 14, 24 and 32 other than the first terminal 14*a* and the second terminal 14*b*.

The insulating films 460 may be formed at the same time on the terminals 14, the terminals 24 and the terminals 32 or may be formed successively on the terminals 14, the terminals 24 and the terminals 32. The insulating films 460 may be formed on the terminals 14, 24 and 32 before the process step of bending the terminals 14, 24 and 32.

In this way, the semiconductor device 101B shown in FIGS. 20-28 is obtained.

The mount structure 801B of the semiconductor device 101B is described below with reference to FIGS. 35-38.

The mount structure 801B includes the semiconductor device 101B, a mount board 811, solder layers 820, a heat dissipating member 840, a first action member 858 and a second action member 859.

The mount board 811 includes a principal surface 811*a* and a reverse surface 811*b*. The principal surface 811*a* and the reverse surface 811*b* face away from each other. The mount board 811 includes a substrate 812, through-hole electrodes 814, principal surface electrodes 816 and reverse surface electrodes 817.

Figure 35:
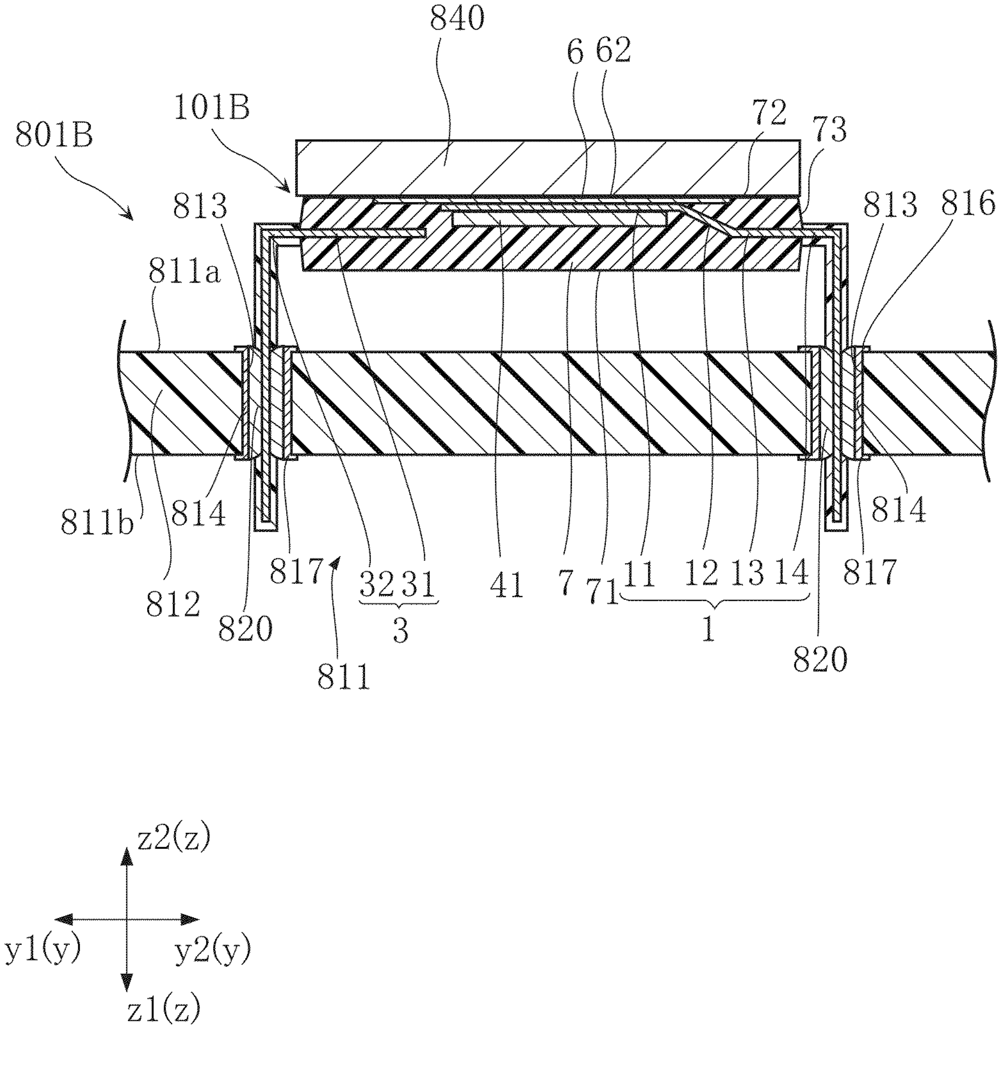
FIG. 35 is a sectional view of a mount structure of a semiconductor device according to the 1B Embodiment.
Figure 38:
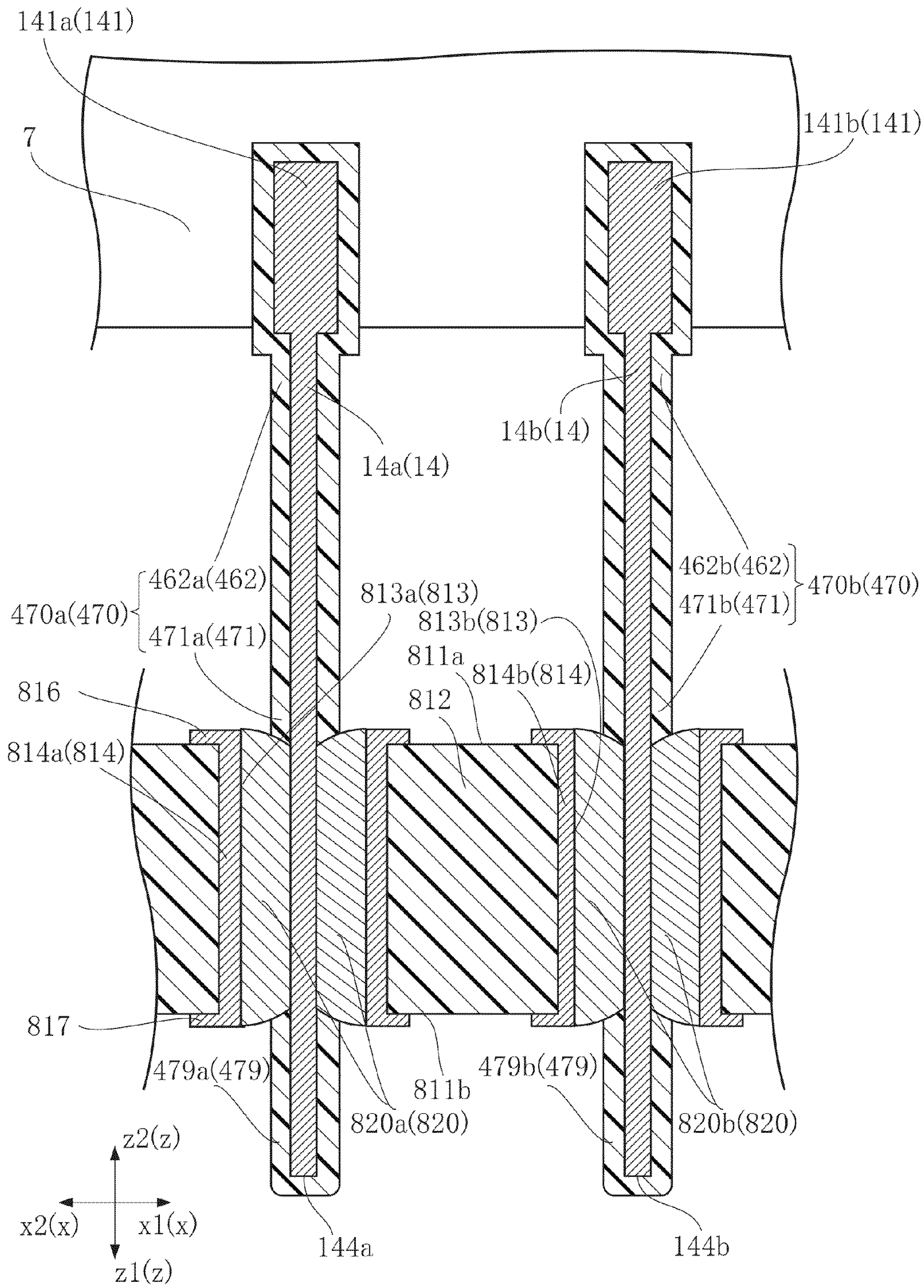
FIG. 38 is a partially enlarged sectional view of a mount structure of a semiconductor device according to the 1B Embodiment.

The substrate 812 is made of an insulating material. As shown in FIGS. 35 and 38, the substrate 812 (i.e., the mount board 811) has a plurality of through-holes 813. Each of the through-holes 813 extends through the substrate 812 from the principal surface 811*a* to the reverse surface 811*b*. One of the terminals 14, 24, 32 penetrates through each of the through-holes 813 (partially not shown). The principal surface electrodes 816 are on the principal surface 811*a* of the substrate 812. The reverse surface electrodes 817 are on the reverse surface 811*b* of the substrate 812. Each of the through-hole electrodes 814 is provided in one of the through-hole 813.

As shown in FIG. 38, the through-holes 813 include a first through-hole 813*a* and a second through-hole 813*b*. The through-hole electrodes 814 include a first through-hole electrode 814*a* and a second through-hole electrode 814*b*. The first through-hole electrode 814*a* and the second through-hole electrode 814*b* are insulated from each other.

The structure of the semiconductor device 101B after mounted on the mount board 811 is the same as that before mounted on the mount board 811 except that the insulating film 460 has become the insulating films 470 and 479. Thus, the elements other than the insulating films 470 and 479 are not explained.

The insulating films 470 cover the terminals 14, 24 and 32 (partially not shown). As shown in FIG. 38, the insulating films 470 include an insulating film 470*a* that covers the first terminal 14*a* and an insulating film 470*b* that covers the second terminal 14*b*. Hereinafter, of the insulating films 470, the insulating film 470*a* and the insulating film 470*b* are explained. Since other insulating films 470 have the same structure as that of the first insulating film 470*a* and the second insulating film 470*b*, explanation of these are omitted. Similarly, the insulating films 479 cover the terminals 14, 24 and 32 (partially not shown). The insulating films 479 include an insulating film 479*a* (additional insulating film) that covers the first terminal 14*a* and an insulating film 479*b* that covers the second terminal 14*b*. Hereinafter, of the insulating films 479, the insulating films 479*a* and 479*b* are explained. Since other insulating films 479 have the same structure as that of the insulating films 479*a* and 479*b*, explanation of these are omitted.

The insulating films 470*a* and 479*a* come from the first insulating film 460*a*, whereas the insulating film 470*b* and 479*b* come from the second insulating film 460*b*.

Each insulating film 470 includes a covering portion 471 and a surrounding portion 462. The insulating film 470*a* includes a covering portion 471*a* and a surrounding portion 462*a*. The covering portion 471*a* surrounds the first terminal 14*a*. That is, the insulating film 470*a* includes a portion surrounding the first terminal 14*a*. The covering portion 471*a* is connected to the surrounding portion 462*a*.

The insulating film 479*a* surrounds the first terminal 14*a*. The insulating film 479*a* is on the opposite side of the insulating film 470*a* with respect to the mount board 811.

Similarly, the insulating film 470*b* includes a covering portion 471*b* and a surrounding portion 462*b*. The covering portion 471*b* surrounds the second terminal 14*b*. That is, the insulating film 470*b* includes a portion surrounding the second terminal 14*b*. The covering portion 471*b* is connected to the surrounding portion 462*b*. A part of the covering portion 471*b* faces the covering portion 471*a*.

The insulating film 479*b* surrounds the second terminal 14*b*. The insulating film 479*b* is on the opposite side of the insulating film 470*b* with respect to the mount board 811. A part of the insulating film 479*b* faces the insulating film 479*a*.

Each solder layer 820 is provided in one of the through-holes 813 formed in the substrate 812. The solder layers 820 include a solder layer 820*a* provided in the first through-hole 813*a* and a solder layer 820*b* provided in the second through-hole 813*b*.

The solder layer 820*a* is between the first terminal 14*a* and the mount board 811. The solder layer 820*a* is in contact with the insulating film 470*a*, and more specifically, in contact with the covering portion 471*a* of the insulating film 470*a*. In this embodiment, the solder layer 820*a* is in contact with the insulating film 479*a*.

Similarly, the solder layer 820*b* is between the second terminal 14*b* and the mount board 811. The solder layer 820*b* is in contact with the insulating film 470*b*, and more specifically, in contact with the covering portion 471*b* of the insulating film 470*b*. In this embodiment, the solder layer 820*b* is in contact with the insulating film 479*b*.

Figure 36:
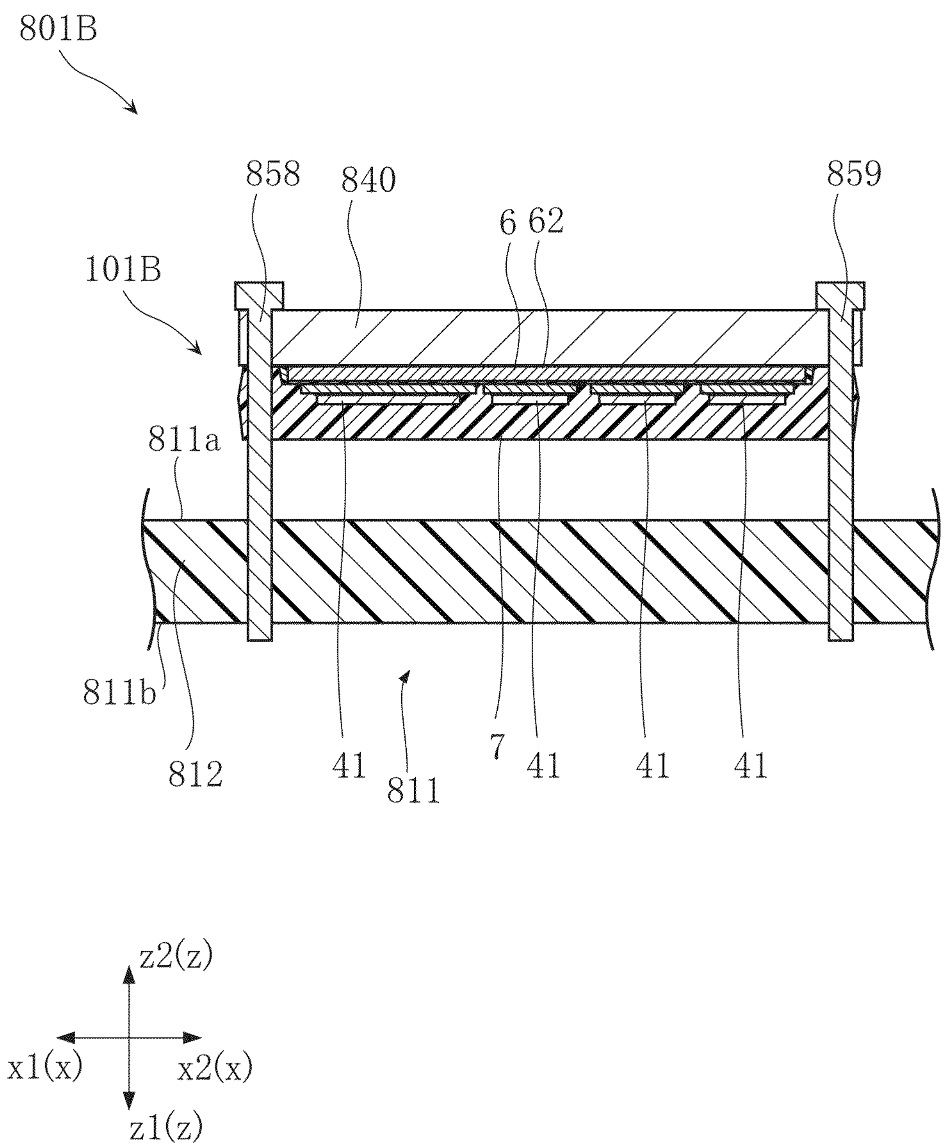
FIG. 36 is a sectional view of a mount structure of a semiconductor device according to the 1B Embodiment.
Figure 37:
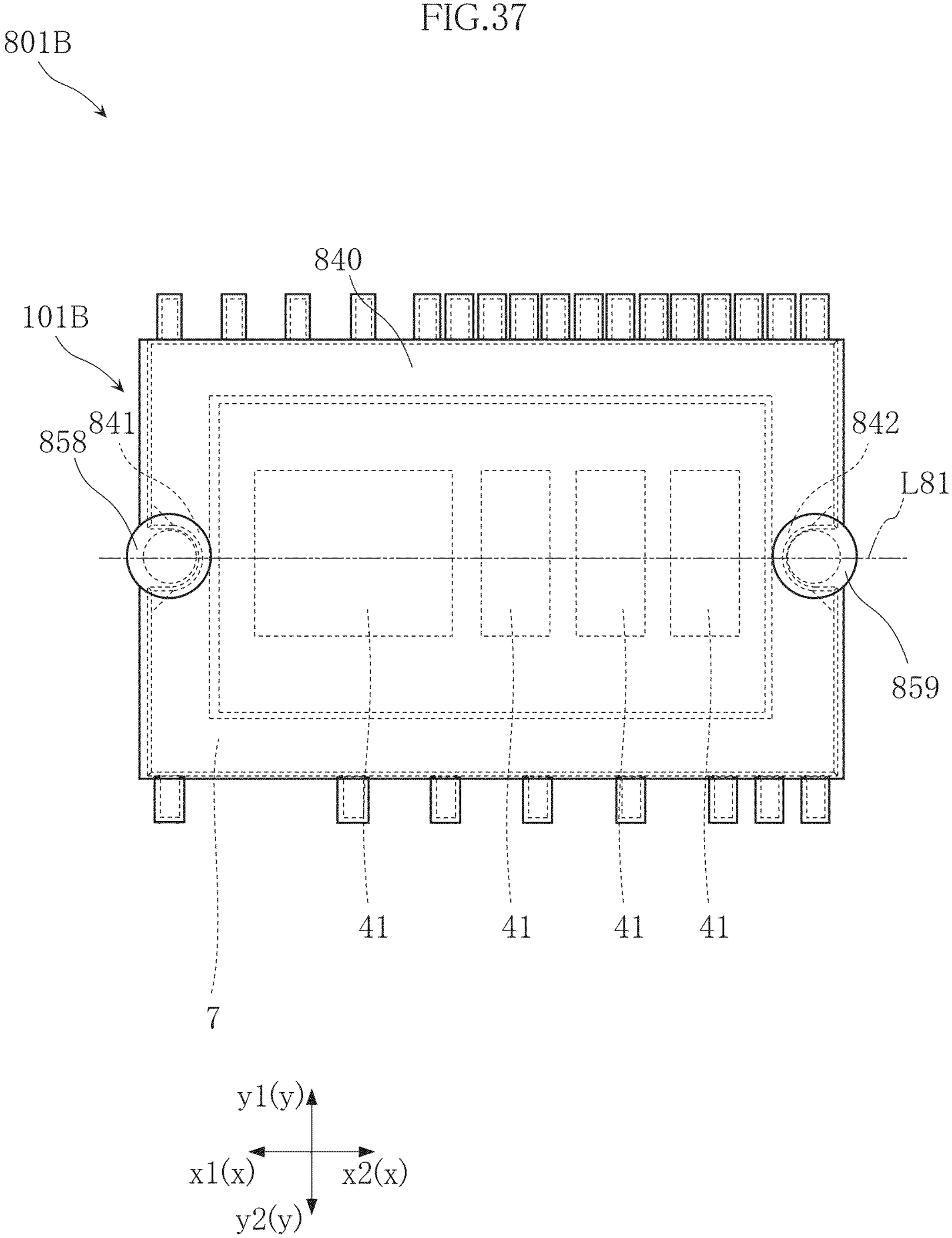
FIG. 37 is a plan view of a mount structure of a semiconductor device according to the 1B Embodiment.

The heat dissipating member 840, which is shown in FIGS. 35-37, is made of a material having a relatively high thermal conductivity, e.g. a metal such as aluminum. The heat dissipating member 840 is in contact with the semiconductor device 101B. More specifically, the heat dissipating member 840 is in contact with the heat dissipation plate 6 of the semiconductor device 101B. As shown in FIG. 37, the heat dissipating member 840 includes a first portion 841 and a second portion 842. The first portion 841 and the second portion 842 are spaced apart from each other as viewed toward the x-y plane. Each of the first portion 841 and the second portion 842 has a hole extending in the direction z. The first portion 841 and the second portion 842 are connected to each other by the straight line L81.

The first action member 858, which is shown in FIGS. 36 and 37, exerts a force on the first portion 841 of the heat dissipating member 840 toward the semiconductor device 101B in the direction z. In this embodiment, the first action member 858 is a screw penetrating the first portion 841. That is, the first action member 858 is inserted in the hole in the first portion 841 and applies a force to the first portion 841 in the direction z1. The first action member 858 is fixed to the mount board 811. Thus, the heat dissipating member 840 is fixed to the semiconductor device 101B and the mount board 811 while being in contact with the semiconductor device 101B. Unlike this embodiment, the first action member 858 may not be a screw separate from the heat dissipating member 840 but may be a part integrally formed on the heat dissipating member 840.

Similarly to the first action member 858, the second action member 859 exerts a force on the second portion 842 of the heat dissipating member 840 toward the semiconductor device 101B in the direction z. In this embodiment, the second action member 859 is a screw penetrating the second portion 842. That is, the second action member 859 is inserted in the hole in the second portion 842 and applies a force to the second portion 842 in the direction z1. The second action member 859 is fixed to the mount board 811. Thus, the heat dissipating member 840 is fixed to the semiconductor device 101B and the mount board 811 while being in contact with the semiconductor device 101B. Unlike this embodiment, the second action member 859 may not be a screw separate from the heat dissipating member 840 but may be a part integrally formed on the heat dissipating member 840.

A method for obtaining the mount structure 801B (i.e., a method for mounting the semiconductor device 101B to the mount board 811) is described below with reference to FIGS. 39 and 40.

Figure 39:
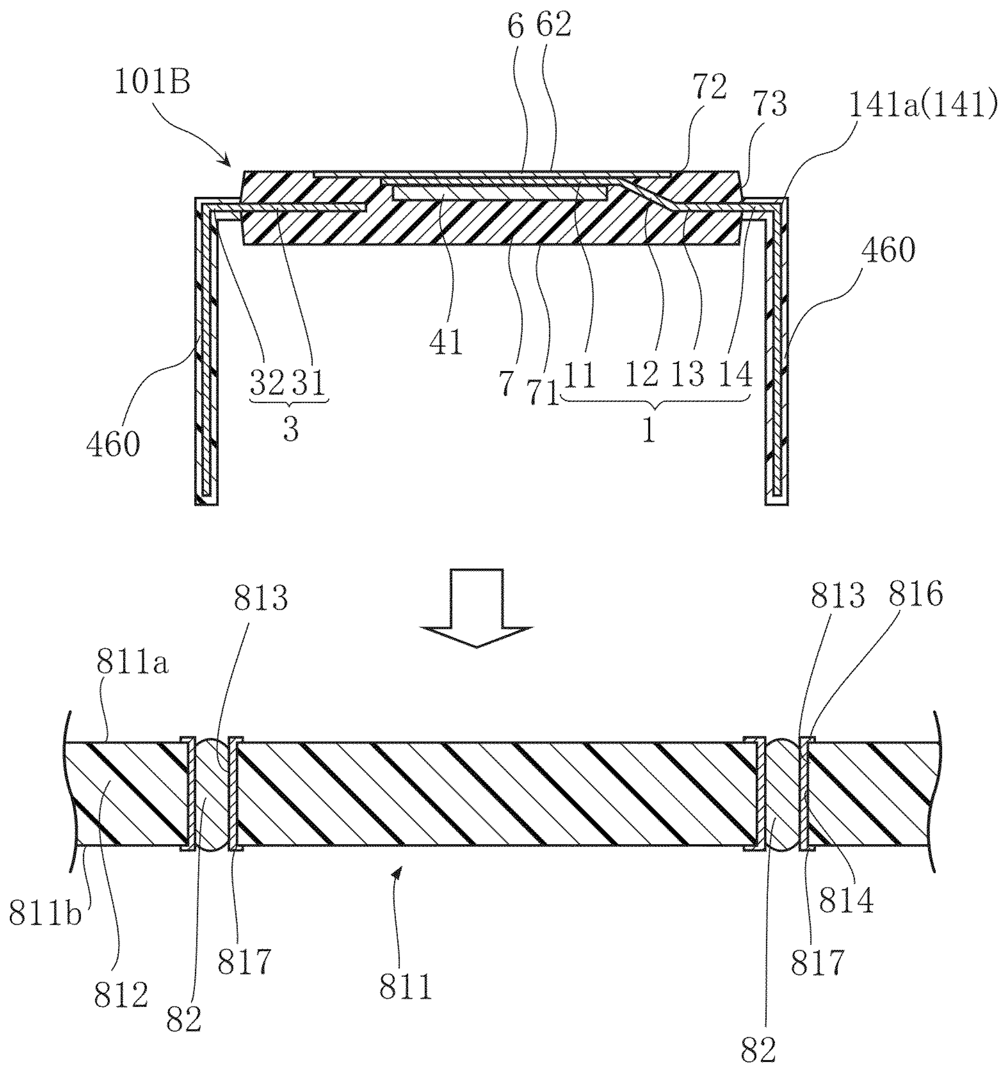
FIG. 39 is a sectional view showing a process step of mounting a semiconductor device of the 1B Embodiment to a mount board.
Figure 40:
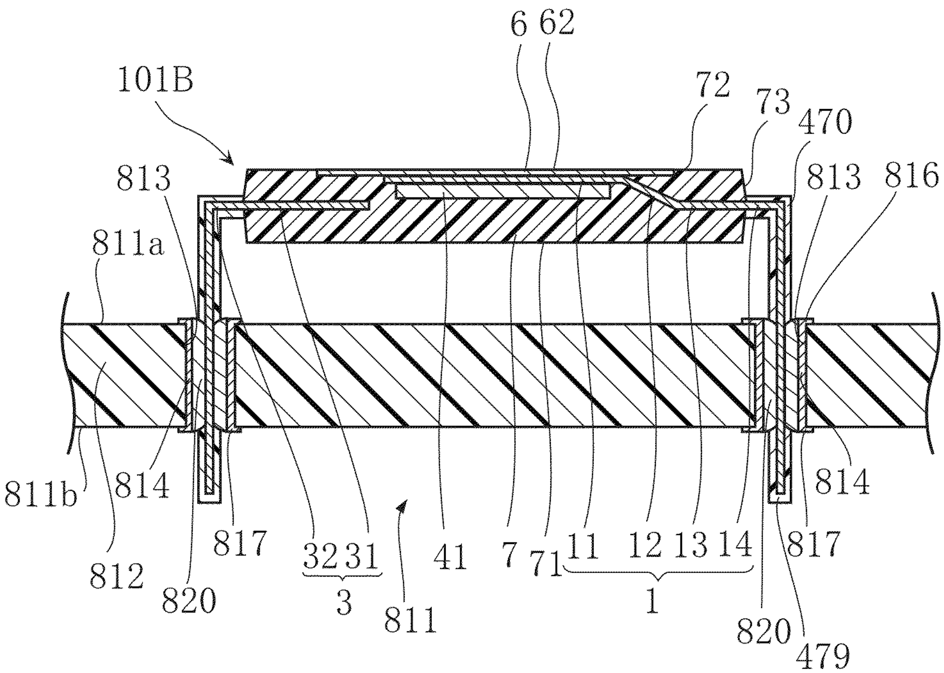
FIG. 40 is a sectional view showing the process step subsequent to FIG. 39.

First, a mount board 811 is prepared as shown in FIG. 39. Then, solder 82 is loaded into each through-hole 813 of the mount board 811. Then, the mount board 811 and the semiconductor device 101B are heated, whereby the solder 82 in the through-holes 813 of the mount board 811 is melt. Then, as shown in FIG. 40, the terminals 14, 24 and 32 are inserted into the through-holes 813 (terminals 24 are not shown in the figure). When the terminals 14, 24 and 32 are inserted in the through-holes 813, a part of the insulating film 460 covering each of the terminals 14, 24 and 32 is removed due to e.g. evaporation, whereby a part of each terminal 14, 24, 32 is exposed from the insulating film 460. Thus, each insulating film 460 is separated into a portion above the mount board 811 in FIG. 40 and a portion below the mount board 811 in FIG. 40. The portion of the insulating film 460 which is above the mount board 811 in FIG. 40 is the insulating film 470. The portion of the insulating film 460 which is below the mount board 811 in FIG. 40 is the insulating film 479. The solder 82 comes into contact with a portion of each terminal 14, 24, 32 which is exposed from the insulating film 460, and the insulating films 470, 479. The solder 82 solidifies to become the above-described solder layers 820. In this way, the semiconductor device 101B is fixed to the mount board 811.

Then, the heat dissipating member 840 is fixed to the semiconductor device 101B and the mount board 811 while being held in contact with the heat dissipation plate 6 of the semiconductor device 101B (not shown). In this way, the semiconductor device 101B is mounted to the mount board 811.

The advantages of this embodiment are described below.

As shown in FIG. 38, in the mount structure 801B, the semiconductor device 101B includes the insulating film 470*a*. The insulating film 470*a* is made of a flux and covers the first terminal 14*a*. According to this arrangement, the insulating film 470*a* intervenes between the first terminal 14*a* and the second terminal 14*b*. Moreover, in the mount structure 801B, the insulating film 470*a* is in contact with the solder layer 820*a*. According to this arrangement, it is not necessary to form a gap between the solder layer 820*a* and the insulating film 470*a*. Thus, it is not necessary to expose a portion of the first terminal 14*a* which is adjacent to the solder layer 820*a* through a gap between the solder layer 820*a* and the insulating film 470*a*. With this arrangement, dielectric breakdown is unlikely to occur between a portion of the first terminal 14*a* which is adjacent to the solder layer 820*a* and the second terminal 14*b* adjacent to the first terminal 14*a*.

Thus, the distance between the first terminal 14*a* and the second terminal 14*b* can be reduced, with the withstand voltage between the first terminal 14*a* and the second terminal 14*b* maintained.

In the mount structure 801B, the semiconductor device 101B includes the insulating film 470*b*. The insulating film 470*b* is made of a flux and covers the second terminal 14*b*. In the mount structure 801B, the insulating film 470*b* is in contact with the solder layer 820*b*. Thus, similarly to the above, dielectric breakdown is unlikely to occur between a portion of the second terminal 14*b* which is adjacent to the solder layer 820*b* and the first terminal 14*a* adjacent to the second terminal 14*b*. Thus, the distance between the first terminal 14*a* and the second terminal 14*b* can be reduced, with the withstand voltage between the first terminal 14*a* and the second terminal 14*b* maintained.

In this way, according to this embodiment, the distance between the first terminal 14*a* and the second terminal 14*b* can be reduced, with the withstand voltage between the first terminal 14*a* and the second terminal 14*b* maintained. Accordingly, the distance between any adjacent ones of the terminals 14 can be reduced, with the withstand voltage between the adjacent terminals 14 maintained. Thus, the semiconductor device 101B is suitable for size reduction.

In the mount structure 801B, the insulating film 470*a* is in contact with the sealing resin 7. According to this arrangement, the insulating film 470*a* covers the first terminal 14*a* from proximity to the portion covered by the solder layer 820*a* to a portion projecting from the sealing resin 7. This arrangement also contributes to the prevention of dielectric breakdown between the first terminal 14*a* and the second terminal 14*b*. In the mount structure 801B, the insulating film 470*b* is in contact with the sealing resin 7. This arrangement also contributes to the prevention of dielectric breakdown between the first terminal 14*a* and the second terminal 14*b*.

As shown in FIG. 38, the mount structure 801B includes the insulating film 479*a* made of a flux and surrounding the first terminal 14*a*. The insulating film 479*a* is on the opposite side of the insulating film 470*a* with respect to the mount board 811. The solder layer 820*a* is in contact with the insulating film 479*a*. According to this arrangement, for the same reason as described above, dielectric breakdown is unlikely to occur between the front end 148*a* of the first terminal 14*a* and the front end 148*b* of the second terminal 14*b*. Thus, the distance between the first terminal 14*a* and the second terminal 14*b* can be reduced, with the withstand voltage between the first terminal 14*a* and the second terminal 14*b* maintained. The mount structure 801B includes the insulating film 479*b* made of a flux and surrounding the second terminal 14*b*. The insulating film 479*b* is on the opposite side of the insulating film 470*b* with respect to the mount board 811. This arrangement also allows the distance between the first terminal 14*a* and the second terminal 14*b* to be reduced, with the withstand voltage between the first terminal 14*a* and the second terminal 14*b* maintained.

As described with reference to FIGS. 36 and 37, in the mount structure 801B, the first action member 858 exerts a force on the first portion 841 of the heat dissipating member 840 toward the semiconductor device 101B in the direction z. The second action member 859 exerts a force on the second portion 842 of the heat dissipating member 840 toward the semiconductor device 101B in the direction z. According to this arrangement, the portion of the heat dissipating member 840 which overlaps the straight line L81 connecting the first portion 841 and the second portion 842 is pressed against the semiconductor device 101B relatively strongly. Thus, among the area of the semiconductor device 101B which is in contact with the heat dissipating member 840, the portion overlapping the straight line L81 transfers heat relatively easily to the heat dissipating member 840. In the mount structure 801B, the semiconductor chips 41 are arranged along the straight line L81 so that each of the semiconductor chips is on the straight line L81. This arrangement is suitable to reduce the distance between the portion of the semiconductor device 101B which overlaps the straight line L81 and the semiconductor chips 41. This assures that heat generated at the semiconductor chips 41 is efficiently transferred to the heat dissipating member 840.

As shown in FIG. 20, in this embodiment, all of the semiconductor chips 41 are in the form of an elongated rectangle of which width direction corresponds to the direction in which the straight line L81 extends. According to this arrangement, as compared with an arrangement in which the semiconductor chips 41 are arranged so that its longitudinal direction corresponds to the direction in which the straight line L81 extends, a larger number of semiconductor chip 41 can be arranged within a given dimension along the straight line L81.

With reference to FIGS. 41-45, a variation of the semiconductor device (FIGS. 41-43) and a variation of the mount structure of a semiconductor device (FIGS. 44-45) are described. The semiconductor device 201B of this variation is a device for surface-mounting.

Figure 41:
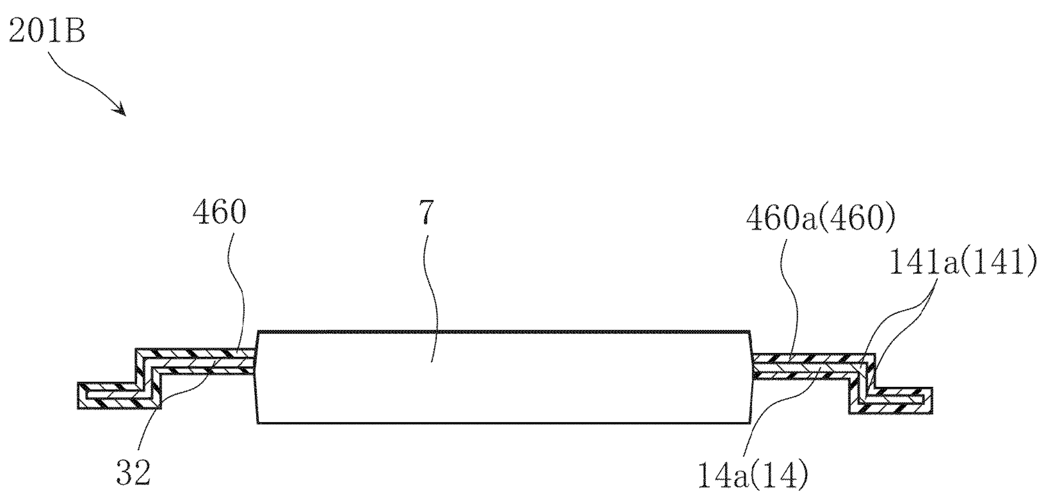
FIG. 41 is a sectional view of a semiconductor device according to a variation of the 1B Embodiment.
Figure 42:
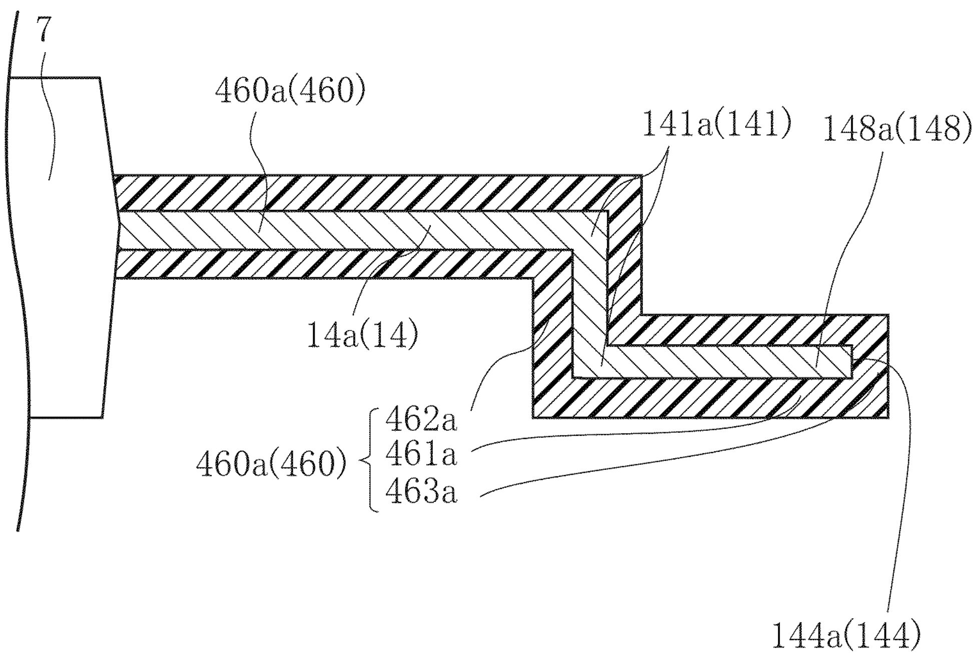
FIG. 42 is a partially enlarged sectional view of FIG. 41.
Figure 43:
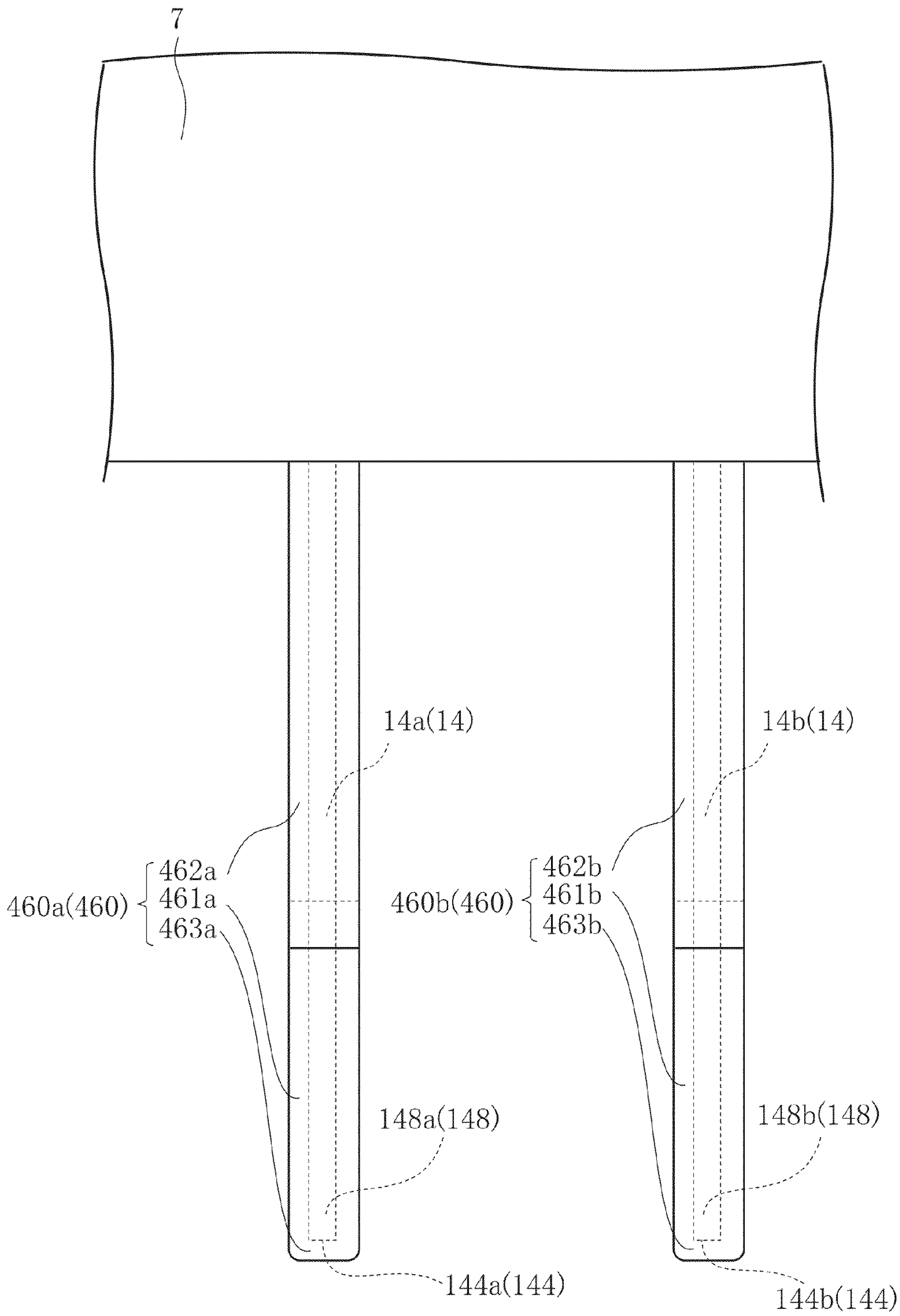
FIG. 43 is a partially enlarged plan view of a semiconductor device according to a variation of the 1B Embodiment.

Each terminal 14 shown in FIGS. 41-43 has two bent portions 141. That is, the first terminal 14*a* has two bent portions 141*a*, and the second terminal 14*b* has two bent portions 141*b*. In this embodiment again, each bent portion 141*a* is surrounded by the surrounding portion 462*a* of the first insulating film 460*a*. Similarly, each bent portion 141*b* is surrounded by the surrounding portion 462*b* of the second insulating film 460*b*.

Since the method for manufacturing the semiconductor device 201B is similar to that for manufacturing the semiconductor device 101B, description of the manufacturing method is omitted.

The mount structure 802B of the semiconductor device 201B is described below with reference to FIGS. 44-45.

The mount structure 802B of the semiconductor device 201B shown in these figures includes the semiconductor device 201B, a mount board 811 and a solder layer 820.

The mount board 811 has the same structure as that of the mount board 811 of the mount structure 801B except that it does not have through-holes 813. As shown in FIG. 45, in this variation, the principal surface electrodes 816 include a principal surface electrode 816*a* and a principal surface electrode 816*b*. The principal surface electrode 816*a* and the principal surface electrode 816*b* are insulated from each other.

The structure of the semiconductor device 201B after mounted on the mount board 811 is the same as that before mounted on the mount board 811 except that the insulating film 460 has become the insulating film 470. Thus, the elements other than the insulating film 47 are not explained.

Figure 45:
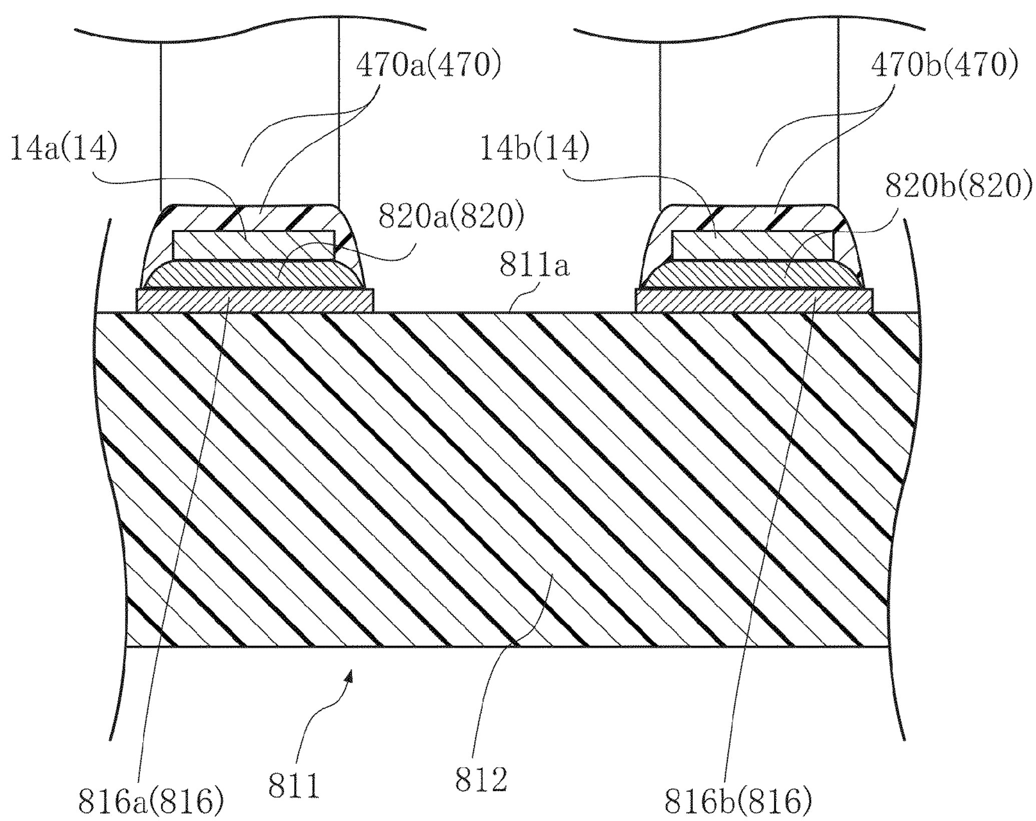
FIG. 45 is a partially enlarged sectional view of a mount structure of a semiconductor device according to a variation of the 1B Embodiment.

As shown in FIG. 45, in this embodiment again, the insulating film 470 include an insulating film 470*a* that covers the first terminal 14*a* and an insulating film 470*b* that covers the second terminal 14*b*. Hereinafter, of the insulating films 470, the insulating films 470*a* and 470*b* are explained. Since other insulating films 470 have the same structure as that of the insulating film 470*a* and 470*b*, explanation of these are omitted.

The insulating film 470*a* comes from the first insulating film 460*a*. The insulating film 470*a* is in contact with the sealing resin 7. The insulating film 470*b* comes from the second insulating film 460*b*. The insulating film 470*b* is in contact with the sealing resin 7. As shown in FIG. 45, a part of the insulating film 470*b* faces the insulating film 470*a*.

The solder layers 820 include a solder layer 820*a* between the first terminal 14*a* and the mount board 811. The solder layer 820*a* is in contact with the insulating film 470*a*. More specifically, the solder layer 820*a* is between the principal surface electrode 816*a* of the mount board 811 and the first terminal 14*a*.

The solder layers 820 include a solder layer 820*b* between the second terminal 14*b* and the mount board 811. The solder layer 820*b* is between the principal surface electrode 816*b* of the mount board 811 and the second terminal 14*b*.

A resist layer (not shown) may be provided on the principal surface electrode 816*b*.

A method for obtaining the mount structure 802B (i.e., a method for mounting the semiconductor device 201B to the mount board 811) is briefly described below.

Figure 44:
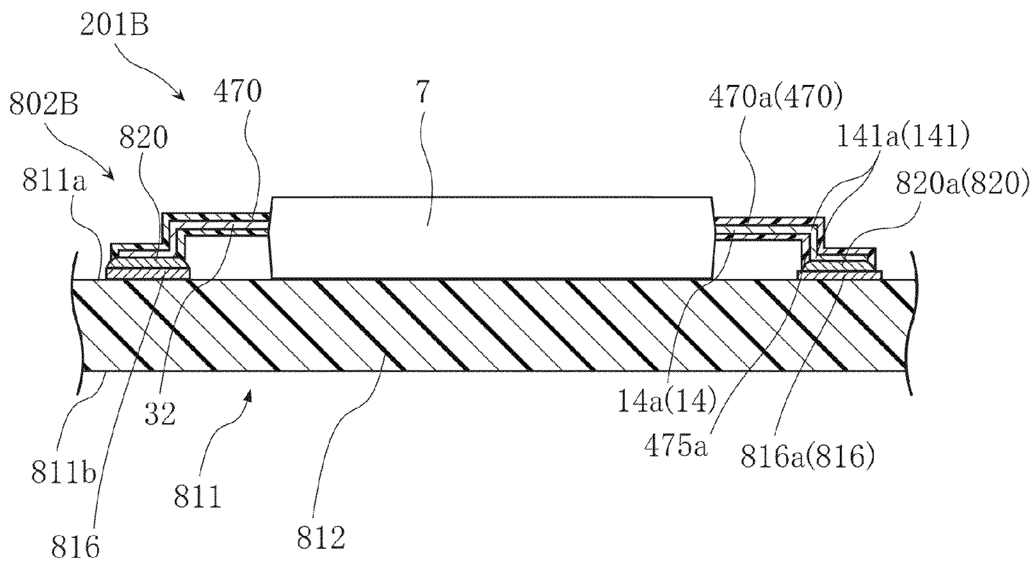
FIG. 44 is a sectional view of a mount structure of a semiconductor device according to a variation of the 1B Embodiment.

First, a mount board 811 shown in FIG. 44 is prepared. Then, solder is applied to the principal surface electrode 816 of the mount board 811. Then, the mount board 811 and the semiconductor device 201B are heated, whereby the solder is melt. Then, the terminals 14 are bonded to the principal surface electrodes 816 via the solder. (Since the terminals 24 and 32 are bonded in a similar way, explanation of these will be omitted. This holds true hereinafter.) As a result, a part of the insulating film 460 covering each of the terminals 14 is removed due to e.g. evaporation, whereby a part of each terminal 14 is exposed from the insulating film 460. The solder comes into contact with a portion of each terminal 14 which is exposed from the insulating film 460 and the principal surface electrode 816. The solder 82 solidifies to become the above-described solder layers 820. In this way, the semiconductor device 201B is mounted to the mount board 811.

The advantages of this embodiment are described below.

As shown in FIG. 45, in the mount structure 802B, the semiconductor device 201B includes the insulating film 470*a*. The insulating film 470*a* is made of a flux and covers the first terminal 14*a*. According to this arrangement, the insulating film 470*a* intervenes between the first terminal 14*a* and the second terminal 14*b*. Moreover, in the mount structure 802B, the insulating film 470*a* is in contact with the solder layer 820*a*. According to this arrangement, it is not necessary to form a gap between the solder layer 820*a* and the insulating film 470*a*. Thus, it is not necessary to expose a portion of the first terminal 14*a* which is adjacent to the solder layer 820*a* through a gap between the solder layer 820*a* and the insulating film 470*a*. With this arrangement, dielectric breakdown is unlikely to occur between a portion of the first terminal 14*a* which is adjacent to the solder layer 820*a* and the second terminal 14*b* adjacent to the first terminal 14*a*. Thus, the distance between the first terminal 14*a* and the second terminal 14*b* can be reduced, with the withstand voltage between the first terminal 14*a* and the second terminal 14*b* maintained.

In the mount structure 802B, as shown in FIG. 45, the semiconductor device 201B includes the insulating film 470*b*. The insulating film 470*b* is made of a flux and covers the second terminal 14*b*. In the mount structure 802B, the insulating film 470*b* is in contact with the solder layer 820*b*. Thus, similarly to the above, dielectric breakdown is unlikely to occur between a portion of the second terminal 14*b* which is adjacent to the solder layer 820*b* and the first terminal 14*a* adjacent to the second terminal 14*b*. Thus, the distance between the first terminal 14*a* and the second terminal 14*b* can be reduced, with the withstand voltage between the first terminal 14*a* and the second terminal 14*b* maintained.

In this way, according to this embodiment, the distance between the first terminal 14*a* and the second terminal 14*b* can be reduced, with the withstand voltage between the first terminal 14*a* and the second terminal 14*b* maintained. Thus, the distance between any adjacent ones of the terminals 14 can be reduced, with the withstand voltage between the adjacent terminals 14 maintained. Thus, the semiconductor device 201B is suitable for size reduction.

As shown in FIG. 44, in the mount structure 802B, the insulating film 470*a* is in contact with the sealing resin 7. For the same reason as that described with respect to the mount structure 801B, this arrangement also contributes to the prevention of dielectric breakdown between the first terminal 14*a* and the second terminal 14*b*. In the mount structure 802B, the insulating film 470*b* is in contact with the sealing resin 7. This arrangement also contributes to the prevention of dielectric breakdown between the first terminal 14*a* and the second terminal 14*b*.

Other embodiments of the variation of the present invention are described below. In the figures used below, the elements that are identical or similar to those of the foregoing embodiment are designated by the same reference signs as those used for the foregoing embodiment.

2B Embodiment

The 2B Embodiment of the variation of the present invention is described below with reference to FIGS. 46-48.

Figure 46:
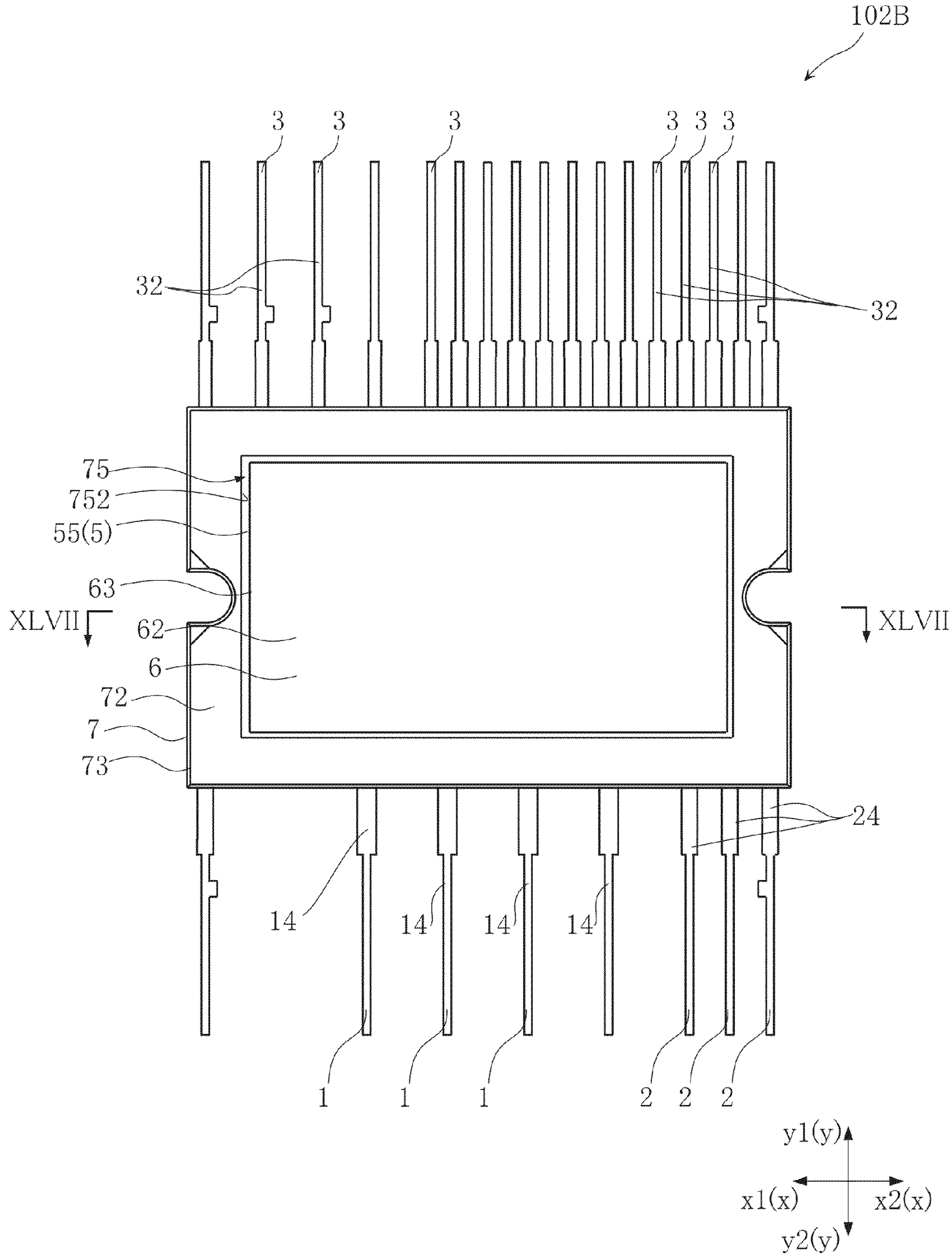
FIG. 46 is a bottom view of a semiconductor device according to the 2B Embodiment.
Figure 47:
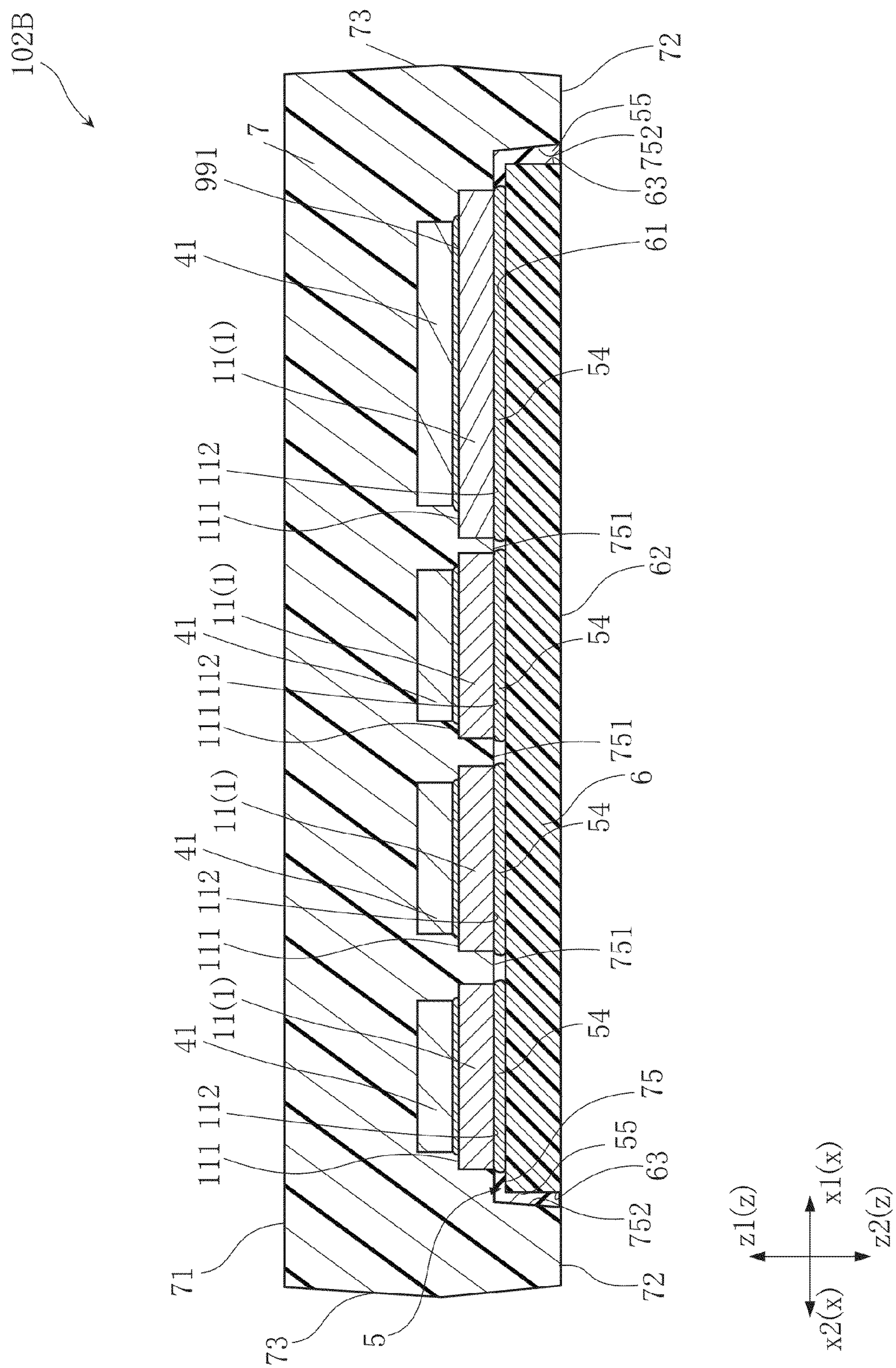
FIG. 47 is a sectional view taken along lines XLVII-XLVII in FIG. 46.
Figure 48:
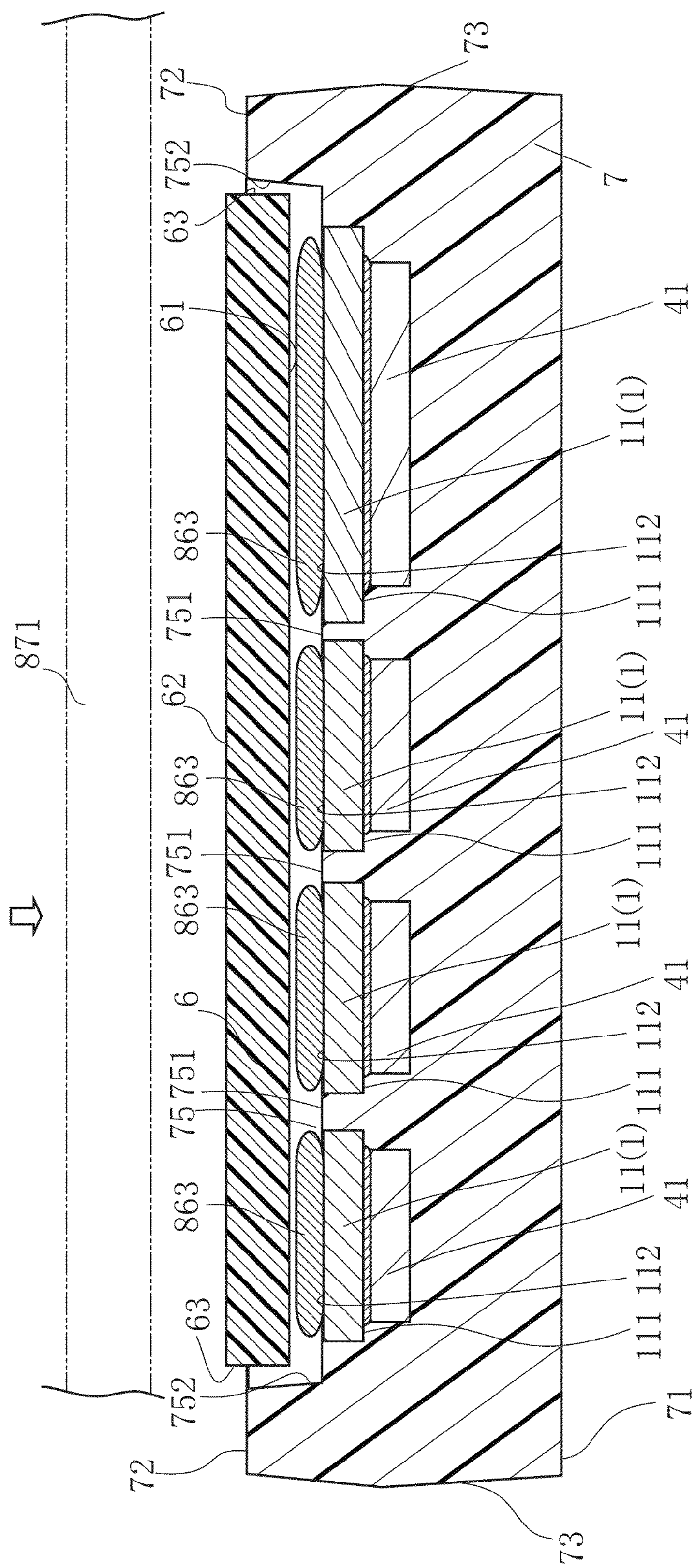
FIG. 48 is a sectional view showing a process step of a semiconductor device according to the 2B Embodiment.

Since the elements other than the intermediate layer 5 and the heat dissipation plate 6 of the semiconductor device 102B shown in FIGS. 46 and 47 have the same structure as those of the semiconductor device 101B, description of these elements is omitted.

In the semiconductor device 102B, the heat dissipation plate 6 is arranged in the recess 75 of the sealing resin 7. The heat dissipation plate 6 is in the form of a plate extending along the x-y plane. The heat dissipation plate 6 is provided to quickly dissipate the heat generated at the semiconductor chips 41 to the outside of the semiconductor device 102B. In this embodiment, the heat dissipation plate 6 has insulating properties. Examples of the insulating material for forming the heat dissipation plate 6 include a ceramic material such as alumina, aluminum nitride or silicon nitride. Similarly to the 1B embodiment, as viewed toward the x-y plane, the heat dissipation plate 6 overlaps the entirety of each die pad 11.

The heat dissipation plate 6 has a first surface 61, a second surface 62 and a side surface 63. Since the first surface 61, the second surface 62 and the side surface 63 are the same as those of the semiconductor device 101B, description of these portions are omitted.

The intermediate layer 5 is between the heat dissipation plate 6 and the sealing resin 7. The intermediate layer 5 includes a plurality of first portion 54 and an insulating portion 55.

In this embodiment, the first portions 54 are made of a conductor. Examples of the conductor include silver, gold and copper. Each of the first portions 54 is made of metal paste. Each of the first portions 54 bonds one of the die pads 11 and the heat dissipation plate 6 and is between the die pad 11 and the heat dissipation plate 6. The first portion 54 is in contact with the second surface 112 of the die pad 11 and the first surface 61 of the heat dissipation plate 6. The first portions 54 are spaced apart from each other so that the die pads 11 are not electrically connected to each other via the first portions 54.

The insulating portion 55 bonds the recess side surface 752 and the heat dissipation plate 6 and is between the recess side surface 752 and the heat dissipation plate 6. The insulating portion 55 is exposed to the direction z2 side. The insulating portion 55 is in contact with the recess side surface 752 and the side surface 63 of the heat dissipation plate 6. The insulating portion 55 is made of a resin such as epoxy. The intermediate layer 5 may not include the insulating portion 55.

A method for manufacturing the semiconductor device 102B is described below.

First, the product shown in FIG. 46 is made by the same process as described in the 1B embodiment. Then, as shown in FIG. 48, the heat dissipation plate 6 is pressed by a plate member 871 against the die pads 11, with metal paste 863 as an adhesive layer sandwiched between them. Thereafter, the metal paste 863 is allowed to harden to become the above-described first portions 54. In this way, the heat dissipation plate 6 is bonded to the die pads 11.

Then, the insulating portion 55 (see FIG. 47) of the intermediate layer 5 is formed by e.g. loading resin paste into the space between the side surface 63 of the heat dissipation plate 6 and the recess side surface 752. Then, similarly to the 1B embodiment, the lead frame 300 is cut, whereby the semiconductor device 102B shown in FIG. 47 and so on is obtained.

In this embodiment, after the formation of the sealing resin 7, the heat dissipation plate 6 is bonded to the die pads 11 by pressing the heat dissipation plate 6 against the die pads 11, with the metal paste 863 as an adhesive layer sandwiched between them. According to this arrangement again, because of the same reason as those described in the 1B embodiment, size reduction of the semiconductor device can be achieved.

Since the heat dissipation plate 6 is made of a ceramic material, the heat dissipation plate 6 may break if a strong force is applied to the heat dissipation plate 6. However, by arranging the semiconductor chips 41 along the straight line L81 as described with respect to the 1B embodiment, the heat generated at the semiconductor chips 41 is efficiently transferred to the heat dissipating member 8 even when the heat dissipating member 840 is not strongly pressed against the heat dissipation plate 6.

This embodiment provides the same advantages as those of the 1B embodiment.

Figure 49:
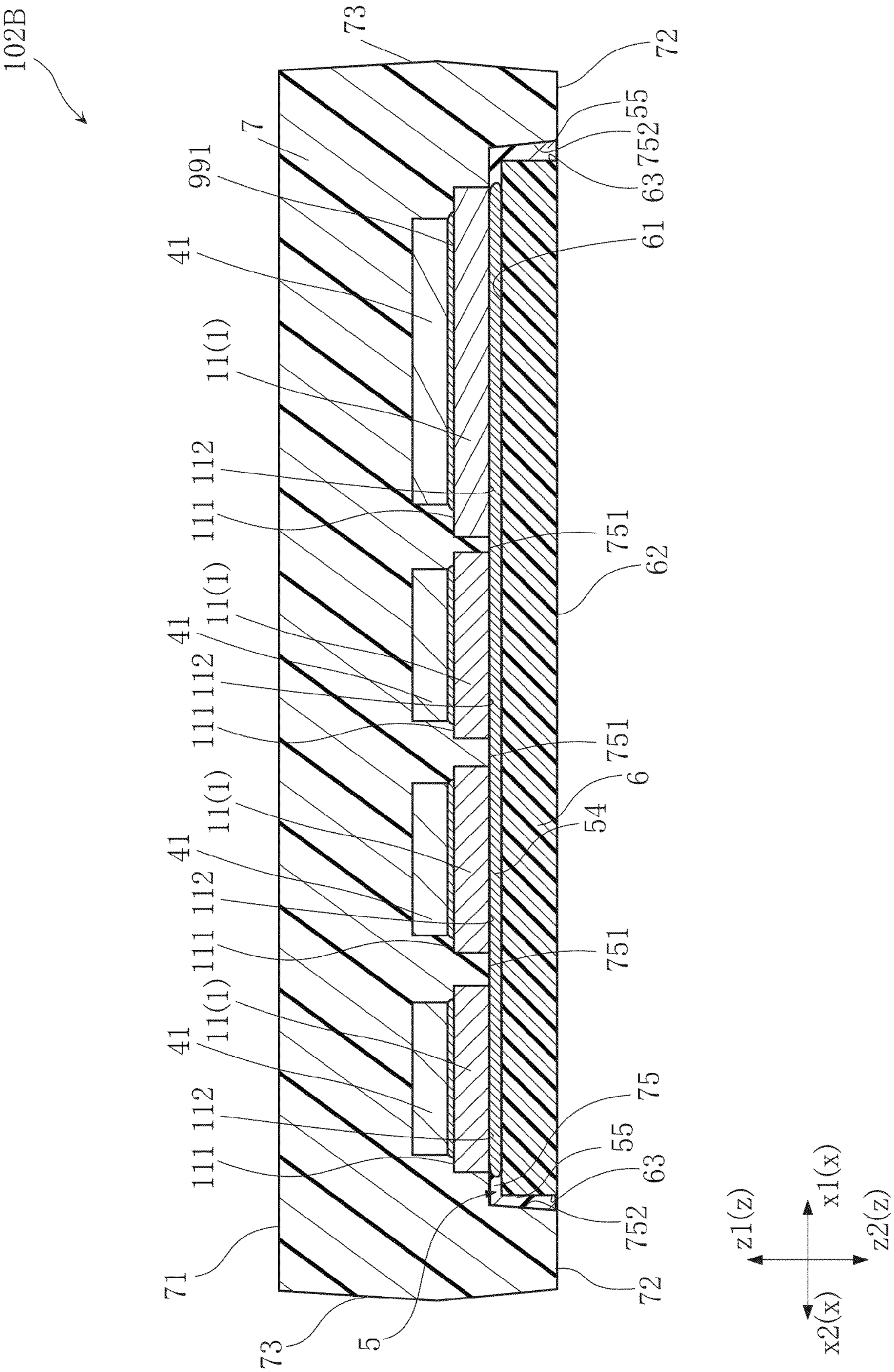
FIG. 49 is a sectional view of a semiconductor device according to a variation of the 2B Embodiment.
Figure 50:
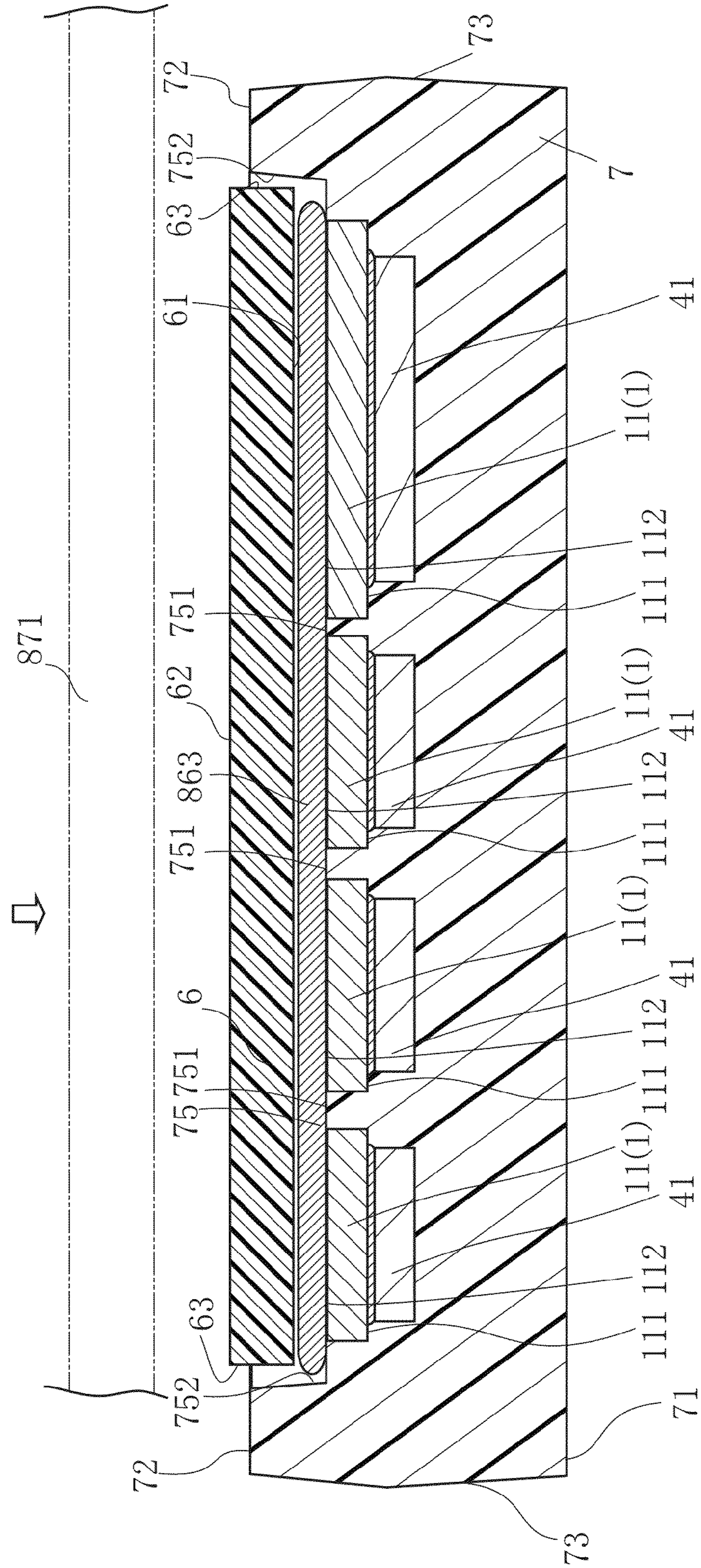
FIG. 50 is a sectional view showing a process step of a method for manufacturing a semiconductor device according to a variation of the 2B Embodiment.

FIG. 49 is a sectional view of a semiconductor device according to a variation of this embodiment. The semiconductor device 102B shown in this figure differs from the semiconductor device 102B shown in FIG. 47 in that the intermediate layer 5 includes not a plurality of first portions 54 but a single first portion 54. The first portion 54 of this variation is bonded to a plurality of die pads 11. To make the semiconductor device 102B of this variation, metal paste 863 as an adhesive layer is applied to a plurality of die pads 11 as shown in FIG. 50. Alternatively, metal paste 863 as an adhesive layer may be applied to the substantial entirety of the first surface 61 of the heat dissipation plate 6. Then, the heat dissipation plate 6 is pressed by a plate member 871 against the die pads 11, with the metal paste 863 as an adhesive layer sandwiched between them. Thereafter, the metal paste 863 is allowed to harden to become the above-described first portion 54. According to this arrangement again, the same advantages as those of the semiconductor device 102B shown in FIG. 47 are obtained.

3B Embodiment

Figure 51:
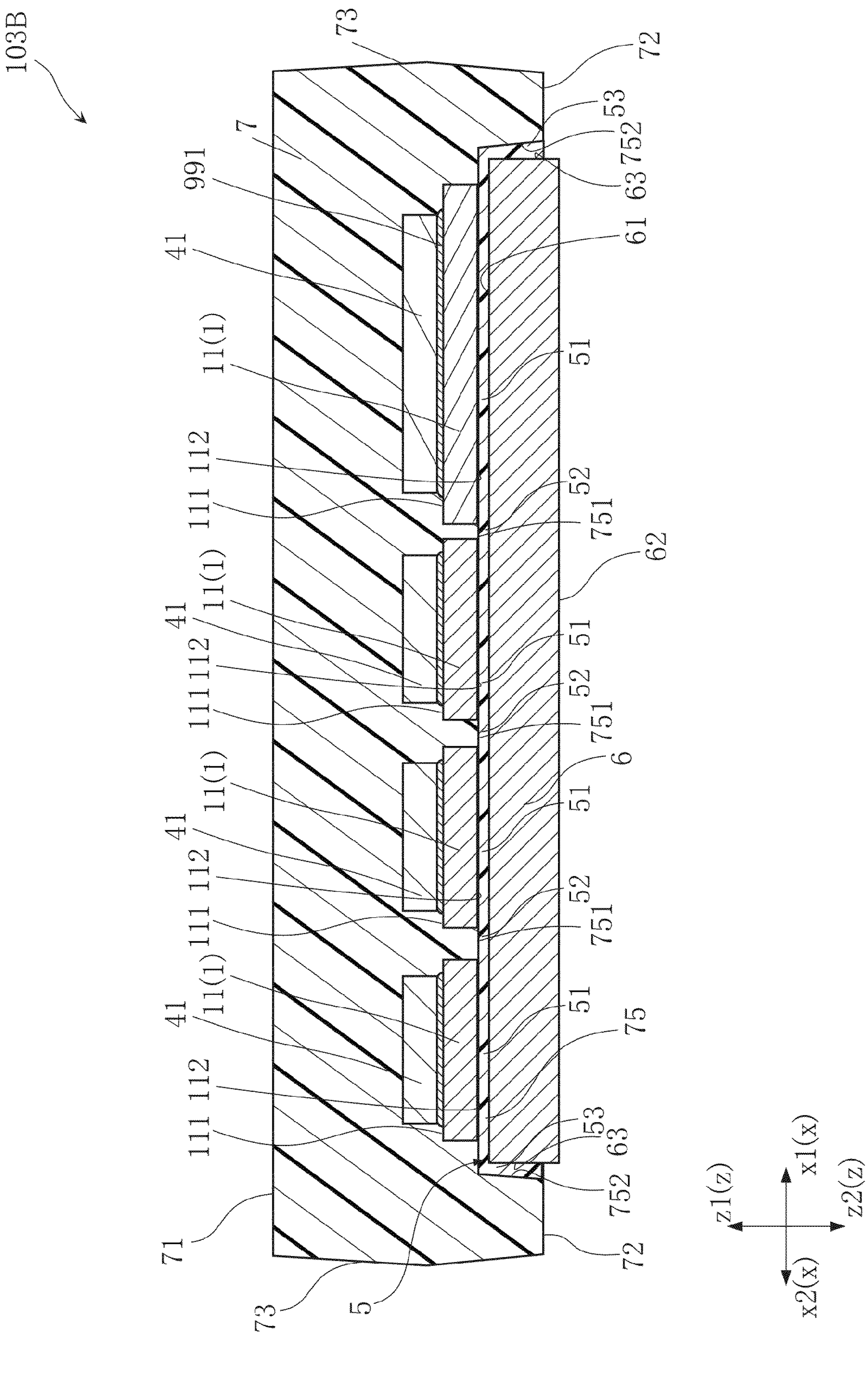
FIG. 51 is a sectional view of a semiconductor device according to the 3B Embodiment.

The 3B Embodiment of the variation of the present invention is described below with reference to FIG. 51.

The semiconductor device 103B shown in this figure differs from the semiconductor device 101B in that a part of the heat dissipation plate 6 projects from the resin bottom surface 72. In the semiconductor device 103B, the second surface 62 of the heat dissipation plate 6 projects from the resin bottom surface 72. According to this arrangement, the heat dissipating member 840 shown in FIGS. 35-37 does not easily come into contact with the resin bottom surface 72, and the second surface 62 of the heat dissipation plate 6 easily comes into contact with the heat dissipating member 840. Thus, the heat transferred from the semiconductor chips 41 to the heat dissipation plate 6 is efficiently transferred to the heat dissipating member 80. The arrangement of this embodiment may be employed in the semiconductor device 102B.

4B Embodiment

Figure 52:
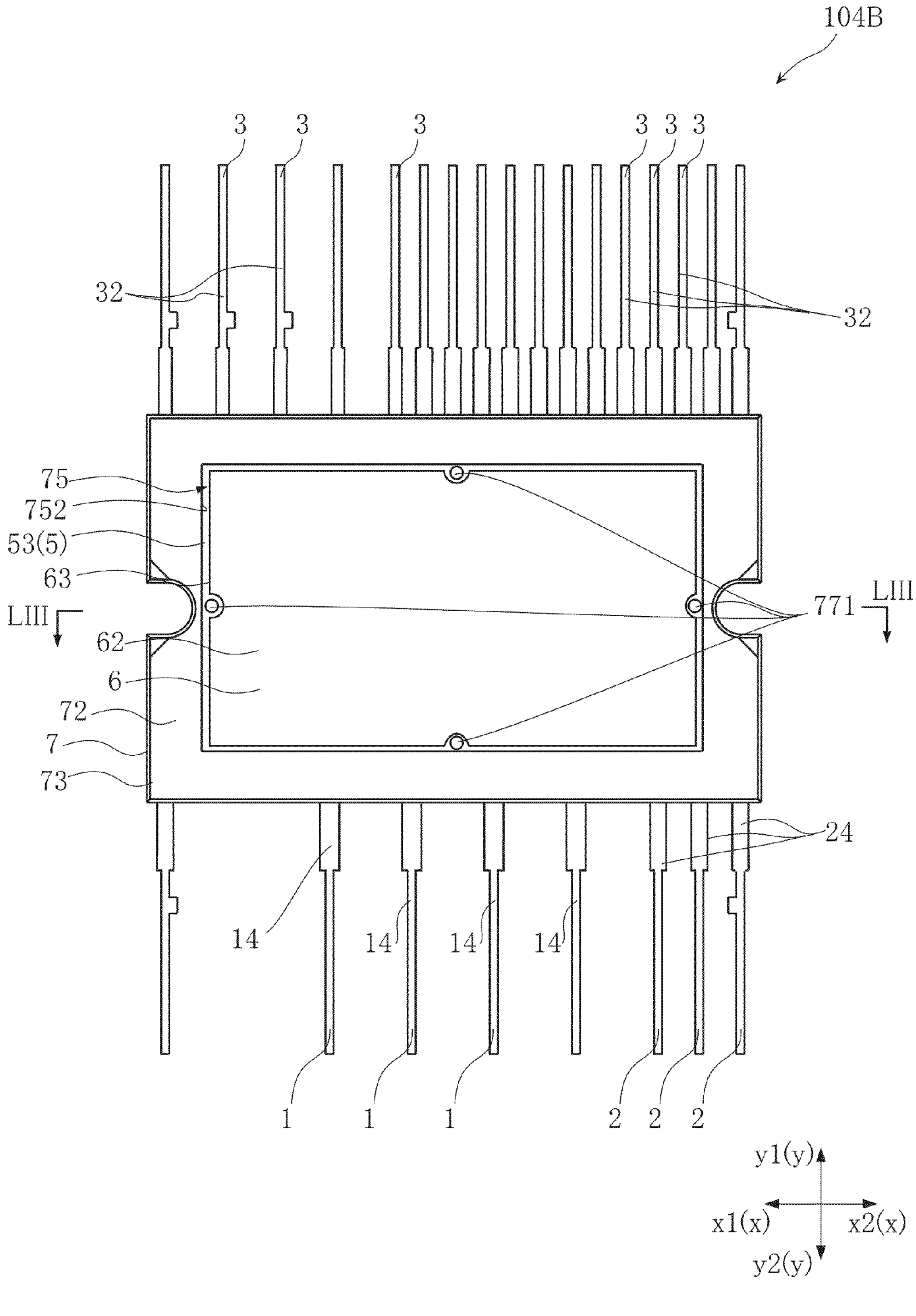
FIG. 52 is a bottom view of a semiconductor device according to the 4B Embodiment.
Figure 53:
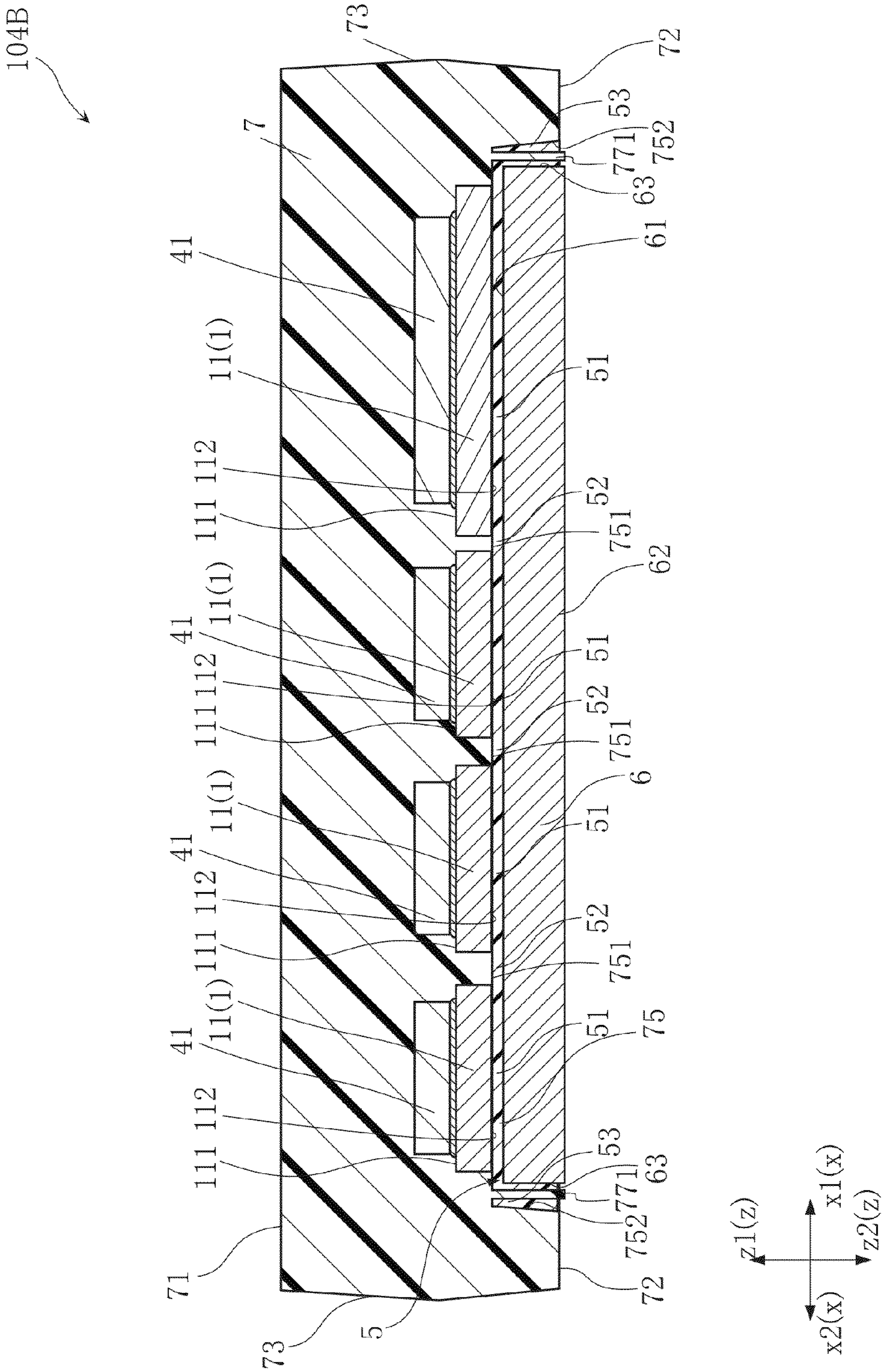
FIG. 53 is a sectional view taken along lines LIII-LIII in FIG. 52.

The 4B Embodiment of the variation of the present invention is described below with reference to FIGS. 52 and 53.

Figure 54:
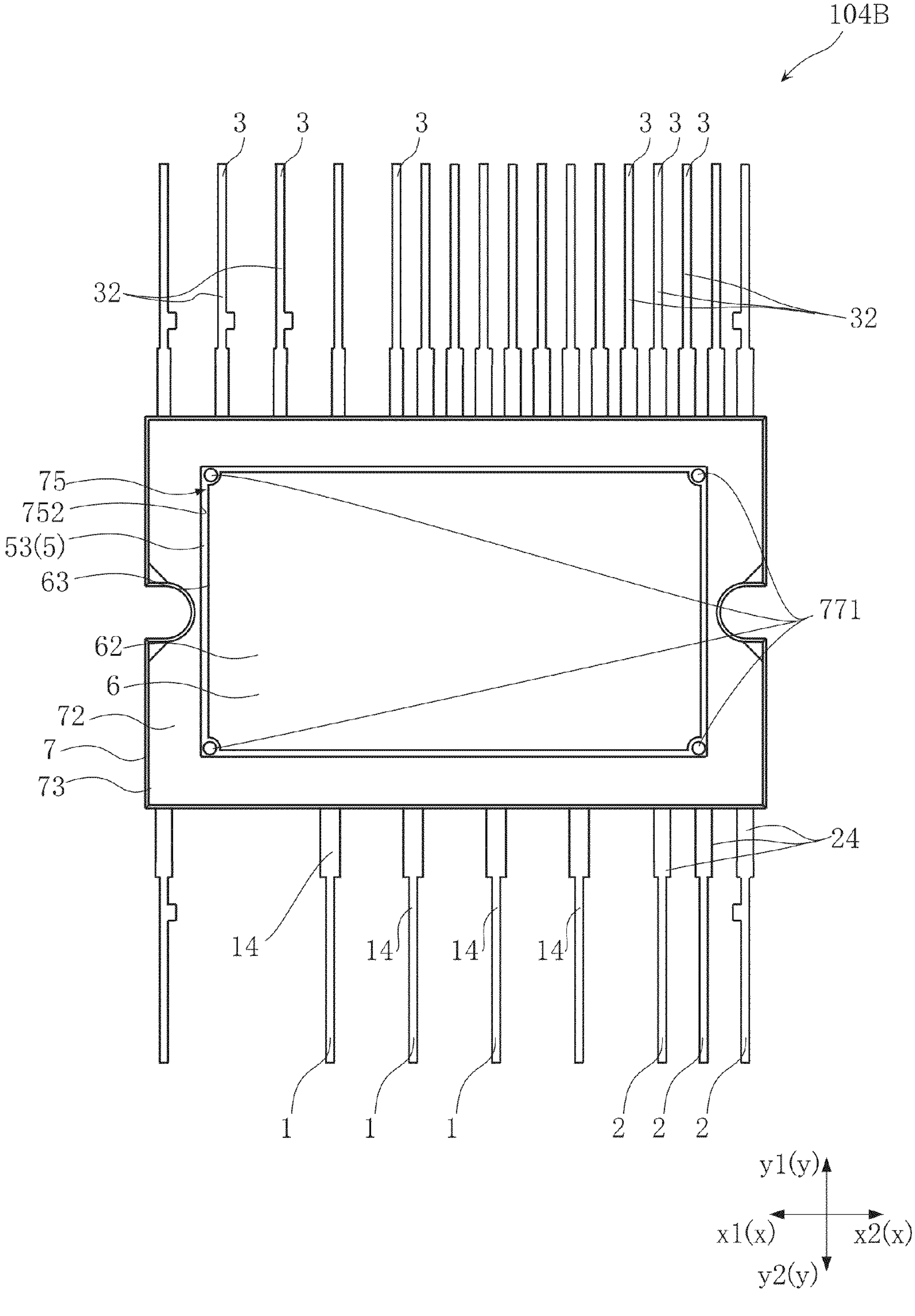
FIG. 54 is a bottom view of a semiconductor device according to a variation of the 4B Embodiment.

The semiconductor device 104B shown in these figures differs from the semiconductor device 101B in that the sealing resin 7 includes a plurality of bar portions 771. Each of the bar portions 771 is provided between the side surface 63 of the heat dissipation plate 6 and the recess side surface 752. In the semiconductor device 104B, in the direction z, the end of each bar portion 771 on the direction z2 side is at the same position as the second surface 62 of the heat dissipation plate 6. According to this arrangement, the plate member 871 shown in FIG. 33 pushes the heat dissipation plate 6 toward the recess bottom surface 751 until it comes into contact with the bar portions 771. After the plate member 871 comes into contact with the bar portions 771, the plate member 871 does not push the heat dissipation plate 6 toward the recess bottom surface 751 Thus, the position and posture of the heat dissipation plate 6 in the semiconductor device 104B are determined by the position of the end of each bar portion 771. This allows the heat dissipation plate 6 to be set in the semiconductor device 104B at a desired position with a desired posture. As shown in FIG. 54, the bar portions 771 may be set at four corners of the heat dissipation plate 6.

5B Embodiment

Figure 55:
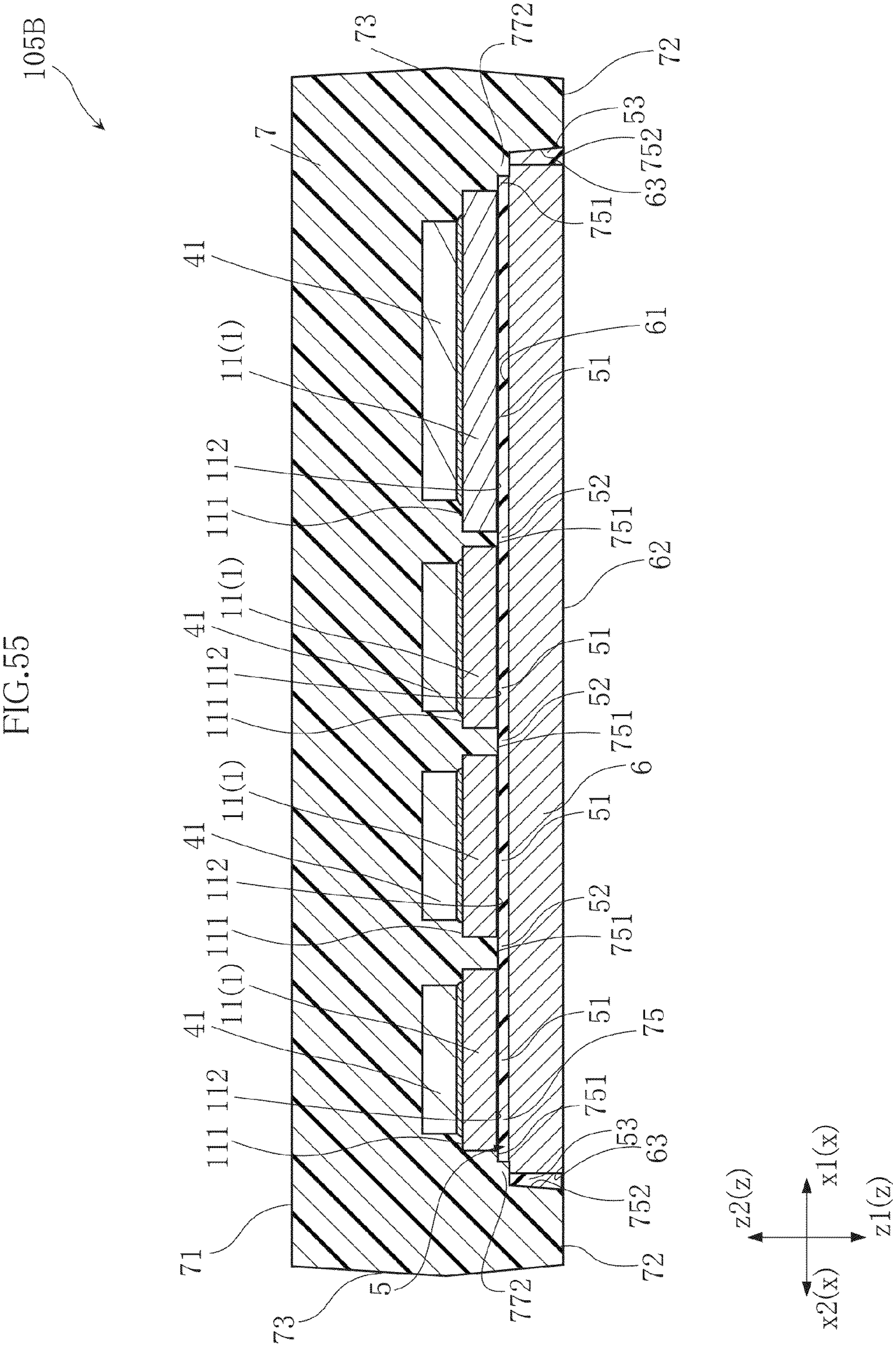
FIG. 55 is a sectional view of a semiconductor device according to the 5B Embodiment.

The 5B embodiment of the variation of the present invention is described below with reference to FIG. 55.

The semiconductor device 105B shown in the figure differs from the semiconductor device 101B in that the sealing resin 7 includes a projection 772 projecting from the recess bottom surface 751 and that the projection 772 is in contact with the heat dissipation plate 6. According to this arrangement, in pressing the heat dissipation plate 6 against the die pads 11, the movement of the heat dissipation plate 6 toward the die pads 11 is stopped by the projection 772 after the heat dissipation plate 6 comes into contact with the projection 772. Thus, after the heat dissipation plate 6 comes into contact with the projection 772, the heat dissipation plate 6 does not get closer to the die pads 11. Thus, the position and posture of the heat dissipation plate 6 in the semiconductor device 105B are determined by the projection 772. This allows the heat dissipation plate 6 to be set in the semiconductor device 105B at a desired position with a desired posture.

This variation invention is not limited to the foregoing embodiments. The specific structure of the variation can be varied in design in many ways. The intermediate layer may comprise a composite material or the heat dissipation plate may comprise a composite material. The semiconductor device may be provided with a plurality of heat dissipation plates.

An insulating tube may be fitted to the first terminal 14*a* at a portion adjacent to the sealing resin 7, and an insulating film of a flux may be formed on the first terminal 14*a* at a portion closer to the front end than the portion to which the insulating tube is fitted is. An insulating film made of a flux can be formed not only on a terminal of a DIP type or SOP type semiconductor device but also on a terminal of a QFN type or ball mount type semiconductor device.

Although the heat dissipation plate is attached after the sealing resin is formed in the above-described examples, the sealing resin may be formed after the heat dissipation plate is attached.

The variation of the present invention is summarized below.

(Appendix 1)

A semiconductor device comprising:

a semiconductor chip;

a sealing resin covering the semiconductor chip;

a plurality of terminals exposed from the sealing resin; and a first insulating film made of a flux and covering a first terminal, the first terminal being one of said terminals.

(Appendix 2)

The semiconductor device as set forth in Appendix 1, wherein the terminals extend out of the sealing resin and are arranged in parallel to each other, and the first insulating film includes a first surrounding portion, the first surrounding portion surrounding a front end of the first terminal in a direction in which the first terminal extends from the sealing resin.

(Appendix 3)

The semiconductor device as set forth in Appendix 2, wherein the first insulating film includes a second surrounding portion surrounding the first terminal, the second surrounding portion being connected to the first surrounding portion and in contact with the sealing resin.

(Appendix 4)

The semiconductor device as set forth in Appendix 3, wherein the first terminal includes a bent portion surrounded by the second surrounding portion.

(Appendix 5)

The semiconductor device as set forth in any one of Appendixes 2-4, further comprising a second insulating film made of a flux, wherein the second insulating film includes an additional surrounding portion surrounding a front end of a second terminal in a direction in which the second terminal extends from the sealing resin, the second terminal being one of said terminals, the additional surrounding portion including a portion facing the first surrounding portion via a gap.

(Appendix 6)

A semiconductor device mount structure comprising:

a semiconductor device;

a mount board to which the semiconductor device is mounted; and a solder layer;

the semiconductor device including:

a semiconductor chip;

a sealing resin covering the semiconductor chip;

a plurality of terminals exposed from the sealing resin; and a first insulating film made of a flux and covering a first terminal, the first terminal being one of said terminals, wherein the solder layer is between the first terminal and the mount board and in contact with the first insulating film.

(Appendix 7)

The semiconductor device mount structure as set forth in Appendix 6, wherein the terminals extend out of the sealing resin and are arranged in parallel to each other, and the first insulating film includes a portion surrounding the first terminal.

(Appendix 8)

The semiconductor device mount structure as set forth in Appendix 7, wherein the first insulating film is in contact with the sealing resin.

(Appendix 9)

The semiconductor device mount structure as set forth in Appendix 8, wherein the first terminal includes a bent portion surrounded by the first insulating film.

(Appendix 10)

The semiconductor device mount structure as set forth in any one of Appendixes 7-9, further comprising: a second insulating film made of a flux; and an additional solder layer, wherein the second insulating film surrounds a second terminal and includes a portion facing the first insulating film, the second terminal being one of said terminals, and the additional solder layer is between the second terminal and the mount board and in contact with the second insulating film.

(Appendix 11)

The semiconductor device mount structure as set forth in any one of Appendixes 7-10, wherein the mount board includes a through-hole in which the solder layer is formed, and the first terminal extends through the through-hole.

(Appendix 12)

The semiconductor device mount structure as set forth in any one of Appendixes 7-11, further comprising an additional insulating film made of a flux and surrounding the first terminal, wherein the additional insulating film is on an opposite side of the first insulating film with respect to the mount board, and the solder layer is in contact with the additional insulating film.

(Appendix 13)

The semiconductor device mount structure as set forth in any one of Appendixes 6-10, wherein the mount board includes a principal surface to which the semiconductor device is disposed, and the solder layer is between the principal surface and the first terminal.

(Appendix 14)

A method for manufacturing a semiconductor device, the method comprising the steps of:

disposing a semiconductor chip on a lead frame;

sealing a part of the lead frame and the semiconductor chip with sealing resin;

cutting the lead frame to provide a plurality of terminals extending out of the sealing resin; and forming an insulating film of a flux to surround a front end of a first terminal in a direction in which the first terminal extends from the sealing resin, the first terminal being one of said terminals.

(Appendix 15)

The method for manufacturing a semiconductor device as set forth in Appendix 14, wherein the step of forming the insulating film comprises bringing the insulating film into contact with the sealing resin.

(Appendix 16)

The method for manufacturing a semiconductor device as set forth in Appendix 15, further comprising the step of bending the terminals after the terminals are formed, wherein the step of forming the insulating film is performed after the step of bending the terminals.

Another aspect of the variation of the present invention is summarized below.

(Appendix 1)

A semiconductor device mount structure comprising:

a mount board;

a semiconductor device mounted to the mount board;

a heat dissipating member including a first portion and a second portion spaced apart from each other as viewed in a thickness direction of the mount board, the heat dissipating member being in contact with the semiconductor device;

a first action member that exerts a force on the first portion toward the semiconductor device in the thickness direction; and a second action member that exerts a force on the second portion toward the semiconductor device in the thickness direction;

wherein the semiconductor device includes a plurality of semiconductor chips arranged along a straight line connecting the first portion and the second portion so that each of the semiconductor chips is on the straight line, as viewed in the thickness direction.

(Appendix 2)

The semiconductor device mount structure as set forth in Appendix 1, each of the semiconductor chips includes a plurality of functional element portions.

(Appendix 3)

The semiconductor device mount structure as set forth in Appendix 1 or 2, wherein one of the semiconductor chips is in a form of an elongated rectangle as viewed in the thickness direction, a width direction of the elongated rectangle corresponding to a direction in which the straight line extends.

(Appendix 4)

The semiconductor device mount structure as set forth in any one of Appendixes 1-3, wherein the semiconductor device includes:

a die pad on which one of the semiconductor chips is disposed;

a heat dissipation plate arranged between the die pad and the heat dissipating member; and a sealing resin covering the semiconductor chips, the die pad and the heat dissipation plate, the heat dissipation plate being in contact with the heat dissipating member.

(Appendix 5)

The semiconductor device mount structure as set forth in Appendix 4, wherein the semiconductor device includes an intermediate layer including a first portion, the sealing resin includes a recess that exposes the die pad, the heat dissipation plate is arranged in the recess, and the first portion bonds the die pad and the heat dissipation plate to each other and is between the die pad and the heat dissipation plate.

(Appendix 6)

The semiconductor device mount structure as set forth in Appendix 5, wherein the recess includes a recess side surface spaced apart from the heat dissipation plate.

(Appendix 7)

The semiconductor device mount structure as set forth in Appendix 6, wherein one of the heat dissipation plate and the first portion has insulating properties.

(Appendix 8)

The semiconductor device mount structure as set forth in Appendix 6 or 7, wherein the die pad has an irregular surface in contact with the first portion.

(Appendix 9)

The semiconductor device mount structure as set forth in any one of Appendixes 6-8, wherein the recess includes a recess bottom surface, and the die pad is exposed from the recess bottom surface.

(Appendix 10)

The semiconductor device mount structure as set forth in Appendix 9, wherein the recess bottom surface is an irregular surface.

(Appendix 11)

The semiconductor device mount structure as set forth in any one of Appendixes 6-10, wherein the intermediate layer includes an insulating portion between the recess side surface and the heat dissipation plate.

(Appendix 12)

The semiconductor device mount structure as set forth in any one of Appendixes 6-11, wherein the intermediate layer includes a second portion arranged at a different position from the semiconductor chip as viewed in the thickness direction, the heat dissipation plate is made of a conductor, and the first portion and the second portion are made of a same insulating material.

(Appendix 13)

The semiconductor device mount structure as set forth in Appendix 12, further comprising a filler contained in the first portion and the second portion.

(Appendix 14)

The semiconductor device mount structure as set forth in Appendix 12 or 13, wherein the conductor is aluminum, copper or iron.

(Appendix 15)

The semiconductor device mount structure as set forth in any one of Appendixes 12-14, wherein the insulating material is thermoplastic resin.

(Appendix 16)

The semiconductor device mount structure as set forth in any one of Appendixes 6-11, wherein the heat dissipation plate is made of a ceramic material, and the first portion is made of a conductor.

(Appendix 17)

The semiconductor device mount structure as set forth in Appendix 16, wherein the ceramic material is alumina, aluminum nitride or silicon nitride.

(Appendix 18)

The semiconductor device mount structure as set forth in Appendix 16 or 17, wherein the conductor is silver, gold or copper.

(Appendix 19)

The semiconductor device mount structure as set forth in any one of Appendixes 6-18, wherein the sealing resin includes a resin bottom surface, the recess is dented from the resin bottom surface, and a part of the heat dissipation plate projects from the resin bottom surface.

(Appendix 20)

The semiconductor device mount structure as set forth in Appendix 9, wherein the sealing resin includes a plurality of bar portions standing from the recess bottom surface, each of the bar portions being between the heat dissipation plate and the recess side surface.

(Appendix 21)

The semiconductor device mount structure as set forth in Appendix 9, wherein the sealing resin includes a projection projecting from the recess bottom surface, the projection being in contact with the heat dissipation plate.

(Appendix 22)

The semiconductor device mount structure as set forth in any one of Appendixes 1-21, wherein the first action member is a screw penetrating the first portion, and the second action member is a screw penetrating the second portion.

(Appendix 23)

The semiconductor device mount structure as set forth in any one of Appendixes 1-22, wherein the semiconductor chips are power chips.

1C Embodiment

The 1C Embodiment of a variation of the present invention is described below with reference to FIGS. 56-59.

Figure 56:
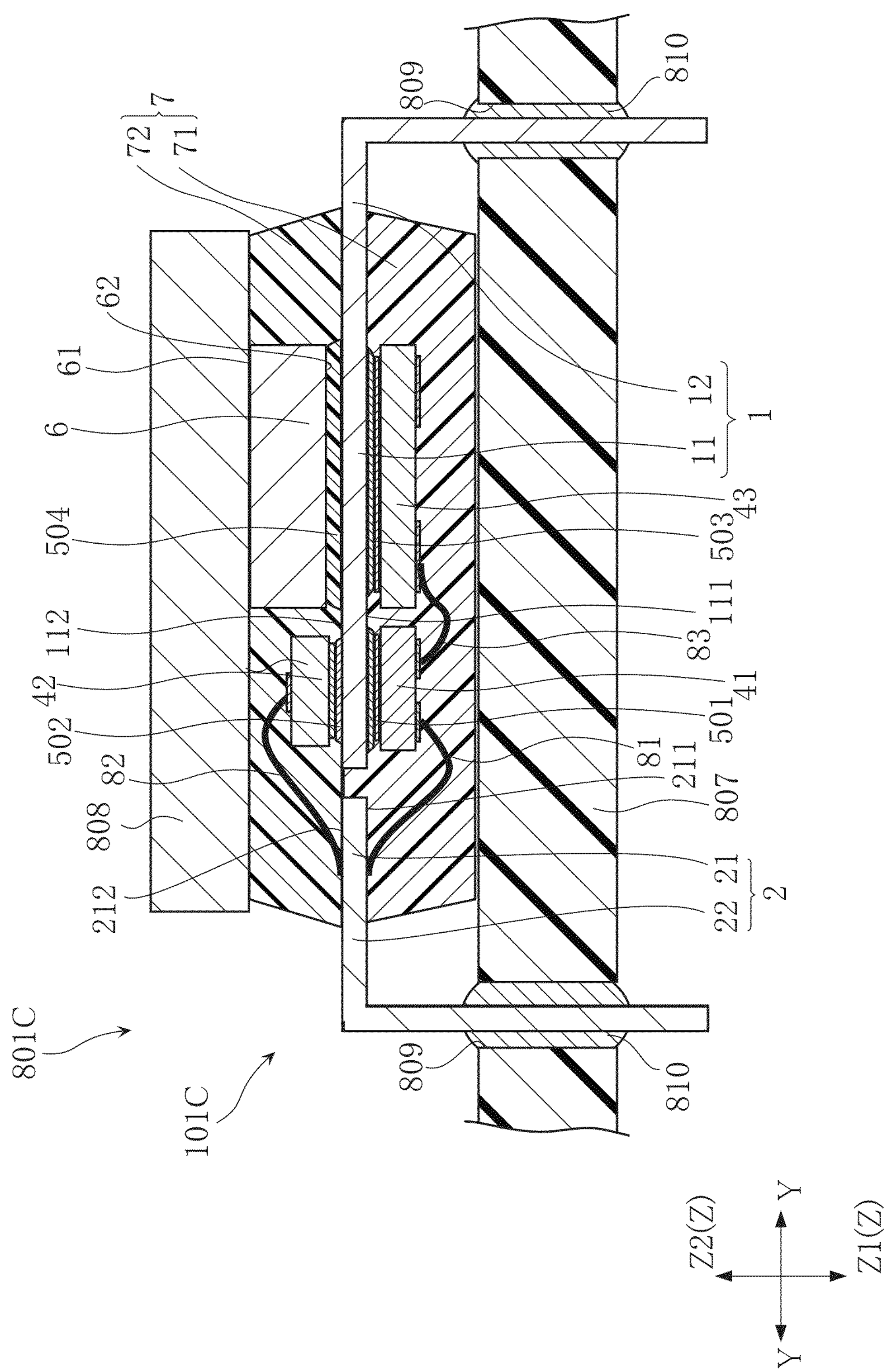
FIG. 56 is a sectional view of a mount structure of a semiconductor device according to 1C Embodiment.

FIG. 56 is a sectional view showing a mount structure of a semiconductor device according to this embodiment.

The mount structure 801C of a semiconductor device shown in FIG. 56 includes a semiconductor device 101C, a board 807 and a heat dissipating member 808.

On the board 807 are mounted a plurality of electronic components. The board 807 is made of an insulating material. The board 807 is provided with a non-illustrated wiring pattern. The board 807 has a plurality of holes 809. The heat dissipating member 808 is made of a material having a relatively high thermal conductivity, e.g. a metal such as aluminum. The heat dissipating member 808 is fixed to the board 807 by a non-illustrated support member. The semiconductor device 101C is mounted on the board 807. For instance, the semiconductor device 101C is a product called an IPM (Intelligent Power Module). The product called IPM is used for e.g. an air conditioner or motor control equipment.

Figure 57:
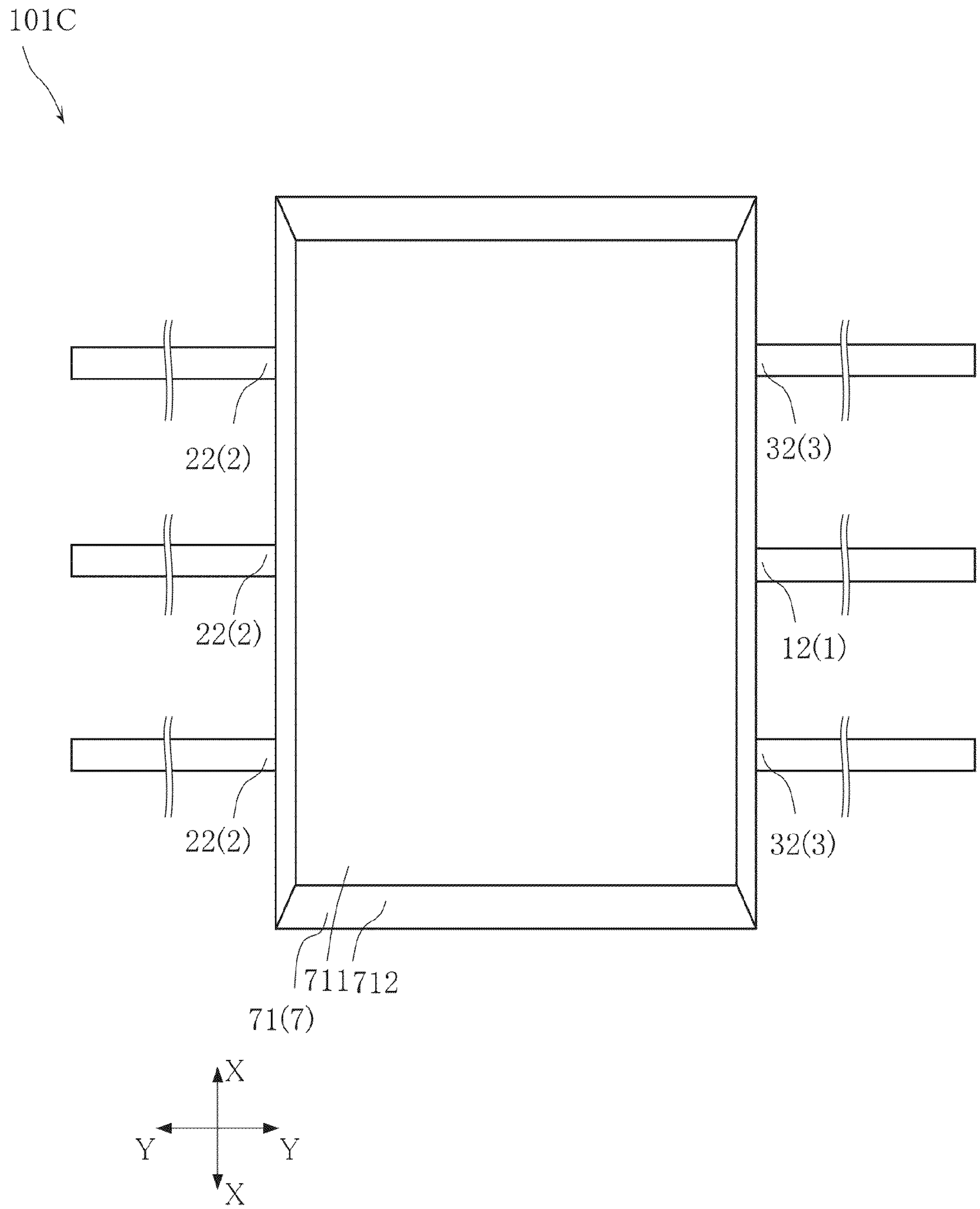
FIG. 57 is a plan view of the semiconductor device according to the 1C Embodiment.
Figure 58:
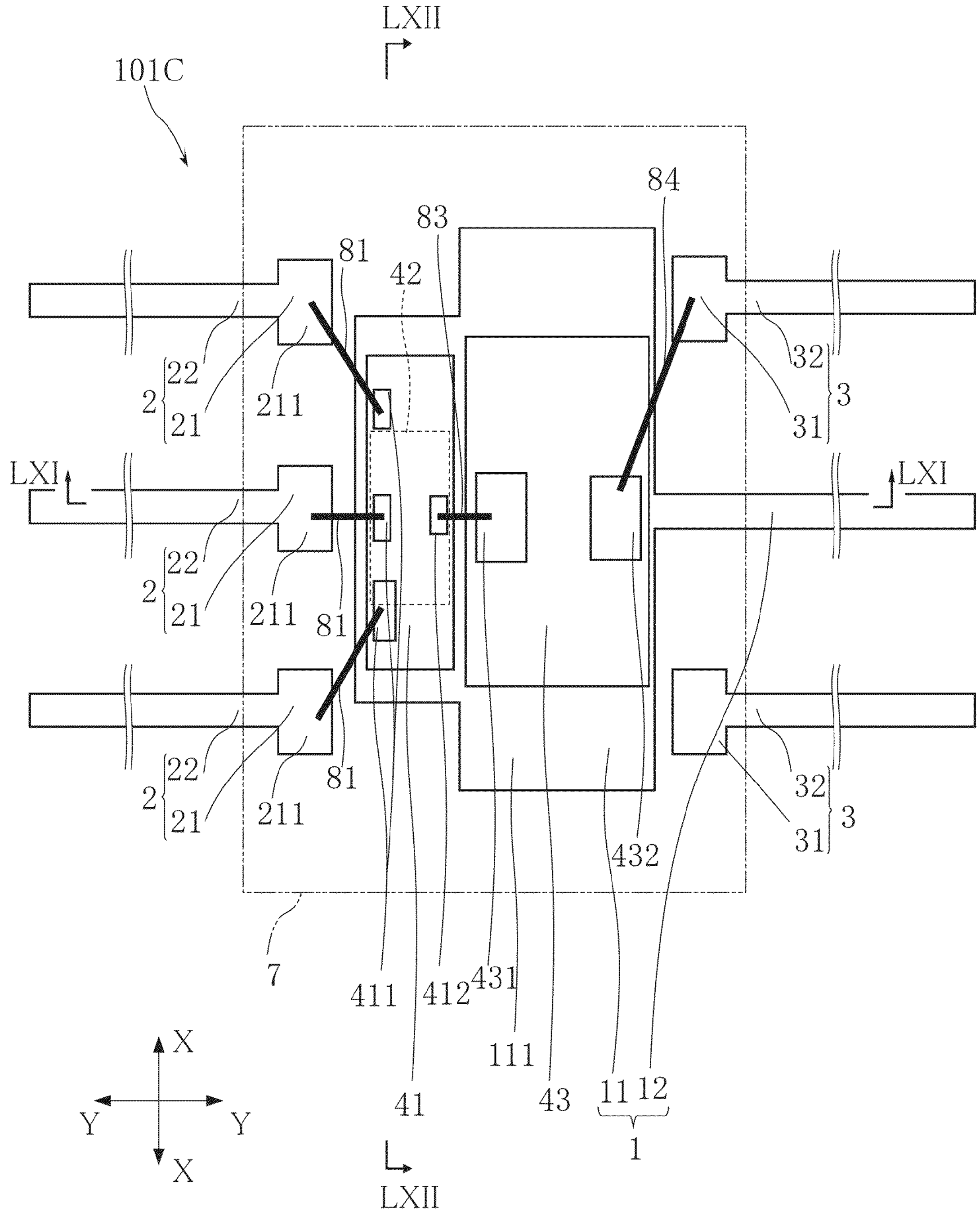
FIG. 58 is a plan view (partially omitted) of the semiconductor device according to the 1C Embodiment.
Figure 59:
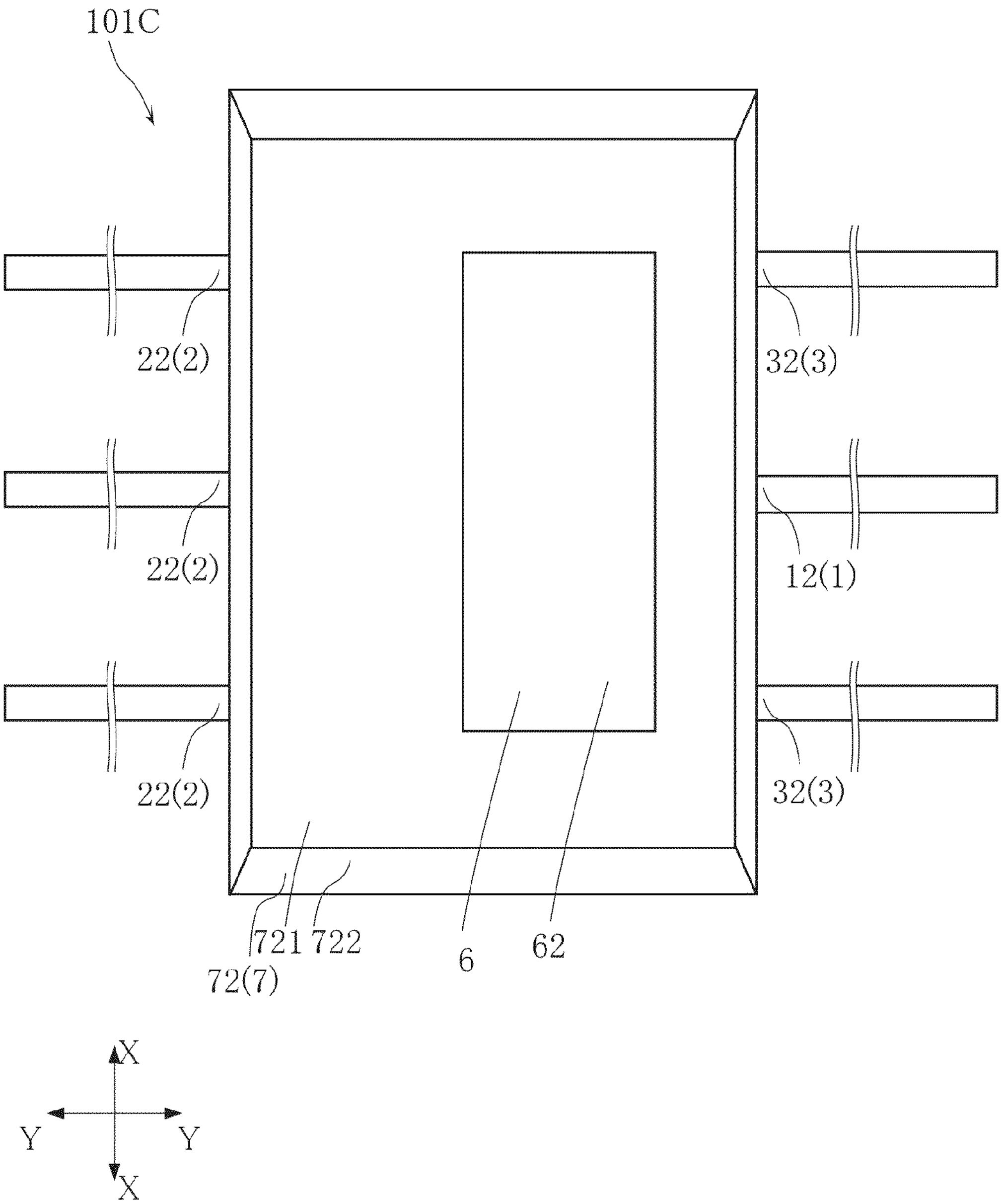
FIG. 59 is a bottom view of the semiconductor device according to the 1C Embodiment.
Figure 60:
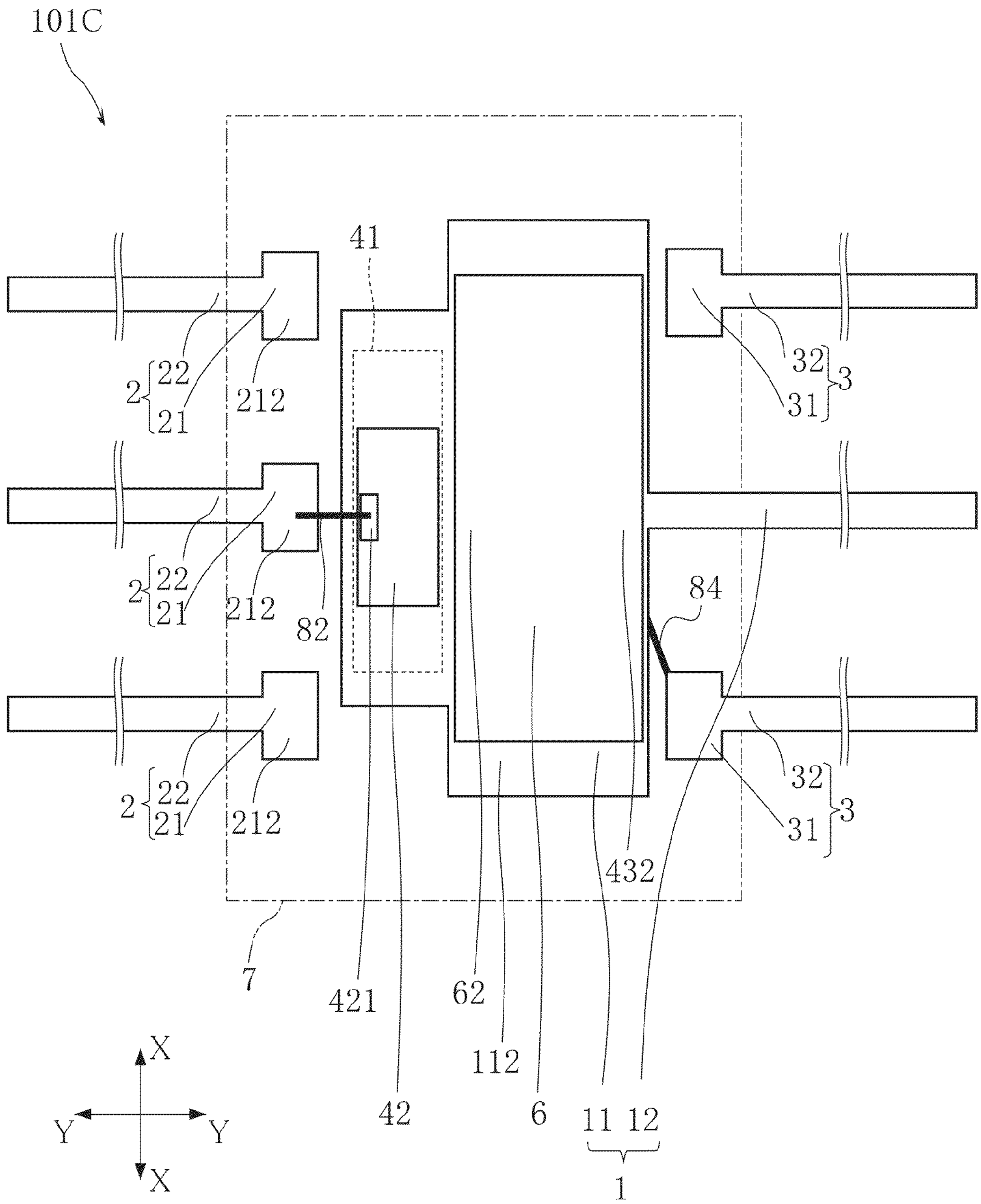
FIG. 60 is a bottom view (partially omitted) of the semiconductor device according to the 1C Embodiment.
Figure 61:
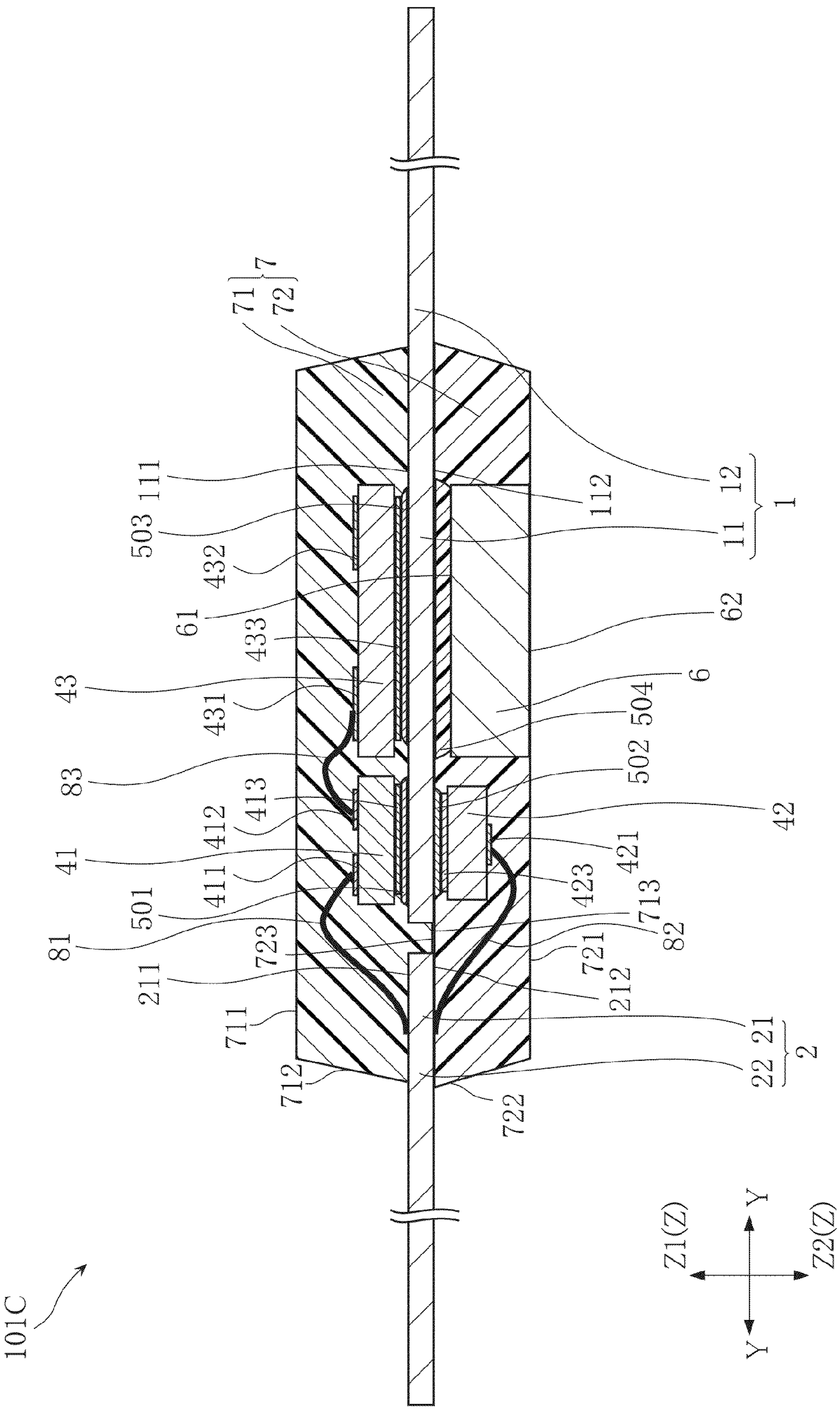
FIG. 61 is a sectional view taken along lines LXI-LXI in FIG. 58.
Figure 62:
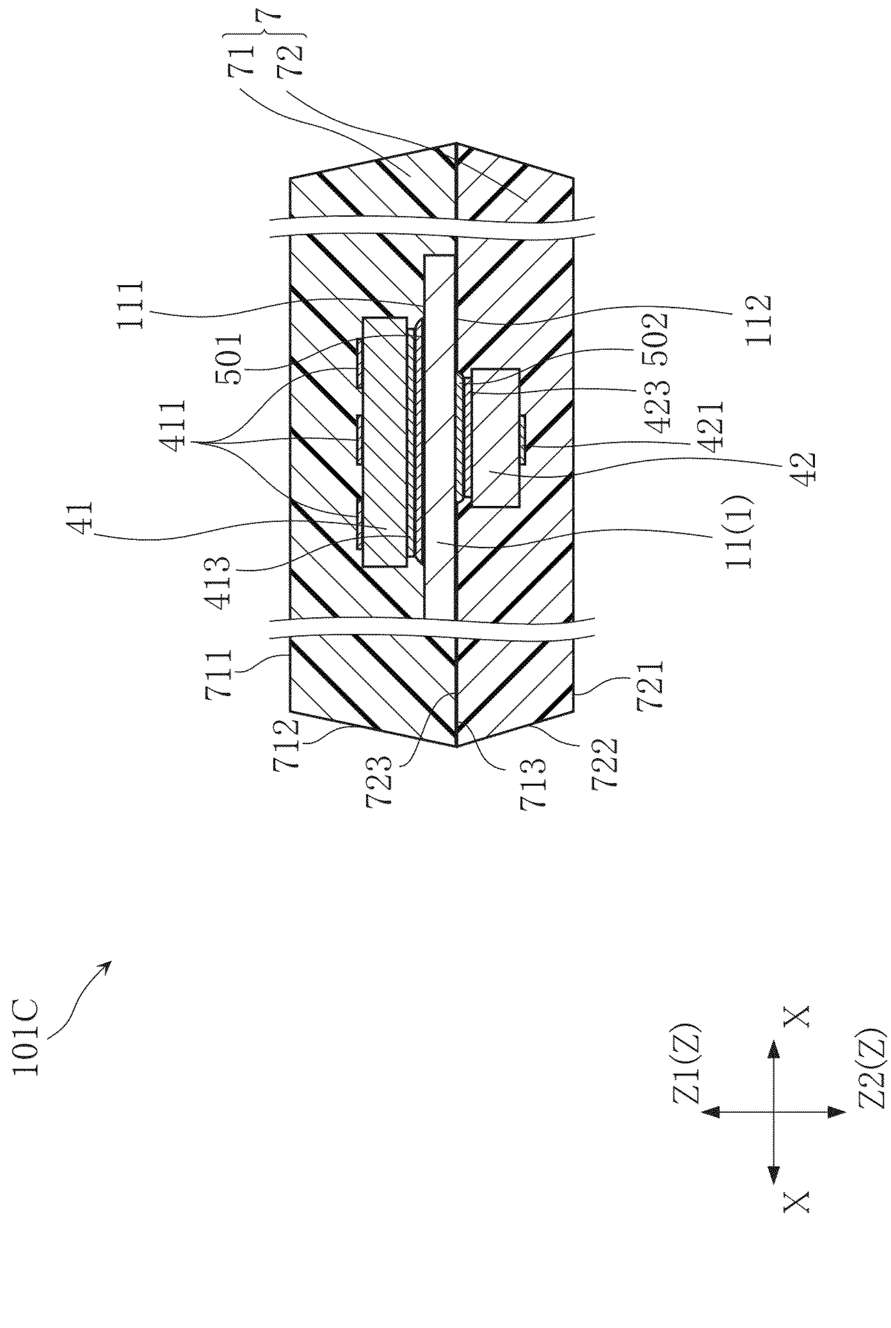
FIG. 62 is a sectional view taken along lines LXII-LXII in FIG. 58.

FIG. 57 is a plan view of the semiconductor device according to this embodiment. FIG. 58 is a plan view (partially omitted) of the semiconductor device according to this embodiment. FIG. 59 is a bottom view of the semiconductor device according to this embodiment. FIG. 60 is a bottom view (partially omitted) of the semiconductor device according to this embodiment. FIG. 61 is a sectional view taken along lines LXI-LXI in FIG. 58. FIG. 62 is a sectional view taken along lines LXII-LXII in FIG. 58.

The semiconductor device 101C shown in these figures includes a plurality of electrodes 1, 2 and 3, a semiconductor chip 41 (first semiconductor chip), a semiconductor chip 42 (second semiconductor chip), a semiconductor chip 43 (third semiconductor chip), a bonding layer 501 (first bonding layer), a bonding layer 502 (second bonding layer), a bonding layer 503 (third bonding layer), a bonding layer 504, a heat sink 6, a sealing resin portion 7, a wire 81 (first wire), a wire 82 (second wire), and wires 83, 84. In FIGS. 58 and 60, the sealing resin portion 7 is shown by double-dashed lines.

All the electrodes 1-3 shown in FIGS. 56-62 are made of a conductive material. Examples of the conductive material include copper.

The electrode 1 includes a die pad 11 and a lead 12 (first lead).

The die pad 11 is in the form of a plate extending along the x-y plane. The die pad 11 has a die pad surface 111 (first die pad surface) and a die pad surface 112 (second die pad surface). The die pad surface 111 and the die pad surface 112 face away from each other. Specifically, the die pad surface 111 faces to one side in the direction Z (hereinafter referred to as direction Z1), whereas the die pad surface 112 faces to the other side in the direction Z (hereinafter referred to as direction Z2).

The lead 12 is connected to the die pad 11. The lead 12 extends along the direction Y. The lead 12 includes a portion projecting from the sealing resin portion 7, which will be described later. The lead 12 of this embodiment is for insertion mounting. As shown in FIG. 56, in mounting the semiconductor device 101C to the board 807, the lead 12 is bent and inserted into one of the holes 809. To fix the lead 12 to the board 807, the hole 809 is filled with solder 810.

Each of the plurality of electrodes 2 (three in this embodiment) includes a wire bonding portion 21 and a lead 22. The electrodes 2 are spaced apart from each other in the direction X.

Each wire bonding portion 21 has a shape extending along the x-y plane. Each wire bonding portion 21 includes a wire bonding surface 211 (first wire bonding surface) and a wire bonding surface 212 (second wire bonding surface). The wire bonding surface 211 and the wire bonding surface 212 face away from each other. Specifically, the wire bonding surface 211 faces to the direction Z1, whereas the wire bonding surface 212 faces to the direction Z2.

Each lead 22 is connected to a corresponding one of the wire bonding portions 21. Each lead 22 extends along the direction Y. Each lead 22 includes a portion projecting from the sealing resin portion 7, which will be described later. The leads 22 of this embodiment are for insertion mounting. As shown in FIG. 56, similarly to the lead 12, in mounting the semiconductor device 101C to the board 807, each lead 22 is inserted into one of the holes 809. To fix the leads 22 to the board 807, the holes 809 are filled with solder 810.

Similarly to the electrodes 2, each of the plurality of electrodes 3 (two in this embodiment) includes a wire bonding portion 31 and a lead 32. The electrodes 3 are spaced apart from the lead 12 in the direction X. Since the electrodes 3 have the same structure as that of the electrodes 2, the description of the structure of the electrodes 3 is omitted.

The semiconductor chip 41, which is shown in FIGS. 56, 58, 61, and 62, is disposed on the die pad 11. Specifically, the semiconductor chip 41 is disposed on the die pad surface 111 of the die pad 11. As shown in FIG. 61, the semiconductor chip 41 includes principal surface electrodes 411 and 412 and a reverse surface electrode 413. The principal surface electrodes 411 and 412 are on the direction Z1 side of the semiconductor chip 41. The principal surface electrodes 411 and 412 are arranged at different positions as viewed toward the X-Y plane. The reverse surface electrode 413 is on the direction Z2 side of the semiconductor chip 41. The reverse surface electrode 413 faces the die pad surface 111 via a bonding layer 501, which will be described later. Unlike this embodiment, the semiconductor chip 41 may not include the reverse surface electrode 413.

The semiconductor chip 42, which is shown in FIGS. 56 and 60-62, is disposed on the die pad 11. Specifically, the semiconductor chip 42 is disposed on the die pad surface 112 of the die pad 11. As shown in FIG. 60, in this embodiment, a part of the semiconductor chip 42 overlaps the semiconductor chip 41 as viewed toward the X-Y plane. As shown in FIG. 61, the semiconductor chip 42 includes a principal surface electrode 421 and a reverse surface electrode 423. The principal surface electrodes 421 is on the direction z2 side of the semiconductor chip 42. The reverse surface electrode 423 is on the direction Z1 side of the semiconductor chip 42. The reverse surface electrode 423 faces the die pad surface 112 via a bonding layer 502, which will be described later. Unlike this embodiment, the semiconductor chip 42 may not include the reverse surface electrode 423.

The semiconductor chip 43, which is shown in FIGS. 56, 58 and 61, is disposed on the die pad 11. Specifically, the semiconductor chip 43 is disposed on the die pad surface 111 of the die pad 11. The semiconductor chip 43 is arranged at a different position from the semiconductor chip 41 as viewed toward the X-Y plane. As shown in FIG. 61, the semiconductor chip 43 includes principal surface electrodes 431 and 432 and a reverse surface electrode 433. The principal surface electrodes 431 and 432 are on the direction Z1 side of the semiconductor chip 43. The principal surface electrodes 431 and 432 are arranged at different positions as viewed toward the X-Y plane. The reverse surface electrode 433 is on the direction Z2 side of the semiconductor chip 43. The reverse surface electrode 433 faces the die pad surface 111 via a bonding layer 503, which will be described later. Unlike this embodiment, the semiconductor chip 43 may not include the reverse surface electrode 433.

The wires 81, 82, 83 and 84, which are shown in FIGS. 56, 58, 60 and 61, are made of a conductive material. Examples of the conductive material include gold and aluminum.

As shown in FIG. 58, each of the wires 81 is bonded to the semiconductor chip 41 and one of the wire bonding portions 21. Specifically, each wire 81 is bonded to the principal surface electrode 411 of the semiconductor chip 41 and the wire bonding surface 211 of one of the wire bonding portions 21. Thus, the semiconductor chip 41 and the wire bonding portions 21 are electrically connected to each other via the wires 81.

Similarly to this, as shown in FIG. 60, the wire 82 is bonded to the semiconductor chip 42 and one of the wire bonding portions 21. Specifically, the wire 82 is bonded to the principal surface electrode 421 of the semiconductor chip 42 and the wire bonding surface 212 of the wire bonding portion 21. Thus, the semiconductor chip 42 and the wire bonding portion 21 are electrically connected to each other via the wire 82. One of the wires 81 is also bonded to wire bonding portion 21 to which the wire 82 is bonded.

As shown in FIG. 58, the wire 83 is bonded to the semiconductor chip 41 and the semiconductor chip 43. Specifically, the wire 83 is bonded to the principal surface electrode 412 of the semiconductor chip 41 and the principal surface electrode 431 of the semiconductor chip 43. The wire 84 is bonded to the semiconductor chip 43 and one of the wire bonding portions 31. Specifically, the wire 84 is bonded to the principal surface electrode 432 of the semiconductor chip 43 and one of the wire bonding portions 31.

The heat sink 6, which is shown in FIGS. 56 and 59-61, is provided to quickly dissipate heat generated at the semiconductor chips 41, 42 and 43 to the outside of the semiconductor device 101C. The heat sink 6 is arranged on the die pad 11. Specifically, the heat sink 6 is disposed on the die pad surface 112 of the die pad 11. On the opposite side of the heat sink 6 with respect to the die pad 11, the semiconductor chip 43 is disposed on the die pad 11. As shown in FIG. 61, in this embodiment, a part of the heat sink 6 overlaps the semiconductor chip 43 as viewed toward the X-Y plane (viewed in the direction Z).

In order that the heat generated at the semiconductor chips 41, 42, 43 can be quickly dissipated to the outside of the semiconductor device 101C, making the heat sink 6 from a material having a higher thermal conductivity is better. Preferably, the heat sink 6 is made of a material having a thermal conductivity higher than that of the material for the sealing resin 7. More preferably, the heat sink 6 is made of a material having a thermal conductivity higher than that of the material for the die pads 11. The heat sink 6 is made of an electrically conductive material such as aluminum, copper or iron. The heat sink 6 may be made of aluminum plated with silver. The heat sink 6 may be made of a ceramic material.

As shown in FIG. 61, the heat sink 6 has a first surface 61 and a second surface 62. The first surface 61 faces to the direction Z1. The first surface 61 faces the die pad surface 112 via a bonding layer 504, which will be described later. The second surface 62 faces to the direction Z2 opposite from the direction to which the first surface 61 faces.

The bonding layer 501, which is shown in FIGS. 61 and 62, is between the semiconductor chip 41 and the die pad surface 111. Specifically, the bonding layer 501 is between the reverse surface electrode 413 of the semiconductor chip 41 and the die pad surface 111. The bonding layer 501 bonds the semiconductor chip 41 to the die pad surface 111.

The bonding layer 502, which is shown in FIGS. 61 and 62, is between the semiconductor chip 42 and the die pad surface 112. Specifically, the bonding layer 502 is between the reverse surface electrode 423 of the semiconductor chip 42 and the die pad surface 112. The bonding layer 502 bonds the semiconductor chip 42 to the die pad surface 112.

The bonding layer 503, which is shown in FIG. 61, is between the semiconductor chip 43 and the die pad surface 111. Specifically, the bonding layer 503 is between the reverse surface electrode 433 of the semiconductor chip 43 and the die pad surface 111. The bonding layer 503 bonds the semiconductor chip 43 to the die pad surface 111.

In this embodiment, the bonding layers 501, 502 and 503 are made of an electrically conductive material. Thus, the die pad 11 is electrically connected to the reverse surface electrode 413 of the semiconductor chip 41, the reverse surface electrode 423 of the semiconductor chip 42 and the reverse surface electrode 433 of the semiconductor chip 43. This arrangement is effective when the reverse surface electrodes 413, 423, 433 need to be electrically connected to each other. For instance, the reverse surface electrodes 413, 423, 433 are electrically connected to each other when the reverse surface electrodes 413, 423, 433 are to be connected to ground.

The electrically conductive material for forming the bonding layers 501, 502, 503 may be e.g. silver or solder. Solder has a relatively high thermal conductivity. Thus, using solder as the bonding layers allows heat to be efficiently transferred from each semiconductor chip to the die pad 11.

The bonding layer 504, which is shown in FIG. 61, is between the heat sink 6 and the die pad surface 112. Specifically, the bonding layer 504 is between the first surface 61 of the heat sink 6 and the die pad surface 112. The bonding layer 504 bonds the heat sink 6 to the die pad surface 112. In this embodiment, the bonding layer 504 is made of an insulating material. Examples of the insulating material include a resin such as epoxy. Unlike this embodiment, the bonding layer 504 may be made of e.g. silver paste.

The sealing resin portion 7, which is shown in FIGS. 56-62, covers electrodes 1, 2 and 3, the semiconductor chips 41, 42 and 43, the bonding layers 501, 502, 503 and 504, the heat sink 6, and the wires 81, 82, 83 and 84. The sealing resin portion 7 covers the die pad surfaces 111 and 112.

As better shown in FIGS. 61 and 62, the sealing resin portion 7 includes a resin portion 71 (first resin portion) and a resin portion 72 (second resin portion).

The resin portion 71 covers the die pad surface 111, the wire bonding surface 211, the semiconductor chips 41 and 43, and the bonding layers 501 and 503. For instance, the resin portion 71 is made of a black epoxy resin. The resin portion 71 includes a principal surface 711 (first principal surface), a side surface 712 (first side surface) and a resin surface 713 (first resin surface).

The principal surface 711 faces to the direction Z1. That is, the principal surface 711 faces to the same direction as the die pad surface 111. The principal surface 711 is a flat surface extending along the X-Y plane. The side surface 712 surrounds the semiconductor chips 41 and 43 as viewed toward the X-Y plane (as viewed in the direction Z). The side surface 712 is connected to the principal surface 711. The side surface 712 is tapered. Specifically, the side surface 712 is inclined with respect to the principal surface 711 so as to form an obtuse angle with the principal surface 711.

The resin surface 713 is a flat surface extending along the X-Y plane. The resin surface 713 is flush with the die pad surface 112 of the die pad 11. As shown in FIG. 62, the resin surface 713 is connected to the side surface 712.

As shown in FIGS. 61 and 62, the resin portion 72 covers the die pad surface 112, the wire bonding surface 212, the semiconductor chip 42, the heat sink 6, and the bonding layers 502 and 504. For instance, the resin portion 72 is made of a black epoxy resin. The resin portion 72 may be made of the same material as the resin portion 71 or a different material from the resin portion 71. The resin portion 72 includes a principal surface 721 (second principal surface), a side surface 722 (second side surface) and a resin surface 723 (second resin surface).

The principal surface 721 faces to the direction Z2. That is, the principal surface 721 faces to the same direction as the die pad surface 112. The principal surface 721 is a flat surface extending along the X-Y plane. As shown in FIGS. 59 and 61, the heat sink 6 is exposed from the principal surface 721. The heat sink 6 does not necessarily need to be exposed from the sealing resin portion 7. The principal surface 721 is flush with the second surface 62 of the heat sink 6. The side surface 722 surrounds the semiconductor chip 42 as viewed toward the X-Y plane (as viewed in the direction Z). The side surface 722 is connected to the principal surface 721. The side surface 722 is tapered. Specifically, the side surface 722 is inclined with respect to the principal surface 721 so as to form an obtuse angle with the principal surface 721. As shown in FIG. 62, the side surface 722 is connected to the side surface 712.

The resin surface 723 is a flat surface extending along the X-Y plane. The resin surface 723 is connected to the side surface 722. The resin surface 723 is in contact with the resin surface 713. The resin surface 723 and the resin surface 713 define the boundary between the resin portion 71 and the resin portion 72.

A method for manufacturing the semiconductor device 101C is described below with reference to FIGS. 63-69. In the figures used below for describing the manufacturing method, the elements that are identical or similar to those described above are designated by the same reference signs as those used above.

Figure 63:
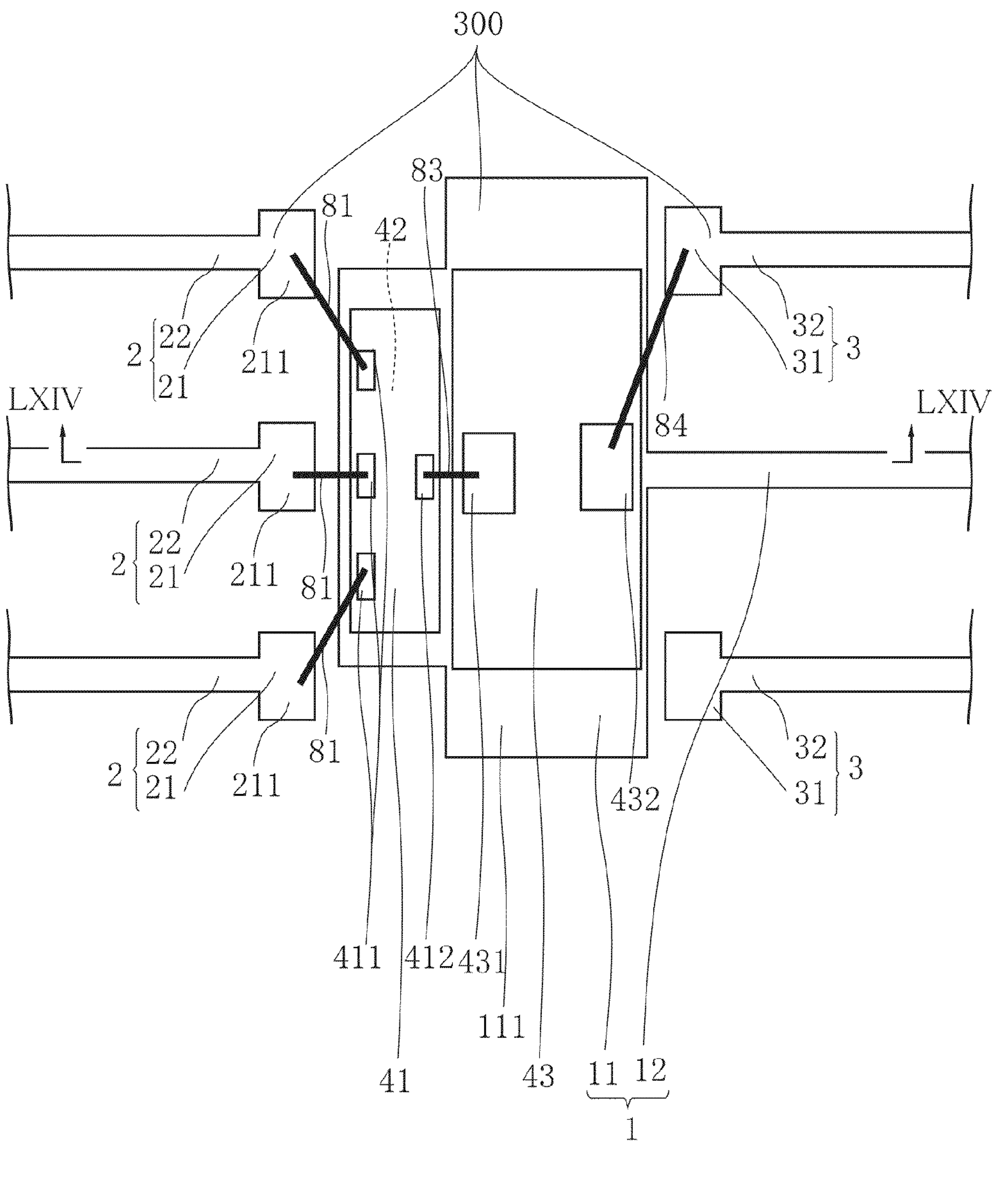
FIG. 63 is a plan view showing a process step of a method for manufacturing a semiconductor device according to the 1C Embodiment.
Figure 64:
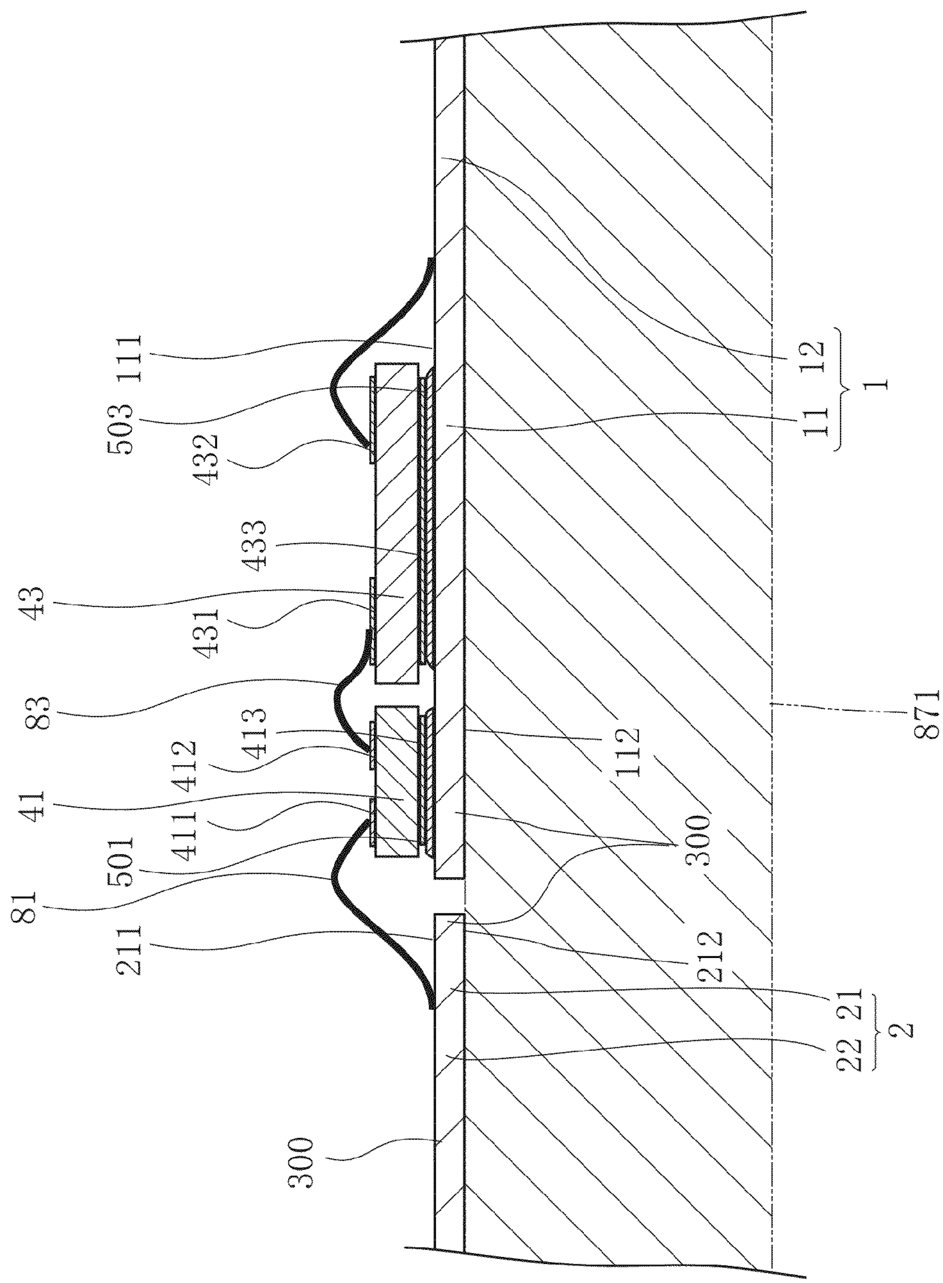
FIG. 64 is a sectional view taken along lines LXIV-LXIV in FIG. 63.

First, as shown in FIGS. 63 and 64, a lead frame 300 is prepared. The lead frame 300 includes the above-described die pad 11 and wire bonding portions 21 and 31. Then, the lead frame 300 is placed on a base 871. When the lead frame 300 is placed on the base 871, the die pad surface 112 of the die pad 11 is in contact with the base 871.

Then, as shown in the figures, a semiconductor chip 41 and a semiconductor chip 43 are disposed on the die pad surface 111. The semiconductor chip 41 is bonded to the die pad surface 111 via a bonding layer 501. Similarly, the semiconductor chip 43 is bonded to the die pad surface 111 via a bonding layer 503.

Then, as shown in the figures, wires 81 are bonded to the semiconductor chip 41 and the wire bonding portions 21. Wires 83 and 84 are bonded to the semiconductor chip 43 and so on.

Figure 65:
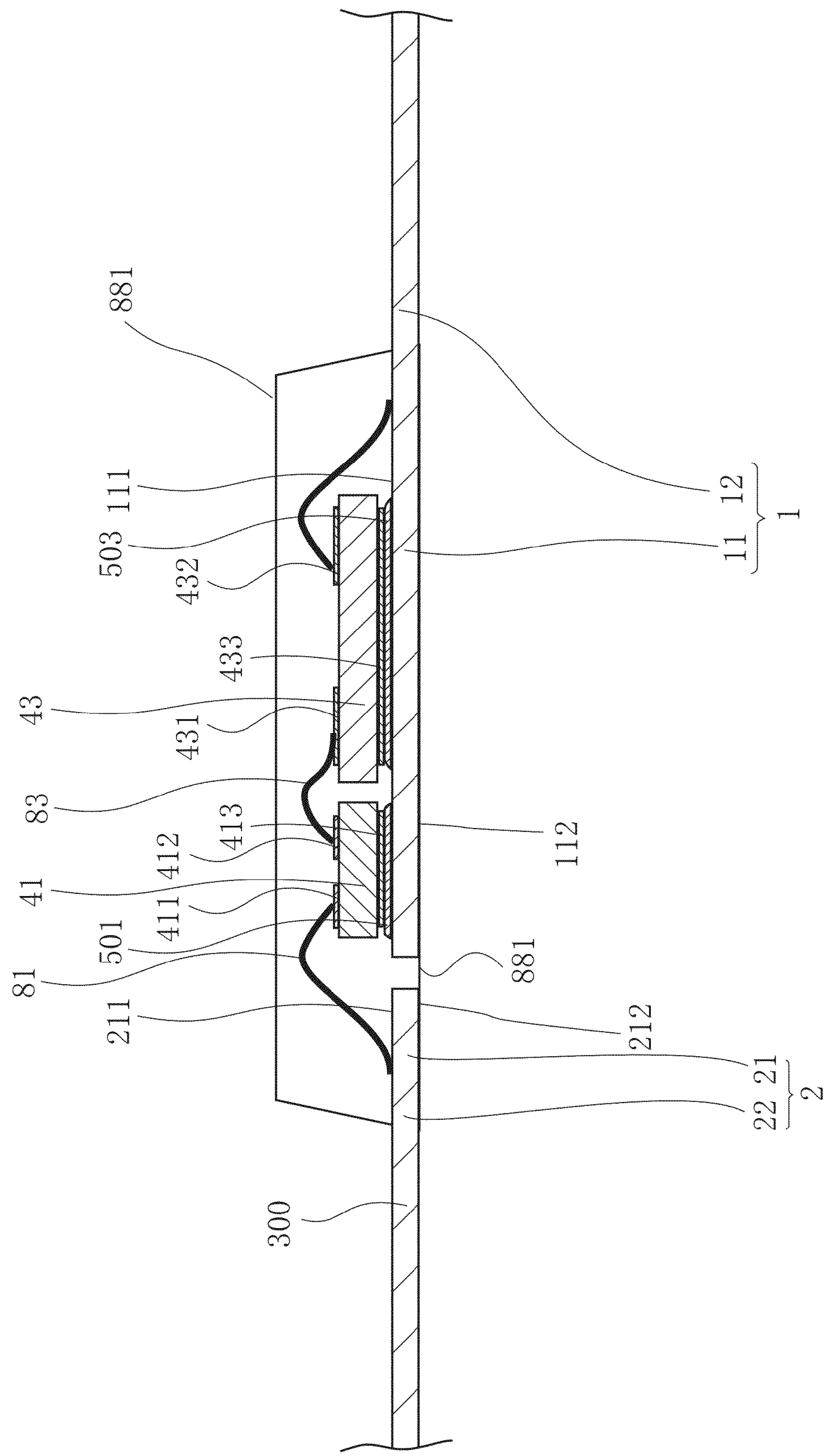
FIG. 65 is a sectional view showing the process step subsequent to FIG. 64.
Figure 66:
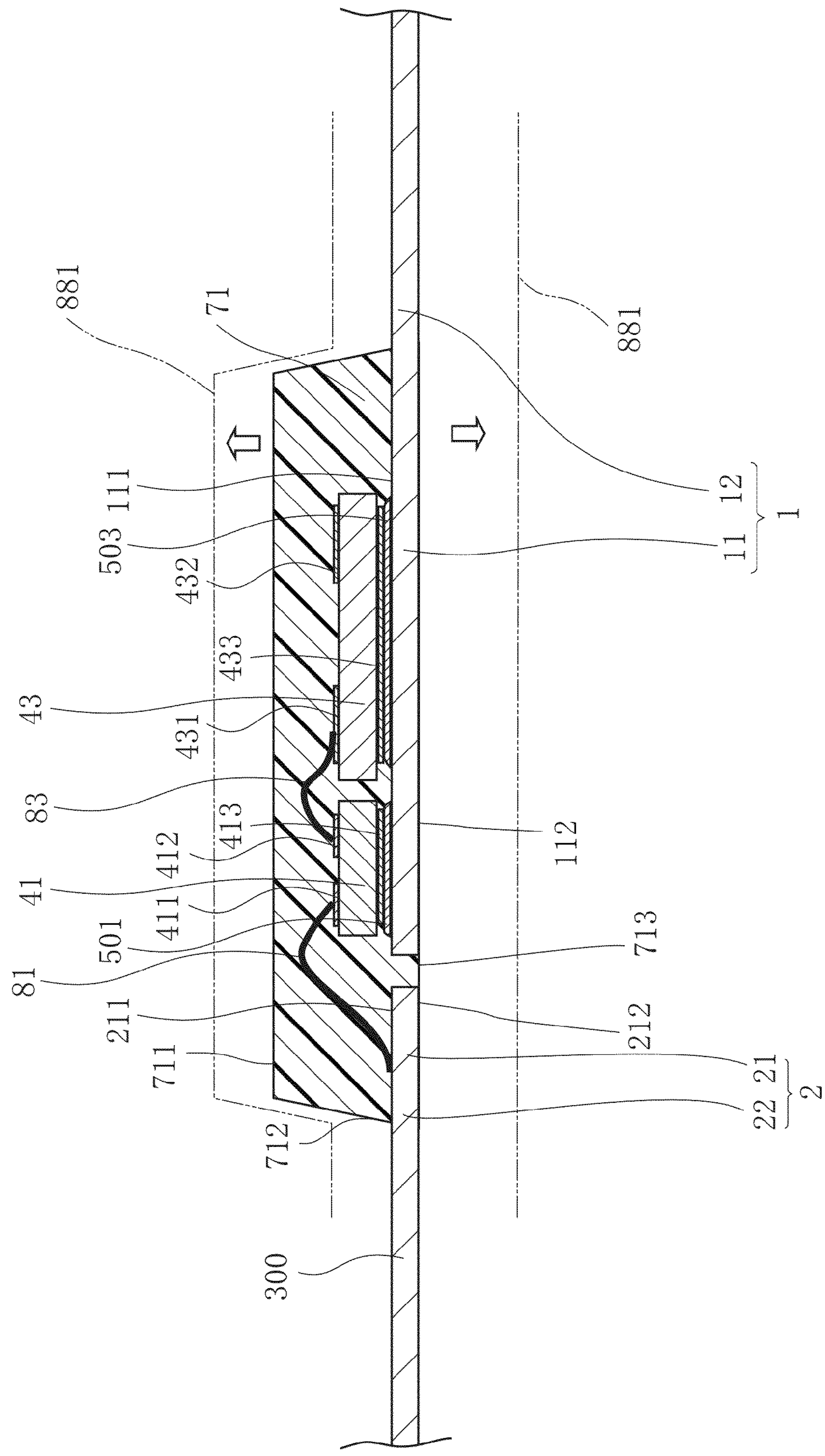
FIG. 66 is a sectional view showing the process step subsequent to FIG. 65.

Then, a resin portion 71 is formed as shown in FIGS. 65 and 66. As shown in FIG. 65, the resin portion 71 is formed by molding using a mold 881. As shown in the figure, the lead frame 300 is pressed with the mold 881. Then, a resin material is injected into the mold 881 and allowed to harden. After the resin material is hardened, the mold 881 is removed from the lead frame 300 and so on, as shown in FIG. 66. Thus, the resin portion 71 is formed.

In the process of forming the resin portion 71, the flat surface of the lower part of the mold member 881 in FIGS. 65 and 66 is in contact with the die pad surface 112 and the wire bonding surface 212. Thus, a resin surface 713 which is flush with the die pad surface 112 and the wire bonding surface 212 is formed in the resin portion 71. The upper part of the mold member 881 in the figure is reversely tapered so as to be easily detached from the resin portion 71. Thus, the side surface 712 of the resin portion 71 is tapered as described above.

Figure 67:
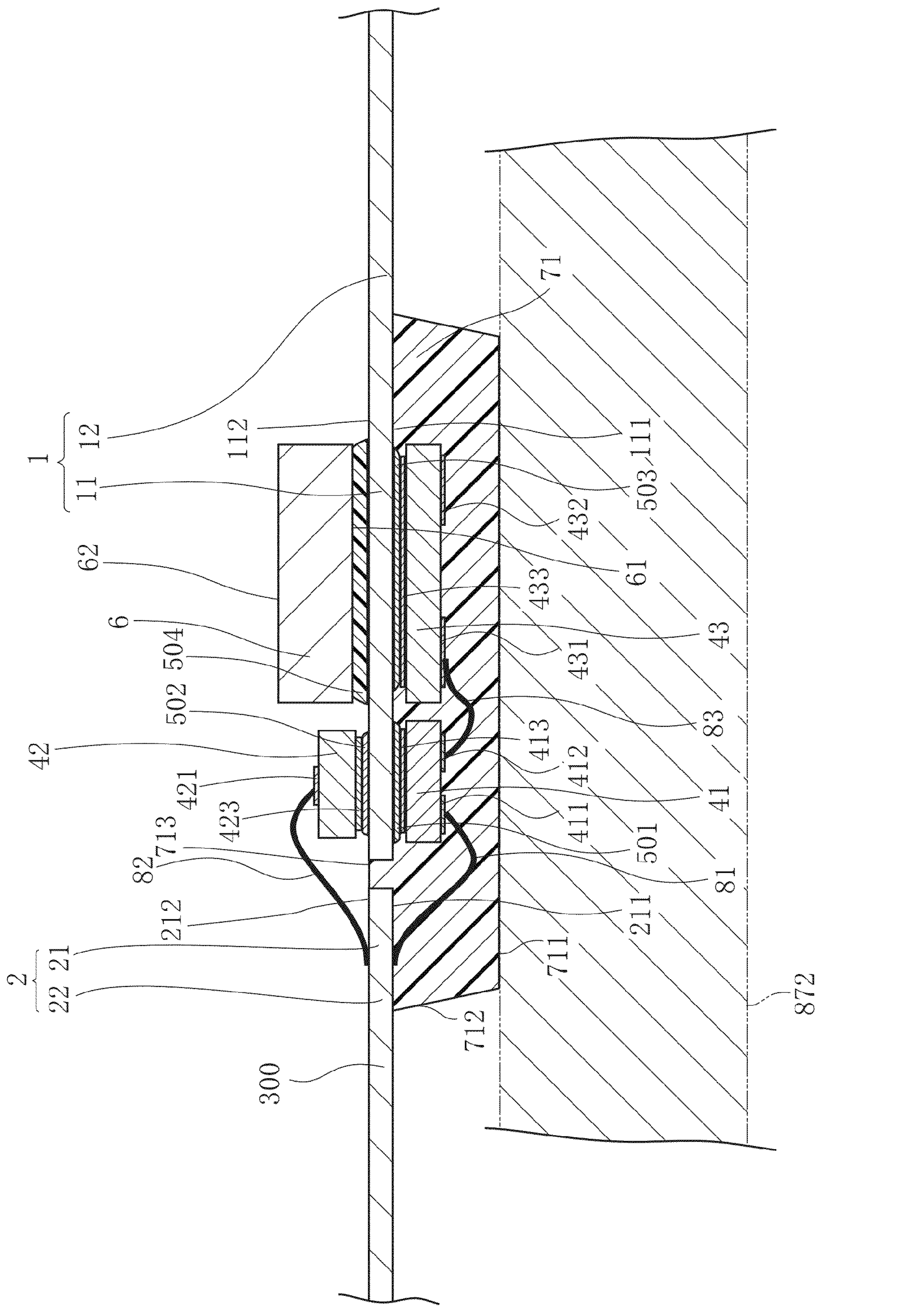
FIG. 67 is a sectional view showing the process step subsequent to FIG. 66.

Then, as shown in FIG. 67, the product shown in FIG. 66 is turned over. Then, the lead frame 300 is placed on the base 872. When the lead frame 300 is placed on the base 872, the resin portion 71 is in contact with the base 872.

Then, as shown in the figure, the semiconductor chip 42 is placed on the die pad surface 112. The semiconductor chip 42 is bonded to the die pad surface 112 via a bonding layer 502. Then, as shown in the figure, a wire 82 is bonded to the semiconductor chip 42 and the wire bonding portion 21. A heat sink 6 is disposed on the die pad surface 112. The heat sink 6 is bonded to the die pad surface 112 via a bonding layer 504.

Figure 68:
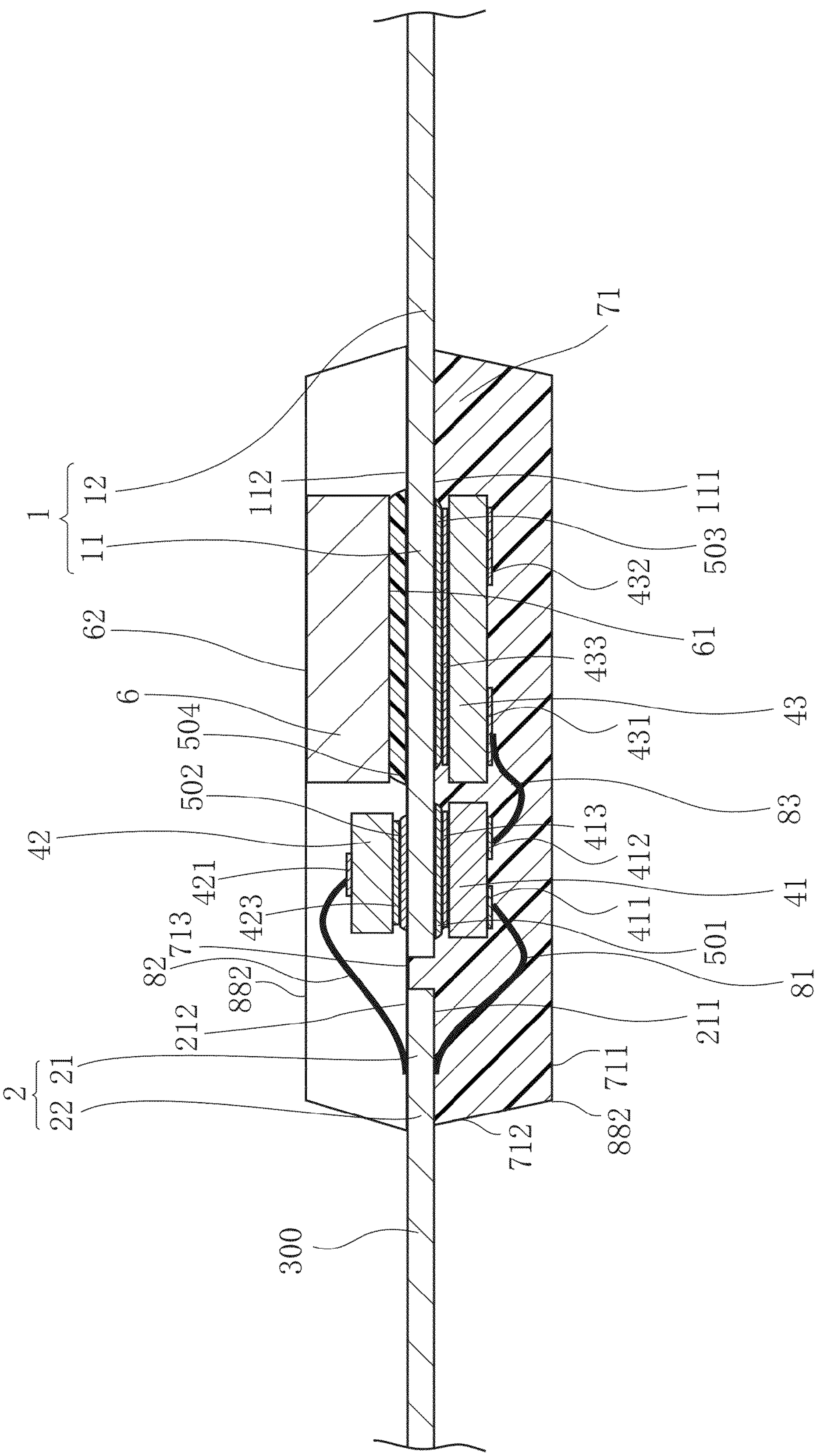
FIG. 68 is a sectional view showing the process step subsequent to FIG. 67.
Figure 69:
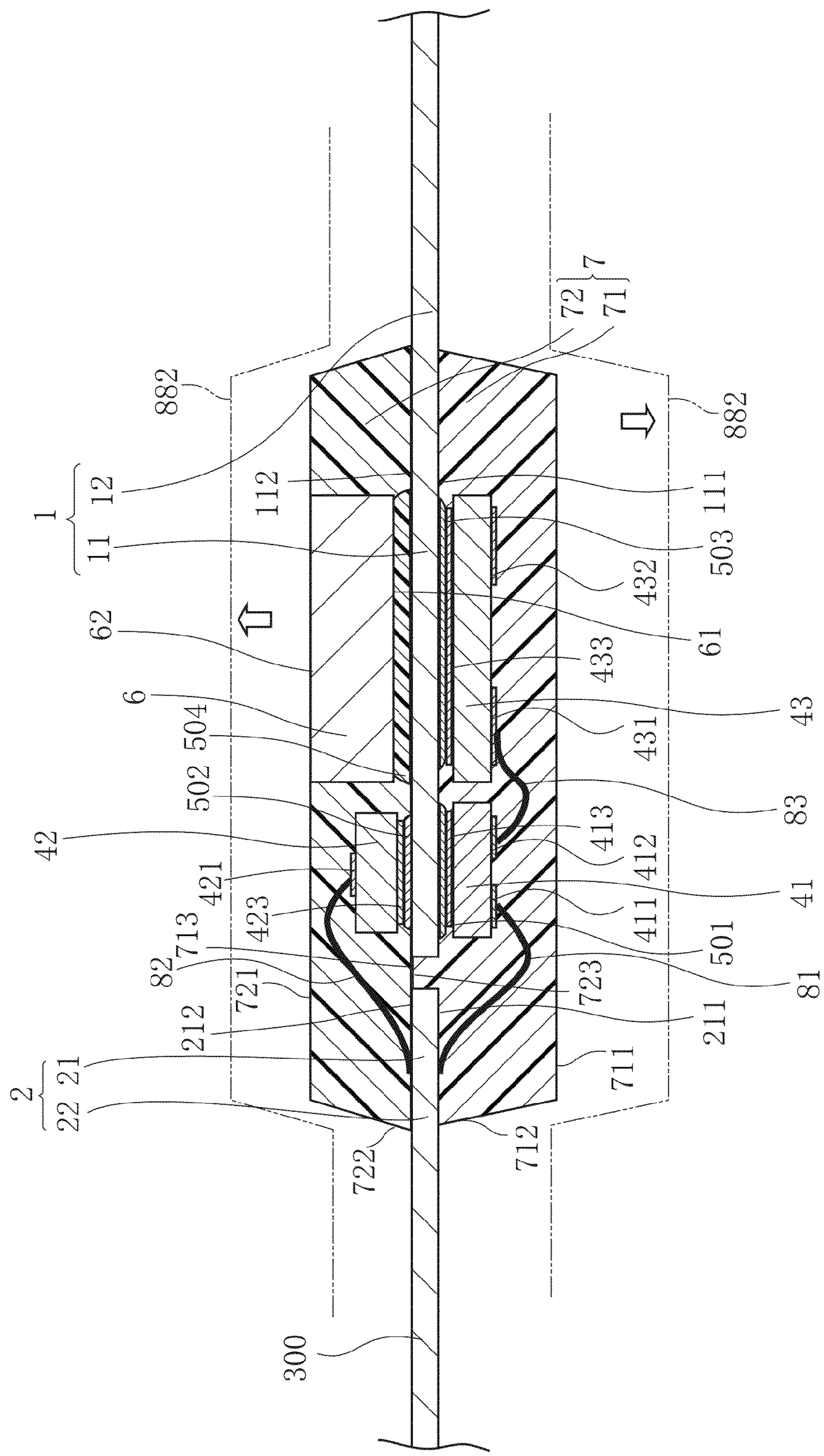
FIG. 69 is a sectional view showing the process step subsequent to FIG. 68.

Then, a resin portion 72 is formed as shown in FIGS. 68 and 69. As shown in FIG. 68, the resin portion 72 is formed by molding using a mold 882. As shown in the figure, the lead frame 300 is pressed with the mold 882. Then, a resin material is injected into the mold 882 and allowed to harden. After the resin material is hardened, the mold 882 is removed from the lead frame 300 and so on, as shown in FIG. 69. Thus, the resin portion 72 is formed.

In forming the resin portion 72, the upper part of the mold member 882 in FIGS. 68 and 69 is reversely tapered so as to be easily detached from the resin portion 72. Thus, the side surface 722 of the resin portion 72 is tapered as described above. A resin surface 723 in contact with the resin surface 713 is formed in the resin portion 72.

Then, the lead frame 300 is cut appropriately, whereby the semiconductor device 101C shown in e.g. FIG. 56-62 is obtained.

The advantages of this embodiment are described below.

In this embodiment, the die pad surface 111 and the die pad surface 112 face away from each other. The semiconductor chip 41 is arranged on the die pad surface 111, whereas the semiconductor chip 42 is arranged on the die pad surface 112. Thus, the semiconductor chip 41 and the semiconductor chip 42 are on the opposite sides of the die pad 11. Thus, the position of the semiconductor chip 41 as viewed toward the X-Y plane is not limited by the position of the semiconductor chip 42. Thus, as viewed toward the X-Y plane, the semiconductor chip 41 and the semiconductor chip 42 can be arranged relatively close to each other. This arrangement reduces the size of the semiconductor device 101C as viewed toward the X-Y plane.

In the semiconductor device 101C, a part of the semiconductor chip 42 overlaps the semiconductor chip 41 as viewed toward the X-Y plane. This arrangement further contributes to reduction of the size of the semiconductor device 101C as viewed toward the X-Y plane.

In this embodiment, the step of disposing the semiconductor chip 41 is performed before the step of disposing the semiconductor chip 42. Thus, in disposing the semiconductor chip 41 as shown in FIGS. 63 and 64, the semiconductor chip 42 is not on the die pad surface 112. Since the semiconductor chip 42 is not on the die pad surface 112, the die pad 11 can be fixed to base 871, with the die pad surface 112 held in contact with the base 871. Thus, even when a force is exerted on the die pad 11 in disposing the semiconductor chip 41 on the die pad 11, the posture of the die pad 11 is properly maintained. Thus, the semiconductor chip 41 is accurately disposed on the die pad 11.

In this embodiment, the step of disposing the semiconductor chip 42 is performed after the step of forming the resin portion 71. Thus, as shown in FIG. 67, in disposing the semiconductor chip 42, the semiconductor chip 41 is covered by the resin portion 71. If the semiconductor chip 41 is not covered by the resin portion 71 but exposed, it is not possible to bring the semiconductor chip 41 into direct contact with the base 872. In this embodiment, in disposing the semiconductor chip 42, the die pad 11 is fixed to the base 872 together with the resin portion 71, with the resin portion 71 held in contact with the base 872. Thus, even when a force is exerted on the die pad 11 in disposing the semiconductor chip 42 on the die pad 11, the posture of the die pad 11 is properly maintained. Thus, the semiconductor chip 42 is accurately disposed on the die pad 11.

In this way, the method according to this embodiment makes it possible to manufacture the semiconductor device 101C in which both of the semiconductor chip 41 and the semiconductor chip 42 are accurately arranged.

In this embodiment, the wire 81 bonded to the semiconductor chip 41 is covered by the resin portion 71 in the process of forming the resin portion 71. According to this arrangement, in disposing the semiconductor chip 42, the wire 81 is covered by the resin portion 71. If the wire 81 is not covered by the resin portion 71 but exposed, it is not possible to bring the wire 81 into direct contact with the base 872, because the wire 81 may be cut and disconnected from the semiconductor chip 41. In this embodiment, in disposing the semiconductor chip 42, the die pad 11 is fixed to the base 872 together with the resin portion 71, without bringing the wire 81 in contact with the base 872 and with the resin portion 71 held in contact with the base 872. Thus, even when the semiconductor device 101C has the wire 8, the semiconductor chip 42 is accurately disposed on the die pad 11, for the same reason as described above.

Generally, problems such as change of the posture of a semiconductor chip or cut of a wire occur in the process of forming a resin portion. In this embodiment, the step of forming the resin portion 71 for covering the semiconductor chip 41 is performed before the step of disposing the semiconductor chip 42, and the step of forming the resin portion 72 for covering the semiconductor chip 42 is performed after the step of disposing the semiconductor chip 42. That is, all the semiconductor chips of the semiconductor device 101C are not simultaneously covered by the sealing resin portion 7. Thus, when such a problem as described above occurs in covering the semiconductor chip 41 with the resin portion 71, the problem is found before the step of disposing the semiconductor chip 42 is performed. Thus, disposing the semiconductor chip 42 on a defective product is avoided. That is, the semiconductor chip 42 is reliably disposed only on a product that is not defective. This prevents waste of the semiconductor chip 42.

The larger the number of the semiconductor chips to be covered by the resin portion is, the higher the possibility that the above-described problems occur in forming the resin portion is. The semiconductor device 101C includes a heat sink 6 on the die pad surface 112. To efficiently dissipate the heat generated at the die pad 11 to the outside of the semiconductor device 101C, the dimension of the heat sink 6 within the X-Y plane tends to be made relatively large. Thus, on the die pad surface 112, the space for disposing semiconductor chips may be limited. Thus, it is highly likely that the number of semiconductor chips that can be disposed on the die pad surface 112 is smaller than the number of semiconductor chips that can be disposed on the die pad surface 111.

Thus, the above-described problems are more likely to occur in forming the resin portion 71 for covering the die pad surface 111, on which a larger number of semiconductor chips are disposed, than in forming the resin portion 72 for covering the die pad surface 112, on which a smaller number of semiconductor chips are disposed. If such a problem as described above is found in the final step in the process for making the semiconductor device 101C, all the steps performed before the final step will have been wasted. In this embodiment, the step for forming the resin portion 71, in which such a problem is more likely to occur, is performed before the step of forming the resin portion 72, in which such a problem is less likely to occur. This increases the possibility that the problem, if occurs, is found in a relatively early stage in the process of manufacturing the semiconductor device 101C. This reduces the number of steps to be wasted and hence contributes to enhancement of the efficiency of manufacture of the semiconductor device 101C.

In this embodiment, both of the wires 81 and the wire 82 are bonded to the wire bonding portions 21. The wires 81 are bonded to the wire bonding surface 211, whereas the wire 82 is bonded to the wire bonding surface 212 on the opposite side of the wire bonding surface 211. According to this arrangement, it is not necessary to bond the wires 81 and 82 to a same surface. This allows the size of the wire bonding surface 211 as viewed toward the X-Y plane to be reduced.

2C Embodiment

The 2C Embodiment of the variation of the present invention is described below with reference to FIGS. 70-75. In the figures referred to below, the elements that are identical or similar to those of the foregoing embodiments are designated by the same reference signs as those used for the foregoing embodiments, and description of the elements is omitted.

Figure 70:
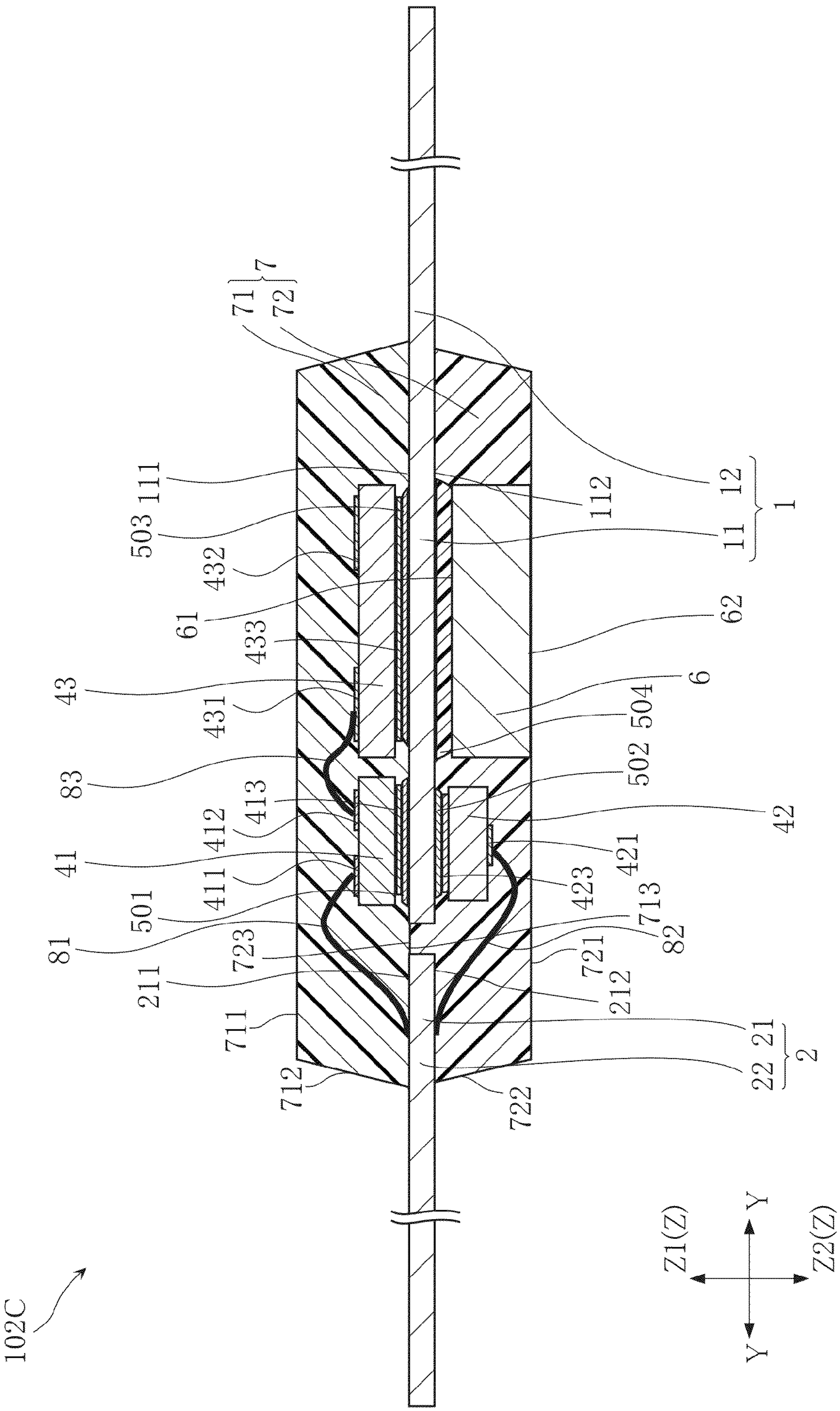
FIG. 70 is a sectional view of a semiconductor device according to the 2C Embodiment.
Figure 71:
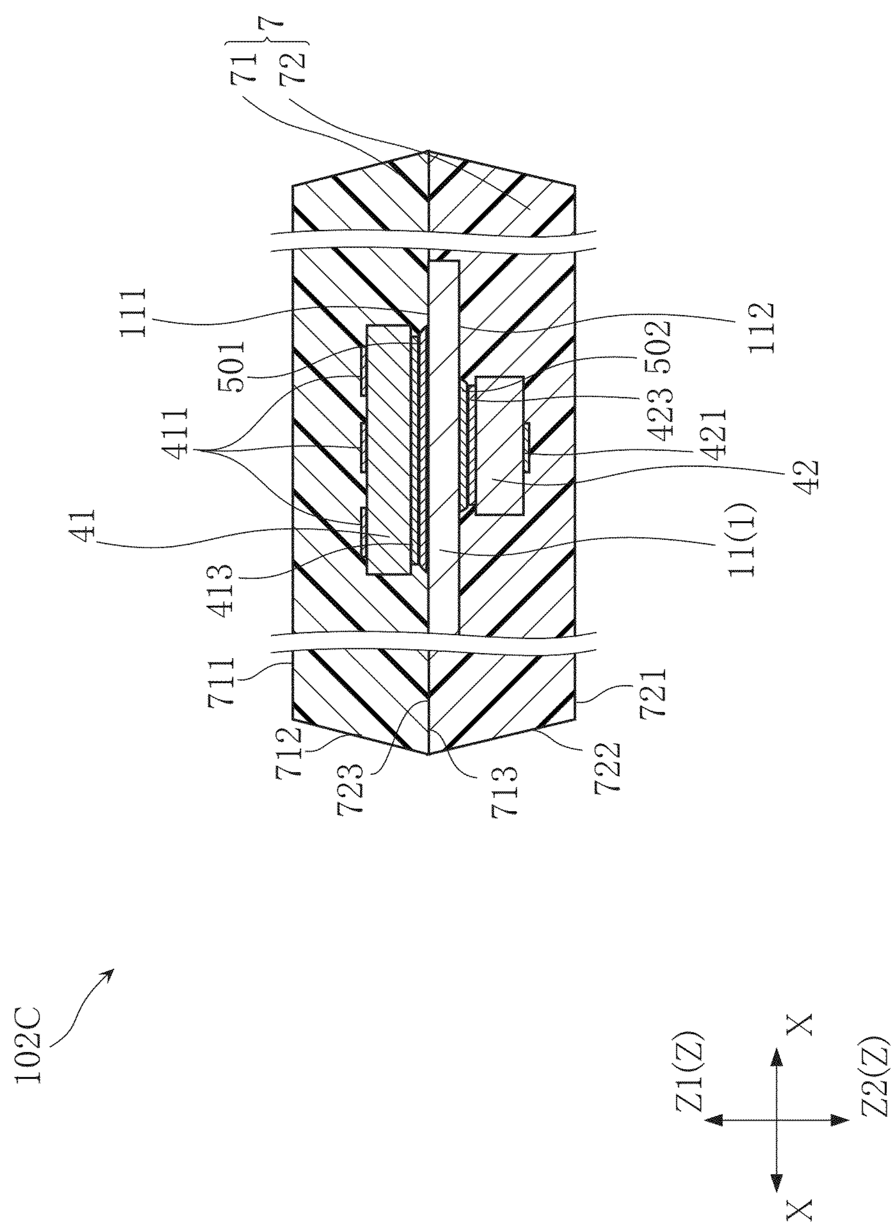
FIG. 71 is a sectional view of the semiconductor device according to the 2C Embodiment.

FIG. 70 is a sectional view of the semiconductor device according to this embodiment. FIG. 71 is another sectional view of the semiconductor device according to this embodiment.

This embodiment differs from the 1C Embodiment mainly in that the resin portion 71 and the resin portion 72 are formed in reverse order so that the semiconductor device 102C has a different structure. This is explained below in detail.

The semiconductor device 102C includes a plurality of electrodes 1, 2 and 3, a semiconductor chip 41 (second semiconductor chip), a semiconductor chip 42 (first semiconductor chip), a semiconductor chip 43 (third semiconductor chip), a bonding layer 501 (second bonding layer), a bonding layer 502 (first bonding layer), a bonding layer 503 (third bonding layer), a bonding layer 504, a heat sink 6, a sealing resin portion 7, a wire 81 (second wire), a wire 82 (first wire), and wires 83, 84.

Since the structures of the semiconductor chips 41, 42, 43, bonding layers 501, 502, 503, 504, heat sink 6 and wires 81, 82, 83, 84 of the semiconductor device 102C are the same as those of the semiconductor device 101C, description of these structures is omitted.

The electrode 1 includes a die pad 11 and a lead 12 (first lead). The die pad 11 includes a die pad surface 111 (second die pad surface) and a die pad surface 112 (first die pad surface). Since the structure of the electrode 1 of this embodiment is the same as that of 1C embodiment, the description is omitted. Since the structures of the electrodes 2 and 3 of this embodiment are the same as those of 1C embodiment, the description is omitted.

The sealing resin portion 7 includes a resin portion 71 (second resin portion) and a resin portion 72 (first resin portion). In this embodiment, unlike the foregoing embodiment, the resin surface 713 (second resin surface) of the resin portion 71 is not flush with the die pad surface 112. The resin surface 723 (first resin surface) of the resin portion 72 is flush with the die pad surface 111. Except this point, the resin portions 71 and 72 have the same structure as those of the 1C Embodiment, so that the description is omitted.

A method for manufacturing the semiconductor device 102C is described below with reference to FIGS. 72-75. In the figures used below for describing the manufacturing method, the elements that are identical or similar to those described above are designated by the same reference signs as those used above.

Figure 72:
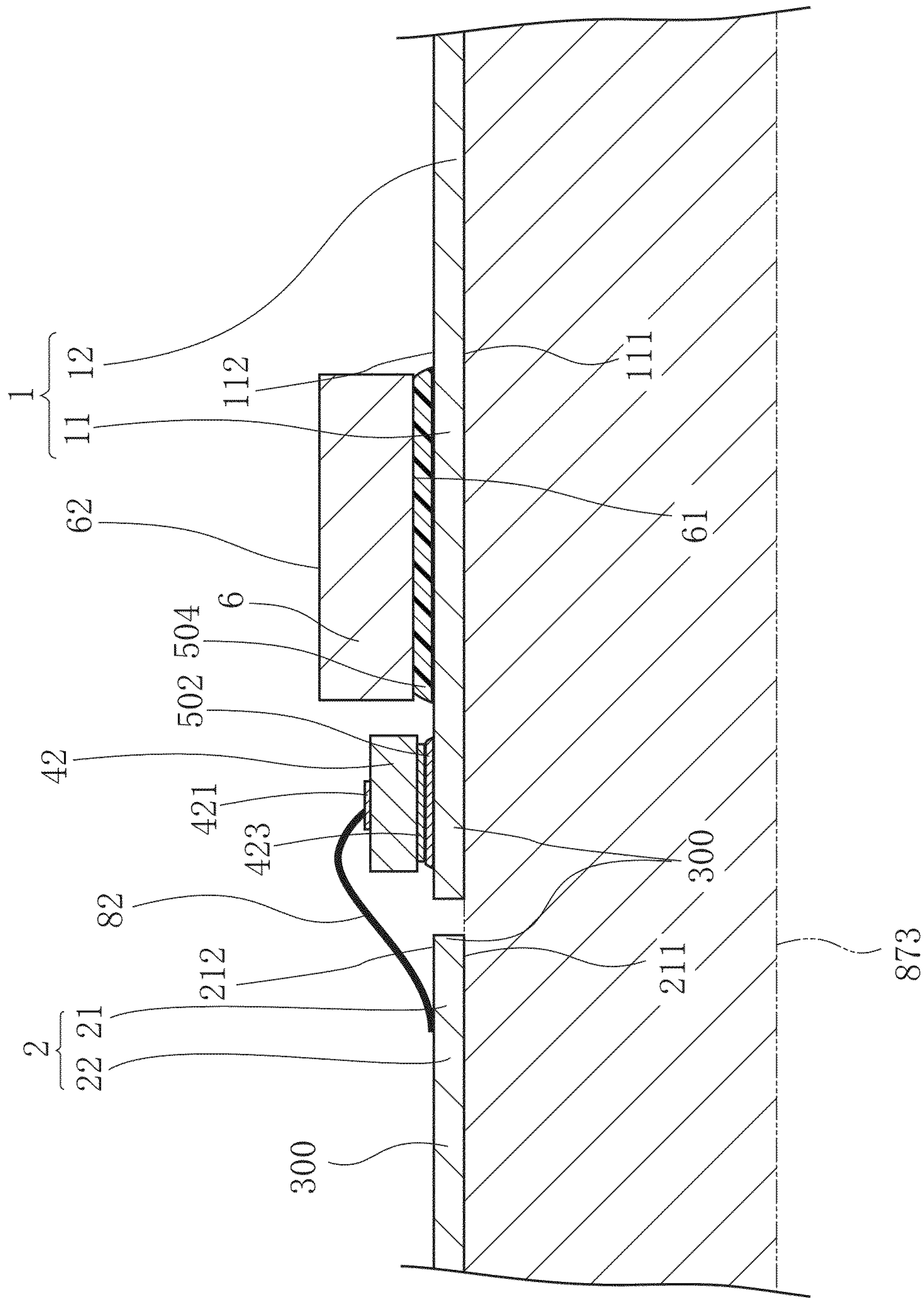
FIG. 72 is a sectional view showing a process step of a method for manufacturing a semiconductor device according to the 2C Embodiment.

In this embodiment again, as shown in FIG. 72, a lead frame 300 is prepared and placed on a base 873. When the lead frame 300 is placed on the base 873, the die pad surface 111 of the die pad 11 is in contact with the base 873.

Then, as shown in the figure, a semiconductor chip 42 is disposed on the die pad surface 112. The semiconductor chip 42 is bonded to the die pad surface 112 via a bonding layer 502. Then, as shown in the figure, a wire 82 is bonded to the semiconductor chip 42 and the wire bonding portion 21. Then, a heat sink 6 is disposed on the die pad surface 112. The heat sink 6 is bonded to the die pad surface 112 via a bonding layer 504.

Figure 73:
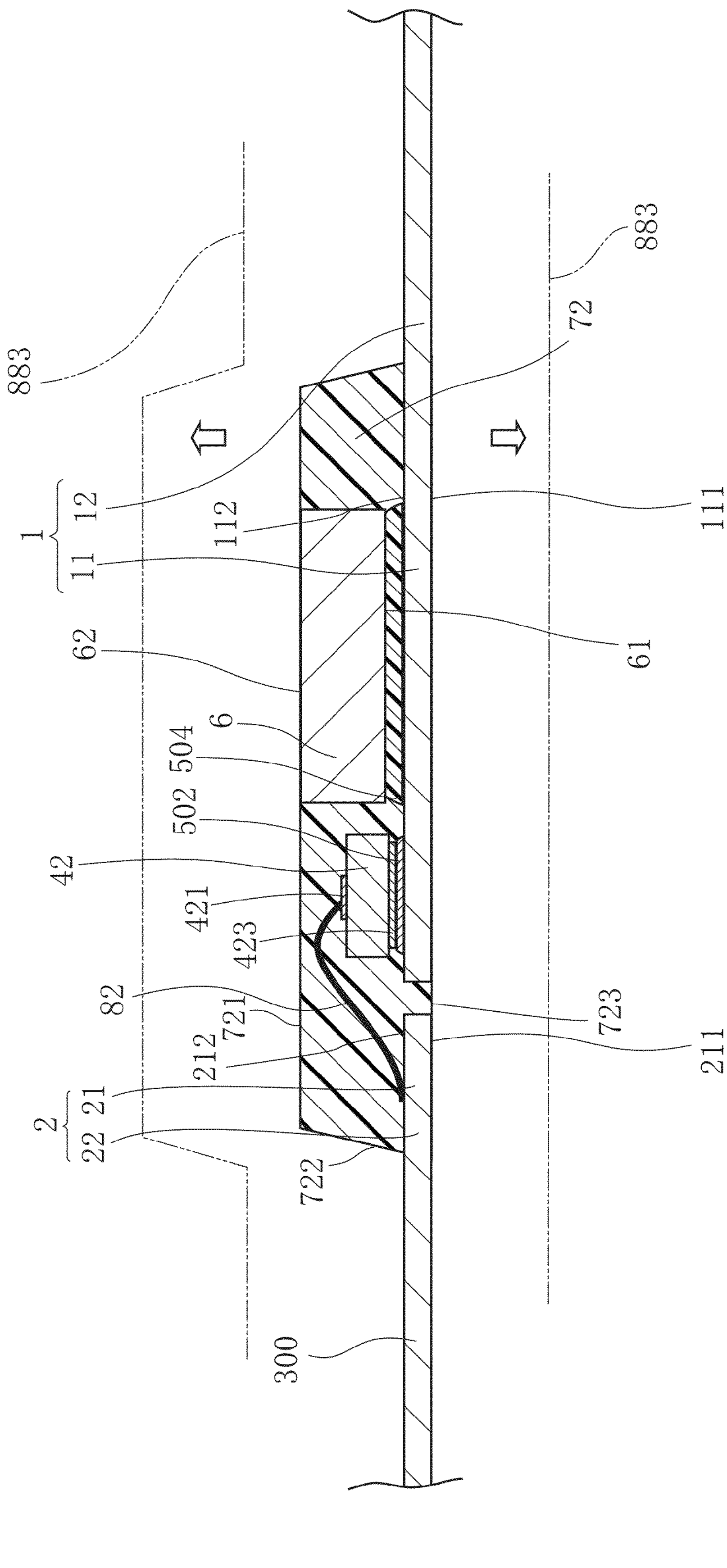
FIG. 73 is a sectional view showing the process step subsequent to FIG. 72.

Then, a resin portion 72 is formed as shown in FIG. 73. The resin portion 72 is formed by molding using a mold 883.

In the process of forming the resin portion 72, the flat surface of the lower part of the mold member 883 in FIG. 73 is in contact with the die pad surface 111 and the wire bonding surface 211. Thus, a resin surface 723 which is flush with the die pad surface 111 and the wire bonding surface 211 is formed in the resin portion 72.

Figure 74:
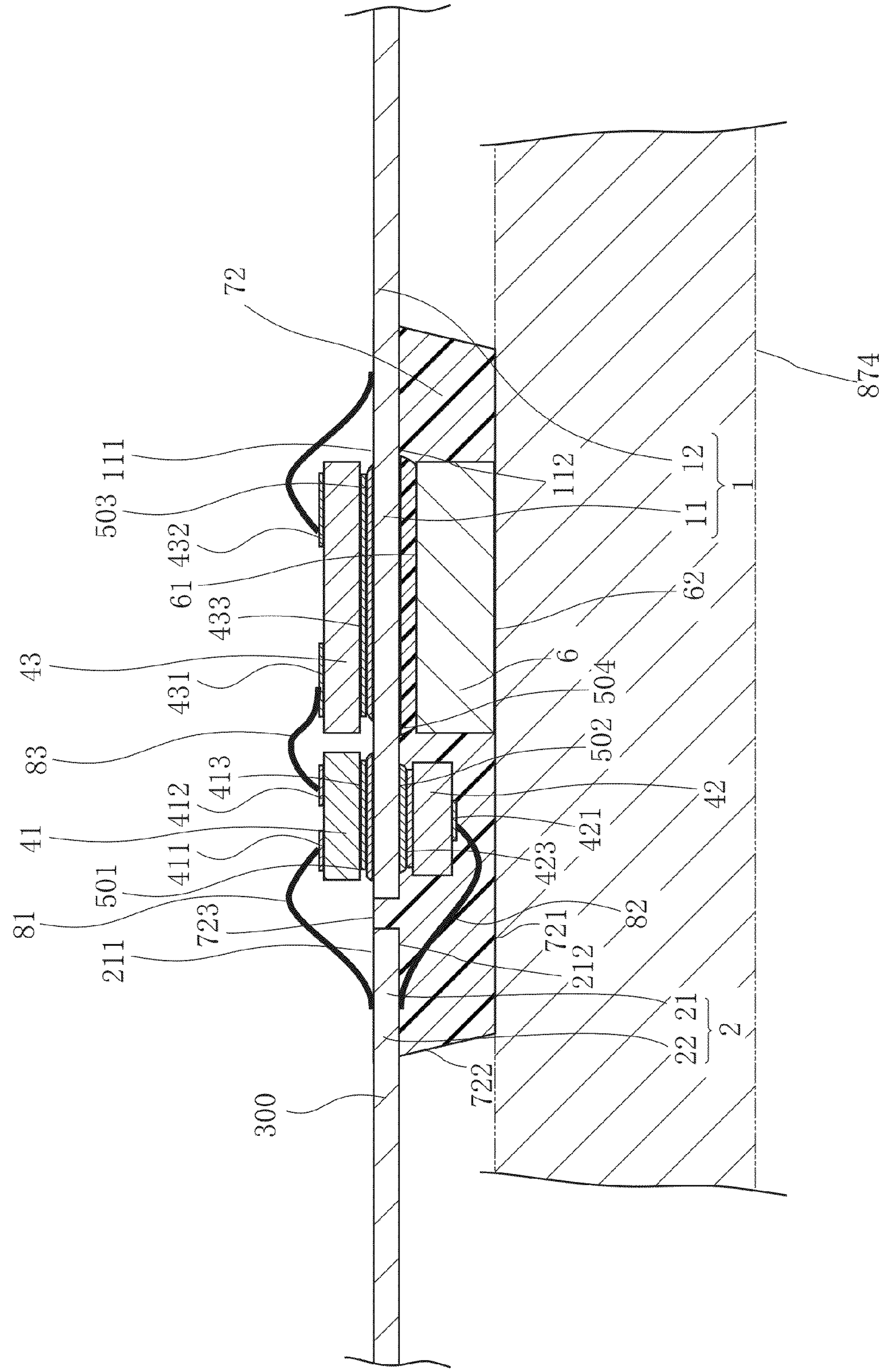
FIG. 74 is a sectional view showing the process step subsequent to FIG. 73.

Then, as shown in FIG. 74, the product shown in FIG. 73 is turned over. Then, the lead frame 300 is placed on the base 874. When the lead frame 300 is placed on the base 874, the resin portion 72 is in contact with the base 874.

Then, as shown in the figure, semiconductor chips 41 and 43 are placed on the die pad surface 111. Then, as shown in the figure, a wire 81 is bonded to the semiconductor chip 41 and the wire bonding portion 21. Wires 83 and 84 are also bonded to the semiconductor chip 43 and so on.

Figure 75:
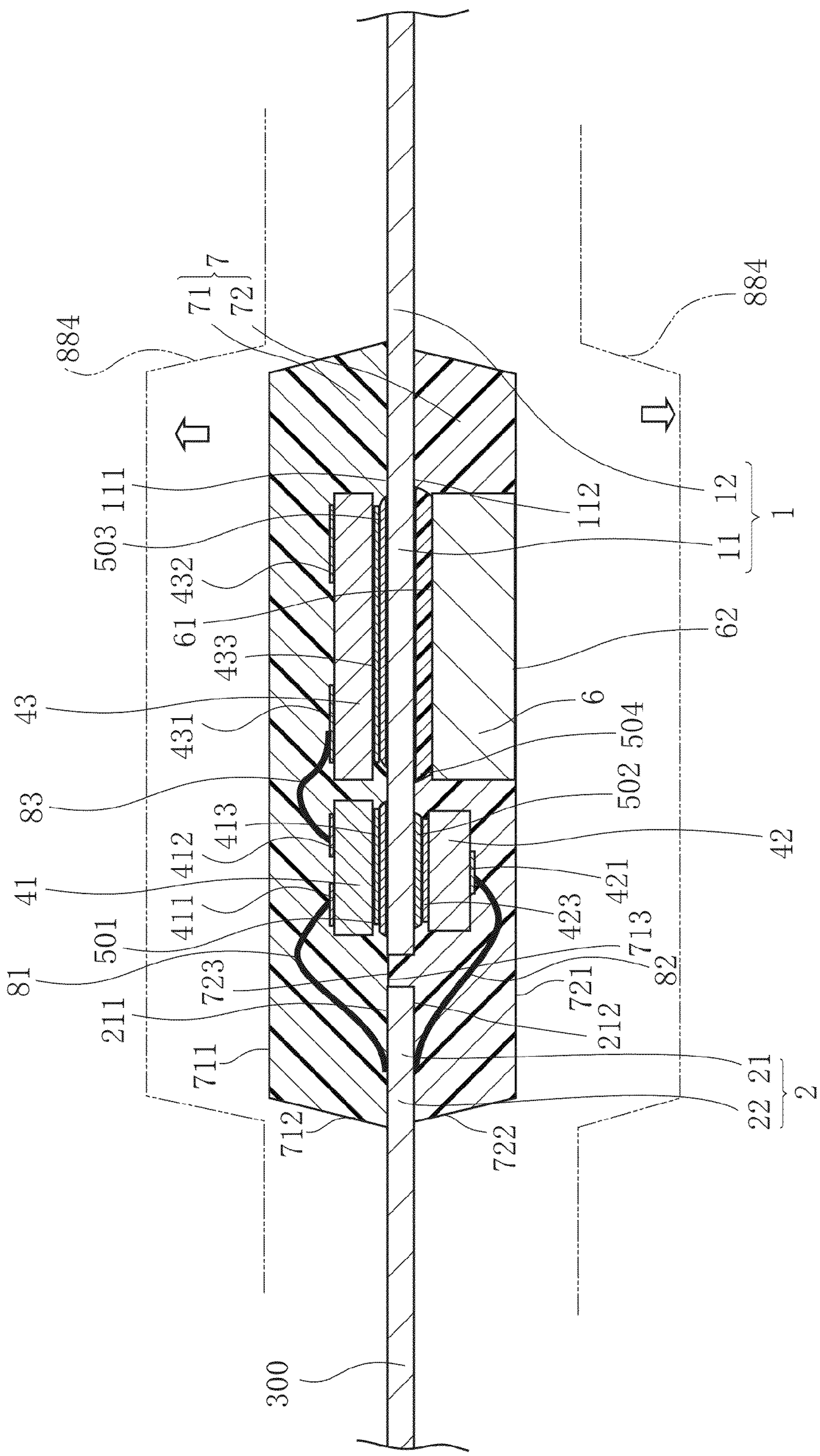
FIG. 75 is a sectional view showing the process step subsequent to FIG. 74.

Then, a resin portion 71 is formed as shown in FIG. 75. As shown in FIG. 75, the resin portion 71 is formed by molding using a mold 884. A resin surface 713 in contact with the resin surface 723 is formed in the resin portion 71.

Then, the lead frame 300 is cut appropriately, whereby the semiconductor device 102C shown in e.g. FIG. 70 is obtained.

The advantages of this embodiment are described below.

In this embodiment, the die pad surface 111 and the die pad surface 112 face away from each other. The semiconductor chip 41 is arranged on the die pad surface 111, whereas the semiconductor chip 42 is arranged on the die pad surface 112. Thus, the semiconductor chip 41 and the semiconductor chip 42 are on the opposite sides of the die pad 11. For the same reason as described as to the 1C Embodiment, this arrangement reduces the size of the semiconductor device 102C as viewed toward the X-Y plane.

In the semiconductor device 102C, a part of the semiconductor chip 42 overlaps the semiconductor chip 41 as viewed toward the X-Y plane. This arrangement further contributes to reduction of the size of the semiconductor device 102C as viewed toward the X-Y plane.

In this embodiment, the step of disposing the semiconductor chip 42 is performed before the step of disposing the semiconductor chip 41. Thus, as shown in FIG. 72, in disposing the semiconductor chip 42, the semiconductor chip 41 is not on the die pad surface 111. According to this method, for the same reason as described with respect to the IC Embodiment, the semiconductor chip 42 is accurately disposed on the die pad 11.

In this embodiment, the step of disposing the semiconductor chip 41 is performed after the step of forming the resin portion 72. Thus, as shown in FIG. 74, in disposing the semiconductor chip 41, the semiconductor chip 42 is covered by the resin portion 72. According to this method, for the same reason as described with respect to the IC Embodiment, the semiconductor chip 41 is accurately disposed on the die pad 11.

In this way, the method according to this embodiment makes it possible to manufacture the semiconductor device 102C in which both of the semiconductor chip 41 and the semiconductor chip 42 are accurately disposed.

In this embodiment, the wire 82 bonded to the semiconductor chip 42 is covered by the resin portion 72 in the process of forming the resin portion 72. Thus, even when the semiconductor device 102C has the wire 82, the semiconductor chip 41 is accurately arranged on the die pad 11, for the same reason as described with respect to the 1C Embodiment.

In this embodiment, the step of forming the resin portion 72 for covering the semiconductor chip 42 is performed before the step of disposing the semiconductor chip 41, and the step of forming the resin portion 71 for covering the semiconductor chip 41 is performed after the step of disposing the semiconductor chip 41. That is, all the semiconductor chips of the semiconductor device 102C are not simultaneously covered by the sealing resin portion 7. Thus, when such a problem as described above occurs in covering the semiconductor chip 42 with the resin portion 72, the problem is found before the step of disposing the semiconductor chip 41 is performed. Thus, the semiconductor chip 41 is reliably disposed only on a product that is not defective. This prevents waste of the semiconductor chip 41.

In this embodiment, both of the wires 81 and the wire 82 are bonded to the wire bonding portions 21. The wires 81 are bonded to the wire bonding surface 211, whereas the wire 82 is bonded to the wire bonding surface 212 on the opposite side of the wire bonding surface 211. According to this arrangement, it is not necessary to bond the wires 81 and 82 to a same surface. This allows the size of the wire bonding portion 21 within the X-Y plane to be reduced.

The variation of the present invention is not limited to the foregoing embodiments. The specific structure of each part of the variation of the present invention can be varied in design in many ways. For instance, the semiconductor device 101C, 102C may not include the heat sink 6. Even in the case where the semiconductor device 101C, 102C is to include the heat sink 6, the heat sink 6 does not necessarily need to be disposed on the die pad 11 at the above-described timing. That is, a recess may be formed in the resin portion 72, and the heat sink 6 may be disposed in the recess of the resin portion 72 after both of the resin portion 71 and the resin portion 72 are formed. Further, although the semiconductor device for insertion mounting is exemplarily described in the foregoing embodiments, the semiconductor device may be of a surface-mounting type. As the semiconductor chip 41 to be disposed on the same side as the heat sink 6, a component other than a power transistor, such as an LSI or a discrete component, may be employed.

The variation of the present invention is summarized below.

(Appendix 1)

A semiconductor device comprising:

a die pad including a first die pad surface and a second die pad surface which face away from each other;

a first semiconductor chip on the first die pad surface;

a second semiconductor chip on the second die pad surface; and a sealing resin portion covering the first die pad surface and the second die pad surface, wherein the sealing resin portion includes a first resin portion covering the first semiconductor chip and a second resin portion covering the second semiconductor chip, the first resin portion including a first resin surface, the second resin portion including a second resin surface in contact with the first resin surface.

(Appendix 2)

The semiconductor device as set forth in Appendix 1, wherein the first semiconductor chip includes a portion overlapping the second semiconductor chip as viewed in a thickness direction of the die pad.

(Appendix 3)

The semiconductor device as set forth in Appendix 1 or 2, further comprising a first wire bonded to the first semiconductor chip.

(Appendix 4)

The semiconductor device as set forth in any one of Appendixes 1-3, further comprising a heat sink on the die pad.

(Appendix 5)

The semiconductor device as set forth in Appendix 4, wherein the heat sink is on the second die pad surface.

(Appendix 6)

The semiconductor device as set forth in Appendix 4, wherein the heat sink is on the first die pad surface.

(Appendix 7)

The semiconductor device as set forth in any one of Appendixes 4-6, further comprising a third semiconductor chip arranged on the die pad on an opposite side of the heat sink with respect to the die pad, wherein the third semiconductor chip includes a portion overlapping the heat sink as viewed in a thickness direction of the die pad.

(Appendix 8)

The semiconductor device as set forth in any one of Appendixes 1-7, wherein the first resin surface is flush with the second die pad surface.

(Appendix 9)

The semiconductor device as set forth in any one of Appendixes 4-7, wherein the heat sink includes a portion covered by the sealing resin portion.

(Appendix 10)

The semiconductor device as set forth in Appendix 3, further comprising: a second wire bonded to the second semiconductor chip; and a wire bonding portion to which both of the first wire and the second wire are bonded.

(Appendix 11)

The semiconductor device as set forth in any one of Appendixes 1-10, further comprising:

a first bonding layer between the first semiconductor chip and the first die pad surface; and a second bonding layer between the second semiconductor chip and the second die pad surface, wherein both of the first bonding layer and the second bonding layer are made of an electrically conductive material.

(Appendix 12)

The semiconductor device as set forth in any one of Appendixes 1-11, wherein the first resin portion includes a first principal surface facing to a same direction as the first die pad surface, and a first side surface connected to the first principal surface, whereas the second resin portion includes a second principal surface facing to a same direction as the second die pad surface, and a second side surface connected to the second principal surface, and the first side surface is inclined with respect to the first principal surface to form an obtuse angle with the first principal surface, whereas the second side surface is inclined with respect to the second principal surface to form an obtuse angle with the second principal surface.

(Appendix 13)

The semiconductor device as set forth in any one of Appendixes 1-12, further comprising:

a first lead connected to the die pad and projecting from the sealing resin portion; and a second lead connected to the wire bonding portion and projecting from the sealing resin portion.

(Appendix 14)

A method for manufacturing a semiconductor device, comprising the steps of:

preparing a lead frame including a die pad that includes a first die pad surface and a second die pad surface which face away from each other;

disposing a first semiconductor chip on the first die pad surface;

forming a first resin portion to cover the first die pad surface and the first semiconductor chip;

disposing a second semiconductor chip on the second die pad surface after the step of forming the first resin portion; and forming a second resin portion to cover the second die pad surface and the second semiconductor chip.

(Appendix 15)

The method for manufacturing a semiconductor device as set forth in Appendix 14, wherein the step of disposing the second semiconductor chip comprises disposing the second semiconductor chip at a position that overlaps the first semiconductor chip as viewed in a thickness direction of the die pad.

(Appendix 16)

The method for manufacturing a semiconductor device as set forth in Appendix 14 or 15, further comprising the step of bonding a first wire to the first semiconductor chip before the step of forming a first resin portion, wherein the step of forming a first resin portion comprises covering the first wire by the first resin portion.

(Appendix 17)

The method for manufacturing a semiconductor device as set forth in any one of Appendixes 14-16, further comprising the step of disposing a heat sink on the die pad.

(Appendix 18)

The method for manufacturing a semiconductor device as set forth in Appendix 17, wherein the step of disposing a heat sink is performed after the step of forming a first resin portion and comprises disposing the heat sink on the second die pad surface.

(Appendix 19)

The method for manufacturing a semiconductor device as set forth in Appendix 17, wherein the step of disposing a heat sink is performed before the step of forming a first resin portion and comprises disposing the heat sink on the first die pad surface.

(Appendix 20)

The method for manufacturing a semiconductor device as set forth in any one of Appendixes 17-19, further comprising the step of disposing a third semiconductor chip on the die pad, wherein the step of disposing a heat sink comprises disposing the heat sink at a position that overlaps the third semiconductor chip as viewed in a thickness direction of the die pad.

(Appendix 21)

The method for manufacturing a semiconductor device as set forth in Appendix 16, further comprising the steps of:

bonding the first wire to the wire bonding portion; and bonding a second wire to the second semiconductor chip and the wire bonding portion before the step of forming a second resin portion.

(Appendix 22)

The method for manufacturing a semiconductor device as set forth in any one of Appendixes 14-21, wherein:

the step of disposing a first semiconductor chip comprises bonding the first semiconductor chip to the first die pad surface via a first bonding layer made of an electrically conductive material; and the step of disposing a second semiconductor chip comprises bonding the second semiconductor chip to the second die pad surface via a second bonding layer made of an electrically conductive material.

1D Embodiment

The 1D Embodiment of the variation of the present invention is described below with reference to FIGS. 76-94.

FIGS. 76-94 show a method for manufacturing a semiconductor device according to this embodiment, and a semiconductor device according to this embodiment. The semiconductor device and the method for manufacturing the semiconductor device according to this embodiment are described below with reference to these figures.

Figure 76:
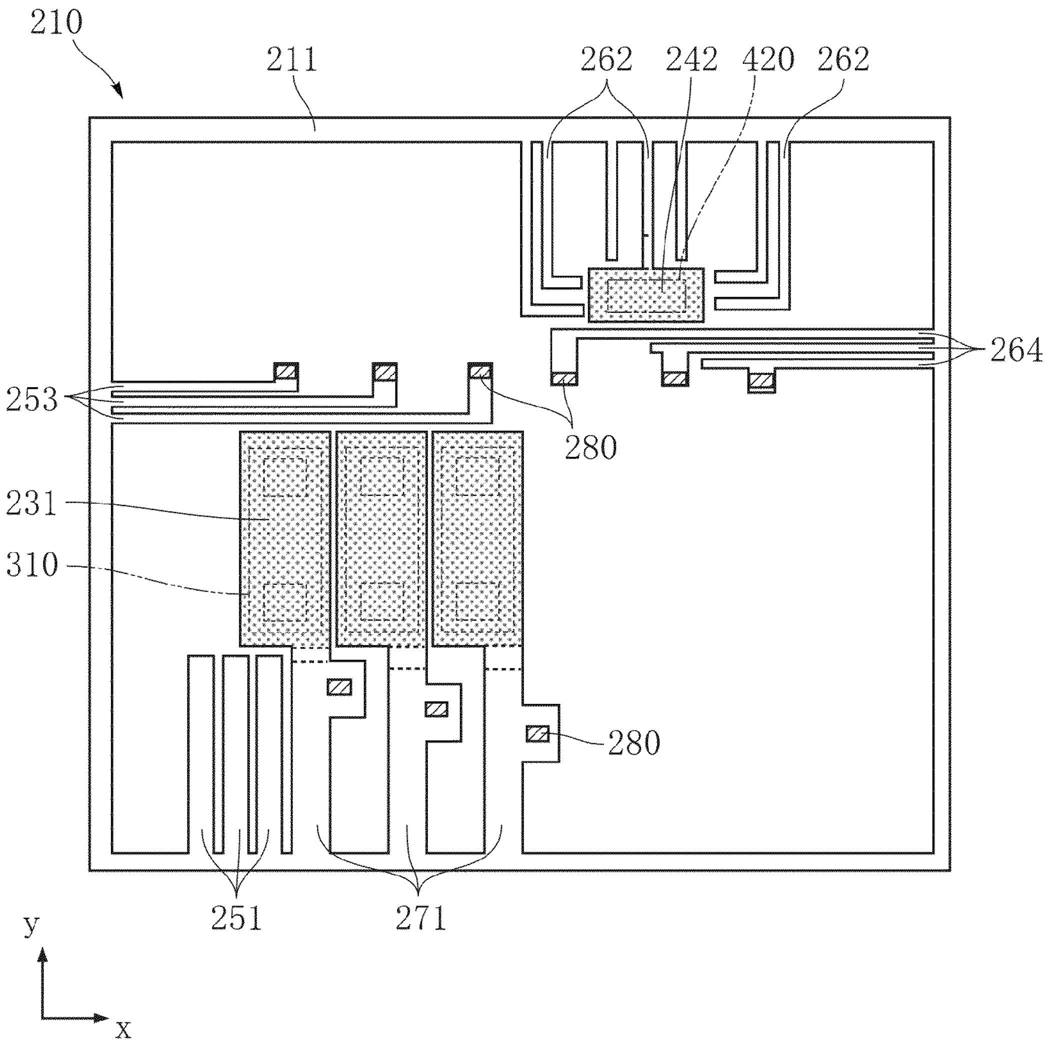
FIG. 76 is a plan view of a first lead frame used for manufacturing a semiconductor device according to the 1D Embodiment.
Figure 77:
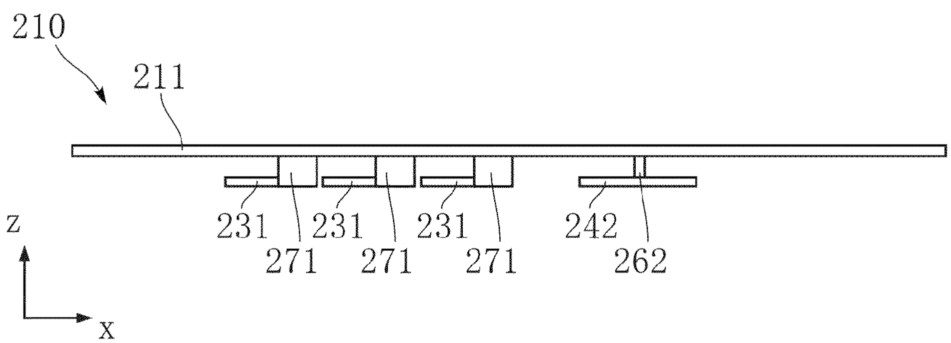
FIG. 77 is a side view showing the first lead frame of FIG. 76.
Figure 78:
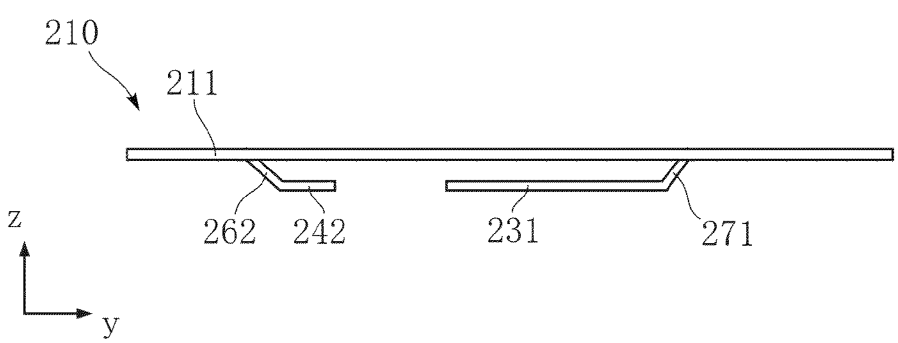
FIG. 78 is a side view showing the first lead frame of FIG. 76.

First, a lead frame 210 is prepared as shown in FIGS. 76-78. The lead frame 210 corresponds to the first lead frame of the variation of the present invention. The lead frame 210 includes a frame 211, a plurality of main islands 231, an auxiliary island 242, a plurality of main leads 251, 253, a plurality of auxiliary leads 262, 264, and a plurality of support leads 271. The frame 211 corresponds to the first frame of the variation of the present invention. The main islands 231 correspond to the first main island of the variation of the present invention. The auxiliary island 242 corresponds to the second auxiliary island of the variation of the present invention. The main leads 251 and 253 correspond to the first main lead of the variation of the present invention. The auxiliary leads 262 and 264 correspond to the second auxiliary lead of the variation of the present invention. The support lead 271 corresponds to the first support lead of the variation of the present invention. The lead frame 210 is obtained by collectively performing punching and bending with respect to a metal plate made of e.g. Cu or Cu alloy.

The frame 211 connects the elements of the lead frame 210 to each other and is in the form of a rectangular enclosure in this embodiment. The main islands 231 are the portions on which control elements 310, which will be described later, are to be mounted and may be rectangular. The auxiliary island 242 is the portion on which a driver element 420, which will be described later, is to be mounted and may be rectangular. As shown in FIGS. 77 and 78, the main islands 231 and the auxiliary island 242 are at positions shifted from the frame 211 in the z direction. In FIG. 76, the portions shifted from the frame 211 in the z direction are shown by hatching. As shown in FIG. 76, the main islands 231 and the auxiliary island 242 are spaced apart from each other in both of the x direction and the y direction.

Each of the main leads 251 is in the form of a strip extending from the frame 211 toward the main islands 231 in the y direction. Each of the main leads 253 is in the form of a strip extending from the frame 211 toward the main islands 231 in the x direction and is bent so that its end faces to the y direction. Each of the auxiliary leads 262 is in the form of a strip extending from the frame 211 toward the auxiliary island 242 in the y direction. Some of the auxiliary leads 262 have ends directed to the x direction. Each of the auxiliary leads 264 is in the form of a strip extending from the frame 211 toward the auxiliary island 242 in the direction x and is bent so that its end faces to the y direction. Each of the support leads 271 connects the frame 211 and one of the main islands 231. Each support lead 271 has a wider part that has a larger dimension in the x direction than other portions.

Solder 280 is applied to the end of each main lead 253, the end of each auxiliary lead 264 and the wider part of each support lead 271 which has a larger dimension in the x direction. The solder 280 is used to bond the lead frame 210 to a lead frame 220, which will be described later. The application of the solder 280 may be performed at any timing before the step of bonding the lead frames 210 and 220.

Figure 79:
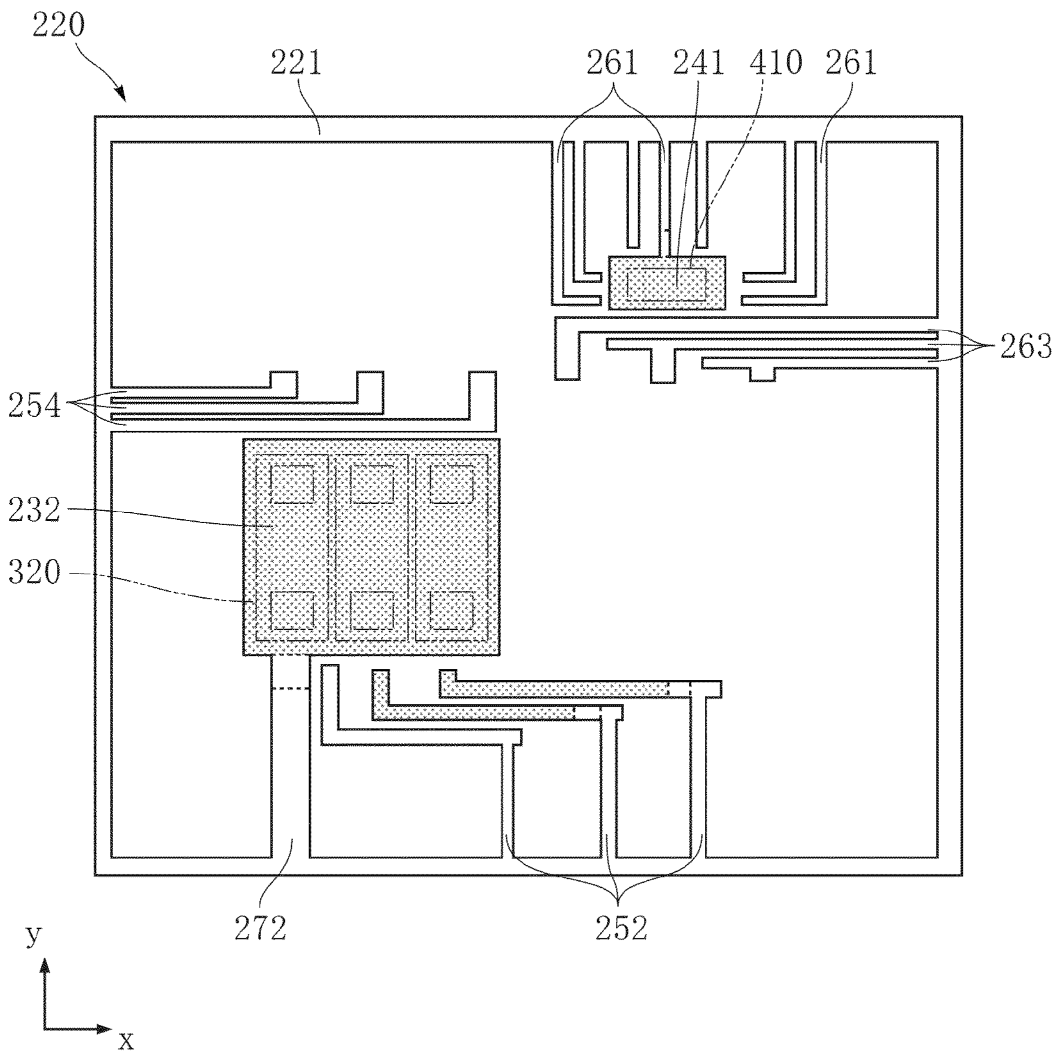
FIG. 79 is a plan view of a second lead frame used for manufacturing a semiconductor device according to the 1D Embodiment.
Figure 80:
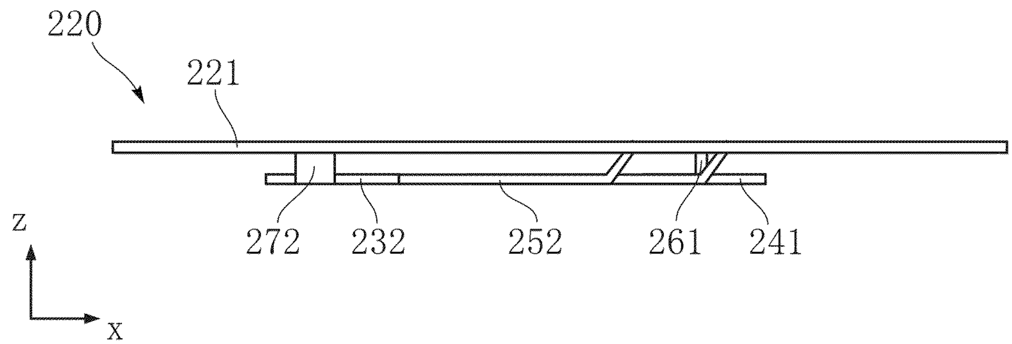
FIG. 80 is a side view showing the second lead frame of FIG. 79.
Figure 81:
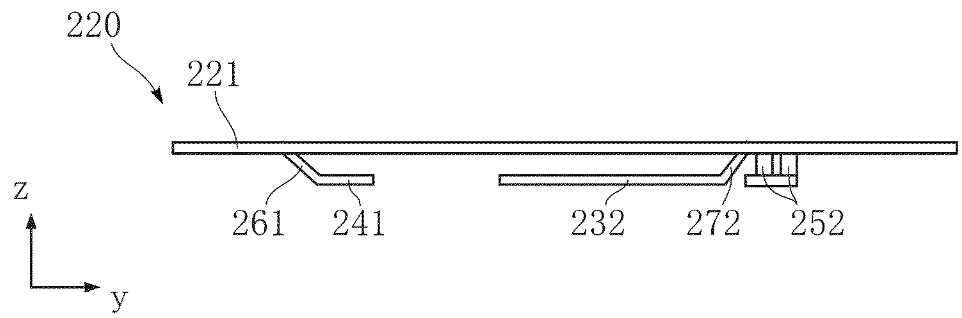
FIG. 81 is a side view showing the second lead frame of FIG. 79.

Then, a lead frame 220 as shown in FIGS. 79-81 is prepared. The lead frame 220 corresponds to the second lead frame of the variation of the present invention. The lead frame 220 includes a frame 221, a main island 232, an auxiliary island 241, a plurality of main leads 252 and 254, a plurality of auxiliary leads 261 and 263 and a support lead 272. The frame 221 corresponds to the second frame of the variation of the present invention, the main island 232 corresponds to the second main island of the variation of the present invention, the auxiliary island 241 corresponds to the first auxiliary island of the variation of the present invention, the main leads 252 and 254 correspond to the second main lead of the variation of the present invention, and the auxiliary leads 261 and 263 correspond to the first auxiliary lead of the variation of the present invention. The lead frame 220 is obtained by collectively performing punching and bending with respect to a metal plate made of e.g. Cu or Cu alloy.

The frame 221 connects the elements of the lead frame 220 to each other and is in the form of a rectangular enclosure in this embodiment. The main island 232 is the portion on which control elements 320, which will be described later, are to be mounted. The main island may be rectangular and has a size that allows arrangement of three control elements 320 on it. The auxiliary island 241 is the portion on which a driver element 410, which will be described later, is to be mounted and may be rectangular. As shown in FIGS. 80 and 81, the main island 232 and the auxiliary island 241 are at positions shifted from the frame 221 in the z direction. In FIG. 79, the portions shifted from the frame 221 in the z direction are shown by hatching. As shown in FIG. 79, the main island 232 and the auxiliary island 241 are spaced apart from each other in both of the x direction and the y direction.

Each of the main leads 252 is in the form of a bent strip including a portion extending from the frame 221 toward the main island 232 in the y direction, a portion extending therefrom in the x direction, and an end portion extending therefrom in the y direction. The end portion extending in the y direction and the intermediate portion extending in the x direction of each of the two main leads 252 from the right in the figure are shifted from the frame 221 in the z direction, similarly to the main island 232 and the auxiliary island 241. Each of the main leads 254 is in the form of a strip extending from the frame 221 toward the main island 232 in the x direction and bent so that its end faces to the y direction. Each of the auxiliary leads 261 is in the form of a strip extending from the frame 221 toward the auxiliary island 241 in the y direction. Some of the auxiliary leads 261 have ends extending in the x direction. Each of the auxiliary leads 263 is in the form of a strip extending from the frame 221 toward the auxiliary island 241 in the x direction and is bent so that its end faces to the y direction. The support lead 272 connects the frame 221 and the main island 232 to each other.

Figure 82:
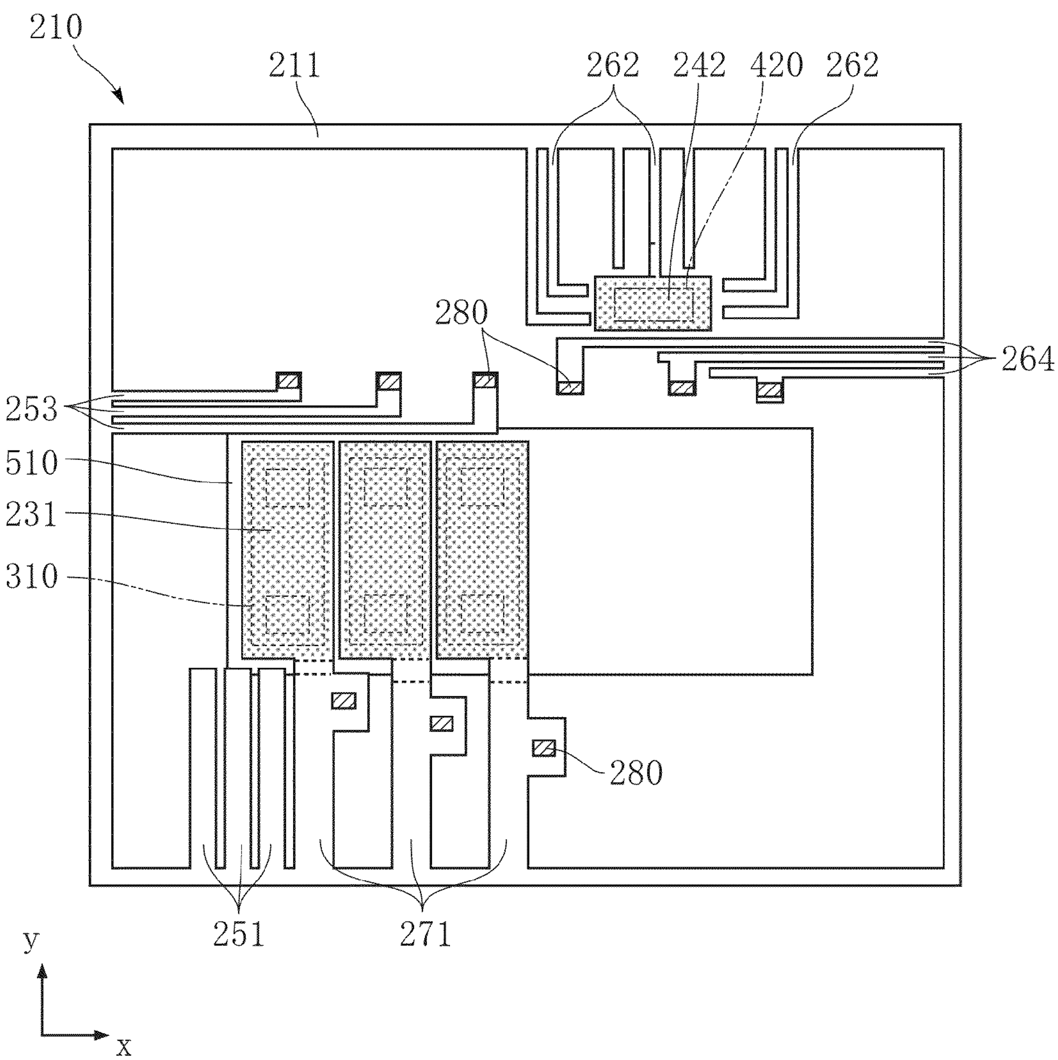
FIG. 82 is a plan view showing the state in which the first heat dissipation plate is attached to the first lead frame in a method for manufacturing the semiconductor device according to the 1D Embodiment.
Figure 83:
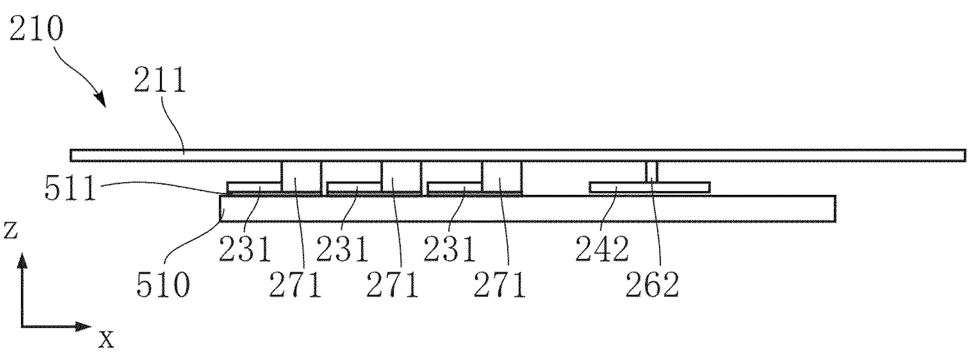
FIG. 83 is a side view showing the first lead frame and the first heat dissipation plate of FIG. 82.
Figure 84:
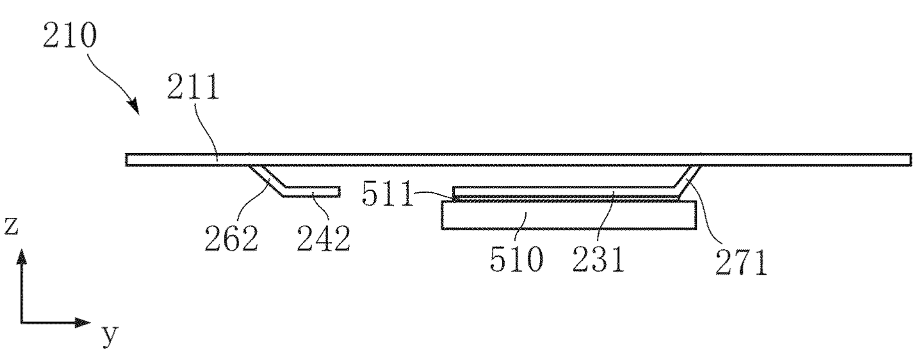
FIG. 84 is a side view showing the first lead frame and the first heat dissipation plate of FIG. 82.

Then, as shown in FIGS. 82-84, a heat dissipation plate 510 is bonded to the three main islands 231 of the lead frame 210. The heat dissipation plate 510 corresponds to the first heat dissipation plate of the variation of the present invention and is made of e.g. Cu. In this embodiment, the heat dissipation plate 510 has a thickness larger than that of the lead frame 210 and is in the form of a rectangle considerably larger than the three main islands 231 combined together, as viewed in plan. The bonding of the heat dissipation plate 510 and the main islands 231 is performed by using an insulating bonding material 511. For instance, the insulating bonding material 511 may be an adhesive sheet including a base material made of polyimide resin.

Figure 85:
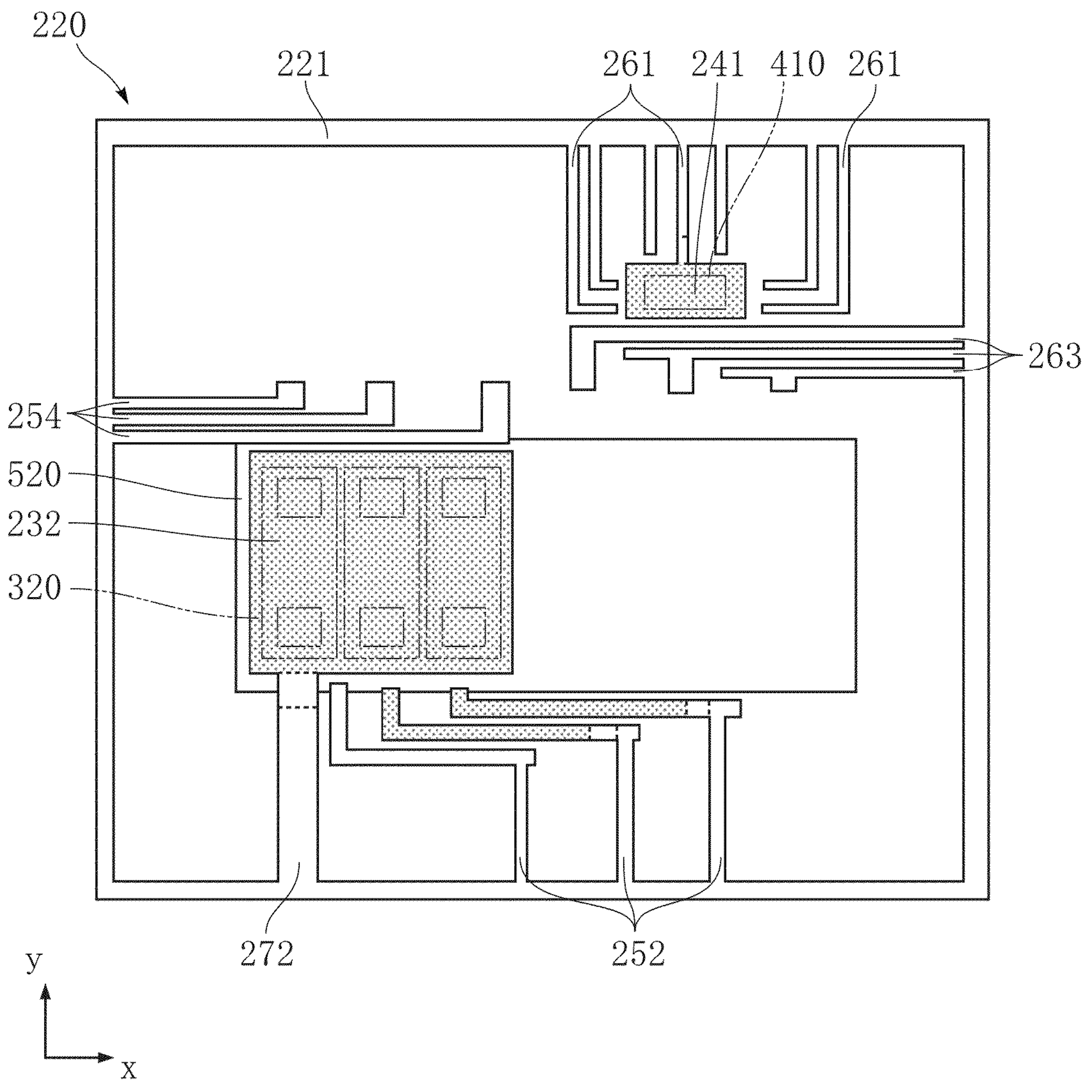
FIG. 85 is a plan view showing the state in which the second heat dissipation plate is attached to the second lead frame in a method for manufacturing the semiconductor device according to the 1D Embodiment.
Figure 86:
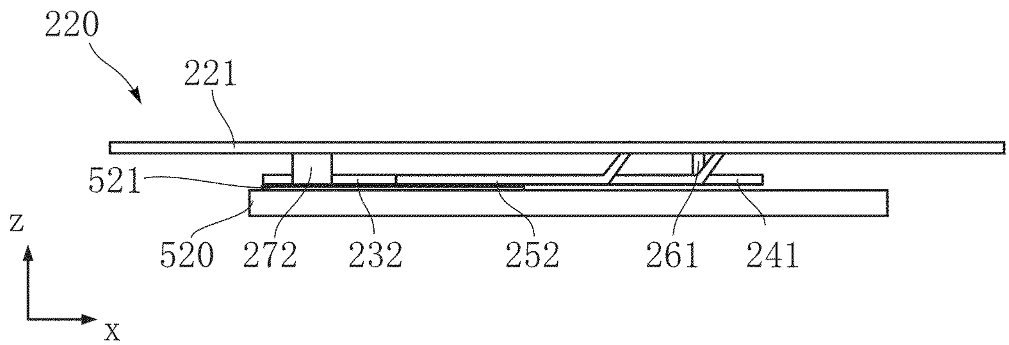
FIG. 86 is a side view showing the second lead frame and the second heat dissipation plate of FIG. 85.
Figure 87:
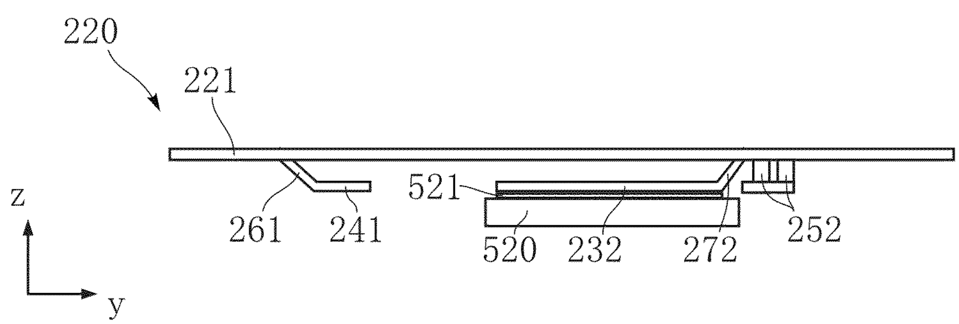
FIG. 87 is a side view showing the second lead frame and the second heat dissipation plate of FIG. 85.

Then, as shown in FIGS. 85-87, a heat dissipation plate 520 is bonded to the main island 232 of the lead frame 220. The heat dissipation plate 520 corresponds to the second heat dissipation plate of the variation of the present invention and is made of e.g. Cu. In this embodiment, the heat dissipation plate 520 has a thickness larger than that of the lead frame 220 and is in the form of a rectangle considerably larger than the main island 232 as viewed in plan. The bonding of the heat dissipation plate 520 and the main island 232 is performed by using an insulating bonding material 521. For instance, the insulating bonding material 521 may be an adhesive sheet including a base material made of polyimide resin.

Figure 88:
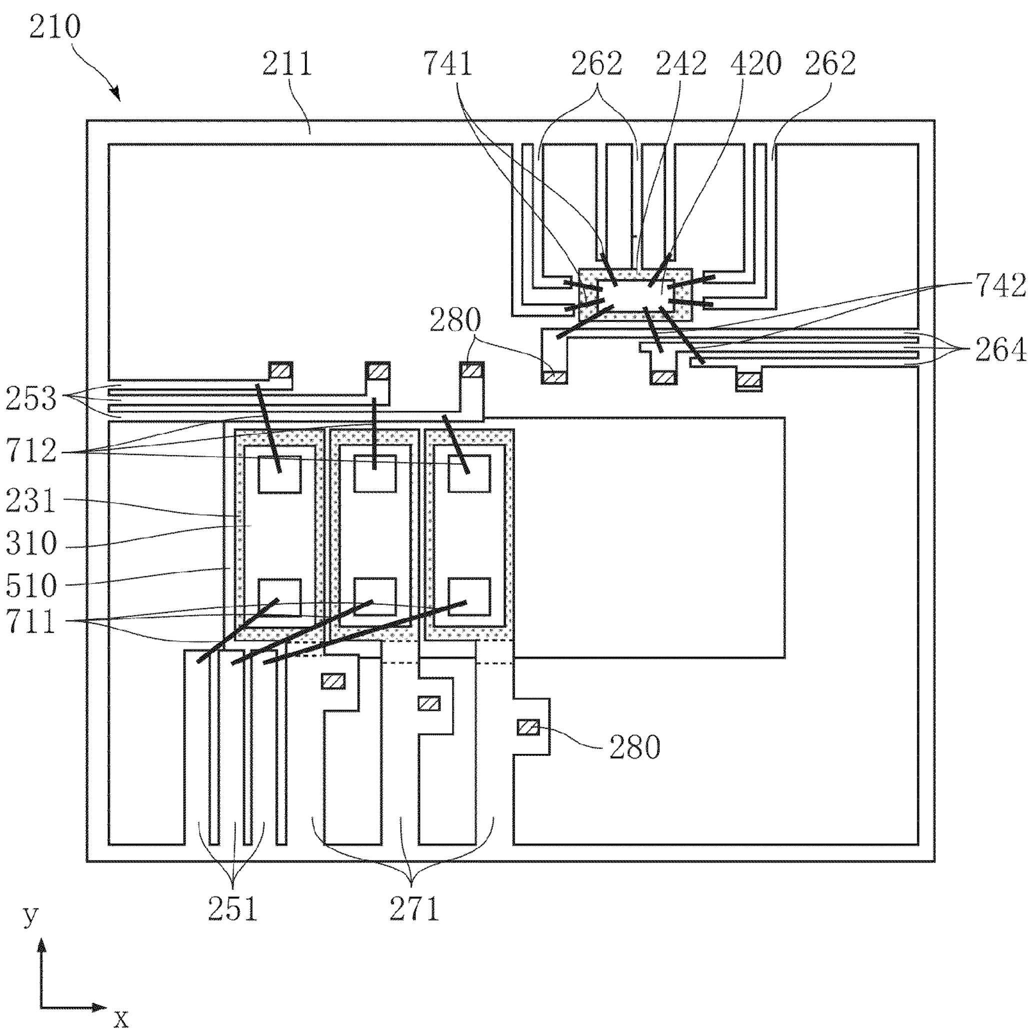
FIG. 88 is a plan view showing the state in which a first control element and a second driver element are mounted to the first lead frame in a method for manufacturing the semiconductor device according to the 1D Embodiment.

Then, as shown in FIG. 88, three control elements 310 and a driver element 420 are mounted to the lead frame 210. Each control element 310 may be a power MOSFET or an IGBT. The driver element 420 is an element for driving and controlling the control element 320, which will be described later. Each control element 310 is mounted to a respective one of the main islands 231. The driver element 420 is mounted to the auxiliary island 242. Mounting of the control elements 310 and the driver element 420 is performed by using insulating paste made of an insulating resin to which Ag particles are added to enhance the thermal conductivity. The control elements 310 and the driver element 420 may be mounted by using electrically conductive paste, depending on their specifications. Then, each of the control elements 310 is connected to a corresponding one of the main leads 251 by a wire 711, and each of the control elements 310 is connected to a corresponding one of the main leads 253 by a wire 712. The driver element 420 is connected to each of the auxiliary leads 262 by a wire 741. The driver element 420 is connected to each of the auxiliary leads 264 by a wire 742.

Figure 89:
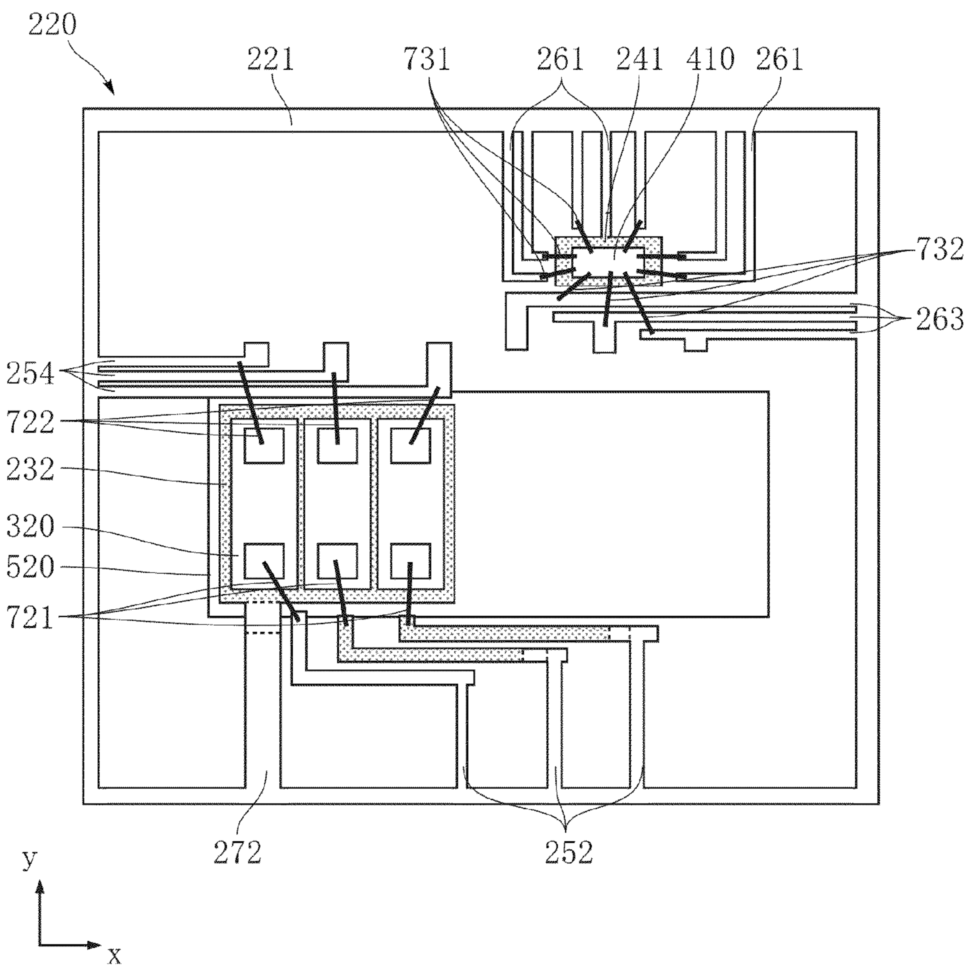
FIG. 89 is a plan view showing the state in which a second control element and a first driver element are mounted to the second lead frame in a method for manufacturing the semiconductor device according to the 1D Embodiment.

Then, as shown in FIG. 89, three control elements 320 and a driver element 410 are mounted to the lead frame 220. Each control element 320 may be a power MOSFET or an IGBT. The driver element 410 is an element for driving the control element 310. The three control element 320 are mounted to the main island 232. The driver element 410 is mounted to the auxiliary island 241. Mounting of the control elements 320 and the driver element 410 is performed by using insulating paste made of an insulating resin to which Ag particles are added to enhance the thermal conductivity. The control elements 320 and the driver element 410 may be mounted by using electrically conductive paste, depending on their specifications. Then, each of the control elements 320 is connected to a corresponding one of the main leads 252 by a wire 721, and each of the control elements 320 is connected to a corresponding one of the main leads 254 by a wire 722. The driver element 410 is connected to each of the auxiliary leads 261 by a wire 731. The driver element 410 is connected to each of the auxiliary leads 263 by a wire 732.

Figure 90:
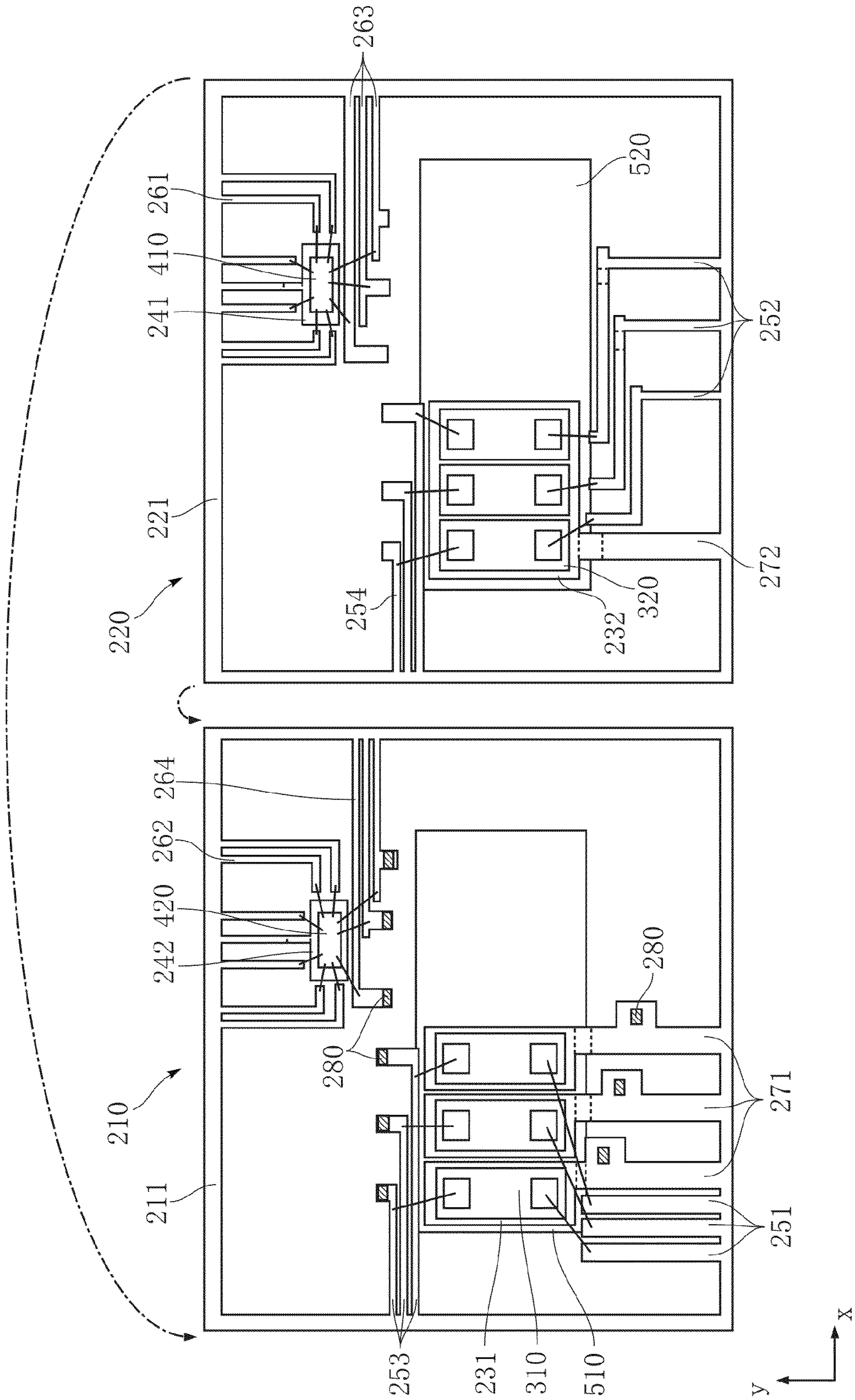
FIG. 90 is a plan view showing the step of bonding the first and the second lead frames in a method for manufacturing the semiconductor device according to the 1D Embodiment.
Figure 91:
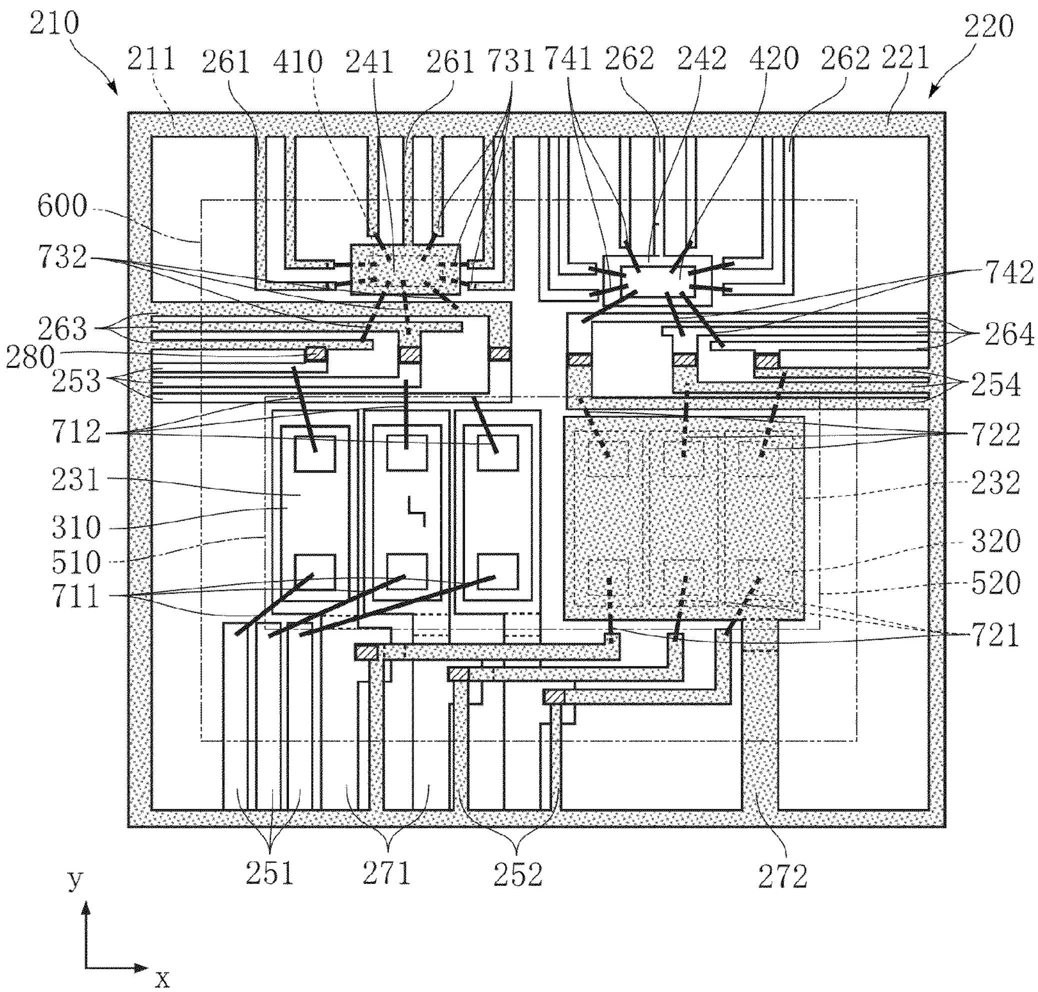
FIG. 91 is a plan view showing the state in which the first and the second lead frames are bonded in a method for manufacturing the semiconductor device according to the 1D Embodiment.

Then, as shown in FIG. 90, the lead frame 210 and the lead frame 220 are bonded together. In this process, the lead frame 210 and the lead frame 220 are put into e.g. a reflow furnace, with the respective sides shown in the figure facing each other. By this process, the main leads 253 and the auxiliary leads 263 are bonded to each other by the solder 280 applied to the main leads 253. The auxiliary leads 264 and the main leads 254 are bonded to each other by the solder 280 applied to the auxiliary leads 264. The support leads 271 and the main leads 252 are bonded to each other by the solder 280 applied to the support lead 271. As a result, as shown in FIG. 91, bonding of the lead frame 210 and the lead frame 220 is completed. In this figure, the lead frame 220 is shown by hatching for easier understanding.

As shown in FIG. 91, when the lead frame 210 and the lead frame 220 are bonded together, the control elements 310 on the main islands 231 and the control elements 320 on the main island 232 are next to each other in the x direction. The driver element 410 on the auxiliary island 241 and the driver element 420 on the auxiliary island 242 are also next to each other in the x direction. The driver element 410 is next to the control elements 310 in the y direction, and the driver element 420 is next to the control elements 320 in the y direction.

The control elements 310 and the driver element 410 are electrically connected to each other via the wires 712, the main leads 253, the solder 280, the auxiliary leads 263 and the wires 732. The control elements 320 and the driver element 420 are electrically connected to each other via the wires 722, the main leads 254, the solder 280, the auxiliary leads 264 and the wires 742. The control elements 320 are electrically connected to the support leads 271 via the wires 721, the main leads 252 and the solder 280. Of the three main leads 252, the two main leads 252 on the upper side (left side) in the figure include portions shifted from the support lead 271 in the z direction and hence extend over the support leads 271 to which the main leads are not electrically connected. Each of the heat dissipation plates 510 and 520 is sized and arranged to overlap the control elements 310 and the control element 320 as viewed in plan.

Figure 92:
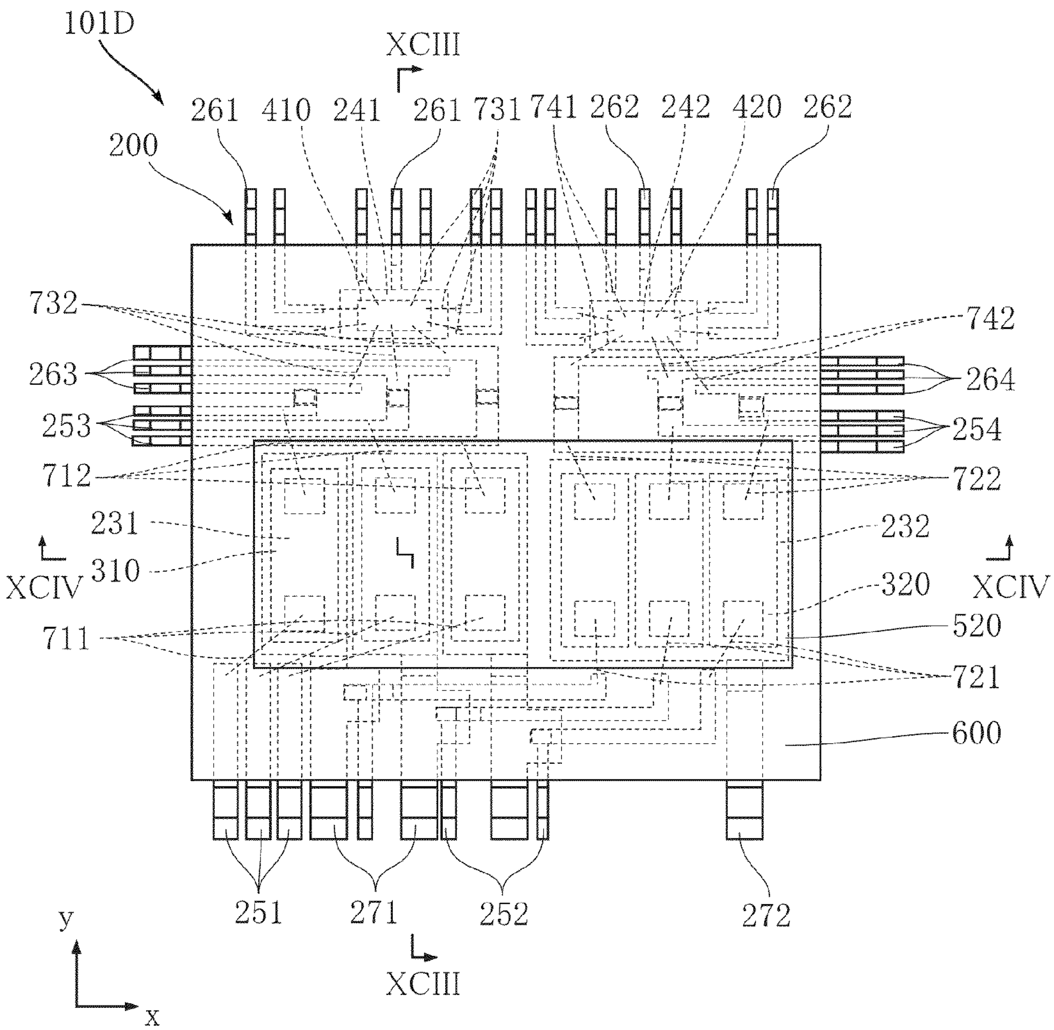
FIG. 92 is a plan view showing a semiconductor device according to the 1D Embodiment.

Then, as indicated by phantom lines in FIG. 91, the sealing resin 600 is formed by molding. The sealing resin 600 is made by using e.g. an epoxy resin. Then, the lead frame 210 and the lead frame 220 are cut to remove the frame 211 and the frame 221. Thus, the semiconductor device 101D shown in FIGS. 92-94 is obtained.

The semiconductor device 101D has a conductive support member 200 made up of the main islands 231 and 232, the auxiliary islands 241 and 242, the main leads 251, 252, 253 and 254, the auxiliary leads 261, 262, 263 and 264, and the support leads 271 and 272, which remain after the removal of the frames 211 and 221. The conductive support member 200 serves to support the control elements 310, 320 and the driver elements 410, 420 and electrically connect the control elements 310, 320 and the driver elements 410, 420 to a member (not shown) to which the semiconductor device 101D is mounted, such as a circuit board.

Figure 93:
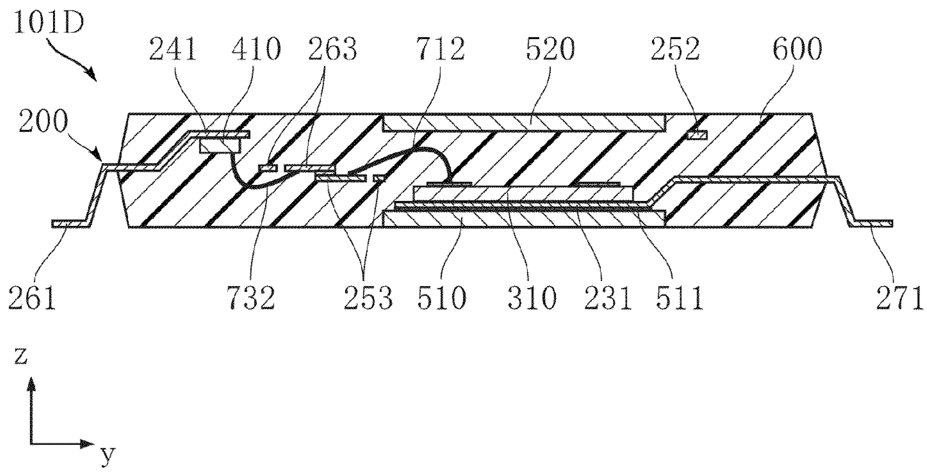
FIG. 93 is a sectional view taken along lines XCIII-XCIII in FIG. 92.
Figure 94:
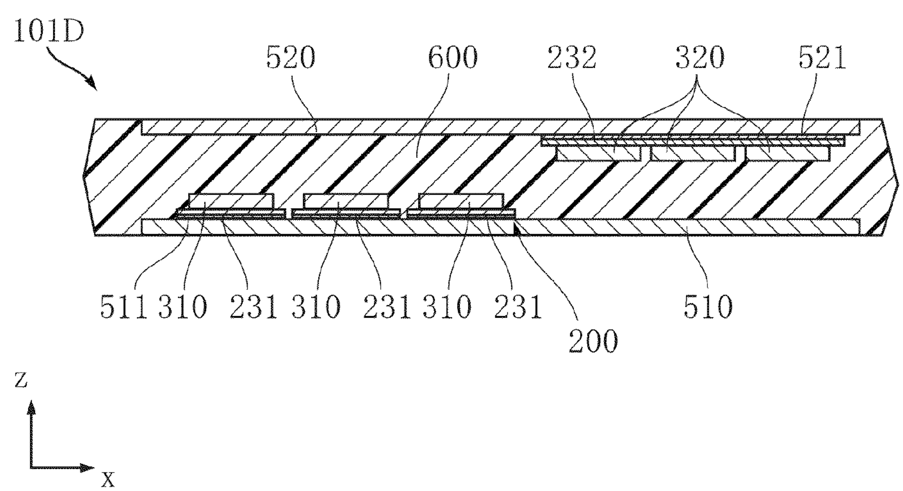
FIG. 94 is a sectional view taken along lines XCIV-XCIV in FIG. 92.
Figure 95:
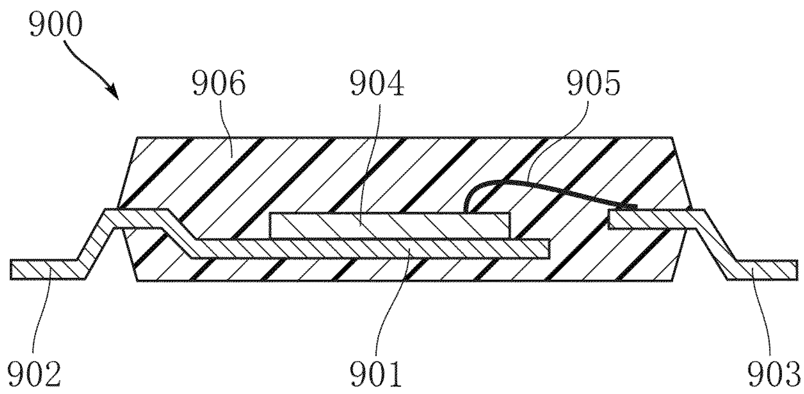
FIG. 95 is a sectional view of an example of a conventional semiconductor device.
Figure 96:
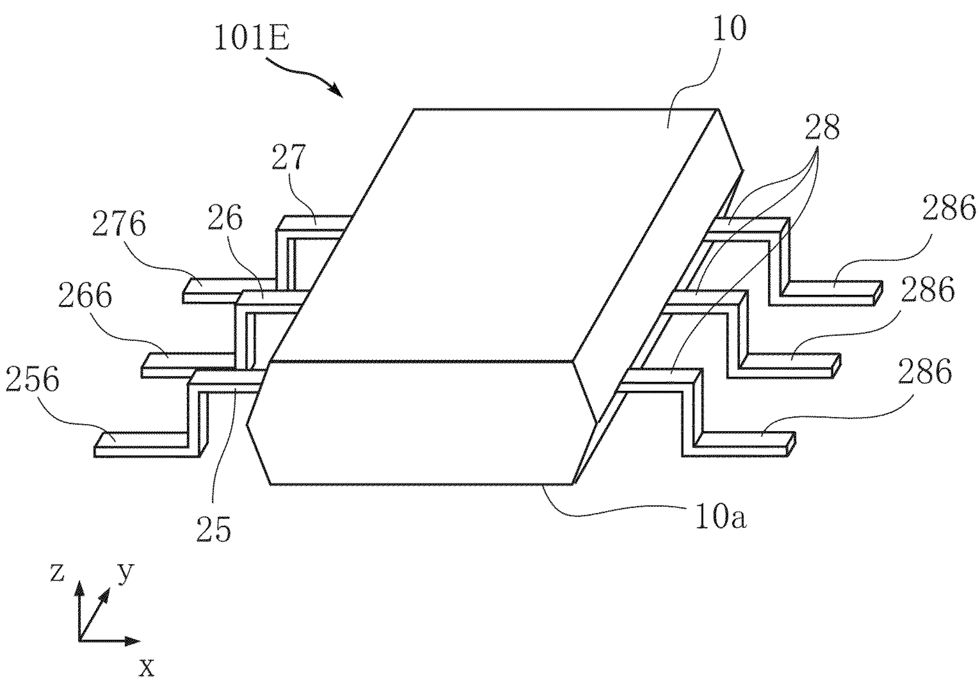
FIG. 96 is a perspective view of a semiconductor device according to the 1E Embodiment.

As shown in FIG. 93, the control element 310 and the driver element 410 for driving and controlling the control element are on the opposite sides in the z direction. This positional relationship holds true for the control element 320 and the driver element 420. Further, as shown in FIG. 94, the control element 310 and the control element 320 are on the opposite sides in the z direction. The heat dissipation plate 510 and the heat dissipation plate 520 are exposed from the sealing resin 600 on the opposite sides in the z direction.

The advantages of the semiconductor device 101D and method for manufacturing the semiconductor device are described below.

According to this embodiment, the heat dissipation plate 510 and the heat dissipation plate 520 do not interfere with each other because these heat dissipation plates are exposed from the sealing resin 600 on the opposite sides in the z direction. Thus, although each of the heat dissipation plate 510 and the heat dissipation plate 520 has a relatively large size that makes the two heat dissipation plates overlap each other as viewed in plan, the size of the semiconductor device 101D as viewed in plan does not become too large. The heat dissipation plates 510 and 520 having a relatively large size enhances the heat dissipation performance of the semiconductor device 101D.

For instance, the control element 310 and the driver element 410 are three-dimensionally spaced apart from each other, and the conduction path electrically connecting these two elements has a relatively complicated shape. However, the conduction path is constituted of not only the wires 712 and 732 but also the main lead 253 and the auxiliary lead 263. In the conduction path electrically connecting the control element 310 and the driver element 410 which are arranged at different positions in the z direction, the main lead 253 and the auxiliary lead 263 constitute the portion connecting these elements in the z direction as well. Thus, although the control element 310 and the driver element 410 are electrically connected to each other three-dimensionally by a relatively complicated conduction path, the resistance is relatively low as compared with the case where the conduction path is constituted of wires only.

Since some of the main leads 252 extend over the support leads 271, the resistance in the conduction path between the control element 320 and the main lead 252 or a part of the support lead 271 which is exposed from the sealing resin 600 is reduced. If this conduction path is constituted of wires only, increase of the resistance or interference of the wires may occur. The semiconductor device 101D can avoid such problems.

The lead frame 210 and the lead frame 220 are made into a single unit by bonding using solder 280 before the sealing resin 600 is formed. This assures that the molding process for forming the sealing resin 600 is performed properly without the need for supporting each part of the lead frame 210 and lead frame 220.

The semiconductor device and method for manufacturing the semiconductor device according to the variation of the present invention is not limited to the foregoing embodiment. The specific structure of each part of the semiconductor device and the manufacturing method according to the variation of the present invention can be varied in design in many ways.

The variation of the present invention is summarized below.

(Appendix 1)

A semiconductor device comprising:

a plurality of control elements for controlling an input current or an input voltage to generate an output current or an output voltage;

a plurality of driver elements for driving and controlling the control elements;

a conductive support member supporting the control elements and the driver elements and including a part electrically connected to these elements; and a sealing resin covering the control elements, the driver elements and a part of the conductive support member, wherein:

the control elements include at least one first control element and at least one second control element, the driver elements include a first driver element for driving and controlling the first control element and a second driver element for driving and controlling the second control element, the semiconductor device further comprises a first heat dissipation plate and a second heat dissipation plates, a part of the first heat dissipation plate and a part of the second heat dissipation plate being exposed from the sealing resin on opposite sides in a first direction, and the conductive support member includes a first main island which is bonded to the first heat dissipation plate and to which the first control element is bonded, and a second main island which is bonded to the second heat dissipation plate and to which the second control element is bonded.

(Appendix 2)

The semiconductor device as set forth in Appendix 1, wherein the first and the second heat dissipation plates overlap each other as viewed in the first direction.

(Appendix 3)

The semiconductor device as set forth in Appendix 1 or 2, wherein the first main island and the first heat dissipation plate are bonded to each other via an insulating bonding material.

(Appendix 4)

The semiconductor device as set forth in any one of Appendixes 1-3, wherein the second main island and the second heat dissipation plate are bonded to each other via an insulating bonding material.

(Appendix 5)

The semiconductor device as set forth in any one of Appendixes 1-4, wherein the first control element and the second control element are spaced apart from each other in a second direction perpendicular to the first direction.

(Appendix 6)

The semiconductor device as set forth in Appendix 5, wherein the first driver element and the second driver element are spaced apart from each other in the second direction and spaced apart from the first and the second control elements in a third direction perpendicular to both of the first direction and the second direction.

(Appendix 7)

The semiconductor device as set forth in Appendix 6, wherein, in the first direction, the first driver element is close to the second heat dissipation plate, whereas the second driver element is close to the first heat dissipation plate.

(Appendix 8)

The semiconductor device as set forth in Appendix 7, wherein the conductive support member includes a first auxiliary island to which the first driver element is bonded and a second auxiliary island to which the second driver element is bonded.

(Appendix 9)

The semiconductor device as set forth in any one of Appendixes 1-8, wherein the conductive support member includes first main leads wire-connected to the first control element, second main leads wire-connected to the second control element, first auxiliary leads wire-connected to the first driver element and second auxiliary leads wire-connected to the second driver element.

(Appendix 10)

The semiconductor device as set forth in Appendix 9, wherein one of the first main leads and one of the first auxiliary leads are bonded to each other between the first main island and the first auxiliary island in the first direction.

(Appendix 11)

The semiconductor device as set forth in Appendix 10, wherein the first main lead and the first auxiliary lead are bonded to each other with solder.

(Appendix 12)

The semiconductor device as set forth in any one of Appendixes 9-11, wherein one of the second main leads and one of the second auxiliary leads are bonded to each other between the second main island and the second auxiliary island in the first direction.

(Appendix 13)

The semiconductor device as set forth in Appendix 12, wherein the second main lead and the second auxiliary lead are bonded to each other with solder.

(Appendix 14)

The semiconductor device as set forth in any one of Appendixes 9-13, wherein the conductive support member includes a first support lead connected to the first main island;

the first support lead and one of the second main leads are bonded to each other between the first main island and the second main island in the first direction.

(Appendix 15)

The semiconductor device as set forth in Appendix 14, wherein the first support lead and the second main lead are bonded to each other with solder.

(Appendix 16)

A method for manufacturing a semiconductor device comprising the steps of:

preparing a first lead frame and a second lead frame, the first lead frame including a first main island, a second auxiliary island, first main leads, second auxiliary leads, and a first frame supporting these, the first main island and the second auxiliary island being deviated from the first frame toward a same side in a thickness direction, the second lead frame including a second main island, a first auxiliary island, second main leads, first auxiliary lead s, and a second frame supporting these, the second main island and the first auxiliary island being deviated from the second frame toward a same side in a thickness direction;

mounting a first control element to the first main island and mounting a second driver element to the second auxiliary island;

mounting to the second main island a second control element to be driven and controlled by the second driver element and mounting to the first auxiliary island a first driver element for driving and controlling the first control element;

wire-connecting the first control element and one of the first main leads to each other;

wire-connecting the second control element and one of the second main leads to each other;

bonding the first lead frame and the second lead frame to each other in such a manner that respective thickness directions correspond to a first direction and that the first main island and the second auxiliary island are on an opposite side of the second main island and the first auxiliary island in the first direction; and forming a sealing resin that covers the first and the second control elements, the first and the second driver elements, a part of the first lead frame and a part of the second lead frame.

(Appendix 17)

The method for manufacturing a semiconductor device as set forth in Appendix 16, further comprising the steps of:

bonding a first heat dissipation plate to the first main island and bonding a second heat dissipation plate to the second main island before the step of bonding the first lead frame and the second lead frame to each other;

wherein the step of forming the sealing resin comprises exposing a part of the first heat dissipation plate and a part of the second heat dissipation plate from the sealing resin.

(Appendix 18)

The method for manufacturing a semiconductor device as set forth in Appendix 16 or 17, wherein, in the step of bonding the first lead frame and the second lead frame, the first main island and the second main island are arranged as spaced apart from each other in a second direction perpendicular to the first direction.

(Appendix 19)

The method for manufacturing a semiconductor device as set forth in Appendix 18, wherein, in the step of bonding the first lead frame and the second lead frame, the first auxiliary island and the second auxiliary island are arranged as spaced apart from each other in the second direction and spaced apart from the first and the second main islands in a third direction perpendicular to both of the first direction and the second direction.

(Appendix 20)

The method for manufacturing a semiconductor device as set forth in any one of Appendixes 16-19, wherein the step of bonding the first lead frame and the second lead frame comprises solder-bonding one of the first main leads and one of the first auxiliary leads to each other between the first main island and the first auxiliary island in the first direction.

(Appendix 21)

The method for manufacturing a semiconductor device as set forth in any one of Appendixes 16-20, wherein the step of bonding the first lead frame and the second lead frame comprises solder-bonding one of the second main leads and one of the second auxiliary leads to each other between the second main island and the second auxiliary island in the first direction.

(Appendix 22)

The method for manufacturing a semiconductor device as set forth in any one of Appendixes 16-21, wherein the first lead frame includes a first support lead connected to the first main island, and the step of bonding the first lead frame and the second lead frame comprises solder-bonding the first support lead and one of the second main leads to each other between the first main island and the second main island in the first direction.

1E Embodiment

Figure 97:
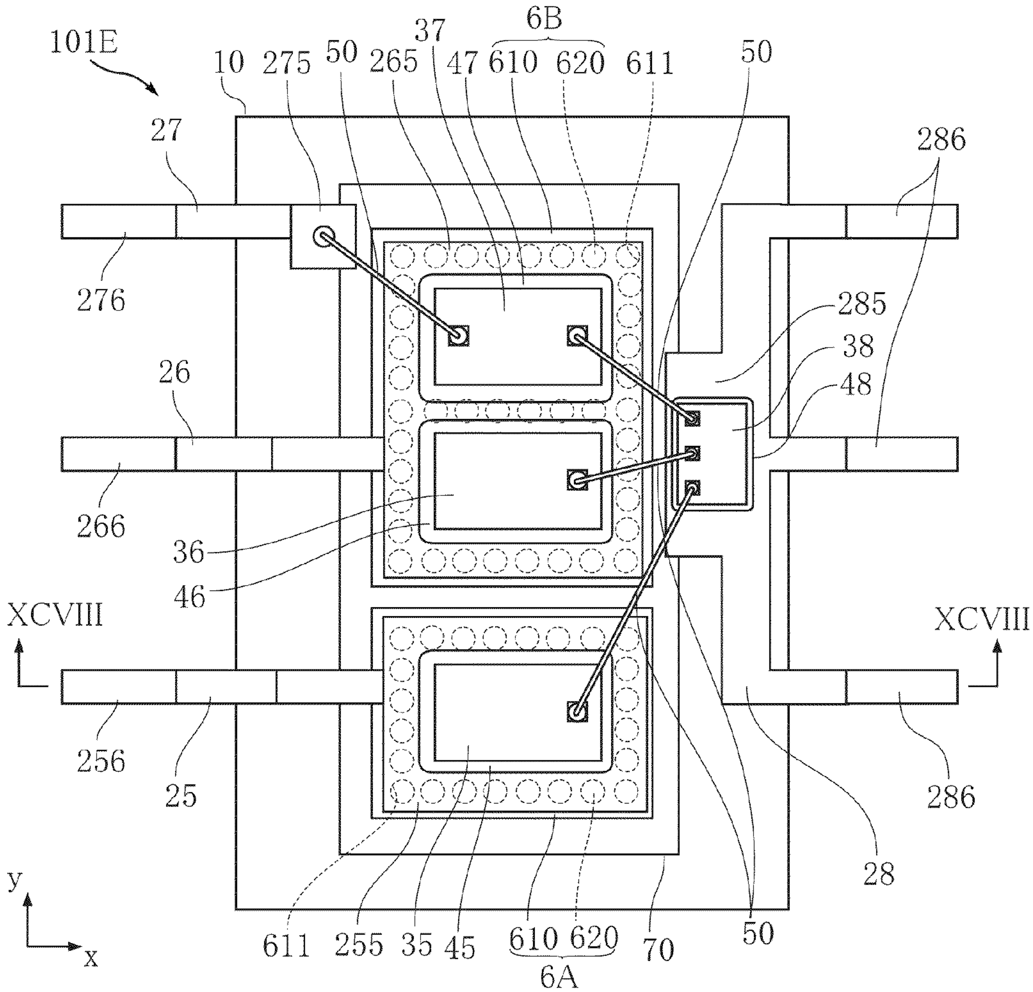
FIG. 97 is a plan view showing the internal structure of the semiconductor device shown in FIG. 96.
Figure 98:
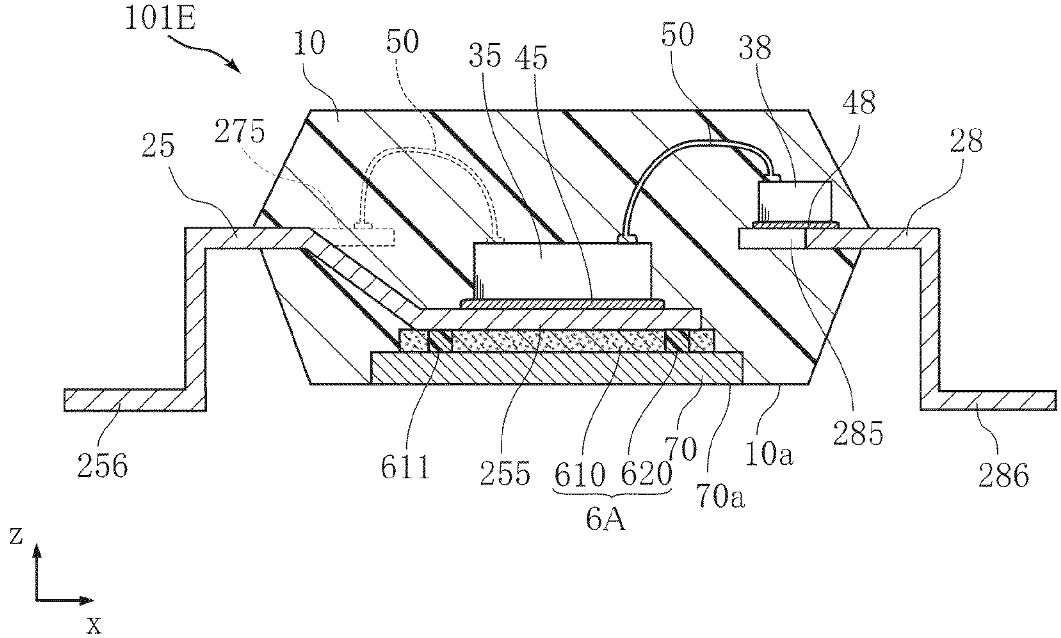
FIG. 98 is a sectional view taken along lines XCVIII-XCVIII in FIG. 97.

FIGS. 96-100 show a semiconductor device according to the 1E Embodiment of a variation of the present invention. The semiconductor device 101E of this embodiment includes a sealing resin 10, leads 25, 26, 27, 28, semiconductor elements 35, 36, 37, an IC chip 38, fixing members 45, 46, 47 and 48, four wires 50, spacers 6A and 6B, and a metal member 70. For instance, the semiconductor device 101E is a power module for controlling electric power and used as incorporated in electronic device. The x direction, the y direction and the z direction used in the following explanation are perpendicular to each other. The z direction is the thickness direction of the die pads 255, 265 and 285, which will be described later. The upper side in the z direction in FIG. 98 is defined as the front side and the lower side in FIG. 98 is defined as the reverse side.

The sealing resin 10 is elongated in the y direction. The sealing resin 10 completely covers the semiconductor elements 35, 36 and 37, the IC chip 38 and the four wires 50 for protection. The sealing resin 10 covers the leads 25, 26 and 27 in such a manner that a part of each lead 25, 26, 27 is exposed from the left side in FIG. 97 in the direction x and covers the lead 28 in such a manner that parts of the lead 28 are exposed from the right side in FIG. 97 in the direction x. The sealing resin 10 covers side surfaces of the spacers 6A and 6B in such a manner that the reverse surfaces of the spacers 6A and 6B are exposed. The sealing resin 10 covers the metal member 70 in such a manner that the reverse surface 70*a* of the metal member 70 is exposed from the reverse surface 10*a*. The sealing resin 10 is made of e.g. a black epoxy resin and the structure inside the sealing resin cannot be seen from outside, though the structure inside the sealing resin 10 is shown in FIG. 97 for explanation.

The leads 25, 26, 27 and 28 are made of e.g. copper and spaced apart from each other. These leads 25, 26, 27, 28 are made by working a copper plate having a thickness of e.g. about 0.2 mm into a predetermined pattern by punching by precision pressing or etching.

As shown FIGS. 97 and 98, the lead 25 includes a die pad 255 and a terminal 256. The die pad 255 is in the form of a plate that is rectangular as viewed in the z direction and is inside the sealing resin 10. A semiconductor element 35 is on the front surface of the die pad 255. As shown in FIG. 97, the semiconductor element 35 is at the center of the die pad 255 as viewed in the z direction. The semiconductor element 35 is fixed to the die pad 255 by the fixing member 45. The terminal 256 projects from the sealing resin 10 to the left in FIG. 97 in the x direction and is used for connection to an external wiring pattern. In this embodiment, the end of the terminal 256 is lower, in the z direction in FIG. 98, than the reverse surface 10*a* of the sealing resin 10.

As shown in FIG. 97, the lead 26 includes a die pad 265 and a terminal 266. The die pad 265 is in the form of a plate that is rectangular as viewed in the z direction, and is inside the sealing resin 10 and spaced apart from the die pad 255 in the y direction, as shown in FIG. 97. The die pad 265 is elongated in the y direction. Semiconductor elements 36 and 37 are on the front surface of the die pad 265 as spaced apart from each other. The semiconductor element 36 is fixed to the die pad 265 by the fixing member 46. The semiconductor element 37 is fixed to the die pad 265 by the fixing member 47. The terminal 266 projects from the sealing resin 10 to the left in FIG. 97 in the x direction and is used for connection to an external wiring pattern. In this embodiment, the end of the terminal 266 is lower, in the z direction in FIG. 98, than the reverse surface 10*a* of the sealing resin 10.

As shown in FIG. 98, the sealing resin 10 covers the die pads 255 and 265 in such a manner that the reverse surfaces of the die pads 255 and 265 are exposed.

As shown in FIG. 97, the lead 27 includes a wire bonding pad 275 and a terminal 276. As shown in FIG. 98, the wire bonding pad 275 is higher than the die pad 255 in the z direction in the figure. To the wire bonding pad 275, an end of a wire 50 is bonded. The other end of the wire 50 bonded to the wire bonding pad 275 is bonded to the semiconductor element 37. The terminal 276 projects from the sealing resin 10 to the left in FIG. 97 in the x direction and is used for connection to an external wiring pattern. In this embodiment, the end of the terminal 276 is lower, in the z direction in FIG. 98, than the reverse surface 10*a* of the sealing resin 10.

As shown in FIG. 97, the lead 28 includes an IC chip die pad 285 and three terminals 286. As shown in FIG. 98, the IC chip die pad 285 is higher than the die pad 255 in the z direction in the figure, and the IC chip 38 is on the front surface of the IC chip die pad. The IC chip 38 is fixed to the IC chip die pad 285 by the fixing member 48. The three terminals 286 project from the sealing resin 10 to the right in FIG. 97 in the x direction and is used for connection to an external wiring pattern. As shown in FIG. 97, the three terminals 286 extend out from the IC chip die pad 285. In this embodiment, the end of each of the terminals 286 is lower, in the z direction in FIG. 98, than the reverse surface 10*a* of the sealing resin 10.

The semiconductor elements 35, 36, 37 are power chips such as an IGBT or FW diode. Each of the semiconductor elements 35 and 36 has an electrode on the front surface and the reverse surface in the z direction. The semiconductor element 37 has a pair of electrodes on the front surface in the z direction. The fixing members 45, 46, 47 may be hardened silver paste. The electrode on the reverse surface of the semiconductor element 35 is electrically connected to the die pad 255 via the fixing member 45. The electrode on the reverse surface of the semiconductor element 36 is electrically connected to the die pad 265 via the fixing member 46. The semiconductor element 37 does not have an electrode on the reverse surface and is not electrically connected to the die pad 265.

The IC chip 38 is e.g. a logic chip and controls the semiconductor elements 35, 36 and 37. The IC chip 38 has three electrodes on the front surface, which are connected to the electrodes on the front surfaces of the semiconductor elements 35, 36 and 37 via the wires 50. The IC chip 38 has a non-illustrated electrode also on the reverse surface. The fixing member 48 may be hardened silver paste. The electrode on the reverses surface of the IC chip 38 is electrically connected to the IC chip die pad 285 via the fixing member 48.

Each of the spacers 6A and 6B has a plate member 610 and a plurality of adhesive members 620. The plate member 610 has a plurality of through-holes 611 that are circular as viewed in the z direction. The through-holes 611 are filled by the adhesive members 620, respectively. Thus, as viewed in the x direction, the plate member 610 and the adhesive members 620 overlap each other. The shape of each adhesive member 620 is the same as that of each through-hole 611 and circular as viewed in the z direction.

The plate member 610 is made of a material harder than the sealing resin 10 and having a higher thermal conductivity than that of the sealing resin. Specifically, the plate member 610 is made of an insulating ceramic material such as silicon nitride, boron nitride or aluminum nitride and 0.2-2 mm in thickness in the z direction. Each through-hole 611 is about 0.2 mm in diameter. The adhesive members 620 are made of e.g. epoxy resin.

Figure 99:
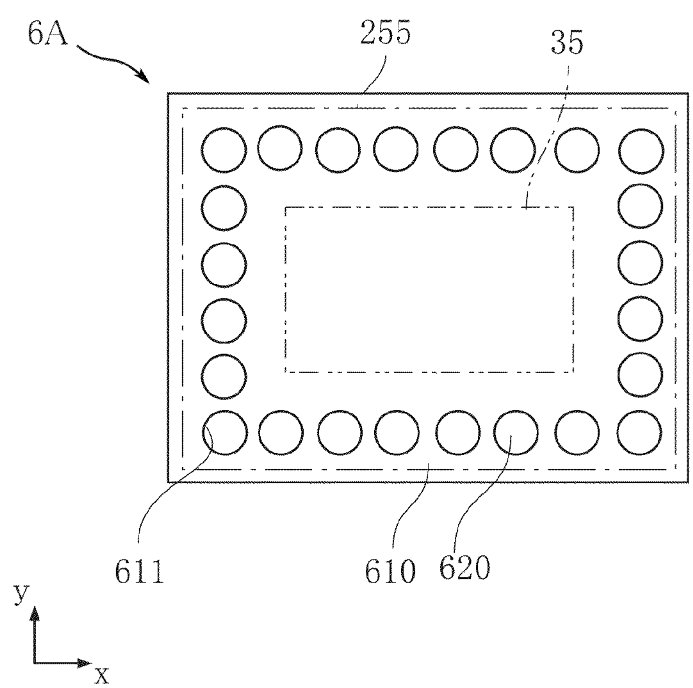
FIG. 99 is a plan view of one of the spacers shown in FIG. 97.

The front surface of the spacer 6A is in contact with the reverse surface of the die pad 255. Specifically, the front surface of the plate member 610 of the spacer 6A is in contact with the reverse surface of the die pad 255, and the front surfaces of the adhesive members 620 adhere to the reverse surface of the die pad 255. FIG. 99 shows the spacer 6A as enlarged. In FIG. 99, the contour of the semiconductor element 35 is indicated by a double-dashed line, whereas the contour of the die pad 255 is indicated by a single-dashed line. As shown in FIGS. 97 and 99, as viewed in the z direction, the spacer 6A is in the form of a rectangle slightly larger than the die pad 255 and overlaps the entirety of the die pad 255. The through-holes 611 and adhesive members 620 of the spacer 6A are arranged along a rectangular frame surrounding the semiconductor element 35 so as not to overlap the semiconductor element 35 as viewed in the z direction.

Figure 100:
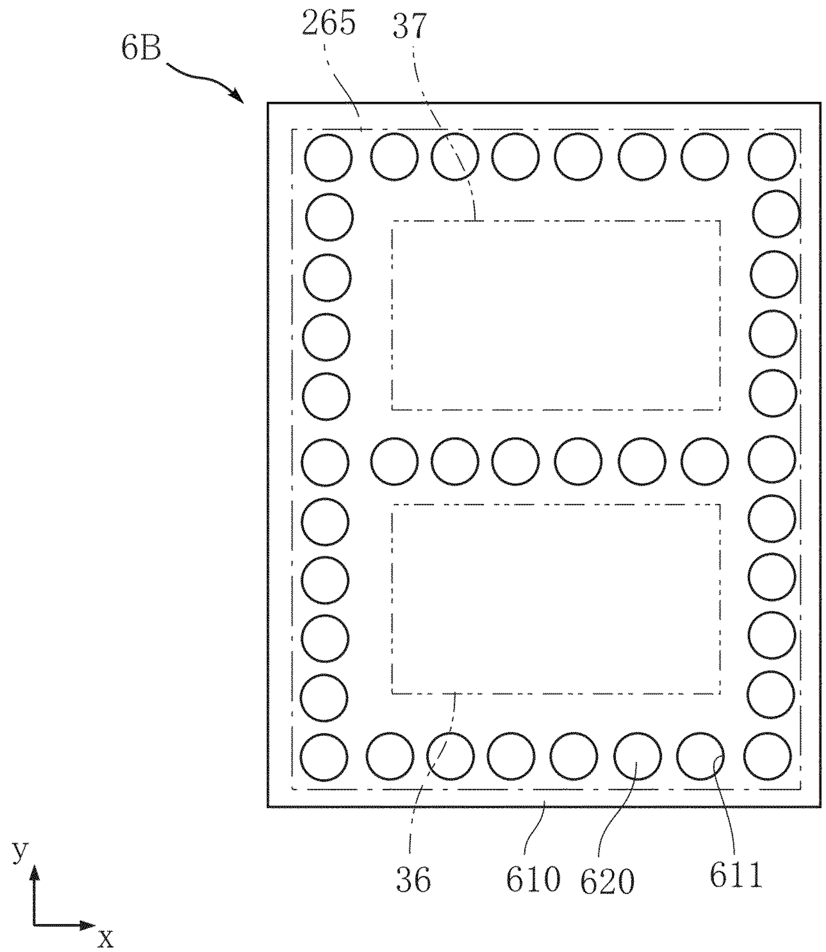
FIG. 100 is a plan view of the other one of the spacers shown in FIG. 97.

The front surface of the spacer 6B is in contact with the reverse surface of the die pad 265. Specifically, the front surface of the plate member 610 of the spacer 6B is in contact with the reverse surface of the die pad 265, and the front surfaces of the adhesive members 620 adhere to the reverse surface of the die pad 265. FIG. 100 shows the spacer 6B as enlarged. In FIG. 100, the contour of each of the semiconductor elements 36 and 37 is indicated by a double-dashed line, whereas the contour of the die pad 265 is indicated by a single-dashed line. As shown in FIGS. 97 and 100, as viewed in the z direction, the spacer 6B is in the form of a rectangle slightly larger than the die pad 265 and overlaps the entirety of the die pad 265. The through-holes 611 and adhesive members 620 of the spacer 6B are arranged along a rectangular frame surrounding the semiconductor elements 36 and 37 so as not to overlap the semiconductor elements 36 and 37 as viewed in the z direction.

The metal member 70 is provided for enhancing the heat dissipation performance of the semiconductor device 101E and comprises e.g. an aluminum plate that is rectangular as viewed in the z direction. As shown in FIG. 97, as viewed in the z direction, the metal member is larger than the spacers 6A and 6B and overlaps the spacers 6A and 6B. In this embodiment, the length of the metal member 70 in the x direction is longer than that of the spacer 6A, 6B, and the length of the metal member 70 in the y direction is longer than that of the spacers 6A and 6B. Further, as shown in FIG. 98, the front surface of the metal member 70 is in contact with the reverse surface of the spacers 6A and 6B. Specifically, the reverse surface of the plate member 610 is in contact with the front surface of the metal member 70, and the reverse surfaces of the adhesive members 620 adhere to the front surface of the metal member 70. The reverse surface 70*a* of the metal member 70 is at the same position as the reverse surface 10*a* of the sealing resin 10 in the z direction. It is preferable that the metal member 70 is thicker than the spacers 6A and 6B. Specifically, the metal member 70 is 0.1 mm in thickness.

A method for manufacturing the semiconductor device 101E is described below with reference to FIGS. 101-107.

Figure 101:
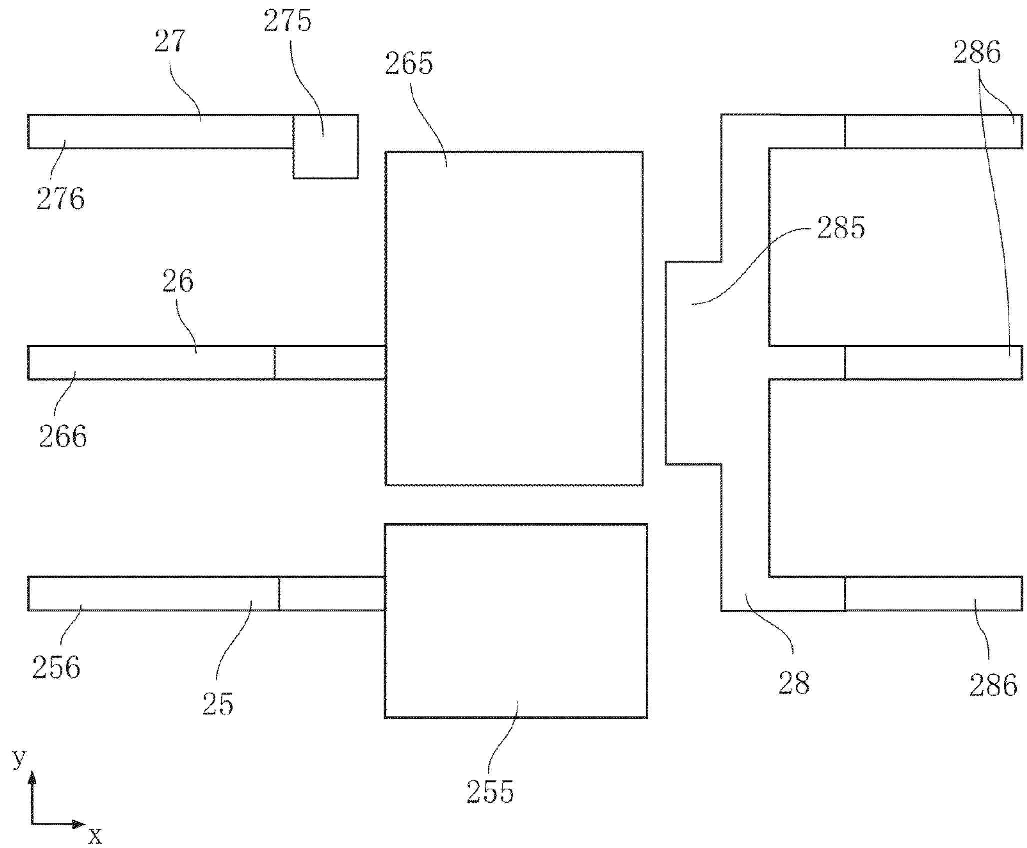
FIG. 101 is a plan view showing the state in which leads are formed in a method for manufacturing the semiconductor device shown in FIG. 96.

To manufacture the semiconductor device 101E, a step of forming leads 25, 26, 27 and 28 from a copper plate is first performed. This step is performed by working a copper plate into a predetermined pattern by punching by precision pressing or etching. By this step, as shown in FIG. 101, die pads 255 and 265, a wire bonding pad 275, an IC chip die pad 285 and terminals 256, 266, 276, 286 are formed. To smoothly perform the subsequent steps, the terminals 256, 266, 276, 286 are not bent into the shapes shown in FIG. 96 in this step. The step of bending the terminals 256, 266, 276, 286 can be performed before the semiconductor device 101E is mounted to a board.

Figure 102:
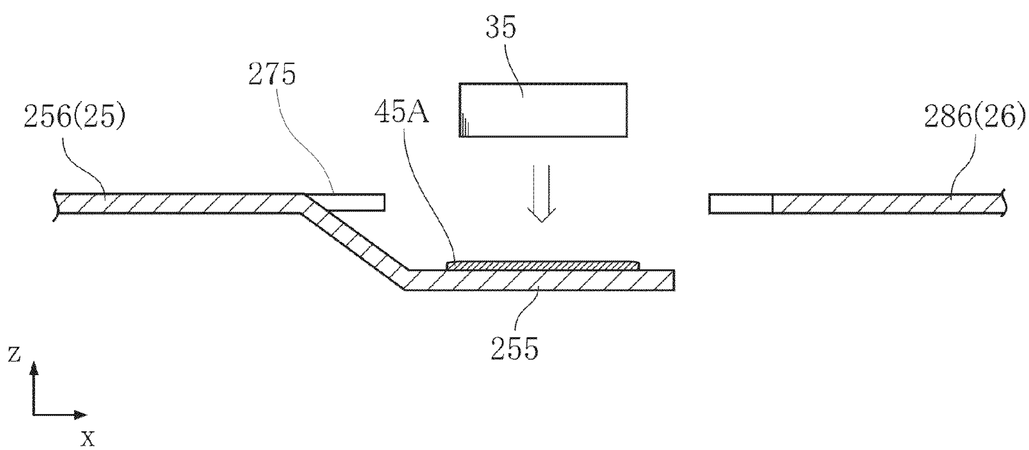
FIG. 102 is a schematic sectional view showing the step of installing a semiconductor element in a method for manufacturing the semiconductor device shown in FIG. 96.

Then, a semiconductor element 35 is mounted to the front surface of the die pad 255. As shown in FIG. 102, this step is performed by applying silver paste 45A to the front surface of the die pad 255 and disposing the semiconductor element 35 on the paste. The silver paste 45A becomes the fixing member 45 when hardened. In this embodiment, the die pad 255 and the terminal 256 are parts of the same lead 25. As noted before, one of the electrodes of the semiconductor element 35 is on the reverse surface. Thus, by this step, the semiconductor element 35 is electrically connected to the terminal 256 via the die pad 255 and the fixing member 45.

Then, semiconductor elements 36 and 37 are mounted to the front surface of the die pad 265. This step is performed by applying silver paste to the front surface of the die pad 265 and disposing the semiconductor elements 36 and 37 on the paste. The silver paste applied to the front surface of the die pad 265 becomes the fixing members 46 and 47 when hardened. Although the fixing members 46 and 47 are separated from each other in the example shown in FIG. 97, the fixing members 46 and 47 may be continuous. In this embodiment, the die pad 265 and the terminal 266 are parts of the same lead 26. As noted before, one of the electrodes of the semiconductor element 36 is on the reverse surface. Thus, by this step, the semiconductor element 36 is electrically connected to the terminal 266 via the die pad 265 and the fixing member 42.

Then, an IC chip 38 is mounted to the front surface of the IC chip die pad 285. This step is performed by applying silver paste to the front surface of the IC chip die pad 285 and disposing the IC chip 38 on the paste. The silver paste applied to the front surface of the IC chip die pad 285 becomes the fixing member 48 when hardened.

The steps of mounting the semiconductor elements 35, 36 and 37 and the step mounting the IC chip 38 may not be performed successively as described above but may be performed at the same time.

Figure 103:
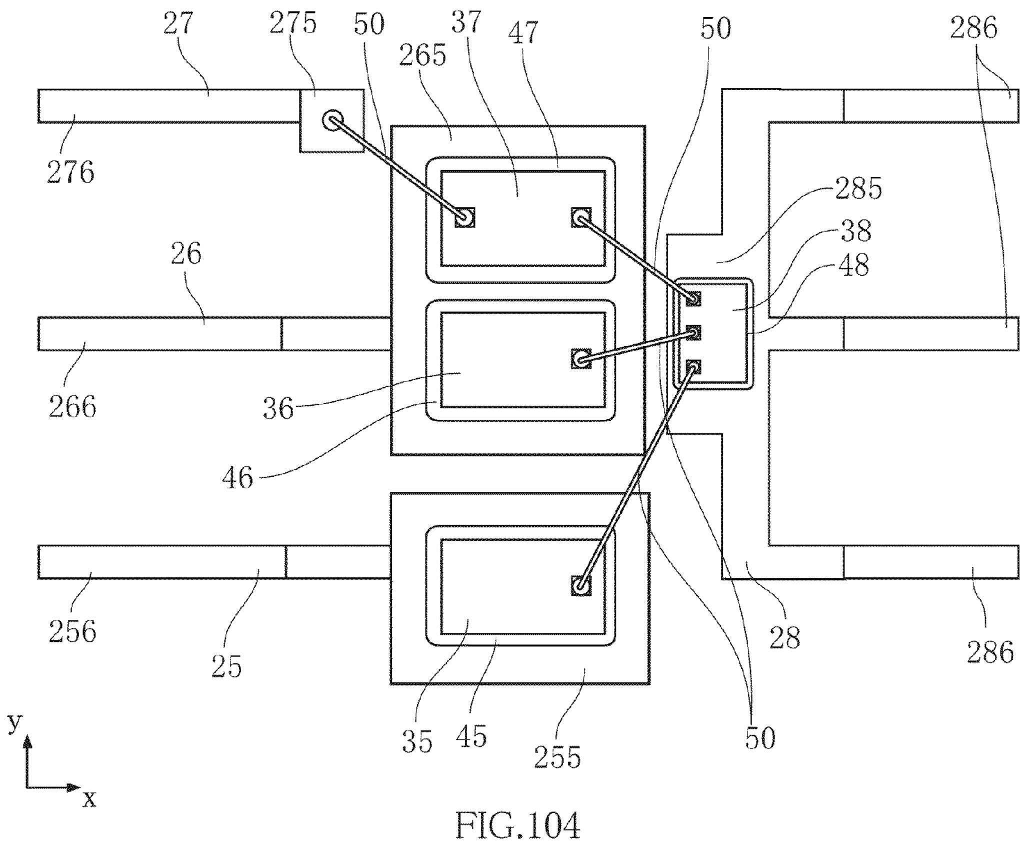
FIG. 103 is a schematic plan view showing the step of forming wires in a method for manufacturing the semiconductor device shown in FIG. 96.

Then, wires 50 are provided. This step may be performed by using a commercially available wire bonding tool. FIG. 103 shows the state after the wires 50 are provided. As shown in FIG. 103, a wire 50 is provided between the electrode on the front surface of the semiconductor element 37 and the wire bonding pad 275. In this embodiment, the wire bonding pad 275 and the terminal 276 are parts of the same lead 27. By this step, the semiconductor element 37 is electrically connected to the terminal 276 via the wire 50 and the wire bonding pad 275. Further, by this step, the semiconductor elements 35, 36 and 37 are electrically connected to the IC chip 38 via the wires 50.

Figure 104:
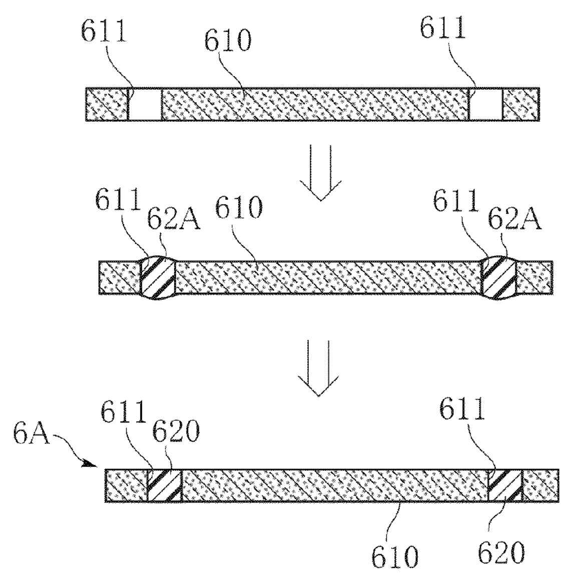
FIG. 104 shows the step of forming one of the spacers in a method for manufacturing the semiconductor device shown in FIG. 96.

Then, the spacers 6A and 6B are made. FIG. 104 schematically illustrates the process of making the spacer 6A. As shown in FIG. 104, to make the spacer 6A, through-holes 611 are formed in a plate member 610. Then, epoxy resin 62A is loaded into the through-holes 611. This step is performed by pouring liquefied epoxy resin 62A into the through-holes 611. Then, the epoxy resin 62A is semi-hardened. Specifically, the epoxy resin 62A is heated at 80° C. for about 1-2 hours and thereby hardened to such a degree that it would stay within the through-holes 611. Thereafter, the front and the reverse surfaces of the spacer 6A are scraped, whereby the part of the epoxy resin 62A that is outside the through-holes 611 are removed. In this way, by removing the unnecessary part of the epoxy resin 62A, the adhesive members 620 are obtained, and the spacer 6A is completed. Since the spacer 6B can be made in the same way as the spacer 6A, the description is omitted.

Figure 105:
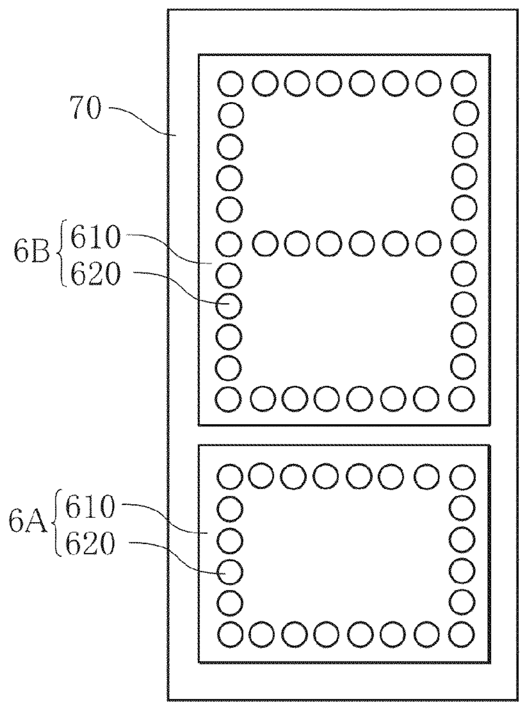
FIG. 105 is a plan view showing the state in which a metal member is attached to the spacers in a method for manufacturing the semiconductor device shown in FIG. 96.

Then, the spacers 6A and 6B are disposed on the metal member 70. FIG. 105 shows the state after the spacer 6A and 6B are attached to the metal member 70. In this step, the adhesive members 620 are brought into contact with the front surface of the metal member 70.

Figure 106:
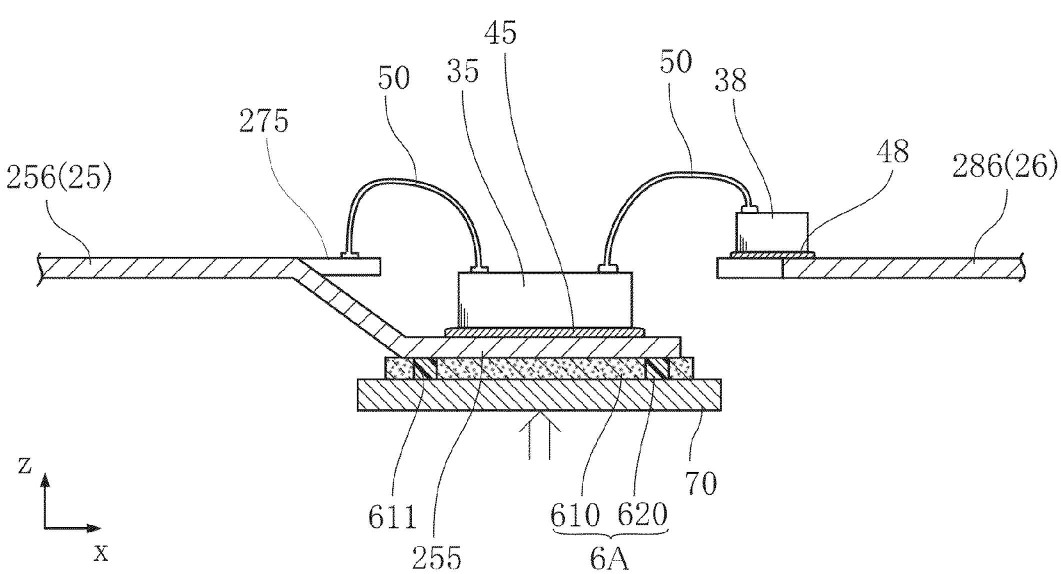
FIG. 106 is a schematic sectional view showing the state in which the spacer is attached to the die pad in a method for manufacturing the semiconductor device shown in FIG. 96.

Then, the spacer 6A and the spacer 6B are attached to the die pad 255 and the die pad 265, respectively. In this step, the spacers 6A and 6B, along with the metal member 70, are pressed against the die pads 255 and 265. As shown in FIG. 106, by applying pressure in the z direction, the adhesive members 620 of the spacer 6A come into contact with the reverse surface of the die pad 255, whereas the adhesive members 620 of the spacer 6B come into contact with the reverse surface of the die pad 265. Thereafter, by conducting heating at 160° C. for about eight hours, the adhesive members 620 are completely hardened. By this step, the plate member 610 is bonded to the reverse surface of the die pads 255, 265 by the adhesive members 620. At the same time, the reverse surface of the plate member 610 is bonded to the front surface of the metal member 70 by the adhesive members 620.

Figure 107:
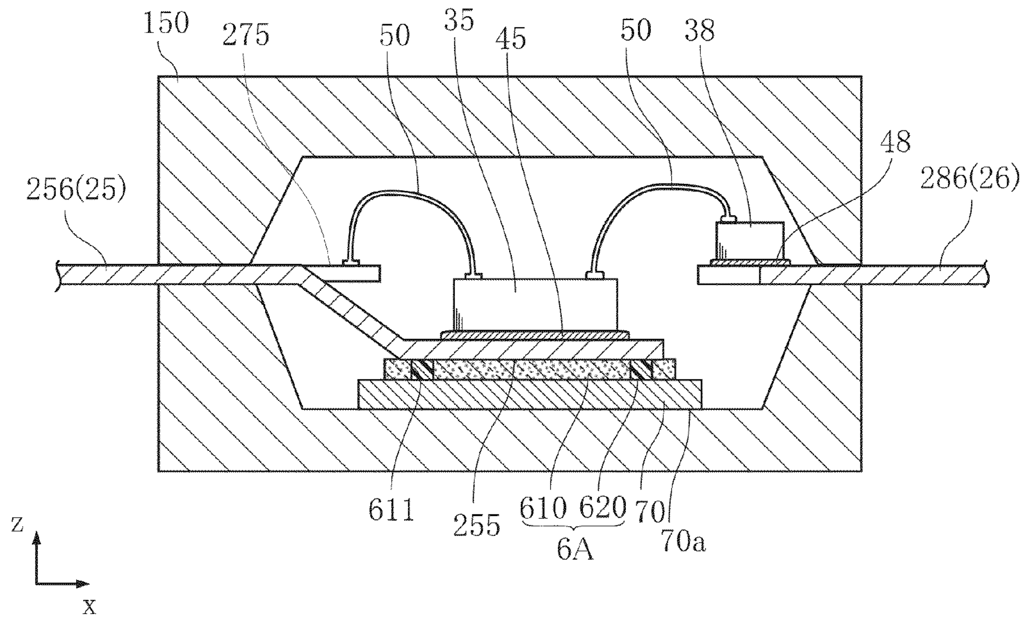
FIG. 107 is a schematic sectional view showing the step of forming a sealing resin in a method for manufacturing the semiconductor device shown in FIG. 96.

Then, the sealing resin 10 is formed. For instance, this step is performed by transformer molding. FIG. 107 shows the state in which the leads 25, 26, 27 and 28 are set in a mold 150 for forming the sealing resin 10. The sealing resin 10 is formed by pouring liquefied epoxy resin into the mold 150 and hardening the epoxy resin. As shown in FIG. 107, the reverse surface 70*a* of the metal member 70 is held in contact with the inner surface of the mold 150. Thus, the reverse surface 10*a* of the sealing resin 10, which is made by using the mold 150, and the reverse surface 70*a* of the metal member 70 are flush with each other.

The advantages of the semiconductor device 101E are described below.

In the semiconductor device 101E, the semiconductor element 35 is electrically connected to the leads 25 and 28 and is not electrically connected to the leads 26 and 27. The semiconductor element 36 is electrically connected to the leads 26 and 28 and is not electrically connected to the leads 25 and 27. The semiconductor element 37 is electrically connected to the leads 27 and 28 and is not electrically connected to the leads 25 and 26. When the lead 25 and the lead 26 are electrically connected to each other accidentally, the semiconductor elements 35 and 36 do not operate properly. In the above-described structure, the metal member 70 is provided to overlap the die pads 255 and 265 as viewed in the z direction, so that there is a worry that leads 25 and 26 may be electrically connected to each other via the metal member 70. In this embodiment, electrical connection of the lead 25 and the lead 26 is prevented by providing the spacers 6A and 6B between the die pads 255, 265 and the metal member 70.

In the semiconductor device 101E, the plate member 610 constitutes most part of each spacer 6A, 6B. The plate member 610 is made of a ceramic material and harder than the sealing resin 10 and the adhesive members 620 made of epoxy resin. The plate member 610 is also harder the resin sheet 94 used in a conventional structure as descried before. Thus, in the above-described process of manufacturing the semiconductor device, spacers 6A and 6B are unlikely to deform even when pressure is applied to the spacers 6A and 6B in the z direction. This is advantageous to reliably insulate the die pads 255, 265 and the metal member 70. Thus, the semiconductor device 101E secures insulation between the die pads 255, 265 and the metal member 70 and hence has enhanced reliability.

The semiconductor elements 35, 36 and 37 generate heat when driven, and the heat is transferred to the die pads 255 and 265. In this embodiment, the front surface of the plate member 610 made of a ceramic material is in contact with the reverse surface of the die pads 255, 265. Since a ceramic material has a higher thermal conductivity than epoxy resin, the heat transferred to the die pads 255, 265 are mainly transferred to the plate member 610, not to the sealing resin 10. Further, the reverse surface of the plate member 610 is in contact with the metal member 70. The heat transferred to the plate member 610 is mainly transferred to metal member 70 having a higher thermal conductivity.

Figure 108:
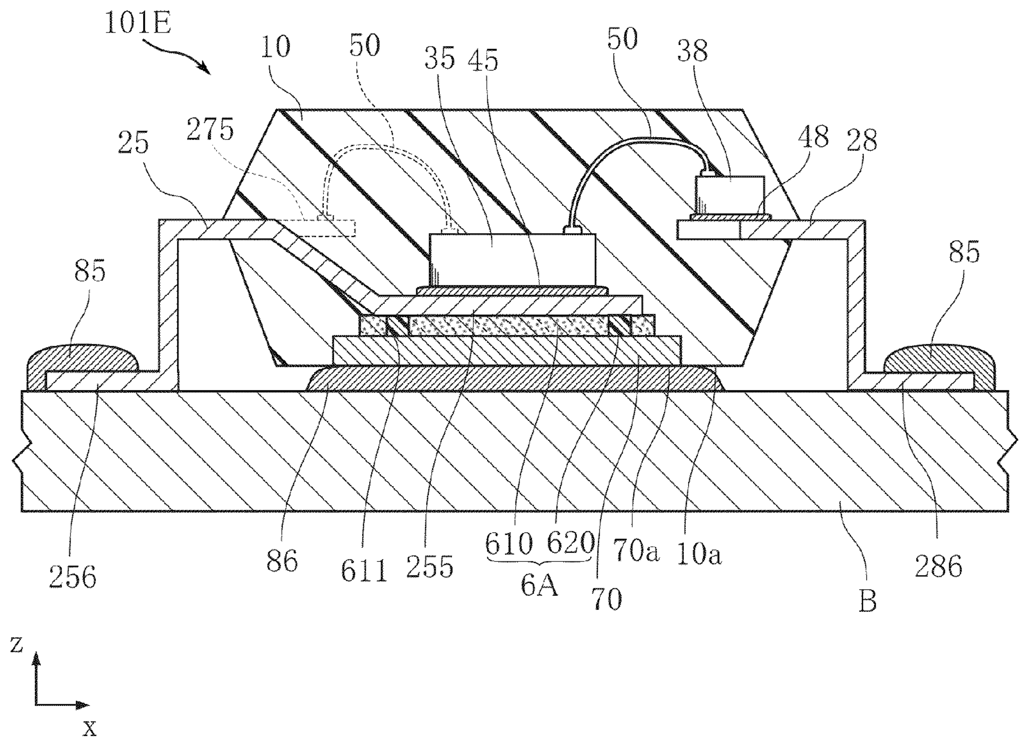
FIG. 108 is sectional view showing an example of use of the semiconductor device shown in FIG. 96.

FIG. 108 shows an example of use of the semiconductor device 101. In the example shown in FIG. 108, the semiconductor device 101E is mounted to a board B. On the board B, a non-illustrated wiring pattern is provided. The terminals 256, 266, 276 and 286 are connected to the wiring pattern with e.g. solder 85. Further, solder 86 is provided between the reverse surface 70*a* of the metal member 70 and the front surface of the board B. By this solder 86, the semiconductor device 101E is strongly bonded to the board B. When the semiconductor device is used in this way, heat transferred to the metal member 70 is further transferred to the solder 86, which can provide enhanced heat dissipation performance.

According to this embodiment, as shown in FIG. 97, the adhesive members 620 are arranged to surround the semiconductor element 35, 36 and 37 as viewed in the z direction. According to this arrangement, the area that overlaps the semiconductor elements 35, 36 and 37 as viewed in the z direction does not include any adhesive members 62. That is, the regions of the spacers 6A and 6B which overlap the semiconductor elements 35, 36 and 37 as viewed in the z direction comprise ceramic material only. This is advantageous to transfer the heat generated at the semiconductor elements 35, 36 and 37 to the metal member 70 through the spacers 6A and 6B.

For the reasons described above, it is preferable that the through-holes 611 are at positions that do not overlap the semiconductor element 35 as viewed in the z direction. On the other hand, to prevent electrical connection between the die pad 255 and the die pad 265 and reduce the size of the semiconductor device 101E, it is preferable that the size of each die pad 255, 265 as viewed in the z direction is small. Further, to assure strong bonding of the spacer 6A, 6B, the die pad 255,265, and the metal member 70, a certain number of adhesive members 620 need to be provided. To satisfy all these requirements, a large number of through-holes 611 need to be provided in a limited area. From this point of view, it is advantageous that the through-holes 611 are circular as viewed in the z direction.

The thermal conductivity of the plate members 610 made of a ceramic material is higher than that of epoxy resin but lower than that of the metal member 70. To enhance the heat dissipation performance, it is preferable that the spaces 6A, 6B are thin and their sizes as viewed in the z direction are small, as long as insulation between the die pads 225, 265 and the metal member 70 is assured. Thus, it is advantageous that the spacers 6A and 6B have the smallest thickness that achieves the required withstand voltage and the size to overlap the die pad 255, 265 as viewed in the z direction. On the other hand, the larger the metal member 70 is, the more the heat dissipation performance is enhanced. Thus, in the semiconductor device 101E, the metal member 70 is made to be thicker than the spacers 6A, 6B and has a large size as viewed in the z direction.

In this embodiment, the plate member 610 has through-holes 611, and the adhesive members 620 are loaded in the through-holes 611. According to this arrangement, the adhesive members 620 are in contact with the inner circumferential surfaces of the through-holes 611. This is advantageous to enhance the bonding strength between the plate members 610 and the adhesive members 620.

As the adhesive members 620, use may be made of phenolic resin or acrylic resin, instead of epoxy resin. Alternatively, as the adhesive member 620, epoxy resin, phenolic resin or acrylic resin filler which contains filler may be used. The filler may comprise at least one material selected from the group consisting of silicon oxide, aluminum oxide, aluminum nitride, silicon nitride and boron nitride.

Figure 109:
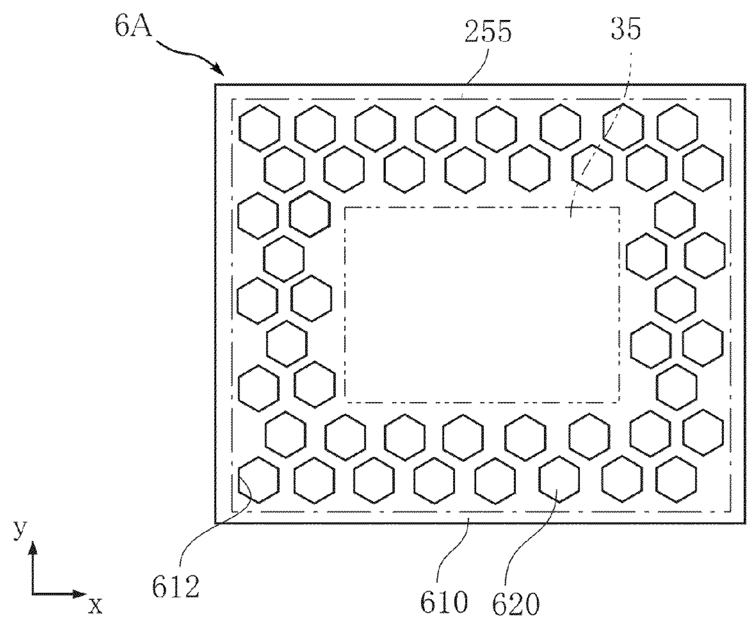
FIG. 109 is a plan view of another example of the spacer shown in FIG. 99.

FIG. 109 shows another example of the spacer 6A. Although the through-holes 611 of the spacer 6A shown in FIG. 99 are circular as viewed in the z direction, the through-holes 612 of the example shown in FIG. 109 are regular hexagonal as viewed in the z direction. In the example shown in FIG. 109, the through-holes 612 are arranged in two rows on each side of the semiconductor element 35 in the y direction. Further, on each side of the semiconductor element 35 in the x direction as well, a larger number of through-holes 612 than in the example shown in FIG. 99 are arranged. Making the shape of the through-holes 612 circular or regular hexagonal as viewed in the z direction allows a larger number of through-holes 612 to be arranged in a given area. The arrangement shown in FIG. 109 can be realized also by the circular through-holes 611 shown in FIG. 99.

FIGS. 110-122 show other embodiments of the variation of the present invention. In these figures, the elements that are identical or similar to those of the foregoing embodiment are designated by the same reference signs as those used for the foregoing embodiment.

2E Embodiment

Figure 110:
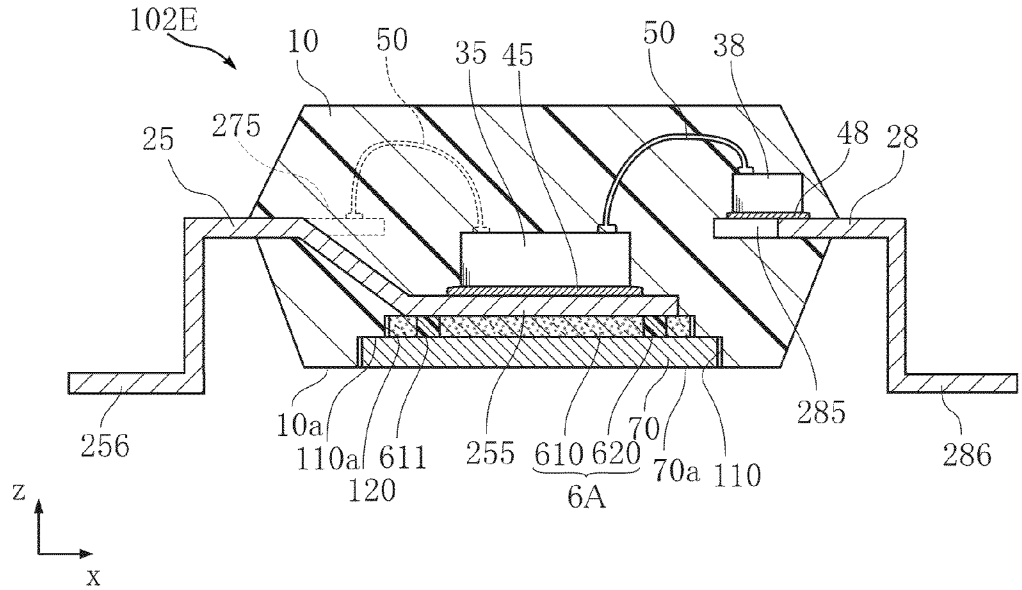
FIG. 110 is a sectional view of a semiconductor device according to the 2E Embodiment.

FIG. 110 shows a semiconductor device according to the 2E Embodiment of the variation of the present invention. In the semiconductor device 102E shown in FIG. 110, the sealing resin 10 has a recess 110 and a recess 120 dented toward the front side in the z direction. The spacer 6A is fitted in the recess 120, and the metal member 70 is fitted in the recess 110. Though not shown in FIG. 110, the spacer 6B is also fitted in a recess formed in the sealing resin 10 (recess 130, which will be described later). The structures of other parts of the semiconductor device 102E are the same as those of the semiconductor device 101E.

As shown in FIG. 110, the recess 110 is formed at the reverse surface 10*a* of the sealing resin 10 to have a depth corresponding to the thickness of the metal member 70. The front surface of the metal member 70 at portions where the spacers 6A, 6B are not provided is in contact with the bottom surface 110*a* of the recess 110. The recess 120 is formed to have a depth corresponding to the thickness of the spacer 6A from the bottom surface 110*a* of the recess 110. The bottom surface of the recess 120 corresponds to the reverse surface of the die pad 255.

An example for manufacturing the semiconductor device 102E is described below with reference to FIGS. 111-113.

The method for manufacturing the semiconductor device 102E is at first performed in the same way as that for manufacturing the semiconductor device 101E. Following the process shown in FIGS. 101-105, the leads 25, 26, 27 and 28 are formed, and the semiconductor elements 35, 36 and 37 are disposed on the die pads 255, 265. Further, the spacers 6A and 6B are made and disposed on the metal member 70.

In the method for manufacturing the semiconductor device 101E, the spacers 6A and 6B are attached to the die pads 255, 265 as shown FIG. 106 before the sealing resin 10 is formed. In the method for manufacturing the semiconductor device 102E, on the other hand, the sealing resin 10 is formed first as shown in FIGS. 111 and 112. Similarly to the semiconductor device 101E, the formation of the sealing resin 10 is performed by transfer molding. In this embodiment, however, the mold 150 having a shape different from the mold shown in FIG. 107 is used.

Figure 111:
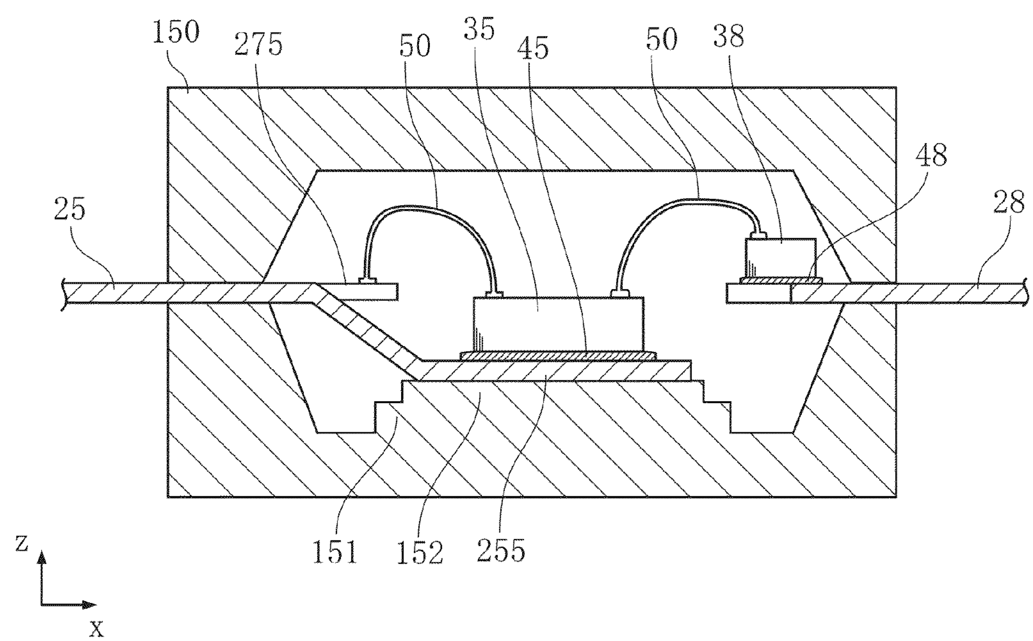
FIG. 111 is a schematic sectional view of an example of a method for manufacturing the semiconductor device shown in FIG. 110.

The mold 150 shown in FIG. 111 has a projection 151 rising from the reverse surface, and a projection 152 further rising from the projection 151. The front surface of the projection 152 is in contact with the reverse surface of the die pad 255. Though not shown, there is also provided a projection in contact with the reverse surface of the die pad 265. FIG. 112 shows the reverse surface 10*a* of the sealing resin 10 formed by using the mold 150. The sealing resin 10 formed in FIG. 112 has the recess 110 corresponding to the projection 151, the recess 120 corresponding to the projection 152, and a recess 130 corresponding to the projection which is not shown in FIG. 111. The recess 110 is formed to have the same shape as that of the metal member 70 as viewed in the z direction. The recess 120 is formed to have the same shape as that of the spacer 6A as viewed in the z direction. The recess 130 is formed to have the same shape as that of the spacer 6B as viewed in the z direction. Since the front surface of the projection 152 is in contact with the die pad 255, the bottom surface of the recess 120 is defined by the reverse surface of the die pad 255, and the bottom surface of the recess 130 is defined by the reverse surface of the die pad 265. That is, the sealing resin 10 is formed to expose the reverse surface of the die pad 255 and the reverse surface of the die pad 265.

Then, exposed portions of the sealing resin 10 and die pads 255 and 265 are cleaned. Then, if necessary, the exposed portions of the die pads 255, 265 are scraped to smooth the surfaces. This step removes burrs, if any, from the reverse surfaces of the die pads 255 and 265.

Figure 113:
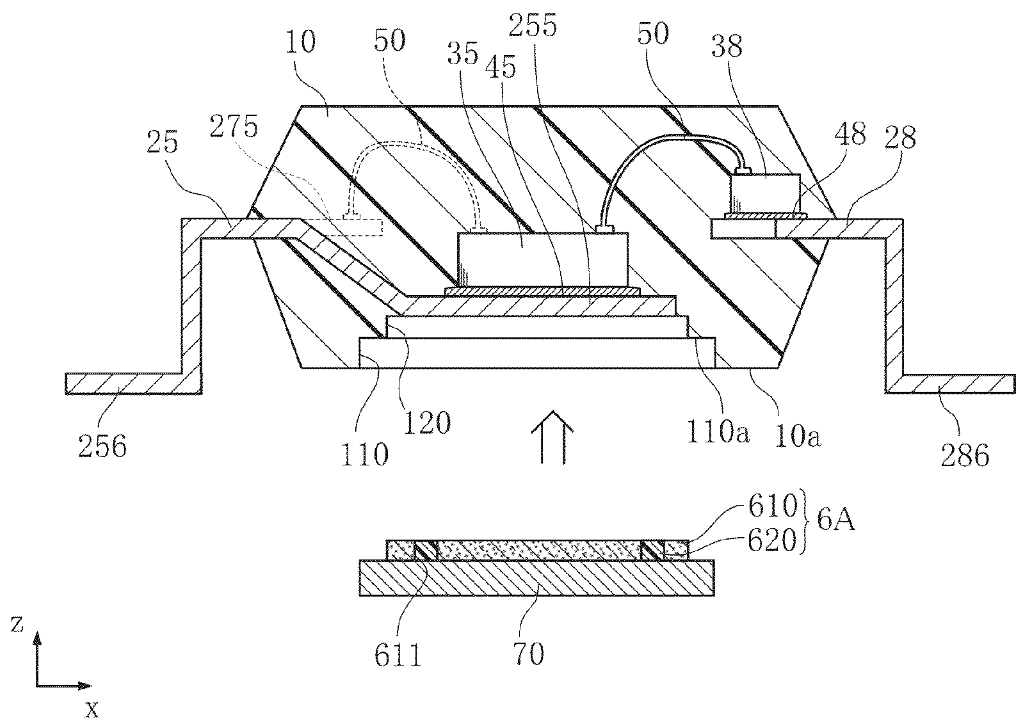
FIG. 113 shows the step of fitting a metal member and a spacer into the sealing resin in a method for manufacturing the semiconductor device shown in FIG. 110.

Then, as shown in FIG. 113, the spacers 6A, 6B and the metal member 70 are fitted in the sealing resin 10. Prior to this step, the spacer 6A and 6B are attached to the metal member 70, in the manner as described with respect to the semiconductor device 101E, as shown in FIG. 105. In this step, the spacers 6A, 6B and the metal member 70, which are made into a single unit, are fitted into the recess 10 in the sealing resin 1. Specifically, the spacer 6A is fitted into the recess 120, whereas the spacer 6B is fitted into the recess 130. The spacer 6A is pressed against the die pad 255 in the z direction, whereas the spacer 6B is pressed against the die pad 265 in the z direction. By this process, the front surface of the metal member 70 at portions where the spacers 6A and 6B are not provided comes into contact with the bottom surface 110*a* of the recess 110. The front surfaces of the plate member 610 and adhesive members 620 of the spacer 6A come into contact with the reverse surface of the die pad 255. The front surfaces of the plate member 610 and adhesive members 620 of the spacer 6B come into contact with the reverse surface of the die pad 265. Then, by conducting heating at 160° C. for about eight hours, the adhesive members 620 are hardened to adhere to the reverse surfaces of the die pads 255, 265 and the front surfaces of the metal member 70.

In the manufacturing method like this, when the size of the recess 110 as viewed in the z direction is exactly equal to that of the metal member 70, it may be difficult to fit the metal member 70 into the recess 110. This holds true for the recess 120 and the spacer 6A, and the recess 130 and the spacer 6B. This problem can be solved by making the recesses 110, 120 and 130 slightly larger than the metal member 70 and the spacers 6A, 6B. This forms gaps between the recess 110 and the metal member 70 and between the recess 120 and the spacer 6A. These gaps may be filled with resin.

The advantages of the semiconductor device 102E and the manufacturing method are described below.

As described with respect to the semiconductor device 101E, to enhance the heat dissipation performance, it is preferable that the front surface of the plate member 610 is in contact with the die pads 255, 265. From this point of view, the step of scraping the surfaces of the spacers 6A, 6B is performed. However, the epoxy resin 62A adhering to the surfaces of the spacers 6A, 6B may not be completely removed. In this case, according to the manufacturing method shown in FIGS. 101-107, a small gap may be formed between the plate member 610 of the spacer 6A and the die pad 255 or between the plate member 610 of the spacer 6B and the die pad 265 when the spacers 6A and 6B are brought into contact with the die pads 255 and 265. When the step shown in FIG. 107 is performed in this state, the sealing resin 10 may flow into the small gaps. The sealing resin 10 in the gaps hinders heat transfer from the die pads 255, 265 to the plate member 610.

Figure 112:
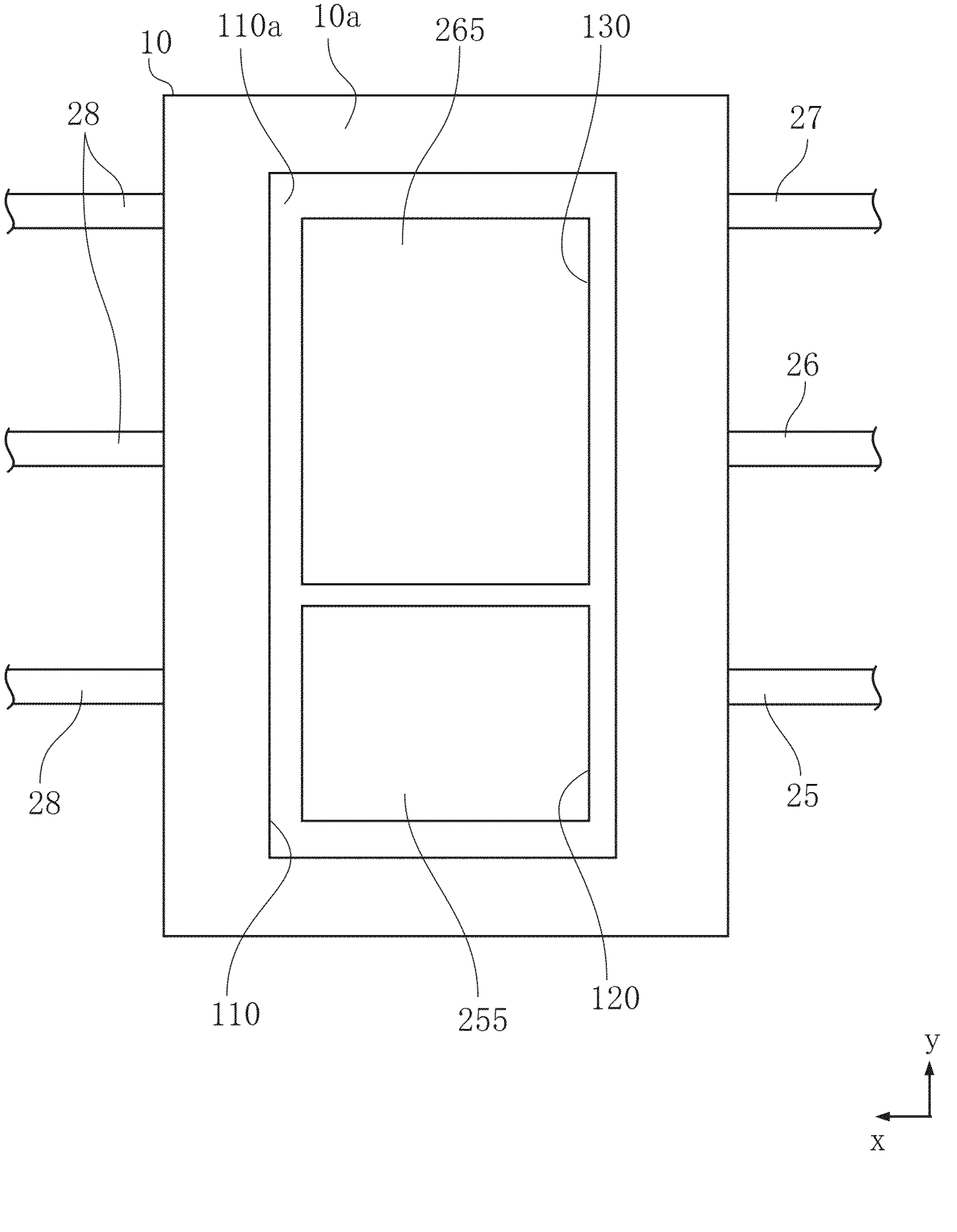
FIG. 112 shows the sealing resin formed in the step shown in FIG. 111.

According to the manufacturing method shown in FIGS. 111-113, the sealing resin 10 is first formed, and then, the spacers 6A, 6B and the metal member 70 are fitted into the recesses 110, 120, 130 of the sealing resin 10. Since the plate member 610 is not set when the sealing resin 10 is to be formed, the situation such that epoxy resin flows between the plate member 610 and the die pads 255, 265 when the epoxy resin is poured into the mold 150 does not occur.

As shown in FIG. 111, the sealing resin 10 is formed by using the mold 150 having projections 151 and 152. Although the projection 152 is in contact with the die pad 255, epoxy resin may flow between the projection 152 and the die pad 255 to form a resin film. According to the manufacturing method of this embodiment, the step of scraping the reverse surfaces of the die pads 255, 265 is performed after the sealing resin 10 is formed. Thus, even when an epoxy resin film is formed on the reverse surface of the die pad 255, the epoxy resin film is removed by this scraping process. Thus, according to the manufacturing method of this embodiment, the reverse surfaces of the die pads 255, 265 and the front surfaces of the spacers 6A, 6B are properly held in contact with each other.

3E Embodiment

Figure 114:
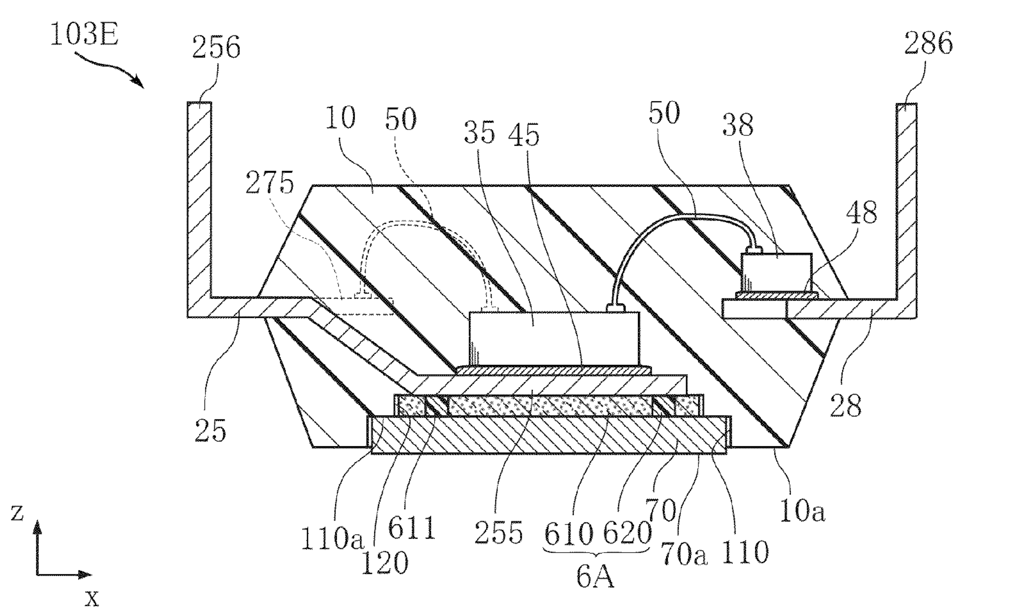
FIG. 114 is a sectional view of a semiconductor device according to the 3E Embodiment.

FIG. 114 shows a semiconductor device according to the 3E Embodiment of the variation of the present invention. In the semiconductor device 103E shown in FIG. 114, the reverse surface 70*a* of the metal member 70 is lower, in the z direction in FIG. 114, than the reverse surface 10*a* of the sealing resin 10. Further, the shapes of the terminals 256 and 286 are different from those in the semiconductor device 102E. Though not shown in FIG. 114, the shapes of the terminals 266, 276 are also different from those in the semiconductor device 101E. The structures of other parts of the semiconductor device 103E are the same as those of the semiconductor device 102E.

The terminals 256, 266, 276 and 286 of the semiconductor device 103E extend upward in the z direction in FIG. 114.

Figure 115:
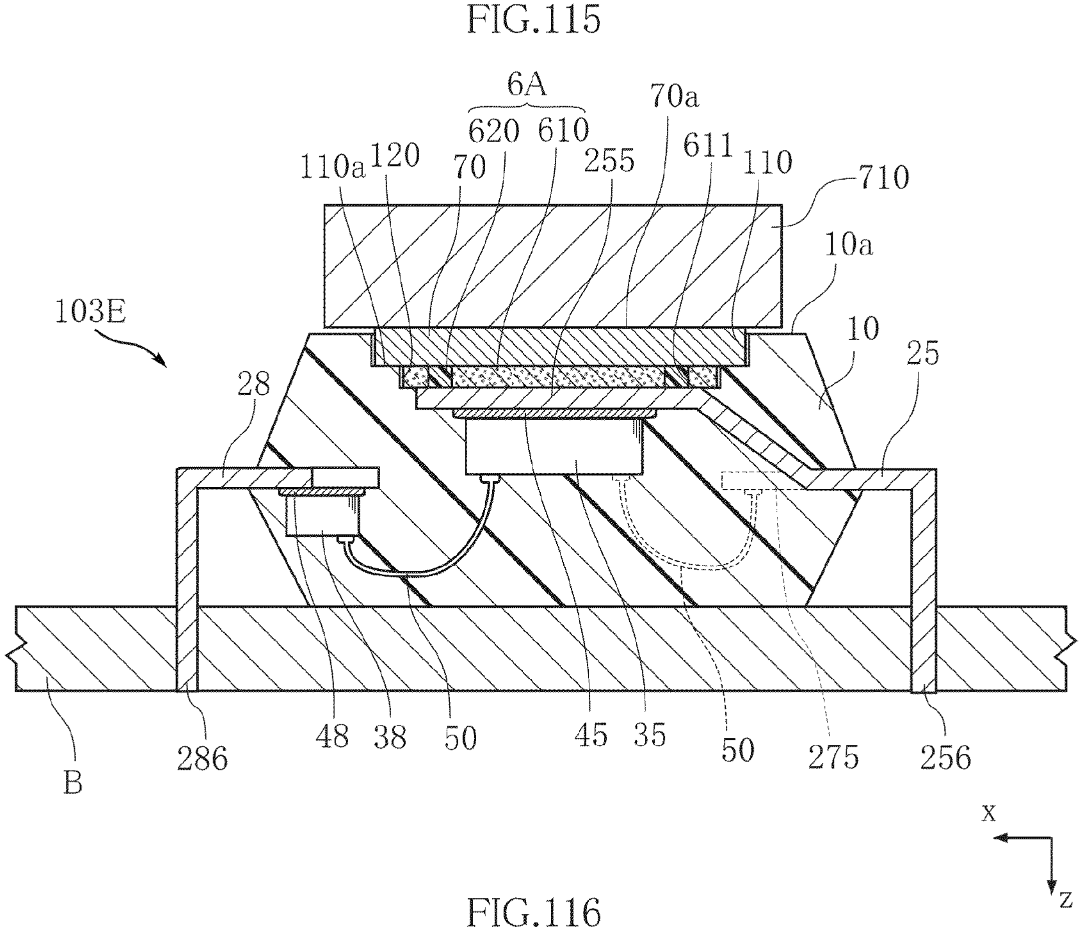
FIG. 115 is a sectional view showing an example of use of the semiconductor device shown in FIG. 114.

FIG. 115 shows an example of use of the semiconductor device 103E. In the example shown in FIG. 115, the semiconductor device 103E is mounted to the board B in such a manner that the front surface of the sealing resin 10 in the direction z comes into contact with the front surface of the board B. In FIG. 115, the front surface of the board B is on the upper side. According to this mounting method, the metal member 70 does not come into contact with the front surface of the board B, and a heat dissipating member 710 is attached to the metal member 70. For example, the heat dissipating member 710 may comprise a metal plate of e.g. aluminum having an increased surface area due to the provision of a number of grooves. Bonding of the metal member 70 and the heat dissipating member 710 may be performed by e.g. using silicone grease.

In the example shown in FIG. 115, the terminals 256, 266, 276, 286 are inserted in the holes formed in the board B. The board B has a non-illustrated wiring pattern formed to be connected to the holes.

In this embodiment, the reverse surface 70*a* of the metal member 70 projects from the reverse surface 10*a*. This arrangement is advantageous to reliably bring the metal member 70 and the heat dissipating member 710 into contact with each other.

The semiconductor device 103E in which the reverse surface 70*a* of the metal member 70 projects from the reverse surface 10*a* can be obtained just by adjusting the thickness of the metal member 70. For instance, it can be obtained by preparing a metal member 70 having a thickness in the z direction larger than the height in the z direction of the projection 151 of the mold 150 shown in FIG. 111.

4E Embodiment

Figure 116:
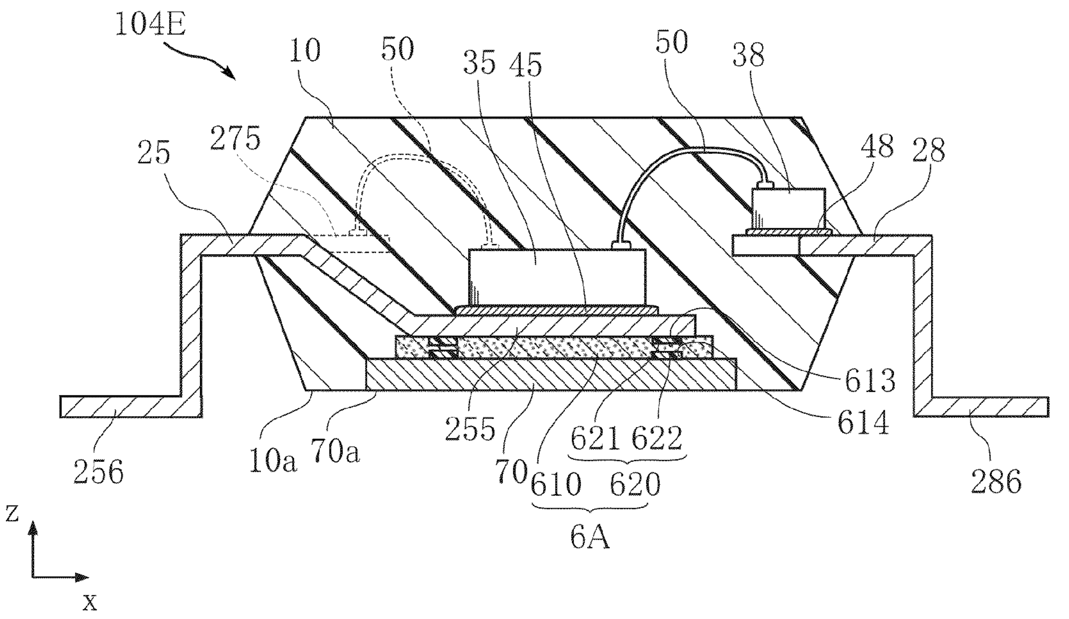
FIG. 116 is a sectional view of a semiconductor device according to the 4E Embodiment.
Figure 117:
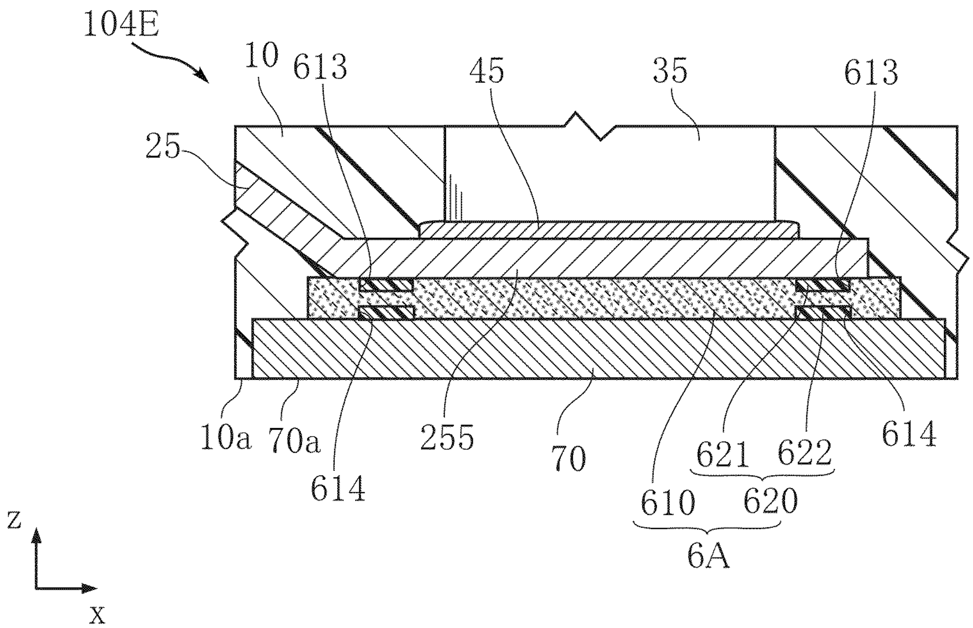
FIG. 117 is a schematic enlarged view of the semiconductor device shown in FIG. 116.

FIGS. 116 and 117 show a semiconductor device according to the 4E Embodiment of the variation of the present invention. In the semiconductor device 104E shown in FIGS. 116 and 117, recesses 613 and 614 are provided instead of the through-holes 611, and the adhesive members 620 include adhesive members 621, 622. The structures of other parts of the semiconductor device 104E are the same as those of the semiconductor device 101E.

The recess 613 is dented from the front side of the plate member 610 in the z direction. The recess 613 is filled by the adhesive member 621. The recess 614 is dented from the reverse side of the plate member 610 in the direction opposite from the recess 613. The recess 614 is filled by the adhesive member 622. In this embodiment again, as viewed in the x direction, the plate member 610 and the adhesive members 621, 622 overlap each other. In the example shown in FIGS. 116 and 117, the recesses 613 and 614 overlap each other as viewed in the z direction. The recesses 613 and 614 are circular or regular hexagonal as viewed in the z direction. Accordingly, the adhesive members 621 and 622 are also circular or regular hexagonal as viewed in the z direction.

The adhesive member 621 is bonded to the reverse surface of the die pad 255, and the adhesive member 622 is bonded to the front surface of the metal member 70. Thus, the spacer 6A of this embodiment has the same function as that of the spacer 6A of the semiconductor device 101E. Although shown in FIGS. 116 and 117 is the spacer 6A, the spacer 6B may also have the recesses 613, 614 instead of the through-holes 611 and the recesses may be filled by the adhesive members 621, 622.

When recesses 613 and 614 are provided instead of the through-holes 611, a ceramic material, which has a higher thermal conductivity than epoxy resin, is sandwiched between the recess 613 and the recess 614 in the z direction. Thus, the proportion of the ceramic material in the spacer 6A of this embodiment is higher than that in the spacer 6A of the semiconductor device 101E.

Although the recesses 613 and 614 overlap each other as viewed in the z direction in this embodiment, the recess 613 and the recess 614 may be arranged independently. For instance, the recess 613 and the recess 614 may not overlap each other as viewed in the z direction.

Although the semiconductor device 104E is based on the structure of the semiconductor device 101E, the semiconductor device 104E may be based on the semiconductor device 102E or 103E. The spacers 6A, 6B of the semiconductor devices 102E, 103E and the spacers 6A, 6B of the semiconductor device 104E may be exchanged.

5E Embodiment

Figure 118:
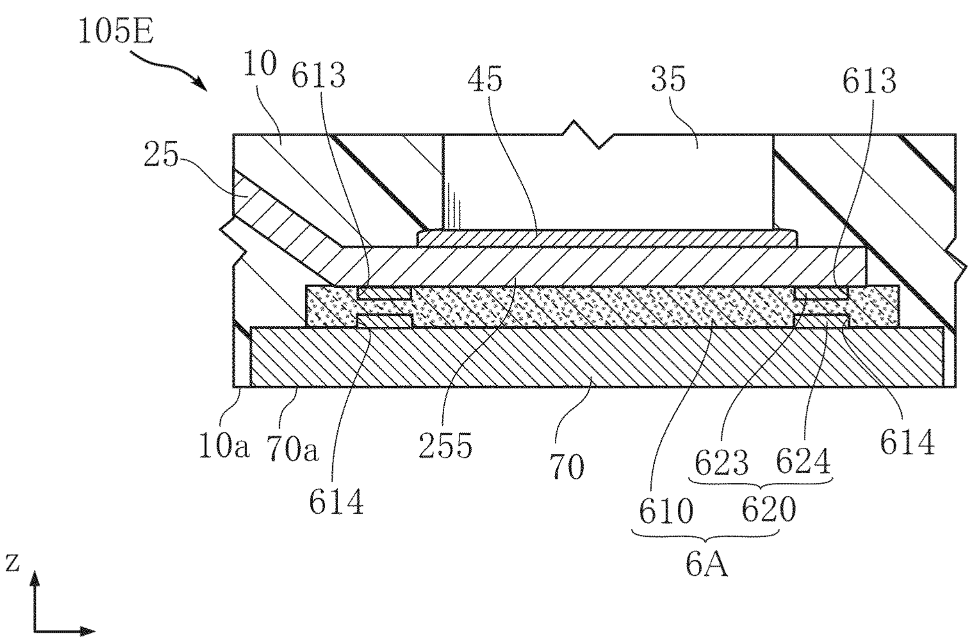
FIG. 118 is a schematic sectional view of a semiconductor device according to the 5E Embodiment.

FIG. 118 shows a semiconductor device according to the 5E Embodiment of the variation of the present invention. In the semiconductor device 105E shown in FIG. 118, the adhesive member 623 made of silver paste is used instead of the adhesive member 621 and the adhesive member 624 made of silver paste is used instead of the adhesive member 622. The structures of other parts of the semiconductor device 105E are the same as those of the semiconductor device 104E.

In this embodiment, the adhesive members 623 and 624 are supported by the plate member 610 having insulating properties. Thus, the insulating properties of the spacers 6A and 6B are maintained even when the adhesive members 623 and 624 are electrically conductive.

Silver has a higher thermal conductivity than a ceramic material which is the material for the plate member 610 and epoxy resin which is the material for the adhesive members 621, 622 of the semiconductor device 104E. Thus, when the recesses 613, 614 are filled by the adhesive members 623, 624 made of silver paste, the thermal conductivity of the spacers 6A and 6B is enhanced as compared to that in the semiconductor device 104E.

6E Embodiment

Figure 119:
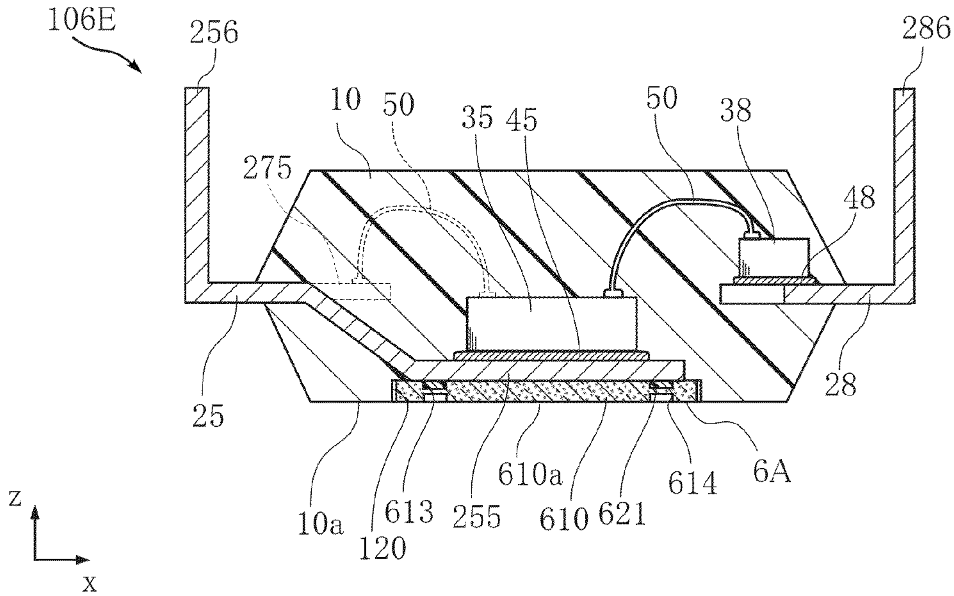
FIG. 119 is a sectional view of a semiconductor device according to the 6E Embodiment.

FIG. 119 shows a semiconductor device according to the 6E Embodiment of the present invention. The semiconductor device 106E shown in FIG. 119 does not include the metal member 70. The reverse surface 610*a* of the plate member 610 is at the same position as the reverse surface 10*a* of the sealing resin 10 in the z direction. The plate member 610 includes a recess 613 and a recess 614. In the recess 613, the adhesive member 621 is disposed. In the state shown in FIG. 119, nothing is in the recess 614. The structures of other parts of the semiconductor device 106E are the same as those of the semiconductor device 103E.

In this embodiment, the plate member 610 is fixed to the die pad 255 by the adhesive member 621. This arrangement is the same as that of the semiconductor device 104E. The adhesive member 623 of the semiconductor device 105E may be used instead of the adhesive member 621.

Figure 120:
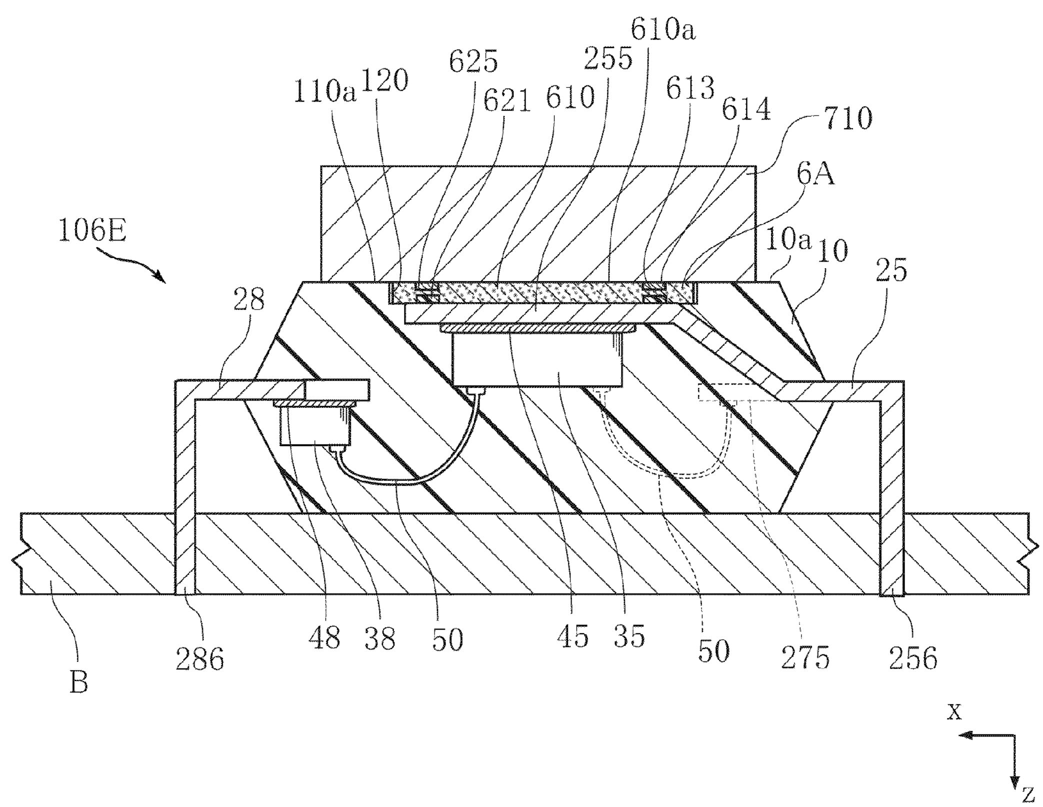
Figure 121:
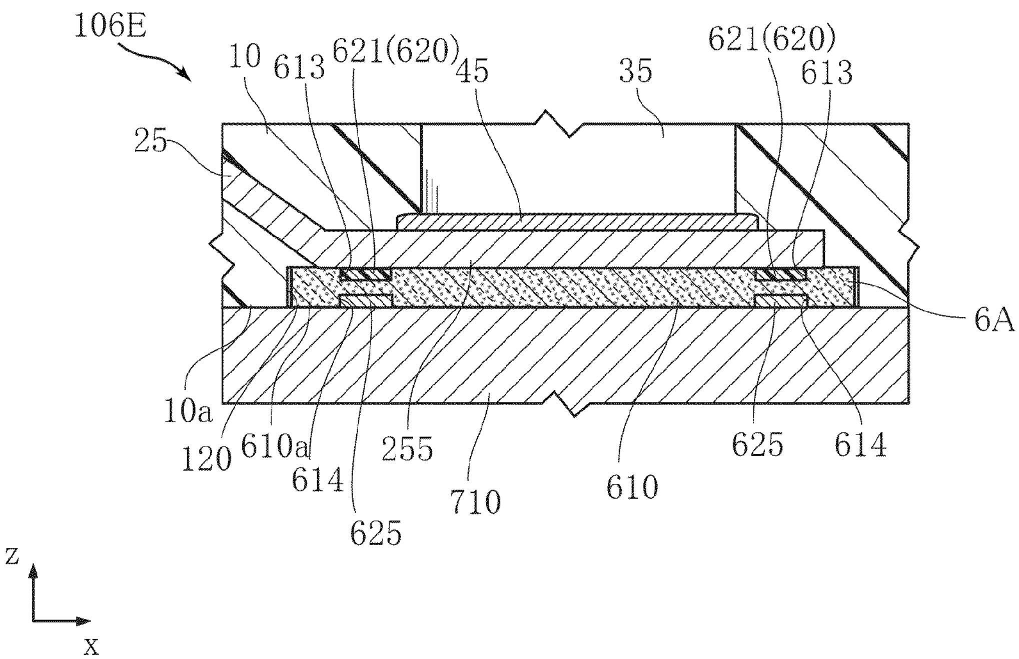

FIG. 120 shows an example of use of the semiconductor device 106E. In the example shown in FIG. 120, a heat dissipating member 710 is provided in contact with the reverse surface 10*a* of the sealing resin 10 and the reverse surface 610*a* of the plate member 610. The heat dissipating member 710 is fixed to the sealing resin 10 by e.g. a non-illustrated screw. FIG. 121 is a schematic enlarged view of the semiconductor device 106E. Shown in FIG. 121 is the state in which the heat dissipating member 710 shown in FIG. 120 is attached.

The recesses 614, which are shown in FIG. 121, are filled by adhesive members 625. The adhesive members 625 are made of silver paste and bond the heat dissipating member 710 and the plate member 610 to each other. The adhesive members 625 are formed by pouring silver paste in the recesses 614 and then hardening the paste in attaching the semiconductor device 106E to the heat dissipating member 710. The adhesive members 625 may be made of a material other than silver paste.

In the case where the heat dissipating member 710 has a high heat dissipation effect, there is not much difference between the semiconductor device 106E and the semiconductor device 103E in the use of the heat dissipating member 710. Thus, the semiconductor device 106E can provide the same advantages as those of the semiconductor device 103E.

7E Embodiment

Figure 122:
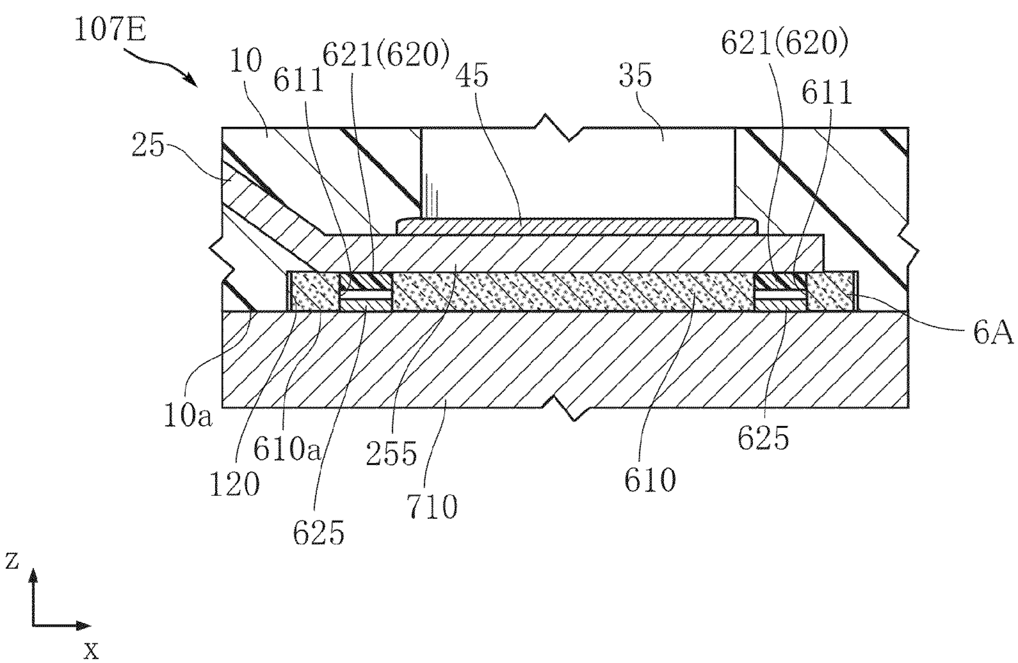
Figure 123:
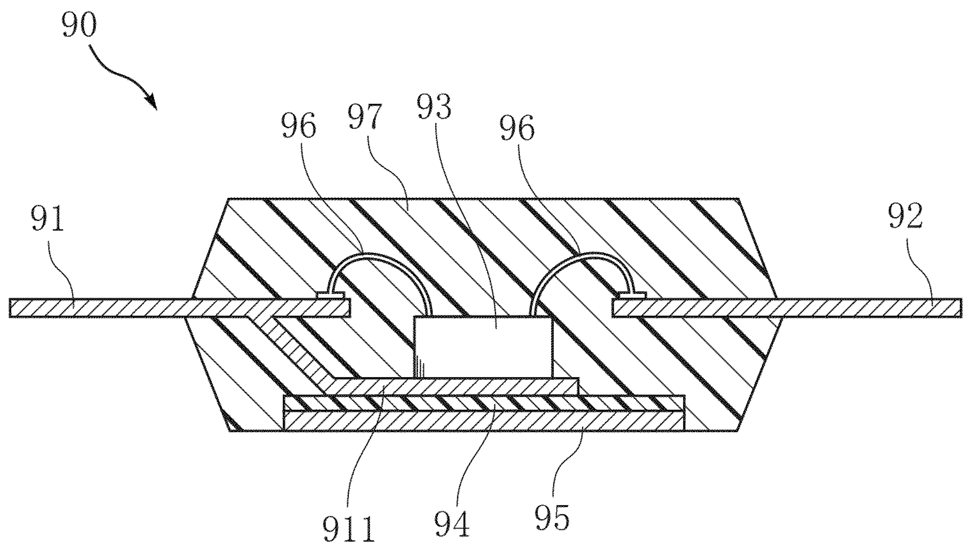
Figure 124:
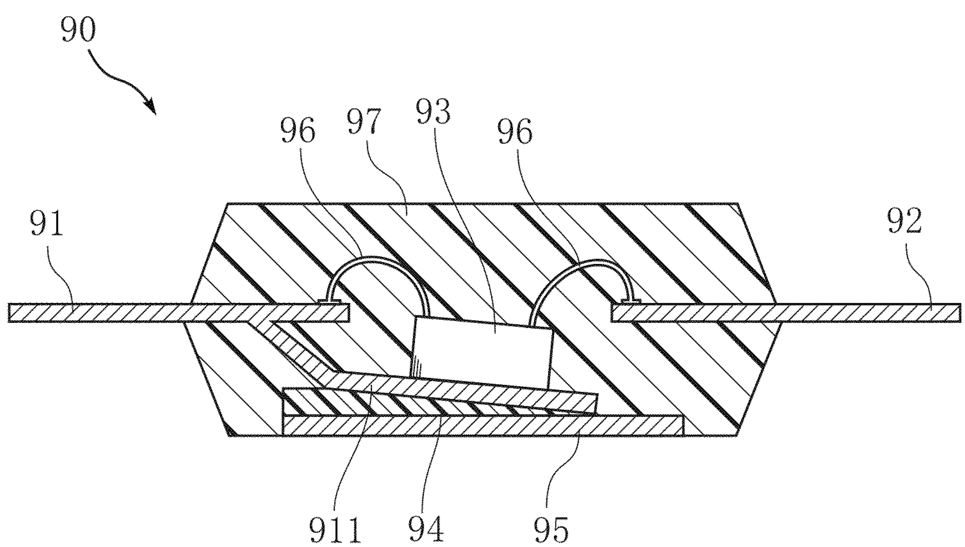

FIG. 122 shows the semiconductor device according to the 7E Embodiment of the present invention. The semiconductor device 107E shown in FIG. 122 is provided by embodying the structure of the semiconductor device 106E by using the plate member 610 having through-holes 611 shown in the semiconductor device 101E, 102E. FIG. 122 is an enlarged view corresponding to FIG. 121 which shows the semiconductor device 106E.

The process for manufacturing the semiconductor device 107E does not require the step of bonding a metal member 70, which is employed in the semiconductor devices 101E-105E, to the plate member 610. Thus, the step of bonding the plate member 610 to the die pad 255 or die pad 265 via the adhesive members 621 is performed. In this step, epoxy resin is poured into a portion of each through-hole 611 on the front surface side so as not to fill the through-hole 61. Alternatively, after the through-hole 611 is filled with epoxy resin, part of the epoxy resin is removed from the reverse surface side. By either of these processes, the spacers 6A and 6B having through-holes 611 which are hollow on the reverse surface side are obtained.

When the method for manufacturing the semiconductor device 101E is employed, the sealing resin 10 enters the hollow portions. Thus, to manufacture the semiconductor device 107E, the method for manufacturing the semiconductor device 101E is not suitable, and the method for manufacturing the semiconductor device 102E is suitable.

To attach a heat dissipating member 710 to the semiconductor device 107E, silver paste or epoxy resin is poured into the hollow portion of each through-hole 611 in which the adhesive member 621 is not provided, and the heat dissipating member 710 is fixed to the plate member 610 via the poured silver paste or epoxy resin. The silver paste or epoxy resin becomes the adhesive members 625. When thermal conductivity is a higher priority, silver paste is preferable as the material for the adhesive members 625. When insulation is a higher priority, epoxy resin is preferable as the material for the adhesive members 625.

According to the above-described method, a part of each through-hole 611 may remain hollow, as shown in FIG. 122.

Instead of the adhesive members 621, adhesive members 623 made of silver paste may be used. In this case, to prevent electrical connection of the die pad 255 and the heat dissipating member 710 via the through-holes 611, an insulating material such as epoxy resin needs to be used as the material for the adhesive members 625.

Although the reverse surface 610*a* of the plate member 610 is at the same position as the reverse surface 10*a* of the sealing resin 10 in the z direction in the semiconductor devices 106E and 107E, this is merely an example. The reverse surface 610*a* of the plate member 610 may project from the sealing resin 10. In this case, the reverse surface 610*a* of the plate member 610 and the heat dissipating member 710 are reliably in contact with each other.

In the semiconductor devices 106E and 107E, when the heat dissipating member 710 can be strongly fixed by the sealing resin 10, it is not necessary to bond the plate member 610 and the heat dissipating member 710 by the adhesive members 625. Sufficient heat dissipation effect is obtained even when the plate member 610 and the heat dissipating member 710 are merely in contact with each other.

The semiconductor device according to the variation of the present invention is not limited to the foregoing embodiments. The specific structure of the semiconductor device according to the variation of the present invention can be varied in design in many ways. Although three semiconductor elements 35, 36 and 37 are sealed in a single sealing resin 10 in the semiconductor device of the foregoing embodiments, a larger number of semiconductor elements may be sealed in the semiconductor device according to the variation of the present invention. Alternatively, only a single semiconductor element may be sealed. Although the semiconductor devices 35, 36, 37 of the foregoing embodiment are power chips, the variation of the present invention is not limited to power chips and is applicable to the sealing of various kinds of semiconductor elements which may be heated in a resin.

Further, in the foregoing embodiment, the through-holes 611, 612 and the recesses 613 and 614 are arranged at positions that do not overlap the semiconductor element 35, 36, 37 as viewed in the z direction, this arrangement is merely a preferable example. The through-holes 611, 612 and the recesses 613, 614 may be arranged to overlap the semiconductor elements 35, 36 and 37 as viewed in the z direction.

Although the plate member 610 has through-holes 611 or recesses 613, 614 in the foregoing embodiments, the plate member may include both of the through-holes 611 and the recesses 613, 614. As noted before, as viewed in the z direction, the plate member 610 is larger than the die pad 255 and smaller than the metal member 70. Thus, the plate member 610 has a region that does not overlap the die pad 255 but overlaps the metal member 70 as viewed in the z direction. There is not much merit in forming recesses 613 in this region, but forming recesses 614 is advantageous to strongly bond the plate member 610 and the metal member 70 to each other. Thus, provision of both the through-holes 611 and the recesses 614 may provide advantages.

In the foregoing embodiments, the adhesive members 620 are in the through-holes 611, 612 and in the recesses 613, 614 formed in the plate member 610. However, this arrangement is merely an example suitable to increase the contact area between the adhesive members 620 and the plate member 610. Thus, the plate member 610 may not include through-holes 611, 612 or recesses 613, 614 and the adhesive member 620 may be in the form of a frame surrounding the plate member 610. This arrangement is within the scope of the variation of the present invention.

The foregoing embodiment shows the case where the die pad 255 and the semiconductor element 35 are electrically connected to each other and contact of the die pad 255 with the metal member 70 leads to a problem. The structure of the variation of the present invention has good effect on such a case, but can be applied to other cases. For instance, the die pad 265 and the semiconductor element 37 are not electrically connected to each other in this embodiment. Even when a semiconductor element and a die pad are not electrically connected to each other in this way, the semiconductor element heats up. Attaching a plate member made of a material having better heat dissipation ability than the sealing resin to the die pad is advantageous to dissipate the heat from the semiconductor element.

Though the metal member 70 is an aluminum plate in the foregoing embodiment, the metal member of the variation of the present invention is not limited to this. For instance, the metal member may comprise a film made of a metal.

The variation of the present invention is summarized below.

(Appendix 1)

A semiconductor device comprising:

a semiconductor element;

a die pad supporting the semiconductor element;

a plurality of terminals electrically connected to the semiconductor element; and a sealing resin covering the semiconductor element, wherein:

the semiconductor element is on a surface of the die pad on a first side in a thickness direction, the semiconductor device further comprises:

an adhesive member in contact with a surface of the die pad on a second side in the thickness direction; and an insulating plate member in contact with the adhesive member, and the plate member is made of a material harder than the sealing resin and having a higher thermal conductivity than the sealing resin.

(Appendix 2)

The semiconductor device as set forth in Appendix 1, wherein the adhesive member overlaps the plate member as viewed in a direction perpendicular to the thickness direction.

(Appendix 3)

The semiconductor device as set forth in Appendix 1 or 2, wherein the plate member is made of a ceramic material.

(Appendix 4)

The semiconductor device as set forth in any one of Appendixes 1-3, wherein a surface of the plate member on the first side in the thickness direction is in contact with the die pad.

(Appendix 5)

The semiconductor device as set forth in any one of Appendixes 2-4, wherein the plate member overlaps the semiconductor element as viewed in the thickness direction, and the adhesive member does not overlap the semiconductor element as viewed in the thickness direction.

(Appendix 6)

The semiconductor device as set forth in any one of Appendixes 1-5, wherein a surface of the plate member on the second side in the thickness direction is exposed from the sealing resin.

(Appendix 7)

The semiconductor device as set forth in any one of Appendixes 1-6, wherein the plate member includes a through-hole penetrating in the thickness direction, and the adhesive member is arranged in the through-hole.

(Appendix 8)

The semiconductor device as set forth in any one of Appendixes 1-6, wherein the plate member includes a recess dented in the thickness direction, and the adhesive member is arranged in the recess.

(Appendix 9)

The semiconductor device as set forth in Appendix 8, wherein the plate member includes an additional recess dented in an opposite direction from the recess.

(Appendix 10)

The semiconductor device as set forth in any one of Appendixes 1-9, wherein the adhesive member is circular or regular hexagonal as viewed in the thickness direction.

(Appendix 11)

The semiconductor device as set forth in any one of Appendixes 1-10, wherein the plate member and the adhesive member constitute a spacer, the semiconductor device further comprises a metal member at least part of which is exposed from the sealing resin, and the spacer is sandwiched between the die pad and the metal member in the thickness direction.

(Appendix 12)

The semiconductor device as set forth in Appendix 11, wherein the adhesive member is in contact with a surface of the metal member on the first side in the thickness direction.

(Appendix 13)

The semiconductor device as set forth in Appendix 11, further comprising an additional adhesive member spaced apart from the adhesive member, in contact with the plate member and in contact with a surface of the metal member on the first side in the thickness direction.

(Appendix 14)

The semiconductor device as set forth in Appendix 13, wherein the additional adhesive member overlaps the plate member as viewed in a direction perpendicular to the thickness direction.

(Appendix 15)

The semiconductor device as set forth in any one of Appendixes 11-14, wherein a surface of the plate member on the second side in the thickness direction is in contact with the surface of the metal member on the first side in the thickness direction.

(Appendix 16)

The semiconductor device as set forth in any one of Appendixes 11-14, wherein the surface of the metal member on the second side in the thickness direction is exposed from the sealing resin.

(Appendix 17)

The semiconductor device as set forth in Appendix 16, wherein the surface of the metal member on the second side in the thickness direction is deviated toward the second side from a surface of the sealing resin on the second side in the thickness direction.

(Appendix 18)

The semiconductor device as set forth in Appendix 16, wherein the surface of the metal member on the second side in the thickness direction is at a same position in the thickness direction as a surface of the sealing resin on the second side in the thickness direction.

(Appendix 19)

The semiconductor device as set forth in any one of Appendixes 11-18, wherein a length of the metal member in a direction perpendicular to the thickness direction is longer than that of the spacer.

(Appendix 20)

The semiconductor device as set forth in any one of Appendixes 11-19, wherein the metal member is thicker than the spacer in the thickness direction.

(Appendix 21)

The semiconductor device as set forth in any one of Appendixes 1-20, wherein the adhesive member is made of a resin.

(Appendix 22)

The semiconductor device as set forth in any one of Appendixes 1-21, wherein the die pad is electrically connected to one of the terminals.

(Appendix 23)

The semiconductor device as set forth in any one of Appendixes 1-22, wherein the plate member is 0.2-2 mm in thickness in the thickness direction.

(Appendix 24)

A method for manufacturing a semiconductor device comprising the steps of: forming a plurality of terminals and a die pad;

disposing a semiconductor element on a surface of the die pad on a first side in a thickness direction;

electrically connecting at least one of the terminals and the semiconductor element; and covering the semiconductor element with a sealing resin, wherein the method further comprises the steps of:

attaching an adhesive member to a plate member made of a material harder than the sealing resin and having a higher thermal conductivity than the sealing resin; and attaching the plate member to a surface of the die pad on a second side in the thickness direction via the adhesive member.

(Appendix 25)

The method for manufacturing a semiconductor device as set forth in Appendix 24, wherein the step of attaching the adhesive member to the plate member comprises attaching the adhesive member to a position overlapping the plate member as viewed in a direction perpendicular to a thickness direction of the plate member.

(Appendix 26)

The method for manufacturing a semiconductor device as set forth in Appendix 25, wherein the step of attaching the adhesive member to the plate member comprises forming a through-hole penetrating the plate member in the thickness direction and attaching the adhesive member in the through-hole.

(Appendix 27)

The method for manufacturing a semiconductor device as set forth in Appendix 25, wherein the step of attaching the adhesive member to the plate member comprises forming a recess dented in the thickness direction in the plate member and attaching the adhesive member in the recess.

(Appendix 28)

The method for manufacturing a semiconductor device as set forth in any one of Appendixes 24-27, wherein:

the step of covering the semiconductor element with a sealing resin comprises forming the sealing resin so as to expose the surface of the die pad on the second side in the thickness direction; and the step of attaching the plate member to the die pad is performed after the step of covering the semiconductor element with a sealing resin.

(Appendix 29)

The method for manufacturing a semiconductor device as set forth in any one of Appendixes 25-28, wherein the step of attaching the plate member to the die pad comprises bringing the surface of the plate member on the first side in the thickness direction and the surface of the die pad on the second side in the thickness direction into contact with each other.

(Appendix 30)

The method for manufacturing a semiconductor device as set forth in any one of Appendixes 24-29, further comprising the step of attaching the plate member to a metal member.

The invention claimed is:

1. A semiconductor device comprising:

a plurality of die pads each having a bottom surface;

a plurality of semiconductor chips each of which is disposed on a respective one of the die pads;

a sealing resin covering top surfaces of the plurality of die pads and the semiconductor chips, the sealing resin extending about the sides of and extending below the bottom surfaces of the plurality of die pads to form a recess comprised of the extended portion of the sealing resin as a recess side surface, the recess exposing the bottom surfaces of the plurality of die pads within the recess;

a heat dissipation plate configured for insertion into and disposed in the recess; and an intermediate layer including a plurality of first portions;

wherein each of the first portions bonds a respective one of the plurality of die pads to the heat dissipation plate and is disposed between the respective one of the die pads and the heat dissipation plate, and wherein the recess includes a recess side surface and a recess bottom surface spaced apart from the heat dissipation plate.

2. The semiconductor device according to claim 1, wherein at least one of the heat dissipation plate or the first portions have electrical insulating properties.

3. The semiconductor device according to claim 1, wherein the bottom surface of each of the plurality of die pads includes an irregular surface with which a corresponding one of the first portions is in contact.

4. The semiconductor device according to claim 1, wherein the recess includes a recess bottom surface, and the die pads are exposed from the recess bottom surface.

5. The semiconductor device according to claim 1, wherein the intermediate layer includes an electrically insulating portion disposed between the recess side surface and the side surface of the heat dissipation plate and also disposed between the recess bottom surface and a part of the top surface of the heat dissipation plate.

6. The semiconductor device according to claim 1, wherein the intermediate layer includes a second portion connected to the first portions, the heat dissipation plate is made of a conductor, and the first portions and the second portion are made of a same electrically insulating material.

7. The semiconductor device according to claim 1, wherein the heat dissipation plate is made of a ceramic material, and the first portions are spaced apart from each other and made of a conductor.

8. The semiconductor device according to claim 1, wherein the sealing resin includes a resin bottom surface, the recess is indented from the resin bottom surface, and the heat dissipation plate includes a portion projecting from the resin bottom surface.

9. The semiconductor device according to claim 4, wherein the recess bottom surface is an irregular surface.

10. The semiconductor device according to claim 4, wherein the sealing resin includes a plurality of bar portions standing from the recess bottom surface, each of the bar portions being positioned between the heat dissipation plate and the recess side surface.

11. The semiconductor device according to claim 4, wherein the sealing resin includes a projection projecting from the recess bottom surface, the projection being in contact with the heat dissipation plate.

12. The semiconductor device according to claim 6, further comprising a filler contained in the first portions and the second portion.

13. The semiconductor device according to claim 6, wherein the conductor is selected from the group consisting of aluminum, copper and iron.

14. The semiconductor device according to claim 6, wherein the electrically insulating material is a thermoplastic resin.

15. The semiconductor device according to claim 7, wherein the ceramic material is selected from the group consisting of alumina, aluminum nitride and silicon nitride.

16. The semiconductor device according to claim 7, wherein the conductor is selected from the group consisting of silver, gold and copper.

17. A semiconductor device comprising:

a plurality of die pads each having a bottom surface;

a plurality of semiconductor chips each of which is disposed on a respective one of the die pads;

a sealing resin including a recess that exposes a plurality of the die pads and covering the plurality of die pads and the semiconductor chips;

a heat dissipation plate disposed in the recess and comprising a top surface and a side surface; and an intermediate layer including a plurality of first portions;

wherein each of the first portions bonds a respective one of the plurality of die pads to the top surface of the heat dissipation plate and is disposed between the respective one of the die pads and the heat dissipation plate, and wherein the recess includes a recess side surface and a recess bottom surface each spaced apart from the heat dissipation plate, wherein the intermediate layer includes an electrically insulating portion disposed between the recess side surface and the side surface of the heat dissipation plate and also disposed between the recess bottom surface and a part of the top surface of the heat dissipation plate.

18. The semiconductor device according to claim 17, wherein the die pads are exposed from the recess bottom surface.

19. The semiconductor device according to claim 17, wherein the sealing resin includes a resin bottom surface, the recess is indented from the resin bottom surface, and the heat dissipation plate includes a portion projecting from the resin bottom surface.

20. The semiconductor device according to claim 18, wherein the recess bottom surface is an irregular surface.

* * * * *